(12) United States Patent
Kimura et al.

(10) Patent No.: US 10,924,090 B2
(45) Date of Patent: Feb. 16, 2021

(54) SEMICONDUCTOR DEVICE COMPRISING HOLDING UNITS

(71) Applicant: SEMICONDUCTOR ENERGY LABORATORY CO., LTD., Atsugi (JP)

(72) Inventors: Hajime Kimura, Kanagawa (JP); Yoshiyuki Kurokawa, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/511,215

(22) Filed: Jul. 15, 2019

(65) Prior Publication Data
US 2020/0028498 A1    Jan. 23, 2020

(30) Foreign Application Priority Data

Jul. 20, 2018  (JP) ................................. 2018-136839

(51) Int. Cl.
*H03K 3/037*    (2006.01)
*G06N 3/04*    (2006.01)
(Continued)

(52) U.S. Cl.
CPC .............. *H03K 3/037* (2013.01); *G06N 3/04* (2013.01); *G11C 11/16* (2013.01); *G11C 13/0004* (2013.01)

(58) Field of Classification Search
CPC ...... G11C 11/16; G11C 13/0004; G06N 3/04; H03K 3/037
(Continued)

(56) References Cited

U.S. PATENT DOCUMENTS 8,803,591 B1 *  8/2014  Roy ................... H03K 19/0027
                                                    327/534
8,866,510 B2   10/2014  Tanabe et al.
(Continued)

FOREIGN PATENT DOCUMENTS

JP         5885719       3/2016
JP    2017-085571 A     5/2017
(Continued)

OTHER PUBLICATIONS

Miyashita.D et al., "Time-Domain Neural Network:A 48.5 TSOp/s/W Neuromorphic Chip Optimized for Deep Learning and CMOS Technology", IEEE ASSCC 2016 (IEEE Asian Solid-State Circuits Conference), Nov. 7, 2016, pp. 25-28.
(Continued)

*Primary Examiner* — Sung Il Cho
(74) *Attorney, Agent, or Firm* — Fish & Richardson P.C.

(57) ABSTRACT

A semiconductor device capable of performing product-sum operation with low power consumption. The semiconductor device includes first and second logic circuits, first to fourth transistors, and first and second holding units. A low power supply potential input terminal of the first logic circuit is electrically connected to the first and third transistors. A low power supply potential input terminal of the second logic circuit is electrically connected to the second and fourth transistors. The potentials of second gates of the first and fourth transistors are held in the first holding unit as potentials corresponding to first data. The potentials of second gates of the second and third transistors are held in the second holding unit. The on/off states of the first to fourth transistors are determined by second data. A difference in signal input/output time between the first and second logic circuits depends on the first data and the second data.

19 Claims, 48 Drawing Sheets

(51) Int. Cl.
*G11C 11/16* (2006.01)
*G11C 13/00* (2006.01)

(58) Field of Classification Search
USPC .......................................................... 365/148
See application file for complete search history.

(56) References Cited

U.S. PATENT DOCUMENTS

| | | | |
|---|---|---|---|
| 8,988,152 | B2 | 3/2015 | Ohmaru et al. |
| 9,142,683 | B2 | 9/2015 | Yamazaki et al. |
| 9,361,577 | B2 | 6/2016 | Miyashita |
| 9,461,126 | B2* | 10/2016 | Yamazaki ............ H01L 27/1225 |
| 9,666,606 | B2 | 5/2017 | Matsuzaki et al. |
| 10,038,402 | B2 | 7/2018 | Okamoto et al. |
| 2015/0074028 | A1 | 3/2015 | Miyashita |
| 2016/0343452 | A1* | 11/2016 | Ikeda ................... H01L 27/1255 |
| 2017/0364791 | A1 | 12/2017 | Miyashita et al. |
| 2018/0018752 | A1* | 1/2018 | Kurokawa ............ G06F 1/3218 |
| 2018/0039882 | A1* | 2/2018 | Ikeda ........................ G06N 3/04 |
| 2018/0061344 | A1* | 3/2018 | Kurokawa ............ G09G 3/3233 |
| 2018/0175074 | A1* | 6/2018 | Kurokawa ............ G09G 3/3677 |
| 2018/0181862 | A1 | 6/2018 | Ikeda |
| 2018/0211620 | A1* | 7/2018 | Kurokawa ............ G06N 3/0454 |
| 2018/0358925 | A1 | 12/2018 | Okamoto et al. |
| 2019/0147329 | A1* | 5/2019 | Hekmatshoartabari ..................... G06N 3/0635 706/26 |
| 2019/0371226 | A1* | 12/2019 | Iwaki ...................... G11C 11/54 |
| 2019/0371798 | A1* | 12/2019 | Yamazaki ............ H01L 27/1207 |
| 2020/0007114 | A1* | 1/2020 | Kimura ................... G06N 3/063 |
| 2020/0028498 | A1* | 1/2020 | Kimura ..................... G06N 3/04 |
| 2020/0105176 | A1* | 4/2020 | Kurokawa ............... G09G 3/20 |
| 2020/0185528 | A1* | 6/2020 | Yamazaki ......... H01L 29/78648 |

FOREIGN PATENT DOCUMENTS

| | | |
|---|---|---|
| JP | 2017-228295 A | 12/2017 |
| JP | 2018-109968 A | 7/2018 |

OTHER PUBLICATIONS

Miyashita.D et al., "A Neuromorphic Chip Optimized for Deep Learning and CMOS Technology With Time-Domain Analog and Digital Mixed-Signal Processing", IEEE Journal of Solid-State Circuits, Oct. 1, 2017, vol. 52, No. 1, pp. 2679-2689.

* cited by examiner

SEMICONDUCTOR DEVICE COMPRISING HOLDING UNITS

BACKGROUND OF THE INVENTION

1. Field of the Invention

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a method for driving any of them, a method for manufacturing any of them, and a method for inspecting any of them.

2. Description of the Related Art

Integrated circuits that imitate the mechanism of the human brain are currently under active development. The integrated circuits incorporate electronic circuits as the brain mechanism and include circuits corresponding to neurons and synapses of the human brain. Such integrated circuits may therefore be referred to as "neuromorphic" or "brainmorphic" circuits. The integrated circuits have a non-von Neumann architecture and are expected to be able to perform parallel processing with extremely low power consumption as compared with a von Neumann architecture, which consumes higher power with increasing processing speed.

An information processing model that imitates a biological neural network including neurons and synapses is referred to as an artificial neural network (ANN). For example, Patent Documents 1 and 2 and Non-Patent Documents 1 and 2 each disclose an arithmetic device including an artificial neural network constructed using resistive random access memory (ReRAM). In particular, Non-Patent Documents 1 and 2 each disclose a circuit that includes the arithmetic device and imitates the brain mechanism.

REFERENCE

Patent Documents

Patent Document 1: Japanese Patent No. 5885719
Patent Document 2: Japanese Published Patent Application No. 2017-228295

Non-Patent Documents

Non-Patent Document 1: D. Miyashita et al., IEEE Asian Solid-State Circuits Conference, Nov. 7-9, 2016, S4-2 (4077), pp. 25-28.
Non-Patent Document 2: D. Miyashita et al., IEEE Journal of Solid-State Circuits, Vol. 52, No. 10, October 2017, pp. 2679-2689.

SUMMARY OF THE INVENTION

In general, an artificial neural network performs calculations in which the connection strength of the synapse (also referred to as a weight coefficient in some cases) that connects two neurons is multiplied by a signal transmitted between the two neurons. In particular, in a hierarchical artificial neural network, the connection strength of the synapses between a plurality of first neurons in a first layer and one of second neurons in a second layer and signals input from the plurality of first neurons in the first layer to the one of the second neurons in the second layer need to be multiplied and summed. The number of connection strengths and the number of parameters indicating the signals are determined by the scale of the artificial neural network. That is, in the artificial neural network, as the numbers of layers and neurons increase, the number of circuits corresponding to neurons and synapses also increase, which sometimes makes the amount of calculation enormous.

An increase in the number of circuits included in a chip increases the power consumption and the amount of heat generated during the driving of a device. In particular, a larger amount of heat generation is more likely to affect the characteristics of circuit components included in a chip; thus, the circuit components included in the chip are preferably less affected by temperatures.

An object of one embodiment of the present invention is to provide a semiconductor device or the like including a hierarchical artificial neural network. Another object of one embodiment of the present invention is to provide a semiconductor device or the like with low power consumption. Another object of one embodiment of the present invention is to provide a semiconductor device or the like that is not easily affected by environmental temperature. Another object of one embodiment of the present invention is to provide a novel semiconductor device or the like.

Note that the objects of one embodiment of the present invention are not limited to those listed above. The objects listed above do not preclude the existence of other objects. The other objects are the ones that are not described above and will be described below. Objects that are not described above will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1) One embodiment of the present invention is a semiconductor device including a first transistor, a second transistor, a third transistor, a fourth transistor, a first logic circuit, a second logic circuit, a first holding unit, and a second holding unit. Each of the first logic circuit and the second logic circuit includes an input terminal, an output terminal, and a power supply potential input terminal. The first logic circuit has a function of outputting an inverted signal of a signal input to the input terminal of the first logic circuit, from the output terminal of the first logic circuit. The second logic circuit has a function of outputting an inverted signal of a signal input to the input terminal of the second logic circuit, from the output terminal of the second logic circuit. Each of the first to fourth transistors includes a first gate and a second gate. The first holding unit includes a fifth transistor and a first capacitor. The second holding unit includes a sixth transistor and a second capacitor. The power supply potential input terminal of the first logic circuit is electrically connected to a first terminal of the first transistor and a first terminal of the third transistor. The power supply potential input terminal of the second logic circuit is electrically connected to a first terminal of the second transistor and a first terminal of the fourth transistor. The first gate of the first transistor is electrically connected to the first gate of the second transistor. The first gate of the third transistor is electrically connected to the first gate of the fourth transistor. A first terminal of the fifth transistor is electrically connected to a first terminal of the first capacitor, the second gate of the first transistor, and the second gate of the fourth transistor. A first terminal of the sixth transistor is electrically connected to a first terminal of the second capacitor, the second gate of the second transistor, and the second gate of the third transistor.

(2) One embodiment of the present invention is a semiconductor device including a first circuit. The first circuit includes a first input terminal, a second input terminal, a third input terminal, a first output terminal, a second output terminal, a first transistor, a second transistor, a third transistor, a fourth transistor, a first logic circuit, a second logic circuit, a third logic circuit, and a fourth logic circuit. Each of the first to fourth logic circuits includes an input terminal, an output terminal, and a power supply potential input terminal. The first logic circuit has a function of outputting an inverted signal of a signal input to the input terminal of the first logic circuit, from the output terminal of the first logic circuit. The second logic circuit has a function of outputting an inverted signal of a signal input to the input terminal of the second logic circuit, from the output terminal of the second logic circuit. The third logic circuit has a function of outputting an inverted signal of a signal input to the input terminal of the third logic circuit, from the output terminal of the third logic circuit. The fourth logic circuit has a function of outputting an inverted signal of a signal input to the input terminal of the fourth logic circuit, from the output terminal of the fourth logic circuit. Each of the first to fourth transistors includes a first gate and a second gate. The first input terminal is electrically connected to the input terminal of one of the first logic circuit and the third logic circuit. When the first input terminal is electrically connected to the input terminal of the first logic circuit, the output terminal of the first logic circuit is electrically connected to the input terminal of the third logic circuit, the output terminal of the third logic circuit is electrically connected to the first output terminal, the second input terminal is electrically connected to the input terminal of the second logic circuit, the output terminal of the second logic circuit is electrically connected to the input terminal of the fourth logic circuit, and the output terminal of the fourth logic circuit is electrically connected to the second output terminal. When the first input terminal is electrically connected to the input terminal of the third logic circuit, the output terminal of the third logic circuit is electrically connected to the input terminal of the first logic circuit, the output terminal of the first logic circuit is electrically connected to the first output terminal, the second input terminal is electrically connected to the input terminal of the fourth logic circuit, the output terminal of the fourth logic circuit is electrically connected to the input terminal of the second logic circuit, and the output terminal of the second logic circuit is electrically connected to the second output terminal. The power supply potential input terminal of the first logic circuit is electrically connected to a first terminal of the first transistor and a first terminal of the third transistor. The power supply potential input terminal of the second logic circuit is electrically connected to a first terminal of the second transistor and a first terminal of the fourth transistor. The first gate of the first transistor is electrically connected to the first gate of the second transistor. The first gate of the third transistor is electrically connected to the first gate of the fourth transistor. The first circuit has a function of turning on the first transistor and the second transistor and turning off the third transistor and the fourth transistor or turning off the first transistor and the second transistor and turning on the third transistor and the fourth transistor, in response to a first signal input to the third input terminal. The first circuit has a function of changing an input/output time from input of a signal to the first input terminal to output of the signal from the first output terminal and an input/output time from input of a signal to the second input terminal to output of the signal from the second output terminal, in response to a potential of the second gate of each of the first to fourth transistors.

(3) One embodiment of the present invention is the semiconductor device according to (2), in which the first circuit includes a holding unit. The holding unit includes a fifth logic circuit and a sixth logic circuit. An output terminal of the fifth logic circuit is electrically connected to an input terminal of the sixth logic circuit, the second gate of the first transistor, and the second gate of the fourth transistor. An input terminal of the fifth logic circuit is electrically connected to an output terminal of the sixth logic circuit, the second gate of the second transistor, and the second gate of the third transistor.

(4) One embodiment of the present invention is the semiconductor device according to (2), in which the first circuit includes a first holding unit and a second holding unit. The first holding unit includes a fifth transistor and a first capacitor. The second holding unit includes a sixth transistor and a second capacitor. A first terminal of the fifth transistor is electrically connected to the second gate of the first transistor, the second gate of the fourth transistor, and a first terminal of the first capacitor. A first terminal of the sixth transistor is electrically connected to the second gate of the second transistor, the second gate of the third transistor, and a first terminal of the second capacitor. Each of the fifth transistor and the sixth transistor contains a metal oxide in a channel formation region.

(5) One embodiment of the present invention is the semiconductor device according to (2), in which the first circuit includes a first holding unit, a second holding unit, a third holding unit, and a fourth holding unit. The first holding unit includes a fifth transistor and a first capacitor. The second holding unit includes a sixth transistor and a second capacitor. The third holding unit includes a seventh transistor and a third capacitor. The fourth holding unit includes an eighth transistor and a fourth capacitor. A first terminal of the fifth transistor is electrically connected to the second gate of the first transistor and a first terminal of the first capacitor. A first terminal of the sixth transistor is electrically connected to the second gate of the second transistor and a first terminal of the second capacitor. A first terminal of the seventh transistor is electrically connected to the second gate of the third transistor and a first terminal of the third capacitor. A first terminal of the eighth transistor is electrically connected to the second gate of the fourth transistor and a first terminal of the fourth capacitor. Each of the fifth to eighth transistors contains a metal oxide in a channel formation region.

(6) One embodiment of the present invention is the semiconductor device according to any one of (1) to (5), in which at least one of the first to fourth transistors contains a metal oxide in a channel formation region.

(7) One embodiment of the present invention is a semiconductor device including a first circuit. The first circuit includes a first input terminal, a second input terminal, a third input terminal, a first output terminal, a second output terminal, a first switch, a second switch, a third switch, a fourth switch, a first logic circuit, a second logic circuit, a third logic circuit, a fourth logic circuit, a first load circuit, and a second load circuit. Each of the first to fourth logic circuits includes an input terminal, an output terminal, and a power supply potential input terminal. The first logic circuit has a function of outputting an inverted signal of a signal input to the input terminal of the first logic circuit, from the output terminal of the first logic circuit. The second logic circuit has a function of outputting an inverted signal of a signal input to the input terminal of the second logic circuit, from the output terminal of the second logic circuit. The third logic circuit has a function of outputting an inverted signal of a signal input to the input terminal of the third logic circuit, from the output terminal of the third logic circuit. The fourth logic circuit has a function of outputting an inverted signal of a signal input to the input terminal of the fourth logic circuit, from the output terminal of the fourth logic circuit. The first input terminal is electrically connected to the input terminal of one of the first logic circuit and the third logic circuit. When the first input terminal is electrically connected to the input terminal of the first logic circuit, the output terminal of the first logic circuit is electrically connected to the input terminal of the third logic circuit, the output terminal of the third logic circuit is electrically connected to the first output terminal, the second input terminal is electrically connected to the input terminal of the second logic circuit, the output terminal of the second logic circuit is electrically connected to the input terminal of the fourth logic circuit, and the output terminal of the fourth logic circuit is electrically connected to the second output terminal. When the first input terminal is electrically connected to the input terminal of the third logic circuit, the output terminal of the third logic circuit is electrically connected to the input terminal of the first logic circuit, the output terminal of the first logic circuit is electrically connected to the first output terminal, the second input terminal is electrically connected to the input terminal of the fourth logic circuit, the output terminal of the fourth logic circuit is electrically connected to the input terminal of the second logic circuit, and the output terminal of the second logic circuit is electrically connected to the second output terminal. The power supply potential input terminal of the first logic circuit is electrically connected to a first terminal of the first switch and a first terminal of the third switch. The power supply potential input terminal of the second logic circuit is electrically connected to a first terminal of the second switch and a first terminal of the fourth switch. A control terminal of the first switch is electrically connected to a control terminal of the second switch. A control terminal of the third switch is electrically connected to a control terminal of the fourth switch. A first terminal of the first load circuit is electrically connected to a second terminal of the first switch and a second terminal of the fourth switch. A first terminal of the second load circuit is electrically connected to a second terminal of the second switch and a second terminal of the third switch. The first circuit has a function of turning on the first switch and the second switch and turning off the third switch and the fourth switch or turning off the first switch and the second switch and turning on the third switch and the fourth switch, in response to a first signal input to the third input terminal. The first circuit has a function of changing an input/output time from input of a signal to the first input terminal to output of the signal from the first output terminal and an input/output time from input of a signal to the second input terminal to output of the signal from the second output terminal, in response to on/off states of the first to fourth switches, a first resistance between the first terminal and a second terminal of the first load circuit, and a second resistance between the first terminal and a second terminal of the second load circuit.

(8) One embodiment of the present invention is the semiconductor device according to (7), in which the first load circuit includes one of a variable resistor, a magnetic tunnel junction element, and a phase-change memory, and the first load circuit has a function of changing the first resistance in response to a signal input to the first load circuit.

(9) One embodiment of the present invention is the semiconductor device according to (8), in which the second load circuit includes one of a variable resistor, a magnetic tunnel junction element, and a phase-change memory, and the second load circuit has a function of changing the second resistance in response to a signal input to the second load circuit.

(10) One embodiment of the present invention is a semiconductor device including a first circuit. The first circuit includes a first circuit comprising a first input terminal, a second input terminal, a third input terminal, a first output terminal, a second output terminal, a first switch, a second switch, a third switch, a fourth switch, a first logic circuit, a second logic circuit, a third logic circuit, a fourth logic circuit, a first load circuit, a second load circuit, a third load circuit, and a fourth load circuit. Each of the first to fourth logic circuits includes an input terminal, an output terminal, and a power supply potential input terminal. The first logic circuit has a function of outputting an inverted signal of a signal input to the input terminal of the first logic circuit, from the output terminal of the first logic circuit. The second logic circuit has a function of outputting an inverted signal of a signal input to the input terminal of the second logic circuit, from the output terminal of the second logic circuit. The third logic circuit has a function of outputting an inverted signal of a signal input to the input terminal of the third logic circuit, from the output terminal of the third logic circuit. The fourth logic circuit has a function of outputting an inverted signal of a signal input to the input terminal of the fourth logic circuit, from the output terminal of the fourth logic circuit. The first input terminal is electrically connected to the input terminal of one of the first logic circuit and the third logic circuit. When the first input terminal is electrically connected to the input terminal of the first logic circuit, the output terminal of the first logic circuit is electrically connected to the input terminal of the third logic circuit, the output terminal of the third logic circuit is electrically connected to the first output terminal, the second input terminal is electrically connected to the input terminal of the second logic circuit, the output terminal of the second logic circuit is electrically connected to the input terminal of the fourth logic circuit, and the output terminal of the fourth logic circuit is electrically connected to the second output terminal. When the first input terminal is electrically connected to the input terminal of the third logic circuit, the output terminal of the third logic circuit is electrically connected to the input terminal of the first logic circuit, the output terminal of the first logic circuit is electrically connected to the first output terminal, the second input terminal is electrically connected to the input terminal of the fourth logic circuit, the output terminal of the fourth logic circuit is electrically connected to the input terminal of the second logic circuit, and the output terminal of the second logic circuit is electrically connected to the second output terminal. The power supply potential input terminal of the first logic circuit is electrically connected to a first terminal of the first switch and a first terminal of the third switch. The power supply potential input terminal of the second logic circuit is electrically connected to a first terminal of the second switch and a first terminal of the fourth switch. A control terminal of the first switch is electrically connected to a control terminal of the second switch. A control terminal of the third switch is electrically connected to a control terminal of the fourth switch. A first terminal of the first load circuit is electrically connected to a second terminal of the first switch. A first terminal of the second load circuit is electrically connected to a second terminal of the third switch. A first terminal of the third load circuit is electrically connected to a second terminal of the fourth switch. A first terminal of the fourth load circuit is electrically connected to a second terminal of the second switch. The first circuit has a function of turning on the first switch and the second switch and turning off the third switch and the fourth switch or turning off the first switch and the second switch and turning on the third switch and the fourth switch, in response to a first signal input to the third input terminal. The first circuit has a function of changing an input/output time from input of a signal to the first input terminal to output of the signal from the first output terminal and an input/output time from input of a signal to the second input terminal to output of the signal from the second output terminal, in response to on/off states of the first to fourth switches, a first resistance between the first terminal and a second terminal of the first load circuit, a second resistance between the first terminal and a second terminal of the second load circuit, a third resistance between the first terminal and a second terminal of the third load circuit, and a fourth resistance between the first terminal and a second terminal of the fourth load circuit.

(11) One embodiment of the present invention is the semiconductor device according to (10), in which each of the first to fourth load circuits includes one of a variable resistor, a magnetic tunnel junction element, and a phase-change memory. The first load circuit has a function of changing the first resistance in response to a signal input to the first load circuit. The second load circuit has a function of changing the second resistance in response to a signal input to the second load circuit. The third load circuit has a function of changing the third resistance in response to a signal input to the third load circuit. The fourth load circuit has a function of changing the fourth resistance in response to a signal input to the fourth load circuit.

(12) One embodiment of the present invention is the semiconductor device according to any one of (2) to (6), including a plurality of first circuits. The first output terminal of one first circuit is electrically connected to the first input terminal of the subsequent first circuit. The second output terminal of the one first circuit is electrically connected to the second input terminal of the subsequent first circuit. When potentials corresponding to first data are supplied to the second gates of the first transistors and the fourth transistors in all the first circuits and first signals corresponding to second data are input to the third input terminals of all the first circuits, a time lag between output signals output from the first output terminal and the second output terminal of the first circuit in the last stage by input of input signals to the first input terminal and the second input terminal of the first circuit in the first stage corresponds to a sum of products of the first data and the second data.

(13) One embodiment of the present invention is the semiconductor device according to any one of (7) to (11), including a plurality of first circuits. The first output terminal of one first circuit is electrically connected to the first input terminal of the subsequent first circuit. The second output terminal of the one first circuit is electrically connected to the second input terminal of the subsequent first circuit. When first resistances corresponding to first data are set in the first load circuits in all the first circuits and first signals corresponding to second data are input to the third input terminals of all the first circuits, a time lag between output signals output from the first output terminal and the second output terminal of the first circuit in the last stage by input of input signals to the first input terminal and the second input terminal of the first circuit in the first stage corresponds to a sum of products of the first data and the second data.

(14) One embodiment of the present invention is the semiconductor device according to (12) or (13), including a second circuit. The second circuit is electrically connected to the first output terminal and the second output terminal of the first circuit in the last stage. The second circuit has a function of generating a signal corresponding to the time lag between the output signals.

(15) One embodiment of the present invention is an electronic device including the semiconductor device according to any one of (1) to (14), in which the semiconductor device performs neural network operation.

In this specification and the like, a semiconductor device means a device that utilizes semiconductor characteristics, and refers to a circuit including a semiconductor element (e.g., a transistor, a diode, or a photodiode), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves may be semiconductor devices or may each include a semiconductor device.

When this specification and the like states that X and Y are connected, the case where X and Y are electrically connected, the case where X and Y are functionally connected, and the case where X and Y are directly connected are regarded as being disclosed in this specification and the like. Accordingly, without limitation to a predetermined connection relation, for example, a connection relation shown in drawings or text, another connection relation is regarded as being disclosed in the drawings or the text. Each of X and Y denotes an object (e.g., a device, an element, a circuit, a wiring, an electrode, a terminal, a conductive film, or a layer).

For example, in the case where X and Y are electrically connected, at least one element that enables electrical connection between X and Y (e.g., a switch, a transistor, a capacitor, an inductor, a resistor, a diode, a display element, a light-emitting element, or a load) can be connected between X and Y Note that a switch is controlled to be turned on or off. That is, a switch is conducting or not conducting (is turned on or off) to determine whether current flows therethrough or not.

For example, in the case where X and Y are functionally connected, at least one circuit that enables functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generator circuit; a memory circuit; and/or a control circuit) can be connected between X and Y For instance, even if another circuit is provided between X and Y, X and Y are regarded as being functionally connected when a signal output from X is transmitted to Y.

Note that an explicit description "X and Y are electrically connected" means that X and Y are electrically connected (i.e., X and Y are connected with another element or circuit provided therebetween), X and Y are functionally connected (i.e., X and Y are functionally connected with another circuit provided therebetween), and X and Y are directly connected (i.e., X and Y are connected without another element or circuit provided therebetween). That is, the explicit expression "X and Y are electrically connected" is the same as the explicit and simple expression "X and Y are connected".

Examples of the expressions include "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order"; "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order"; and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions. Note that these expressions are examples and there is no limitation on the expressions. Here, X and Y each denote an object (e.g., a device, an element, a circuit, a wiring, an electrode, a terminal, a conductive film, or a layer).

Even when a circuit diagram shows that independent components are electrically connected to each other, one component sometimes has functions of a plurality of components. For example, when part of a wiring also serves as an electrode, one conductive film serves as the wiring and the electrode. Thus, the term "electrical connection" in this specification also means such a case where one conductive film has functions of a plurality of components.

In this specification and the like, a transistor includes three terminals called a gate, a source, and a drain. The gate is a control terminal for controlling the on/off state of the transistor. The two terminals functioning as the source and the drain are input/output terminals of the transistor. Functions of the two input/output terminals of the transistor depend on the conductivity type (n-channel type or p-channel type) of the transistor and the levels of potentials applied to the three terminals of the transistor, and one of the two terminals serves as a source and the other serves as a drain. Therefore, the terms "source" and "drain" can be used interchangeably in this specification and the like. In this specification and the like, the terms "one of a source and a drain" (or a first electrode or a first terminal) and "the other of the source and the drain" (or a second electrode or a second terminal) are used to describe the connection relation of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor. In the case where a transistor includes three or more gates, the gates may be referred to as a first gate, a second gate, a third gate, and the like.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. The term "voltage" refers to a potential difference from a reference potential. When the reference potential is a ground potential, for example, "voltage" can be replaced with "potential". The ground potential does not necessarily mean 0 V. Moreover, potentials are relative values, and a potential supplied to a wiring, a potential applied to a circuit and the like, a potential output from a circuit and the like, for example, are changed with a change of the reference potential.

Current means a charge transfer (electrical conduction); for example, the description "electrical conduction of positively charged particles" can be rephrased as "electrical conduction of negatively charged particles in the opposite direction". Therefore, unless otherwise specified, current in this specification and the like refers to a charge transfer (electrical conduction) caused by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of current in a wiring or the like refers to the direction in which a positive carrier moves, and is expressed as a positive current amount. In other words, the direction in which a negative carrier moves is opposite to the direction of current, and is expressed as a negative current amount. Thus, in the case where the polarity of current (or the direction of current) is not specified in this specification and the like, the description "current flows from an element A to an element B" can be rephrased as "current flows from an element B to an element A", for example. As another example, the description "current is supplied to an element A" can be rephrased as "current is output from an element A".

Ordinal numbers such as "first", "second", and "third" in this specification and the like are used in order to avoid confusion among components. Thus, the terms do not limit the number or order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

In this specification and the like, terms for describing arrangement, such as "over", "above", "under", and "below", are sometimes used for convenience to describe the positional relation between components with reference to drawings. Furthermore, the positional relation between components is changed as appropriate in accordance with the direction in which each component is described. Thus, the positional relation is not limited to that described with a term used in this specification and the like and can be explained with another term as appropriate depending on the situation. For example, the expression "an insulator over (on) a top surface of a conductor" can be replaced with the expression "an insulator on a bottom surface of a conductor" when the direction of a diagram showing these components is rotated by 180°.

The term such as "over", "above", "under", or "below" does not necessarily mean that a component is placed directly on or under and directly in contact with another component. For example, the expression "electrode B over insulating layer A" does not necessarily mean that the electrode B is on and in direct contact with the insulating layer A and can mean the case where another component is provided between the insulating layer A and the electrode B.

In this specification and the like, the terms "film" and "layer" can be interchanged with each other depending on circumstances. For example, in some cases, the term "conductive film" can be used instead of "conductive layer", and the term "insulating layer" can be used instead of "insulating film". Moreover, such terms can be replaced with a word not including the term "film" or "layer" depending on the case or circumstances. For example, in some cases, the term "conductor" can be used instead of "conductive layer" or "conductive film", and the term "insulator" can be used instead of "insulating layer" or "insulating film".

In this specification and the like, a term such as an "electrode" or a "wiring" does not limit the function of a component. For example, an "electrode" is used as part of a "wiring" in some cases, and vice versa. Furthermore, the term "electrode" or "wiring" can also mean a combination of a plurality of electrodes or wirings provided in an integrated manner.

In this specification and the like, the terms "wiring", "signal line", "power supply line", and the like can be interchanged with each other depending on the case or according to circumstances. For example, in some cases, the term "signal line" or "power supply line" can be used instead of the term "wiring", and vice versa. In some cases, the term "signal line" can be used instead of "power supply line", and vice versa. As another example, the term "signal" can be used instead of "potential" that is supplied to a wiring and vice versa, depending on the case or circumstances.

In this specification and the like, an impurity in a semiconductor refers to, for example, elements other than the main components of a semiconductor layer. For instance, an element with a concentration of lower than 0.1 atomic % is an impurity. If impurities are contained in a semiconductor, the density of states (DOS) may be formed in the semiconductor, the carrier mobility may be decreased, or the crystallinity may be decreased, for example. When the semiconductor is an oxide semiconductor, examples of impurities that change the characteristics of the semiconductor include Group 1 elements, Group 2 elements, Group 13 elements, Group 14 elements, Group 15 elements, and transition metals other than the main components of the oxide semiconductor. Specific examples are hydrogen (included also in water), lithium, sodium, silicon, boron, phosphorus, carbon, and nitrogen. When the semiconductor is an oxide semiconductor, oxygen vacancies may be formed by entry of impurities such as hydrogen, for instance. When the semiconductor is a silicon layer, examples of impurities that change the characteristics of the semiconductor include oxygen, Group 1 elements except hydrogen, Group 2 elements, Group 13 elements, and Group 15 elements.

In this specification and the like, a switch is conducting or not conducting (is turned on or off) to determine whether current flows therethrough or not. Alternatively, a switch has a function of selecting and changing a current path. For example, an electrical switch or a mechanical switch can be used. That is, a switch is not limited to a certain element and can be any element capable of controlling current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined. In the case of using a transistor as a switch, the on state of the transistor refers to a state in which a source electrode and a drain electrode of the transistor are regarded as being electrically short-circuited. The off state of the transistor refers to a state in which the source electrode and the drain electrode of the transistor are regarded as being electrically disconnected. In the case where a transistor operates just as a switch, there is no particular limitation on the polarity (conductivity type) of the transistor.

An example of a mechanical switch is a switch using a microelectromechanical systems (MEMS) technology. Such a switch includes an electrode that can be moved mechanically, and its conduction and non-conduction is controlled with movement of the electrode.

One embodiment of the present invention can provide a semiconductor device or the like including a hierarchical artificial neural network. Another embodiment of the present invention can provide a semiconductor device or the like with low power consumption. Another embodiment of the present invention can provide a semiconductor device or the like that is not easily affected by environmental temperature. Another embodiment of the present invention can provide a novel semiconductor device or the like.

Note that the effects of one embodiment of the present invention are not limited to the effects mentioned above. The effects described above do not preclude the existence of other effects. The other effects are the ones that are not described above and will be described below. Effects that are not described above will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF THE DRAWINGS

In the accompanying drawings,

FIGS. 2A, 2B1, 2B2, 2C1, and 2C2 are a block diagram and circuit diagrams illustrating structure examples of circuits included in a semiconductor device;

DETAILED DESCRIPTION OF THE INVENTION

Figure 1A:
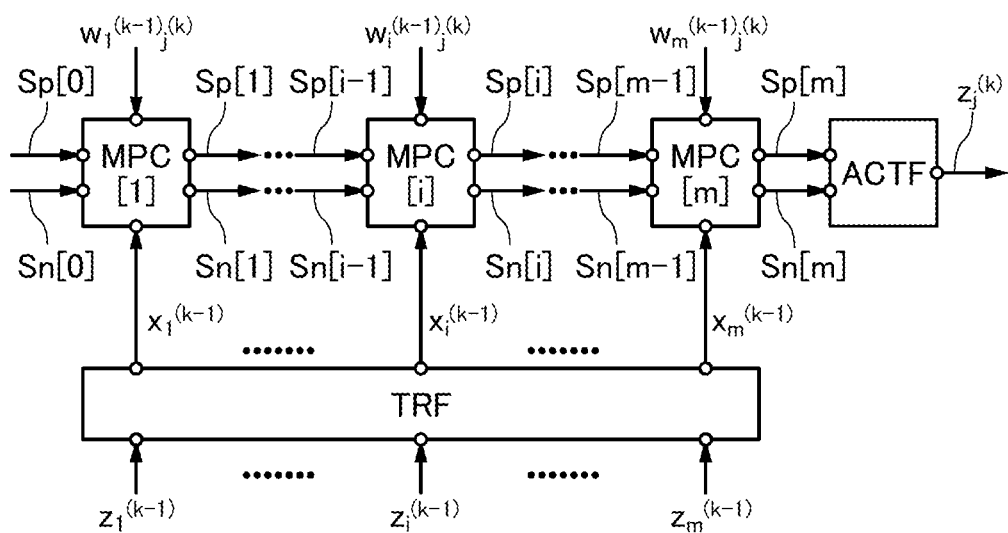
FIGS. 1A to 1C are block diagrams illustrating a structure example of a semiconductor device.

In an artificial neural network (hereinafter referred to as a neural network), the connection strength between synapses can be changed when existing data is given to the neural network. Such processing for determining connection strengths by providing a neural network with existing information is sometimes called learning.

When a neural network in which "learning" has been performed (connection strengths have been determined) is provided with some information, new information can be output on the basis of the connection strengths. Such processing for outputting new information on the basis of provided information and connection strengths in a neural network is sometimes called inference or recognition.

Examples of neural network models include a Hopfield neural network and a hierarchical neural network. Specifically, a multilayer neural network may be called a deep neural network (DNN), and machine learning using a deep neural network may be called deep learning.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is referred to as an oxide semiconductor in some cases. That is, a metal oxide included in a channel formation region of a transistor that has at least one of an amplifying function, a rectifying function, and a switching function can be referred to as a metal oxide semiconductor or shortly as an OS. An OS FET and an OS transistor refer to a transistor including a metal oxide or an oxide semiconductor.

In this specification and the like, a metal oxide containing nitrogen is also referred to as a metal oxide in some cases. Moreover, a metal oxide containing nitrogen may be referred to as a metal oxynitride.

In this specification and the like, one embodiment of the present invention can be constituted with an appropriate combination of a structure shown in one embodiment and any of the structures shown in the other embodiments. In the case where a plurality of structure examples are described in one embodiment, some of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with text in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

Embodiments disclosed in this specification will be described with reference to the drawings. Note that the embodiments can be implemented in many different modes, and it will be readily appreciated by those skilled in the art that modes and details can be changed in various ways without departing from the spirit and scope of the present invention. Therefore, the present invention should not be construed as being limited to the description of the embodiments. Note that in the structures of the invention described in the embodiments, the same portions or portions having similar functions are denoted by the same reference numerals in different drawings and the description of such portions is not repeated in some cases. In perspective views and the like, some of components might not be illustrated for clarity of the drawings.

In this specification and the like, when a plurality of components denoted by the same reference numerals need to be distinguished from each other, "_1", "_2", "[n]", "[m, n]", or the like is sometimes added to the reference numerals.

In the drawings of this specification, the size, the layer thickness, or the region is exaggerated for clarity in some cases. Therefore, the size, the layer thickness, or the region is not limited to the illustrated scale. The drawings are schematic views showing ideal examples, and embodiments of the present invention are not limited to shapes, values, or the like shown in the drawings. For example, the following can be included: variation in signal, voltage, or current due to noise or difference in timing.

Embodiment 1

In this embodiment, an arithmetic circuit that is a semiconductor device of one embodiment of the present invention and performs neural network operation will be described.

<Hierarchical Neural Network>

Figure 4A:
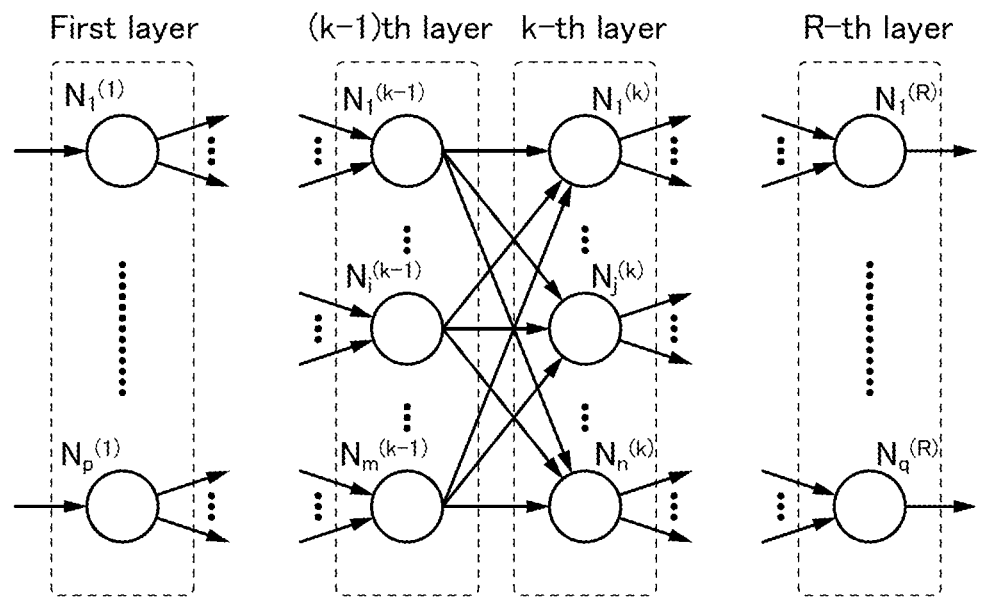
FIGS. 4A and 4B illustrate a hierarchical neural network.

First, a hierarchical neural network is described. A hierarchical neural network includes three or more layers of one input layer, one or more intermediate layers (hidden layers), and one output layer, for example. FIG. 4A illustrates an example of the hierarchical neural network, and a neural network 100 includes first to R-th layers (here, R is an integer greater than or equal to 4). Specifically, the first layer is the input layer, the R-th layer is the output layer, and the other layers are the intermediate layers. Note that FIG. 4A illustrates the (k−1)th layer and the k-th layer (here, k is an integer greater than or equal to 3 and less than or equal to R−1) as the intermediate layers, and does not show the other intermediate layers.

Each of the layers of the neural network 100 includes one or more neurons. In FIG. 4A, the first layer includes neurons $N_1^{(1)}$ to $N_p^{(1)}$ (here, p is an integer greater than or equal to 1). The (k−1)th layer includes neurons $N_1^{(k-1)}$ to $N_m^{(k-1)}$ (here, m is an integer greater than or equal to 1). The k-th layer includes neurons $N_1^{(k)}$ to $N_n^{(k)}$ (here, n is an integer greater than or equal to 1). The R-th layer includes neurons $N_1^{(R)}$ to $N_q^{(R)}$ (here, q is an integer greater than or equal to 1).

FIG. 4A illustrates, in addition to the neurons $N_1^{(1)}$, $N_p^{(1)}$, $N_1^{(k-1)}$, $N_m^{(k-1)}$, $N_1^{(k)}$, $N_n^{(k)}$, $N_1^{(R)}$, and $N_q^{(R)}$, a neuron $N_i^{(k-1)}$ (here, i is an integer greater than or equal to 1 and less than or equal to m) in the (k−1)th layer and a neuron $N_j^{(k)}$ (here, j is an integer greater than or equal to 1 and less than or equal to n) in the k-th layer; the other neurons are not illustrated.

Next, signal transmission from a neuron in one layer to a neuron in the next layer and signals input to and output from neurons are described. Note that the description here is made with a focus on the neuron $N_j^{(k)}$ in the k-th layer.

Figure 4B:
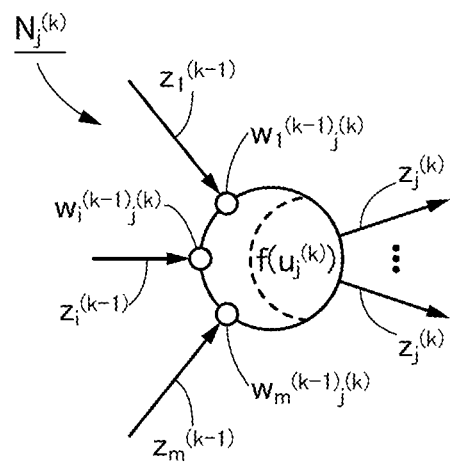

FIG. 4B illustrates the neuron $N_j^{(k)}$ in the k-th layer, signals input to the neuron $N_j^{(k)}$, and a signal output from the neuron $N_j^{(k)}$.

Specifically, output signals $z_1^{(k-1)}$ to $z_m^{(k-1)}$ from the neurons $N_1^{(k-1)}$ to $N_m^{(k-1)}$ in the (k−1)th layer are input to the neuron $N_j^{(k)}$. Then, the neuron $N_j^{(k)}$ generates an output signal $z_j^{(k)}$ in response to the signals $z_1^{(k-1)}$ to $z_m^{(k-1)}$, and outputs the output signal $z_j^{(k)}$ to the neurons in the (k+1)th layer (not illustrated).

The efficiency of transmitting a signal input from a neuron in one layer to a neuron in the next layer depends on the connection strength (hereinafter referred to as weight coefficient) of the synapse that connects the neurons to each other. In the neural network 100, a signal output from a neuron in one layer is multiplied by a corresponding weight coefficient and then is input to a neuron in the next layer. When i is an integer greater than or equal to 1 and less than or equal to m and the weight coefficient of the synapse between the neuron $N_i^{(k-1)}$ in the (k−1)th layer and the neuron $N_j^{(k)}$ in the k-th layer is $w_{i\ j}^{(k-1)(k)}$, a signal input to the neuron $N_j^{(k)}$ in the k-th layer can be expressed by Formula (1.1).

[Formula 1]

$$w_{i\ j}^{(k-1)(k)} \cdot z_i^{(k-1)} \quad (1.1)$$

That is, when the signals $z_1^{(k-1)}$ to $z_m^{(k-1)}$ are transmitted from the neurons $N_1^{(k-1)}$ to $N_m^{(k-1)}$ in the (k−1)th layer to the neuron $N_j^{(k)}$ in the k-th layer, the signals $z_1^{(k-1)}$ to $z_m^{(k-1)}$ are multiplied by respective weight coefficients $w_{1\ j}^{(k-1)(k)}$ to $w_{m\ j}^{(k-1)(k)}$. Then, $w_{1\ j}^{(k-1)(k)} \cdot z_1^{(k-1)}$ to $w_{m\ j}^{(k-1)(k)} \cdot z_m^{(k-1)}$ are input to the neuron $N_j^{(k)}$ in the k-th layer. At that time, the total sum $u_j^{(k)}$ of the signals input to the neuron $N_j^{(k)}$ in the k-th layer is expressed by Formula (1.2).

[Formula 2]

$$u_j^{(k)} = \sum_{i=1}^{m} w_{i\ j}^{(k-1)(k)} \cdot z_i^{(k-1)} \quad (1.2)$$

The neuron $N_j^{(k)}$ generates the output signal $z_j^{(k)}$ in accordance with $u_j^{(k)}$. Note that the output signal $z_j^{(k)}$ from the neuron $N_j^{(k)}$ is defined by the following formula.

[Formula 3]

$$z_j^{(k)} = f(u_j^{(k)}) \quad (1.3)$$

A function $f(u_j^{(k)})$ is an activation function in a hierarchical neural network. A step function, a linear ramp function, a sigmoid function, or the like can be used as the function $f(u_j^{(k)})$. Note that the activation function may be the same among all neurons or may be different among neurons. Furthermore, the neuron activation function in one layer may be the same as or different from that in another layer.

Signals output from the neurons in the layers may have an analog value or a binary value. In the former case, a linear ramp function or a sigmoid function is used as the activation function. In the latter case, a step function with an output of −1 or 1 is used.

The neural network 100 performs operation in which an input signal is input to the first layer (the input layer), output signals are sequentially generated in layers from the first layer (the input layer) to the last layer (the output layer) according to Formulae (1.1) to (1.3) on the basis of the signals input from the previous layers, and the output signals are output to the subsequent layers. The signal output from the last layer (the output layer) corresponds to the calculation results of the neural network 100.

<Arithmetic Circuit>

Here, the description is made on an arithmetic circuit that can calculate Formulae (1.2) and (1.3) in the neural network 100 using a step function with an output of −1 or 1 as the activation function of the neuron.

An arithmetic circuit 110 illustrated in FIG. 1A is a semiconductor device including circuits MPC[1] to MPC[m], a circuit ACTF, and a converter circuit TRF. The arithmetic circuit 110 processes signals input to the neuron $N_j^{(k)}$ in the k-th layer in FIGS. 4A and 4B and generates the signal $z_j^{(k)}$ output from the neuron $N_j^{(k)}$. In this specification and the like, in the case where the circuits MPC[1] to MPC[m] are not distinguished from each other, they are referred to as circuits MPC.

<<Circuit MPC>>

Figure 1B:
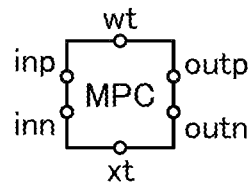

FIG. 1B illustrates terminals included in the circuit MPC. The circuit MPC includes, for example, a terminal inp, a terminal inn, a terminal outp, a terminal outn, a terminal wt, and a terminal xt.

The circuit MPC has a function of outputting a signal input to the terminal inp to one of the terminal outp and the terminal outn and outputting a signal input to the terminal inn to the other. The output destinations of the signals input to the terminal inp and the terminal inn can be determined by a signal input to the terminal xt, for example.

The circuit MPC has a function of changing time from the input of a signal to the terminal inp to the output of the signal from one of the terminal outp and the terminal outn, for example. The time can be determined by a signal input to the terminal wt. In the following description, time from the input of a signal to an input terminal of a circuit to the output of the signal from an output terminal of the circuit is referred to as input/output time.

Figure 2A:
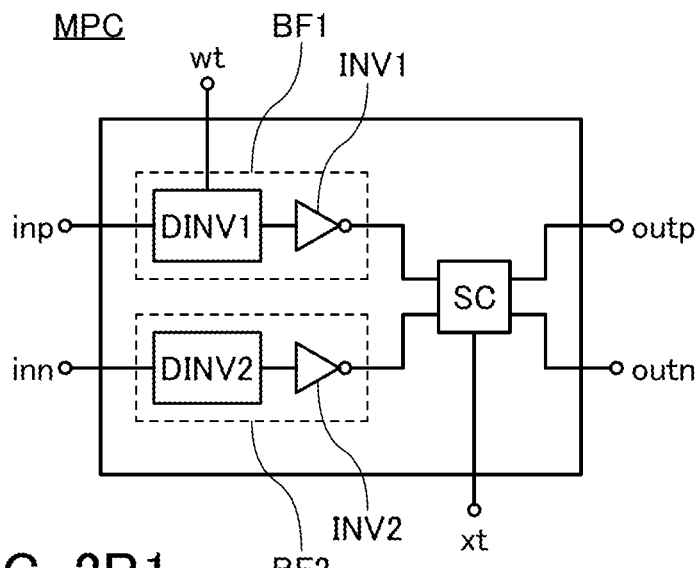
Figure 2A:
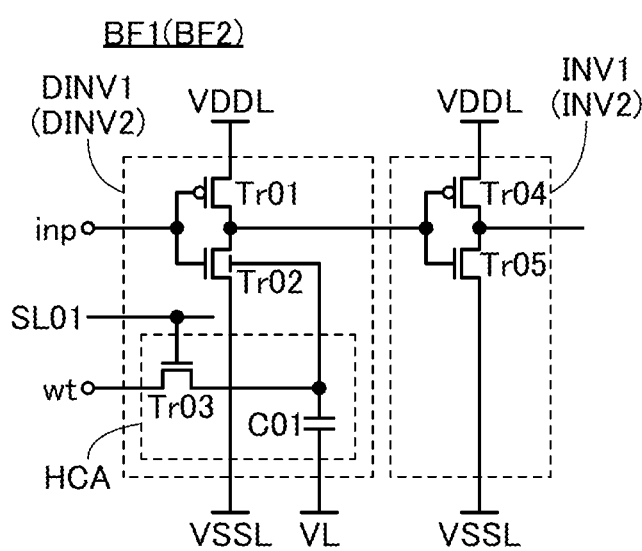
Figure 2A:
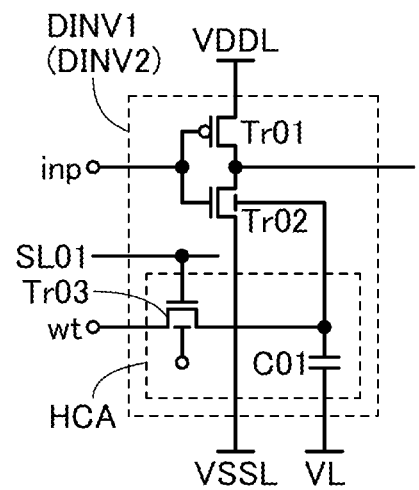
Figure 2A:
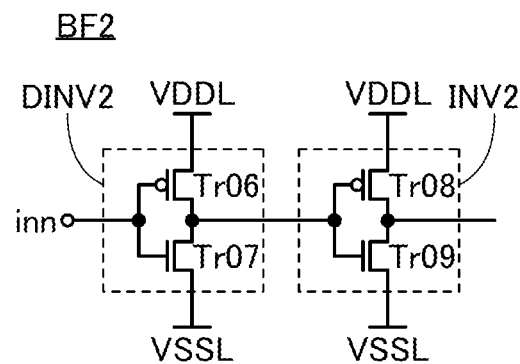
Figure 2A:
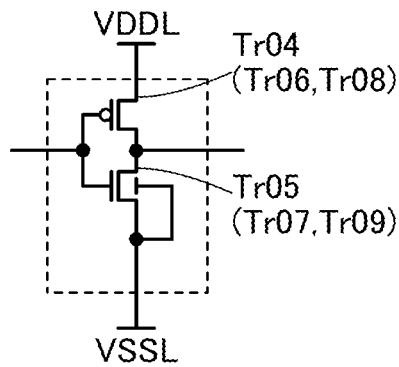

FIG. 2A illustrates a structure example of the circuit MPC. The circuit MPC in FIG. 2A includes a circuit BF1, a circuit BF2, and a switching circuit SC.

An input terminal of the circuit BF1 is electrically connected to the terminal inp, and an output terminal of the circuit BF1 is electrically connected to one of two input terminals of the switching circuit SC. An input terminal of the circuit BF2 is electrically connected to the terminal inn, and an output terminal of the circuit BF2 is electrically connected to the other input terminal of the switching circuit SC. One of two output terminals of the switching circuit SC is electrically connected to the terminal outp, and the other output terminal is electrically connected to the terminal outn.

[Circuit BF1]

The circuit BF1 has a function of correcting a signal input to the input terminal of the circuit BF1 and outputting the signal from the output terminal of the circuit BF1. The circuit BF1 can be, for example, a circuit in which two inverter circuits are connected in series (a buffer circuit). The number of inverter circuits is not limited to two but is preferably an even number other than zero because the circuit can be configured more easily when the input and the output have the same logic value. The inverter circuit can be replaced with a NAND circuit, a NOR circuit, or the like. Furthermore, a logic circuit, a signal converter circuit, or a potential level converter circuit can sometimes be used as the circuit BF1, for example. The circuit BF1 in FIG. 2A includes an inverter circuit DINV1 and an inverter circuit INV1.

The inverter circuit DINV1 and the inverter circuit INV1 each have a function of outputting an inverted signal of an input signal. In particular, the inverter circuit DINV1 is electrically connected to the terminal wt, and the driving speed of the inverter circuit DINV1 can be determined by a signal input to the terminal wt. In other words, the input/output time of the inverter circuit DINV1 can be changed.

FIG. 2B1 illustrates a specific configuration example of the circuit BF1. As an example, the inverter circuit DINV1 includes a transistor Tr01, a transistor Tr02, a transistor Tr03, and a capacitor C01, and the inverter circuit INV1 includes a transistor Tr04 and a transistor Tr05. The transistors Tr01 and Tr04 are p-channel transistors, and the transistors Tr02, Tr03, and Tr05 are n-channel transistors, for example. The transistor Tr02 has a back gate, for example. As another example, the transistor Tr03 may have a back gate. Moreover, the transistor Tr03 preferably has a low off-state current, for example. Specifically, the transistor Tr03 is preferably an OS transistor. The n-channel transistors other than the transistor Tr03 may also be an OS transistor.

In this specification and the like, for example, transistors with a variety of structures can be used, without limitation to a certain type. For example, it is possible to use a transistor including single crystal silicon or a transistor including a non-single-crystal semiconductor film typified by amorphous silicon, polycrystalline silicon, microcrystalline (also referred to as microcrystal, nanocrystal, or semi-amorphous) silicon, or the like. Alternatively, a thin film transistor (TFT) including a thin film of any of these semiconductors can be used, for example. There are various advantages of using TFTs. For example, since TFTs can be formed at a temperature lower than that of transistors using single crystal silicon, the manufacturing cost can be reduced or a manufacturing apparatus can be made larger. Since the manufacturing apparatus is made larger, TFTs can be formed over a large substrate. Accordingly, a large number of semiconductor devices can be formed at the same time, resulting in low cost of manufacture. A substrate having low heat resistance can be used because of low manufacturing temperature. Therefore, transistors can be formed over a light-transmitting substrate. Transmission of light in a display element can be controlled using a transistor formed over a light-transmitting substrate. In addition, part of a film included in a transistor can transmit light because the thickness of the transistor is small; hence, the aperture ratio can be increased.

Examples of transistors include a transistor including a compound semiconductor (e.g., SiGe or GaAs) or an oxide semiconductor (e.g., Zn—O, In—Ga—Zn—O, In—Zn—O, In—Sn—O (ITO), Sn—O, Ti—O, Al—Zn—Sn—O, or In—Sn—Zn—O) and a thin film transistor including a thin film of such a compound semiconductor or oxide semiconductor. The manufacturing temperature of these transistors can be lowered, so that such a transistor can be formed at room temperature, for example. Accordingly, the transistor can be formed directly over a substrate having low heat resistance, such as a plastic substrate or a film substrate. Note that such a compound semiconductor or oxide semiconductor can be used not only for a channel portion of a transistor but also for other applications. For example, such a compound semiconductor or oxide semiconductor can be used for a wiring, a resistor, a pixel electrode, or a light-transmitting electrode. Since such components can be formed at the same time as the transistor, the cost can be reduced.

As another example, a transistor formed by an inkjet method or a printing method can be used. The transistor can be formed at room temperature, formed at a low vacuum, or formed using a large substrate. Accordingly, the transistor can be formed without use of a mask (reticle), so that the layout of the transistor can be easily changed. Alternatively, since the transistor can be formed without using a resist, the material cost is reduced, and the number of steps can be reduced. Furthermore, since a film can be formed where needed, a material is not wasted compared to a manufacturing method by which etching is performed after the film is formed over the entire surface; thus, the cost can be reduced.

As another example, a transistor containing an organic semiconductor or a carbon nanotube can be used. Such a transistor can be formed using a substrate that can be bent. A device including a transistor containing an organic semiconductor or a carbon nanotube can be highly resistant to impact.

Note that a transistor with any of a variety of other structures can also be used. For example, a MOS transistor, a junction transistor, or a bipolar transistor can be used. In the case of using a MOS transistor, the size of the transistor can be reduced; thus, a large number of transistors can be mounted. In the case of using a bipolar transistor, a large amount of current can flow; hence, a circuit can operate at high speed. Note that a MOS transistor and a bipolar transistor may be formed over one substrate. In that case, a reduction in power consumption, a reduction in size, high-speed operation, and the like can be achieved.

For example, it is possible to use a transistor with a structure in which gate electrodes are positioned above and below a channel. With the structure in which the gate electrodes are positioned above and below the channel, a circuit structure is such that a plurality of transistors are connected in parallel. Thus, a channel region is increased, so that the amount of current can be increased. Alternatively, with the structure in which the gate electrodes are positioned above and below the channel, a depletion layer can be easily formed, so that subthreshold swing can be improved.

For example, it is possible to use a transistor with a structure in which a gate electrode is formed above a channel region, a structure in which a gate electrode is formed below a channel region, a staggered structure, an inverted staggered structure, a structure in which a channel region is divided into a plurality of regions, or a structure in which channel regions are connected in parallel or in series. It is also possible to use a transistor with any of a variety of structures such as a planar type, a FIN-type, a Tri-Gate type, a top-gate type, a bottom-gate type, and a double-gate type (with gates above and below a channel).

As another example, it is possible to use a transistor with a structure in which a source electrode or a drain electrode overlaps with a channel region (or part of it). The structure in which the source electrode or the drain electrode overlaps with the channel region (or part of it) can prevent unstable operation due to accumulation of electric charges in part of the channel region.

As another example, it is possible to use a transistor with a structure in which an LDD region is provided. By providing the LDD region, the amount of off-state current can be reduced or the withstand voltage of the transistor can be increased (the reliability can be improved). Alternatively, by providing the LDD region, the drain current does not change much even if the drain-source voltage changes while the transistor operates in a saturation region; hence, a flat slope of the voltage-current characteristics can be obtained.

In this specification and the like, a transistor can be formed using any of a variety of substrates, for example. The type of the substrate is not limited to a certain type. Examples of the substrate include a semiconductor substrate (e.g., a single crystal substrate and a silicon substrate), an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, and a base film. For a glass substrate, for example, barium borosilicate glass, aluminoborosilicate glass, or soda lime glass can be used. Examples of materials for a flexible substrate, an attachment film, a base film, or the like include plastic typified by polyethylene terephthalate (PET), polyethylene naphthalate (PEN), and polyether sulfone (PES) and a synthetic resin such as acrylic. Other examples include polypropylene, polyester, polyvinyl fluoride, and polyvinyl chloride. Other examples include polyamide, polyimide, aramid, epoxy, an inorganic vapor deposition film, and paper. Specifically, the use of a semiconductor substrate, a single crystal substrate, an SOI substrate, or the like enables the manufacture of small-sized transistors with high current capability and a small variation in characteristics, size, shape, or the like. A circuit including such transistors achieves lower power consumption or higher integration of the circuit.

A flexible substrate may be used, and a transistor may be formed directly over the flexible substrate. Alternatively, a separation layer may be provided between a substrate and a transistor. The separation layer can be used when part or the whole of a semiconductor device formed over the separation layer is separated from the substrate and transferred to another substrate. In that case, the transistor can be transferred to even a substrate having low heat resistance or a flexible substrate. As the separation layer, a stack of inorganic films, namely a tungsten film and a silicon oxide film, or an organic resin film of polyimide or the like formed over a substrate can be used, for example.

In other words, a transistor may be formed using one substrate and then transferred to another substrate. Examples of a substrate to which a transistor is transferred include, in addition to the above substrates where the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability and high heat resistance can be provided, and/or the reduction in weight or thickness can be achieved.

Note that all the circuits that are necessary to achieve a predetermined function can be formed using one substrate (e.g., a glass substrate, a plastic substrate, a single crystal substrate, or an SOI substrate). In this manner, the cost can be reduced by a reduction in the number of components or the reliability can be improved by a reduction in the number of connections to circuit components.

Note that it is possible not to form all the circuits that are necessary to achieve a predetermined function on one substrate. That is, it is possible to form part of the circuits necessary to achieve the predetermined function on a given substrate and form the other part of the circuits on another substrate. For example, part of the circuits necessary to achieve the predetermined function can be formed over a glass substrate, and the other part of the circuits can be formed using a single crystal substrate (or an SOI substrate). The single crystal substrate where the other part of the circuits necessary to achieve the predetermined function (such a substrate is also referred to as an IC chip) can be connected to the glass substrate by chip-on-glass (COG), and the IC chip can be provided over the glass substrate. Alternatively, the IC chip can be connected to the glass substrate by tape-automated bonding (TAB), chip-on-film (COF), surface mount technology (SMT), a printed circuit board, or the like. When part of the circuits is formed over the same substrate as a pixel portion, memory cells, an arithmetic circuit, or the like in this manner, the cost can be reduced by a reduction in the number of components or the reliability can be improved by a reduction in the number of connections between circuit components. In particular, a circuit in a portion where a driving voltage is high, a circuit in a portion where a driving frequency is high, or the like consumes much power in many cases. In view of the above, such a circuit is formed on a substrate (e.g., a single crystal substrate) different from a substrate where a pixel portion is formed, whereby an IC chip is formed. The use of this IC chip can prevent the increase in power consumption.

In the inverter circuit DINV1, gates of the transistor Tr01 and the transistor Tr02 are electrically connected to the terminal inp, a first terminal of the transistor Tr01 is electrically connected to a wiring VDDL, and a second terminal of the transistor Tr01 is electrically connected to a first terminal of the transistor Tr02. A second terminal of the transistor Tr02 is electrically connected to a wiring VSSL, and the back gate of the transistor Tr02 is electrically connected to a first terminal of the transistor Tr03 and a first terminal of the capacitor C01. A second terminal of the transistor Tr03 is electrically connected to the terminal wt, and a gate of the transistor Tr03 is electrically connected to a wiring SL01. A second terminal of the capacitor C01 is electrically connected to a wiring VL. The second terminal of the transistor Tr01 and the first terminal of the transistor Tr02 are electrically connected to an input terminal of the inverter circuit INV1.

In the inverter circuit INV1, gates of the transistor Tr04 and the transistor Tr05 are electrically connected to the input terminal of the inverter circuit INV1, a first terminal of the transistor Tr04 is electrically connected to the wiring VDDL, and a second terminal of the transistor Tr04 is electrically connected to a first terminal of the transistor Tr05. A second terminal of the transistor Tr05 is electrically connected to the wiring VSSL. The second terminal of the transistor Tr04 and the first terminal of the transistor Tr05 are electrically connected to an output terminal of the inverter circuit INV1.

The wiring VDDL functions as a voltage line for supplying a voltage VDD that is a high-level potential. The wiring VSSL functions as a voltage line for supplying a voltage VSS that is a low-level potential. Note that the wiring VSSL may be supplied with a negative potential, a positive potential, or a potential of 0 V (GND). The wiring VL functions as a voltage line that supplies a constant voltage. The constant voltage can be VDD, VSS, a ground potential, or the like.

In the inverter circuit DINV1, the transistor Tr03 and the capacitor C01 are included in a holding unit HCA. The holding unit HCA has a function of holding a potential corresponding to a signal input from the terminal wt.

The transistor Tr03 included in the holding unit HCA functions as a switching element. Supply of a potential to the gate of the transistor Tr03 from the wiring SL01 can turn on or off the transistor Tr03.

The transistor Tr03 is turned on by supply of a high-level potential to the wiring SL01, whereby electrical continuity can be established between the terminal wt and the first terminal of the capacitor C01. At this time, the circuit MPC receives a signal from the terminal wt, and then can supply a potential corresponding to the signal to the first terminal of the capacitor C01. After the potential is written to the first terminal of the capacitor C01, the transistor Tr03 is turned off by supply of a low-level potential to the wiring SL01, whereby the potential can be held in the holding unit HCA.

In order to hold the potential supplied to the first terminal of the capacitor C01 in the holding unit HCA for a long time, the transistor Tr03 is preferably an OS transistor. Further preferably, a channel formation region of the transistor Tr03 is an oxide containing at least one of indium, an element M (examples of the element M include aluminum, gallium, yttrium, and tin), and zinc. Still further preferably, the transistor Tr03 has a structure of a transistor described in Embodiment 4.

An OS transistor has an extremely low off-state current because a metal oxide functioning as its channel formation region has a wide band gap. Thus, with the use of the OS transistor as the transistor Tr03, leakage current from the first terminal of the capacitor C01 to the terminal wt at the time when the transistor Tr03 is off can be extremely low. That is, the frequency of refreshing the potential of the first terminal of the capacitor C01 can be decreased, reducing the power consumed to hold the potential of the first terminal of the capacitor C01.

Since the transistor Tr02 has the back gate, the threshold voltage of the transistor Tr02 can be changed with the potential supplied to the back gate. In the circuit MPC, the back gate of the transistor Tr02 is connected to the first terminal of the capacitor C01; hence, the threshold voltage of the transistor Tr02 depends on the potential of the first terminal of the capacitor C01.

For example, when the potential of the first terminal of the capacitor C01 is high, the threshold voltage of the transistor Tr02 shifts negatively; thus, the amount of current flowing between the source and the drain of the transistor Tr02 increases. This shortens the input/output time from the input of a signal to the input terminal of the inverter circuit DINV1 to the output of the signal from the output terminal.

For another example, when the potential of the first terminal of the capacitor C01 is low, the threshold voltage of the transistor Tr02 shifts positively; thus, the amount of current flowing between the source and the drain of the transistor Tr02 decreases. This lengthens the input/output time from the input of a signal to the input terminal of the inverter circuit DINV1 to the output of the signal from the output terminal.

Specifically, when the transistor Tr02 operates with a potential supplied to its gate in the range of −0.8 V to 2.5 V, a high-level potential of 1.5 V or higher and a low-level potential of lower than 1.5 V are supplied to the back gate of the transistor Tr02, for example.

The transistor Tr03 may also have a back gate. FIG. 2B2 illustrates a configuration in which the inverter circuit DINV1 in FIG. 2B1 includes the transistor Tr03 having a back gate. The back gate of the transistor Tr03 can be electrically connected to, for example, the gate of the transistor Tr03. When the gate and the back gate of the transistor Tr03 are electrically connected to each other, the amount of current flowing through the transistor Tr03 in the on state can be increased. For example, the back gate of the transistor Tr03 may be provided with a wiring for electrically connecting to an external circuit, and the threshold voltage of the transistor Tr03 may be increased by supply of a potential to the back gate of the transistor Tr03 from the external circuit. With such a configuration, the off-state current of the transistor Tr03 can be reduced owing to the external circuit.

[Circuit BF2]

FIG. 2A illustrates a structure in which the circuit BF2 includes an inverter circuit DINV2 and an inverter circuit INV2. Like the circuit BF1, the circuit BF2 functions as an amplifier circuit that amplifies a signal input to the input terminal of the circuit BF2 and outputs the signal from the output terminal of the circuit BF2. Thus, the circuit BF2 can have a configuration similar to that of the circuit BF1 in FIG. 2B1. In that case, the first terminal of the capacitor C01 in the inverter circuit DINV2 preferably holds an intermediate potential between a high-level potential and a low-level potential. The potential of the first terminal of the capacitor C01 in the inverter circuit DINV1 is set to a high-level potential or a low-level potential, whereby the input/output time of the circuit BF1 can be shorter or longer than that of the circuit BF2.

The circuit BF2 may have a configuration illustrated in FIG. 2C1. In FIG. 2C1, the inverter circuit DINV2 includes a transistor Tr06 and a transistor Tr07, and the inverter circuit INV2 includes a transistor Tr08 and a transistor Tr09. The transistors Tr06 and Tr08 are p-channel transistors, and the transistors Tr07 and Tr09 are n-channel transistors.

In the inverter circuit DINV2, gates of the transistor Tr06 and the transistor Tr07 are electrically connected to the terminal inn, a first terminal of the transistor Tr06 is electrically connected to the wiring VDDL, and a second terminal of the transistor Tr06 is electrically connected to a first terminal of the transistor Tr07. A second terminal of the transistor Tr07 is electrically connected to the wiring VSSL. The second terminal of the transistor Tr06 and the first terminal of the transistor Tr07 are electrically connected to an input terminal of the inverter circuit INV2.

In the inverter circuit INV2, gates of the transistor Tr08 and the transistor Tr09 are electrically connected to the input terminal of the inverter circuit INV2, a first terminal of the transistor Tr08 is electrically connected to the wiring VDDL, and a second terminal of the transistor Tr08 is electrically connected to a first terminal of the transistor Tr09. A second terminal of the transistor Tr09 is electrically connected to the wiring VSSL. The second terminal of the transistor Tr08 and the first terminal of the transistor Tr09 are electrically connected to an output terminal of the inverter circuit INV2.

That is, the inverter circuit DINV2 can have the same configuration as the inverter circuit INV2. Alternatively, the transistor Tr07 may be provided with a back gate, and the back gate may be connected to the wiring VSSL.

The inverter circuit INV1, the inverter circuit INV2, and the inverter circuit DINV2 may each have a configuration of an inverter circuit INV1A illustrated in FIG. 2C2, for example. The inverter circuit INV1A is different from the inverter circuit INV1, the inverter circuit INV2, and the inverter circuit DINV2 in that the transistor Tr05 (or the transistor Tr07 or Tr09) has a back gate, and the back gate is electrically connected to the second terminal of the transistor Tr05 (or the transistor Tr07 or Tr09).

[Switching Circuit SC]

The switching circuit SC has a function of selecting one of the terminal outp and the terminal outn as the output destination of the signal input to the terminal inp or the terminal inn in the circuit MPC. The switching circuit SC is electrically connected to the terminal xt, and the output destination can be determined by the signal input to the terminal xt (signals $x_1^{(k-1)}$ to $x_m^{(k-1)}$ in FIG. 1A).

Figure 3A:
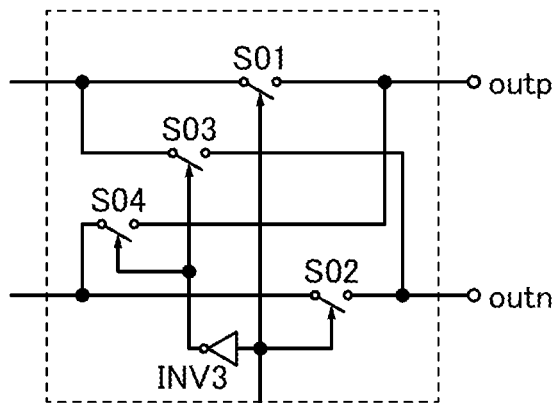
FIGS. 3A to 3D are circuit diagrams illustrating structure examples of a circuit included in a semiconductor device.

FIG. 3A illustrates a configuration example of the switching circuit SC. The switching circuit SC includes switches S01 to S04 and an inverter circuit INV3.

A first terminal of the switch S01 is electrically connected to the output terminal of the circuit BF1 and a first terminal of the switch S03, and a second terminal of the switch S01 is electrically connected to the terminal outp. A first terminal of the switch S02 is electrically connected to the output terminal of the circuit BF2 and a first terminal of the switch S04, and a second terminal of the switch S02 is electrically connected to the terminal outn. A second terminal of the switch S03 is electrically connected to the terminal outn, and a second terminal of the switch S04 is electrically connected to the terminal outp. The terminal xt is electrically connected to control terminals of the switches S01 and S02 and an input terminal of the inverter circuit INV3. An output terminal of the inverter circuit INV3 is electrically connected to control terminals of the switches S03 and S04.

In this specification and the like, each of the switches S01 to S04 is turned on when a high-level potential is applied to the control terminal, and is turned off when a low-level potential is applied to the control terminal.

Next, the operation of the switching circuit SC is described. For example, when a high-level potential is applied to the terminal xt, the switch S01 and the switch S02 are turned on and the switch S03 and the switch S04 are turned off; thus, the switching circuit SC operates such that electrical continuity is established between the output terminal of the circuit BF1 and the terminal outp and between the output terminal of the circuit BF2 and the terminal outn. As another example, when a low-level potential is applied to the terminal xt, the switch S03 and the switch S04 are turned on and the switch S01 and the switch S02 are turned off; thus, the switching circuit SC operates such that electrical continuity is established between the output terminal of the circuit BF1 and the terminal outn and between the output terminal of the circuit BF2 and the terminal outp.

Figure 3B:
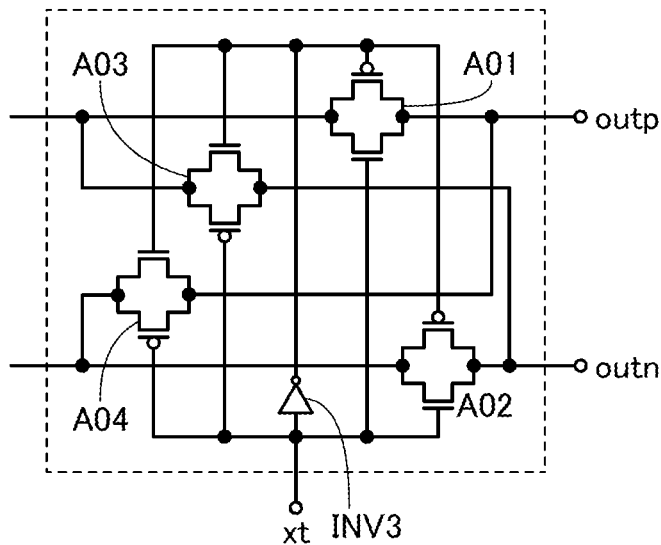

Next, a specific configuration example of the switching circuit SC is described. FIG. 3B illustrates a circuit configuration in which the switches S01 to S04 included in the switching circuit SC in FIG. 3A are replaced with analog switches A01 to A04.

Figure 3C:
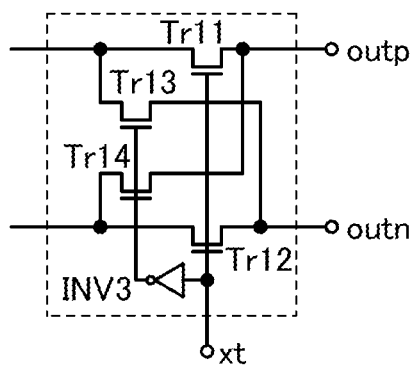

FIG. 3C illustrates another specific configuration example of the switching circuit SC in FIG. 3A, which is different from the configuration in FIG. 3B. The switching circuit SC in FIG. 3C includes transistors Tr1 to Tr14 and the inverter circuit INV3. The transistors Tr11 to Tr14 are n-channel transistors. Note that the control terminals of the switches S01 to S04 correspond to gates of the transistors Tr11 to Tr14.

A first terminal of the transistor Tr11 is electrically connected to the output terminal of the circuit BF1 and a first terminal of the transistor Tr13, and a second terminal of the transistor Tr11 is electrically connected to the terminal outp. A first terminal of the transistor Tr12 is electrically connected to the output terminal of the circuit BF2 and a first terminal of the transistor Tr14, and a second terminal of the transistor Tr12 is electrically connected to the terminal outn. A second terminal of the transistor Tr13 is electrically connected to the terminal outn, and a second terminal of the transistor Tr14 is electrically connected to the terminal outp. The terminal xt is electrically connected to the gates of the transistors Tr11 to Tr14.

Figure 3D:
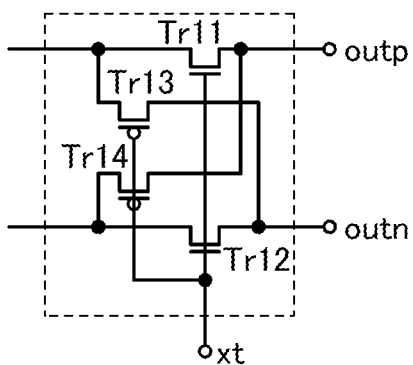

FIG. 3D illustrates another specific configuration example of the switching circuit SC in FIG. 3A, which is different from the configurations in FIGS. 3B and 3C. The switching circuit SC in FIG. 3D includes the transistors Tr11 to Tr14, as in FIG. 3C. The transistors Tr11 and Tr12 are n-channel transistors, and the transistors Tr13 and Tr14 are p-channel transistors. Note that the control terminals of the switches S01 to S04 correspond to the gates of the transistors Tr11 to Tr14. The switching circuit SC in FIG. 3D does not include the inverter circuit INV3 because of the difference in polarity between the transistors Tr1 and Tr12 and the transistors Tr13 and Tr14.

When the switching circuit SC has any of the configurations in FIGS. 3A to 3D, each of the signals $x_1^{(k-1)}$ to $x_m^{(k-1)}$ input to the terminal xt can be a signal with a low-level potential or a high-level potential.

The configuration of the switching circuit SC used in the circuit MPC can be selected from the configurations in FIGS. 3A to 3D depending on the circumstances. Alternatively, the switching circuit SC used in the circuit MPC may have a configuration different from the configurations in FIGS. 3A to 3D.

<<Circuit ACTF>>

Figure 1C:

FIG. 1C illustrates terminals included in the circuit ACTF. The circuit ACTF includes a terminal inpa, a terminal inna, and a terminal outa.

The circuit ACTF has a function of generating a signal on the basis of the order of and/or a time lag between signals input to the terminal inpa and the terminal inna (signals Sp[m] and Sn[m] in FIG. 1A), and outputting the signal from the terminal outa. Note that the output signal corresponds to the signal $z_j^{(k)}$ in FIG. 4B.

For example, the circuit ACTF outputs a signal with low-level potential from the terminal outa when a signal is input to the terminal inpa after a signal is input to the terminal inna, and outputs a signal with a high-level potential from the terminal outa when a signal is input to the terminal inpa before a signal is input to the terminal inna. In other words, the circuit ACTF outputs a signal with low-level potential from the terminal outa when the transition of a potential input to the terminal inpa occurs after the transition of a potential input to the terminal inna, and outputs a signal with a high-level potential from the terminal outa when the transition of a potential input to the terminal inpa occurs before the transition of a potential input to the terminal inna. At that time, with the signal $z_j^{(k)}$ with a low-level potential corresponding to −1 and a high-level potential corresponding to 1, the circuit ACTF corresponds to a circuit that performs arithmetic operation of the step function.

For example, the circuit ACTF may output an analog value using a sigmoid function, a linear ramp function, or the like. Alternatively, the circuit ACTF may have a function of outputting a digital value or an analog value depending on a difference in timing between the signal input to the terminal inpa and the signal input to the terminal inna.

That is, the circuit ACTF has a function of performing the arithmetic operation of the activation function of the neuron in the neural network 100.

In the following description of this embodiment, the circuit ACTF is described as a circuit that performs arithmetic operation of a step function.

In the case where the circuit ACTF performs the arithmetic operation of the step function, a flip-flop circuit can be used as the circuit ACTF. In this case, the circuit ACTF reads a signal input to the terminal inpa when the transition of a signal input to the terminal inna occurs, and outputs the read signal to the terminal outa.

<<Converter Circuit TRF>>

The converter circuit TRF in the neural network 100 has a function of appropriately converting the signals $z_1^{(k-1)}$ to $z_m^{(k-1)}$ output from the neurons $N_1^{(k-1)}$ to $N_m^{(k-1)}$ in the (k−1)th layer and transmitting the converted signals to the circuits MPC[1] to MPC[m].

In FIG. 1A, the signals $z_1^{(k-1)}$ to $z_m^{(k-1)}$ are converted into the signals $x_1^{(k-1)}$ to $x_m^{(k-1)}$, and the signals $x_1^{(k-1)}$ to $x_m^{(k-1)}$ are transmitted to the respective circuits MPC[1] to MPC[m].

Since the signals $z_1^{(k-1)}$ to $z_m^{(k-1)}$ each have a value of −1 or 1 as described above and the signals $x_1^{(k-1)}$ to $x_m^{(k-1)}$ can have a low-level or high-level potential as in the description of the switching circuit SC, the converter circuit TRF can be configured with a logic circuit.

Conversion of the signals $z_1^{(k-1)}$ to $z_m^{(k-1)}$ by the converter circuit TRF will be described later.

<<Variation Examples of Circuit MPC, Circuit ACTF, Converter Circuit TRF, and the Like>>

Figure 5A:
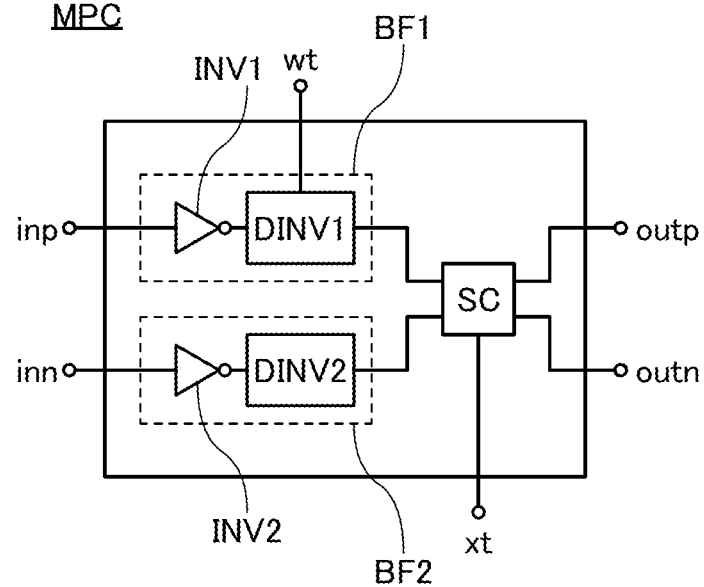
FIGS. 5A and 5B are block diagrams illustrating structure examples of a circuit included in a semiconductor device.
Figure 5B:
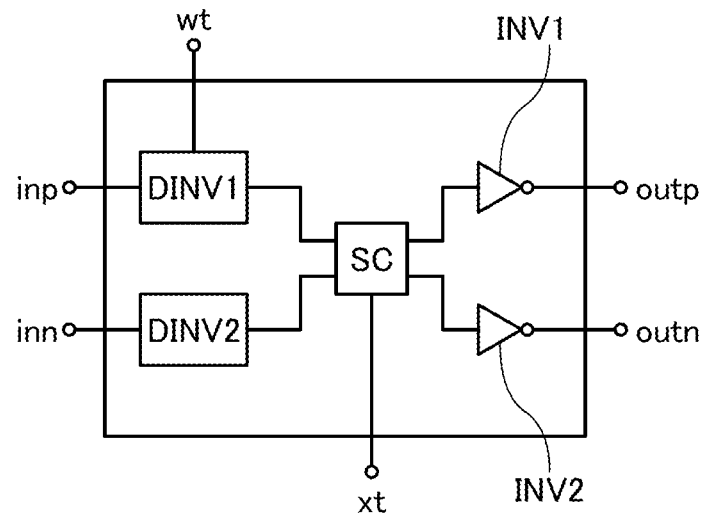

The configuration of the circuit MPC included in the arithmetic circuit 110 in FIG. 1A is not limited to the above and may be changed depending on the circumstances. For example, as a semiconductor device of one embodiment of the present invention, the circuit MPC can have any of configurations in FIGS. 5A and 5B. The circuit MPC in FIG. 5A is different from that in FIG. 2A in the order of electrical connection between the inverter circuit DINV1 and the inverter circuit INV1 in the circuit BF1 and in the order of electrical connection between the inverter circuit DINV2 and the inverter circuit INV2 in the circuit BF2. The circuit MPC in FIG. 5B is different from that in FIG. 2A in the order of electrical connection between the inverter circuit INV1 in the circuit BF1 and the switching circuit SC and in the order of electrical connection between the inverter circuit INV2 and the switching circuit SC.

The transistors included in the circuit MPC, the circuit ACTF, the converter circuit TRF, and the like are preferably OS transistors. The above description of the holding unit HCA mentions that an OS transistor is preferably used as the transistor Tr03; OS transistors are also preferably used as the other transistors. In particular, in the case where OS transistors are used as the other transistors, the OS transistors preferably have a structure described in Embodiment 4. Note that one embodiment of the present invention is not limited thereto.

Alternatively, the transistors included in the circuit MPC, the circuit ACTF, the converter circuit TRF, and the like may be a transistor containing silicon in a channel formation region (hereinafter referred to as a Si transistor) instead of the OS transistor. As silicon, hydrogenated amorphous silicon, microcrystalline silicon, or polycrystalline silicon can be used, for example. Examples of transistors other than the OS transistor or the Si transistor include a transistor containing Ge in an active layer; a transistor containing a compound semiconductor such as ZnSe, CdS, GaAs, InP, GaN, or SiGe in an active layer; a transistor containing a carbon nanotube in an active layer; and a transistor containing an organic semiconductor in an active layer.

Note that for the metal oxides in the semiconductor layers of OS transistors, n-type semiconductors of a metal oxide containing indium (e.g., In oxide) and a metal oxide containing zinc (e.g., Zn oxide) have been manufactured but p-type semiconductors thereof are difficult to manufacture in terms of mobility and reliability. For that reason, in the arithmetic circuit 110, OS transistors may be used as the n-channel transistors and Si transistors may be used as the p-channel transistors included in the circuit MPC, the circuit ACTF, the converter circuit TRF, and the like.

<Operation Method>

An example of an operation method of the arithmetic circuit 110 is described here.

Figure 6:
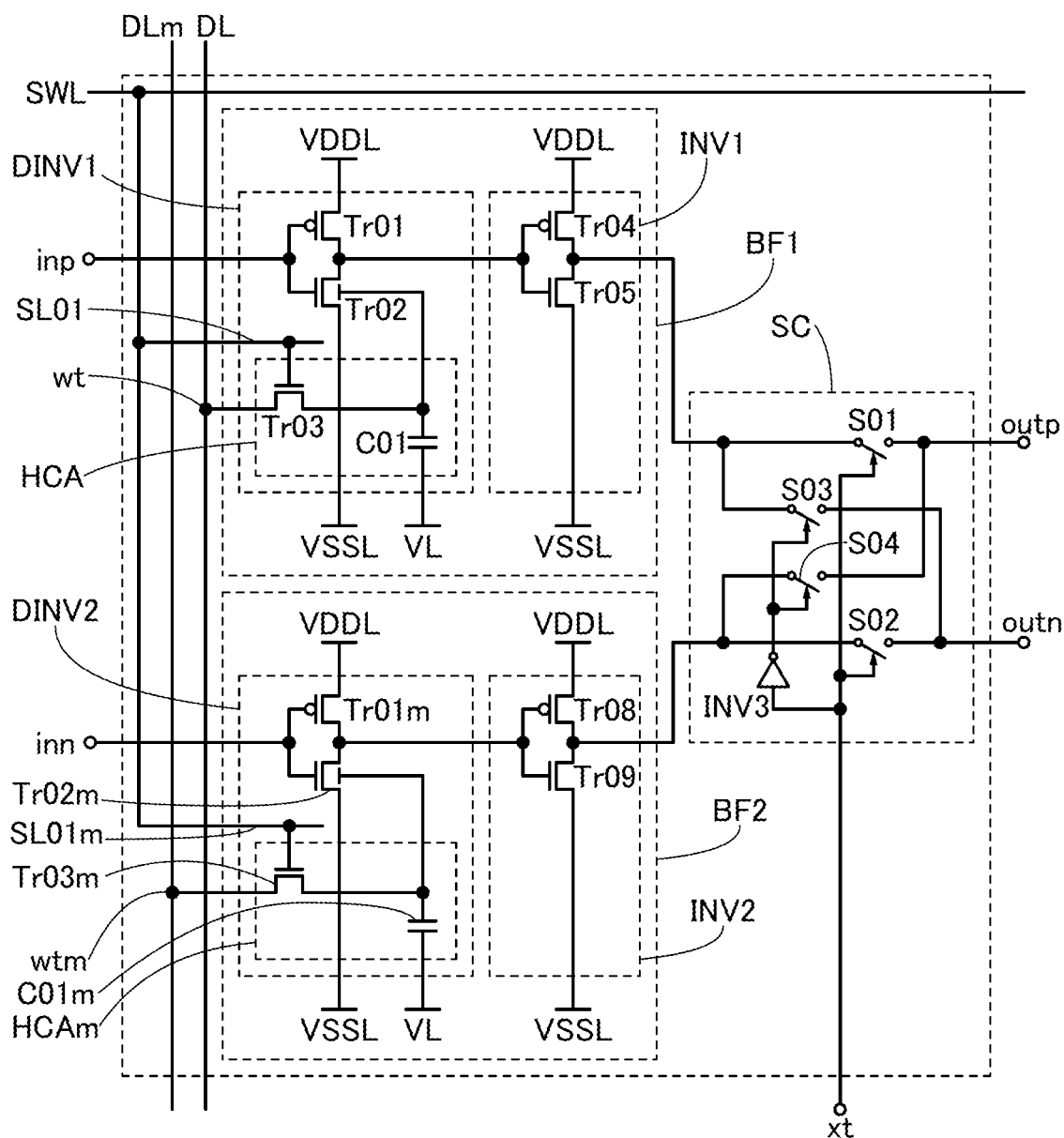
FIG. 6 is a circuit diagram illustrating a structure example of a circuit included in a semiconductor device.

FIG. 6 illustrates a configuration example of the circuit MPC[i] described in this operation example. The circuit MPC[i] includes the circuit BF1 and the circuit BF2 each having the configuration illustrated in FIG. 2B1 and the switching circuit SC illustrated in FIG. 3A.

Note that "m" is added to the end of reference numerals of the circuit components of the inverter circuit DINV2 in the circuit BF2 in FIG. 6 in order to distinguish them from the circuit components of the inverter circuit DINV1 in the circuit BF1. Thus, a holding unit HCAm, a transistor Tr01m, a transistor Tr02m, a transistor Tr03m, a capacitor C01m, and a wiring SL01m in the inverter circuit DINV2 correspond to the holding unit HCA, the transistor Tr01, the transistor Tr02, the transistor Tr03, the capacitor C01, and the wiring SL01 in the inverter circuit DINV1, respectively. A terminal wtm functions as an input terminal for supplying a potential to a first terminal of the capacitor C01m.

In the circuit MPC in FIG. 6, the terminal wt in the holding unit HCA of the circuit BF1 is electrically connected to a wiring DL, and the terminal wtm in the holding unit HCAm of the circuit BF2 is electrically connected to a wiring DLm. In addition, in the circuit MPC in FIG. 6, the wiring SL01 in the circuit BF1 and the wiring SL01m in the circuit BF2 are electrically connected to a wiring SWL.

In this specification and the like, unless otherwise specified, the transistors Tr01 to Tr05, the transistors Tr01m to Tr03m, the transistor Tr08, the transistor Tr09, and the transistors Tr11 to Tr14 in the on state may operate in a linear region in the end. In other words, the gate voltage, the source voltage, and the drain voltage of each of the transistors may be biased as appropriate so that the transistors operate in the linear region.

In this specification and the like, a low-level potential and a high-level potential do not represent any fixed potentials, and specific potentials may vary depending on wirings. For example, a low-level potential and a high-level potential corresponding to signals input to or output from the circuit MPC may be different from a low-level potential and a high-level potential supplied to the wiring SL01.

<<Initial Operation>>

In the initial operation, a potential corresponding to the signal $x_i^{(k-1)}$ is input to the terminal xt. Thus, the transistors Tr11 to Tr14 are turned on or off in response to the potential corresponding to the signal $x_i^{(k-1)}$.

A potential corresponding to the weight coefficient $w_i^{(k-1)}{}_j^{(k)}$ is input to the wiring DL, and an intermediate potential is input to the wiring DLm. After that, a high-level potential is supplied to the wiring SWL to turn on the transistor Tr03 and the transistor Tr03m. With this operation, the potential corresponding to the weight coefficient $w_i^{(k-1)}{}_j^{(k)}$ is supplied to the first terminal of the capacitor C01 and the intermediate potential is supplied to the first terminal of the capacitor C01m. Thus, the threshold voltage of the transistor Tr02 changes in response to the weight coefficient $w_i^{(k-1)}{}_j^{(k)}$, and the threshold voltage of the transistor Tr02m changes in response to the intermediate potential. Lastly, a low-level potential is supplied to the wiring SWL to turn off the transistor Tr03 and the transistor Tr03m, so that the potentials of the first terminal of the capacitor C01 and the first terminal of the capacitor C01m can be held.

<<Arithmetic Operation>>

After the initial operation, a signal Sp[i−1] and a signal Sn[i−1] are input to the terminal inp and the terminal inn, respectively, of the circuit MPC[i] (here, i is an integer greater than or equal to 1 and less than or equal to m), whereby arithmetic operation starts in the circuit MPC[i]. In particular, when i is 1, a signal Sp[0] and a signal Sn[0] are input to the terminal inp and the terminal inn, respectively, of the circuit MPC[1] with little time lag (substantially at the same time). When i is greater than or equal to 2, the signal Sp[i−1] and the signal Sn[i−1] are output from the circuit MPC[i−1]; thus, a time lag therebetween occurs sometimes. In the description of the arithmetic operation, for convenience, the signal Sp[i−1] and the signal Sn[i−1] are input to the terminal inp and the terminal inn, respectively, of the circuit MPC[i] with little time lag (substantially at the same time).

[Condition 1]

Figure 7A:
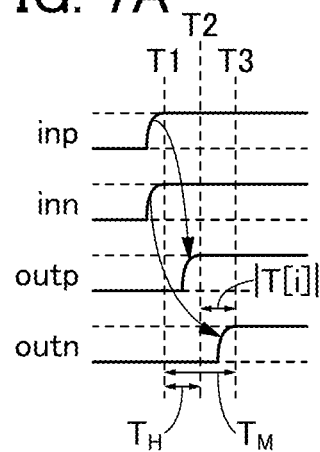
FIGS. 7A to 7D are timing charts illustrating operation examples of a circuit included in a semiconductor device.

Here, the case where the potential corresponding to the weight coefficient $w_i^{(k-1)}{}_j^{(k)}$ is a high-level potential and the potential corresponding to the signal $x_i^{(k-1)}$ is a high-level potential is considered. FIG. 7A is a timing chart showing changes in the potentials of the terminal inp, the terminal inn, the terminal outp, and the terminal outn in this case. First, high-level potentials are supplied as the signal Sp[i−1] and the signal Sn[i−1] to the terminal inp and the terminal inn, respectively, of the circuit MPC[i]. Then, the potentials of the terminal inp and the terminal inn of the circuit MPC[i] are assumed to reach a high-level potential at Time T1.

At this time, a high-level potential is supplied as the signal Sp[i−1] to the input terminal of the circuit BF1 in the circuit MPC[i]; thus, the high-level potential is output from the output terminal of the circuit BF1 in the circuit MPC[i]. Similarly, a high-level potential is supplied as the signal Sn[i−1] to the input terminal of the circuit BF2 in the circuit MPC[i]; thus, the high-level potential is output from the output terminal of the circuit BF2 in the circuit MPC[i]. Note that a high-level potential is supplied to the back gate of the transistor Tr02 in the circuit BF1, and an intermediate potential is supplied to the back gate of the transistor Tr02m in the circuit BF2; accordingly, the circuit BF1 operates faster than the circuit BF2. Thus, when signals are input to the terminal inp and the terminal inn at the same time, the circuit BF1 outputs an output signal before the circuit BF2 outputs an output signal.

Since a high-level potential is supplied to the terminal xt in the switching circuit SC, electrical continuity is established between the output terminal of the circuit BF1 and the terminal outp and between the output terminal of the circuit BF2 and the terminal outn. That is, the output signal of the circuit BF1 is output from the terminal outp, and the output signal of the circuit BF2 is output from the terminal outn.

The output signal of the circuit BF1 is output before the output signal of the circuit BF2; hence, as in FIG. 7A, the potential of the terminal outp becomes high at Time T2, and then, the potential of the terminal outn becomes high at Time T3. That is, a signal Sp[i] is output as the output signal from the terminal outp at Time T2, and a signal Sn[i] is output as the output signal from the terminal outn at Time T3. Note that in FIG. 7A, the input/output time from the input of the signal Sp[i−1] to the terminal inp to the output of the signal Sp[i] from the terminal outp is denoted by $T_H$, and the input/output time from the input of the signal Sn[i−1] to the terminal inn to the output of the signal Sn[i] from the terminal outn is denoted by $T_M$.

[Condition 2]

Figure 7B:
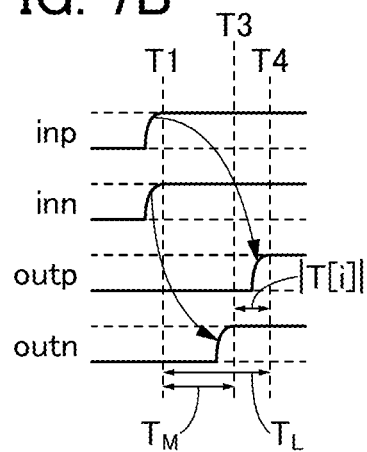

The case where the potential corresponding to the weight coefficient $w_i^{(k-1)}{}_j^{(k)}$ is a low-level potential and the potential corresponding to the signal $x_i^{(k-1)}$ is a high-level potential is considered. FIG. 7B is a timing chart showing changes in the potentials of the terminal inp, the terminal inn, the terminal outp, and the terminal outn in such a case. As in FIG. 7A, first, high-level potentials are supplied as the signal Sp[i−1] and the signal Sn[i−1] to the terminal inp and the terminal inn, respectively, of the circuit MPC[i]. Then, the potentials of the terminal inp and the terminal inn of the circuit MPC[i] are assumed to reach a high-level potential at Time T1.

At this time, a high-level potential is supplied as the signal Sp[i−1] to the input terminal of the circuit BF1 in the circuit MPC[i]; thus, the high-level potential is output from the output terminal of the circuit BF1 in the circuit MPC [i]. Similarly, a high-level potential is supplied as the signal Sn[i−1] to the input terminal of the circuit BF2 in the circuit MPC[i]; hence, the high-level potential is output from the output terminal of the circuit BF2 in the circuit MPC[i]. Note that a low-level potential is supplied to the back gate of the transistor Tr02 in the circuit BF1, and an intermediate potential is supplied to the back gate of the transistor Tr02m in the circuit BF2; accordingly, the circuit BF1 operates slower than the circuit BF2. Consequently, when signals are input to the terminal inp and the terminal inn at the same time, the circuit BF1 outputs an output signal after the circuit BF2 outputs an output signal.

Since a high-level potential is supplied to the terminal xt in the switching circuit SC, electrical continuity is established between the output terminal of the circuit BF1 and the terminal outp and between the output terminal of the circuit BF2 and the terminal outn, as in the case of FIG. 7A. That is, the output signal of the circuit BF1 is output from the terminal outp, and the output signal of the circuit BF2 is output from the terminal outn.

The output signal of the circuit BF1 is output after the output signal of the circuit BF2; thus, as shown in FIG. 7B, the potential of the terminal outn becomes high at Time T3, and then, the potential of the terminal outp becomes high at Time T4. That is, the signal Sn[i] is output as the output signal from the terminal outn at Time T3, and the signal Sp[i] is output as the output signal from the terminal outp at Time T4. Note that in FIG. 7B, the input/output time from the input of the signal Sp[i−1] to the terminal inp to the output of the signal Sp[i] from the terminal outp is denoted by $T_L$, and the input/output time from the input of the signal Sn[i−1] to the terminal inn to the output of the signal Sn[i] from the terminal outn is denoted by $T_M$.

[Condition 3]

Figure 7C:
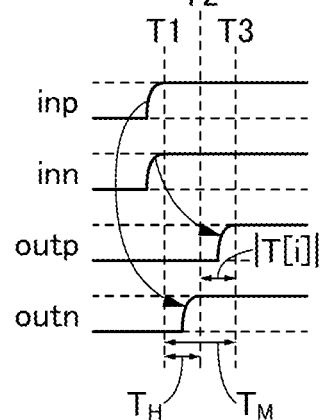

The case where the potential corresponding to the weight coefficient $w_i^{(k-1)}{}_j^{(k)}$ is a high-level potential and the potential corresponding to the signal $x_i^{(k-1)}$ is a low-level potential is considered. FIG. 7C is a timing chart showing changes in the potentials of the terminal inp, the terminal inn, the terminal outp, and the terminal outn in such a case. As in FIG. 7A, first, high-level potentials are supplied as the signal Sp[i−1] and the signal Sn[i−1] to the terminal inp and the terminal inn, respectively, of the circuit MPC[i]. Then, the potentials of the terminal inp and the terminal inn of the circuit MPC[i] are assumed to reach a high-level potential at Time T1.

At this time, a high-level potential is supplied as the signal Sp[i−1] to the input terminal of the circuit BF1 in the circuit MPC[i]; thus, the high-level potential is output from the output terminal of the circuit BF1 in the circuit MPC [i]. Similarly, a high-level potential is supplied as the signal Sn[i−1] to the input terminal of the circuit BF2 in the circuit MPC[i]; thus, the high-level potential is output from the output terminal of the circuit BF2 in the circuit MPC[i]. Note that a high-level potential is supplied to the back gate of the transistor Tr02 in the circuit BF1, and an intermediate potential is supplied to the back gate of the transistor Tr02m in the circuit BF2; accordingly, the circuit BF1 operates faster than the circuit BF2. Thus, when signals are input to the terminal inp and the terminal inn at the same time, the circuit BF1 outputs an output signal before the circuit BF2 outputs an output signal.

Since a low-level potential is supplied to the terminal xt in the switching circuit SC, electrical continuity is established between the output terminal of the circuit BF1 and the terminal outn and between the output terminal of the circuit BF2 and the terminal outp. That is, the output signal of the circuit BF1 is output from the terminal outn, and the output signal of the circuit BF2 is output from the terminal outp.

The output signal of the circuit BF1 is output before the output signal of the circuit BF2; thus, as in FIG. 7C, the potential of the terminal outn becomes high at Time T2, and then, the potential of the terminal outp becomes high at Time T3. That is, the signal Sn[i] is output as the output signal from the terminal outn at Time T2, and the signal Sp[i] is output as the output signal from the terminal outp at Time T3. Note that in FIG. 7C, the input/output time from the input of the signal Sp[i−1] to the terminal inp to the output of the signal Sn[i] from the terminal outn is denoted by $T_H$, and the input/output time from the input of the signal Sn[i−1] to the terminal inn to the output of the signal Sp[i] from the terminal outp is denoted by $T_M$.

[Condition 4]

Figure 7D:
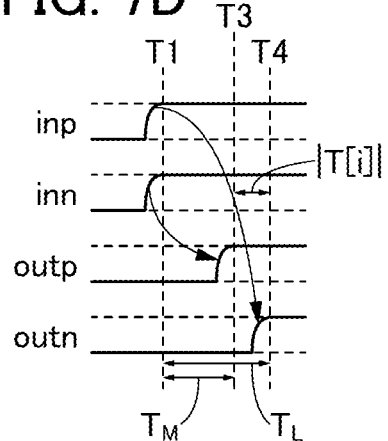

The case where the potential corresponding to the weight coefficient $w_i^{(k-1)}{}_j^{(k)}$ is a low-level potential and the potential corresponding to the signal $x_i^{(k-1)}$ is a low-level potential is considered. FIG. 7D is a timing chart showing changes in the potentials of the terminal inp, the terminal inn, the terminal outp, and the terminal outn in such a case. As in FIG. 7A, first, high-level potentials are supplied as the signal Sp[i−1] and the signal Sn[i−1] to the terminal inp and the terminal inn, respectively, of the circuit MPC[i]. Then, the potentials of the terminal inp and the terminal inn of the circuit MPC[i] are assumed to reach a high-level potential at Time T1.

At this time, a high-level potential is supplied as the signal Sp[i−1] to the input terminal of the circuit BF1 in the circuit MPC[i]; thus, the high-level potential is output from the output terminal of the circuit BF1 in the circuit MPC [i]. Similarly, a high-level potential is supplied as the signal Sn[i−1] to the input terminal of the circuit BF2 in the circuit MPC[i]; hence, the high-level potential is output from the output terminal of the circuit BF2 in the circuit MPC[i]. Note that a low-level potential is supplied to the back gate of the transistor Tr02 in the circuit BF1, and an intermediate potential is supplied to the back gate of the transistor Tr02m in the circuit BF2; accordingly, the circuit BF1 operates slower than the circuit BF2. Consequently, when signals are input to the terminal inp and the terminal inn at the same time, the circuit BF1 outputs an output signal after the circuit BF2 outputs an output signal.

Since a low-level potential is supplied to the terminal xt in the switching circuit SC, electrical continuity is established between the output terminal of the circuit BF1 and the terminal outn and between the output terminal of the circuit BF2 and the terminal outp. That is, the output signal of the circuit BF1 is output from the terminal outn, and the output signal from the circuit BF2 is output from the terminal outp.

The output signal of the circuit BF1 is output after the output signal of the circuit BF2; thus, as in FIG. 7D, the potential of the terminal outp becomes high at Time T3, and then, the potential of the terminal outn becomes high at Time T4. That is, the signal Sp[i] is output as the output signal from the terminal outp at Time T3, and the signal Sn[i] is output as the output signal from the terminal outn at Time T4. Note that in FIG. 7D, the input/output time from the input of the signal Sp[i−1] to the terminal inp to the output of the signal Sn[i] from the terminal outn is denoted by $T_L$, and the input/output time from the input of the signal Sn[i−1] to the terminal inn to the output of the signal Sp[i] from the terminal outp is denoted by $T_M$.

In the conditions 1 to 4, a time lag between the output of the signal Sn[i] from the terminal outn and the output of the signal Sp[i] from the terminal outp is denoted by T[i] (|T[i]| in FIGS. 7A to 7D). As in the description of the conditions 1 to 4, T[i] is determined by the potential corresponding to the weight coefficient $w_i^{(k-1)}{}_j^{(k)}$ and the potential corresponding to the signal $x_i^{(k-1)}$.

For example, when the potential corresponding to the signal $x_i^{(k-1)}$ is high, T[i] becomes smaller as the weight coefficient $w_i^{(k-1)}{}_j^{(k)}$ becomes larger (the potential corresponding to the weight coefficient $w_i^{(k-1)}{}_j^{(k)}$ becomes higher). The signal Sp[i] is output from the terminal outp before the signal Sn[i] is output from the terminal outn; thus, T[i] becomes a negative value. Meanwhile, T[i] becomes larger as the weight coefficient $w_i^{(k-1)}{}_j^{(k)}$ becomes smaller (the potential corresponding to the weight coefficient $w_i^{(k-1)}{}_j^{(k)}$ becomes lower). The signal Sp[i] is output from the terminal outp after the signal Sn[i] is output from the terminal outn; thus, T[i] becomes a positive value.

For example, when the potential corresponding to the signal $x_i^{(k-1)}$ is high, a difference in the input/output time between the circuit BF1 and the circuit BF2 in the circuit MPC[i] is output as it is. For another example, when the potential corresponding to the signal $x_i^{(k-1)}$ is low, a difference in the input/output time between the circuit BF1 and the circuit BF2 in the circuit MPC[i] is multiplied by −1 and then is output. Specifically, when a time lag between the output of the signal Sn[i] from the terminal outn and the output of the signal Sp[i] from the terminal outp under the condition 1 (in the timing chart in FIG. 7A) is T[i] (=$T_H$−$T_M$), a time lag between the output of the signal Sn[i] from the terminal outn and the output of the signal Sp[i] from the terminal outp under the condition 3 (in the timing chart in FIG. 7C) is −T[i] (=$T_M$−$T_H$).

In an actual situation, there is a delay between the input and the output of a signal in the switching circuit SC; accordingly, the time lag T[i] between the output of the signal Sn[i] from the terminal outn and the output of the signal Sp[i] from the terminal outp includes the delay. In this embodiment, the description is made without regard to the delay.

As described above, when the signal Sp[i−1] and the signal Sn[i−1] are input to the circuit MPC[i], the circuit MPC[i] outputs the signal Sp[i] and the signal Sn[i] to which the time lag T[i], which is determined by the potential corresponding to the weight coefficient $w_i^{(k-1)}{}_j^{(k)}$ and the potential corresponding to the signal $x_i^{(k-1)}$, is added.

<<Arithmetic Operation with a Plurality of Connected Circuits MPC>>

Here, the operation of the arithmetic circuit 110 including the m connected circuits MPC as in FIG. 1A is described. In order that the circuit MPC[i] outputs the signal Sp[i] and the signal Sn[i] to which the time lag T[i], which depends on the weight coefficient $w_i^{(k-1)}{}_j^{(k)}$ and the signal $x_i^{(k-1)}$, is added, the signal Sp[0] and the signal Sn[0] are input to the circuit MPC[1] at the same time; thus, the time lags occurring in the circuits MPC[1] to MPC[m] are accumulated.

When the time lag between the output of the signal Sp[i−1] and the output of the signal Sn[i−1] from the circuit MPC[i−1] is T[i−1] and the time lag between the output of the signal Sp[i] and the output of the signal Sn[i] from the circuit MPC[i] is T[i], the relation between T[i] and T[i−1] can be expressed by the following formula.

[Formula 4]

$$T[i] = \{T[i-1] + g(w_i^{(k-1)}{}_j^{(k)})\} \cdot x_i^{(k-1)} \quad (1.4)$$

Note that $g(w_i^{(k-1)}{}_j^{(k)})$ is a function for outputting the time lag between the signal output from the circuit BF1 and the signal output from the circuit BF2, using the weight coefficient as a variable. When the delay time in the switching circuit SC is taken into consideration, the term representing the delay time is added to Formula (1.4).

In Formula (1.4), $g(w_i^{(k-1)}{}_j^{(k)})$, the time lag based on the weight coefficient $w_i^{(k-1)}{}_j^{(k)}$ held in the circuit MPC[i], is added to the time lag T[i−1] between the output of the signal Sp[i−1] and the output of the signal Sn[i−1] from the circuit MPC[i−1], and the sum is multiplied by the signal $x_i^{(k-1)}$ by the switching circuit SC.

Note that T[1] is expressed by the following formula.

[Formula 5]

$$T[1] = g(w_1^{(k-1)}{}_j^{(k)}) \cdot x_1^{(k-1)} \quad (1.5)$$

Here, according to the recurrence relations of Formulae (1.4) and (1.5), T[m] is calculated as in Formula (1.6). Note that H in Formula (1.6) is a polynomial operator representing the infinite product.

[Formula 6]

$$T[m] = \sum_{i=1}^{m} g(w_i^{(k-1)(k)}{}_j) \cdot \left( \prod_{h=i}^{m} x_h^{(k-1)} \right) \quad (1.6)$$

Here, $\Pi x_i^{(k-1)}$ is replaced with $z_i^{(k-1)}$.

[Formula 7]

$$\prod_{h=i}^{m} x_h^{(k-1)} = x_i^{(k-1)} \times \ldots \times x_m^{(k-1)} = z_i^{(k-1)} \quad (1.7)$$

By replacing $\Pi x_i^{(k-1)}$ with $z_i^{(k-1)}$, T[m] can be expressed by the product-sum of the function $g(w_i^{(k-1)}{}_j^{(k)})$ based on the weight coefficient and the signal $z_i^{(k-1)}$ according to Formulae (1.6) and (1.7). That is, Formula (1.2) can be calculated with the arithmetic circuit 110.

Next, the description is made on the relation between $x_i^{(k-1)}$ and $z_i^{(k-1)}$ for replacing $\Pi x_i^{(k-1)}$ with $z_i^{(k-1)}$ and the converter circuit TRF that converts the signals $z_1^{(k-1)}$ to $z_m^{(k-1)}$ into the signals $x_1^{(k-1)}$ to $x_m^{(k-1)}$.

First, $z_{i+1}^{(k-1)}$ is described. According to Formula (1.7), $z_{i+1}^{(k-1)}$ is expressed by the following formula. Note that here, i is an integer greater than or equal to 1 and less than or equal to m−1.

[Formula 8]

$$x_{i+1}^{(k-1)} \times \ldots \times x_m^{(k-1)} = z_{i+1}^{(k-1)} \quad (1.8)$$

Next, the sides of Formula (1.7) are divided by the corresponding sides of Formula (1.8), so that the following formula is obtained.

[Formula 9]

$$x_i^{(k-1)} = \frac{z_i^{(k-1)}}{z_{i+1}^{(k-1)}} \quad (1.9)$$

When i=m, $x_m^{(k-1)}$ is expressed by the following formula according to Formula (1.7).

[Formula 10]

$$x_m^{(k-1)} = z_m^{(k-1)} \quad (1.10)$$

When Formulae (1.9) and (1.10) are satisfied, $\Pi x_i^{(k-1)}$ can be replaced with $z_i^{(k-1)}$ in Formula (1.6).

Next, the description is made on the converter circuit TRF that converts the signals $z_1^{(k-1)}$ to $z_m^{(k-1)}$ into the signals $x_1^{(k-1)}$ to $x_m^{(k-1)}$ so that Formulae (1.9) and (1.10) are satisfied.

In Formula (1.9), $z_i^{(k-1)}$ and $z_{i+1}^{(k-1)}$ are signals output from the neuron $N_i^{(k-1)}$ and the neuron $N_{i+1}^{(k-1)}$, respectively, in the (k−1)th layer. In the arithmetic circuit 110, the activation function of the neuron is the step function with an output of −1 or 1; thus, the signal $x_i^{(k-1)}$ also has a value of −1 or 1. Consequently, $x_i^{(k-1)}$ can be expressed by exclusive NOR of $z_i^{(k-1)}$ and $z_{i+1}^{(k-1)}$.

Figure 8A:
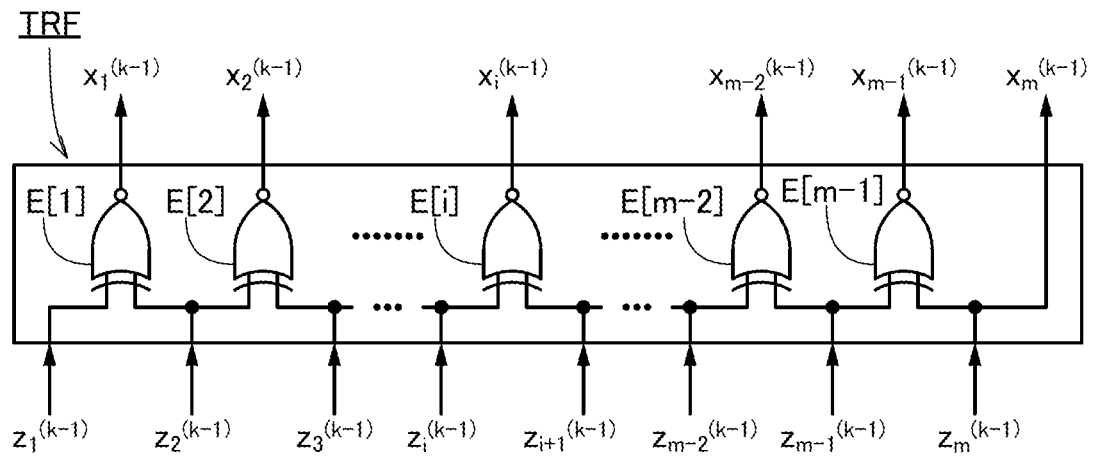
FIGS. 8A and 8B are circuit diagrams illustrating structure examples of a circuit included in a semiconductor device.
Figure 8B:
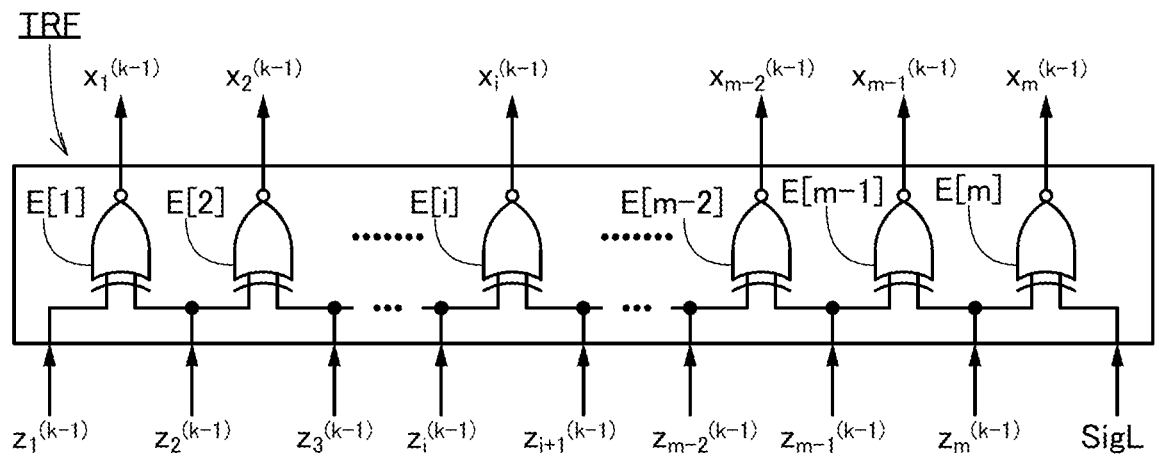

FIGS. 8A and 8B illustrate configuration examples of the converter circuit TRF that converts the signals $z_1^{(k-1)}$ to $z_m^{(k-1)}$ into the signals $x_1^{(k-1)}$ to $x_m^{(k-1)}$.

The converter circuit TRF illustrated in FIG. 8A includes coincidence circuits (exclusive NOR circuits) E[1] to E[m−1]. Note that FIG. 8A illustrates only the coincidence circuits E[1], E[2], E[i], E[m−2], and E[m−1], and does not show the other coincidence circuits.

Here, the coincidence circuit E[i] (here, i is an integer greater than or equal to 1 and less than or equal to m−1) is described. The signal $z_i^{(k-1)}$ is input to a first terminal of the coincidence circuit E[i], and the signal $z_{i+1}^{(k-1)}$ is input to a second terminal of the coincidence circuit E[i]. The signal $x_i^{(k-1)}$ is output from an output terminal of the coincidence circuit E[i].

When receiving the signal $z_m^{(k-1)}$, the converter circuit TRF in FIG. 8A outputs the signal $z_m^{(k-1)}$ as it is as the signal $x_m^{(k-1)}$.

The converter circuit TRF in FIG. 8A can convert the signals $z_1^{(k-1)}$ to $z_m^{(k-1)}$ into the signals $x_1^{(k-1)}$ to $x_m^{(k-1)}$ so that Formulae (1.9) and (1.10) are satisfied.

Note that the configuration of the converter circuit TRF in the arithmetic circuit 110 is not limited to that in FIG. 8A and may be changed depending on the circumstances.

For example, the converter circuit TRF illustrated in FIG. 8B may be used as the converter circuit TRF of the arithmetic circuit 110. The converter circuit TRF in FIG. 8B differs from that in FIG. 8A in including a coincidence circuit E[m].

Specifically, the signal $z_m^{(k-1)}$ is input to a first terminal of the coincidence circuit E[m], and a signal SigL corresponding to a low-level potential is input to a second terminal of the coincidence circuit E[m]. The signal $x_m^{(k-1)}$ is output from an output terminal of the coincidence circuit E[m]. The converter circuit TRF in FIG. 8B can perform operation similar to that of the converter circuit TRF in FIG. 8A.

Note that this embodiment can be combined with any of the other embodiments in this specification as appropriate.

Embodiment 2

In this embodiment, another configuration example of the arithmetic circuit 110 shown in Embodiment 1 will be described.

<Configuration Example of Arithmetic Circuit 110>

Figure 9:
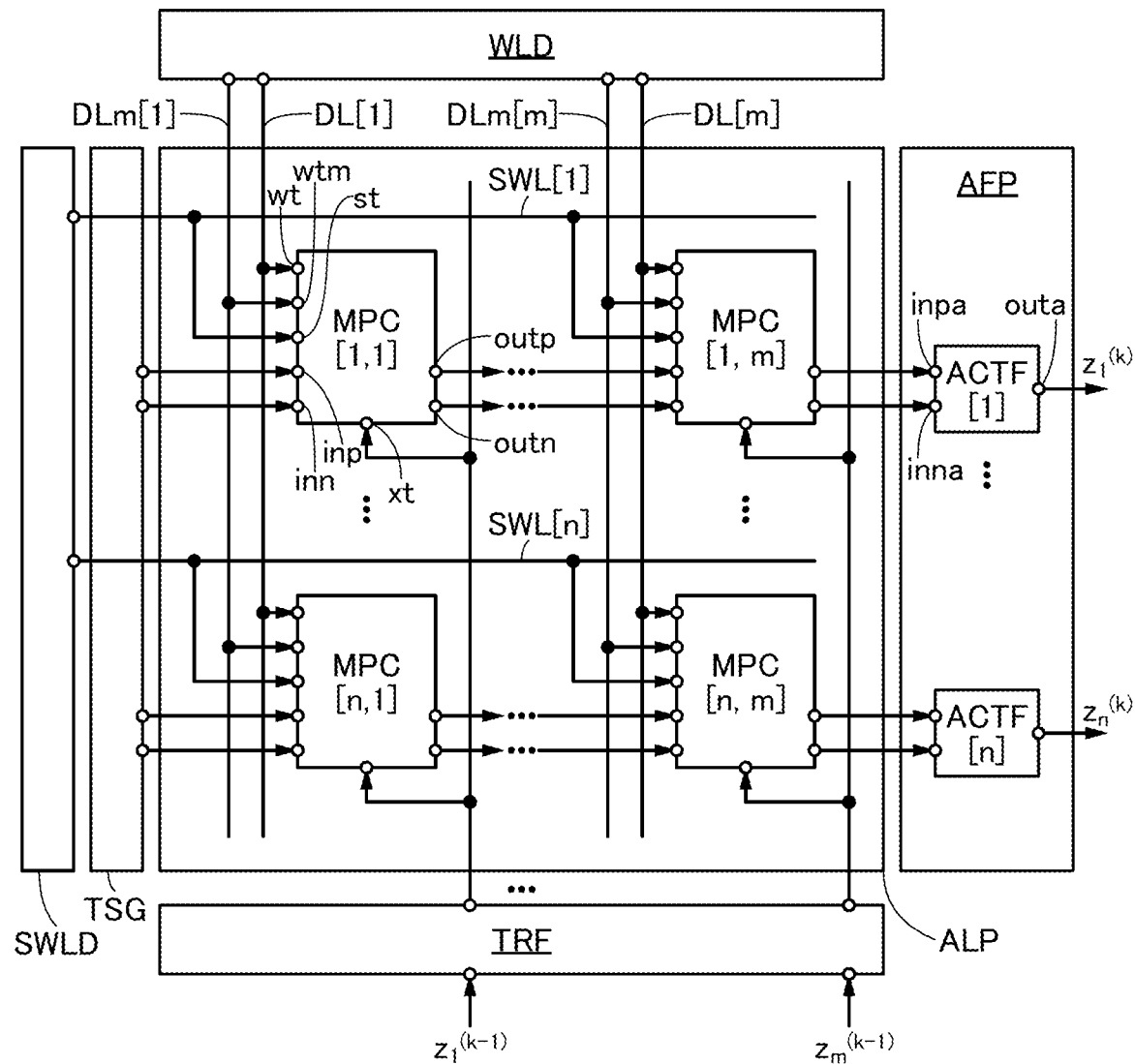
FIG. 9 is a block diagram illustrating a structure example of a semiconductor device.

In the arithmetic circuit 110 in FIG. 1A, the circuits MPC can be arranged in a matrix, for example. FIG. 9 illustrates a configuration example of such an arithmetic circuit.

An arithmetic circuit 120 includes an array portion ALP including the circuits MPC arranged in a matrix, a circuit AFP including a plurality of circuits ACTF, a circuit TSG, a circuit WLD, a circuit SWLD, and the converter circuit TRF.

The array portion ALP includes n×m circuits MPC, and the circuits MPC are arranged in a matrix of n rows and m columns in the array portion ALP. Note that in FIG. 9, a circuit MPC[j, i] represents the circuit MPC in the j-th row and the i-th column (here, j is an integer greater than or equal to 1 and less than or equal to n, and i is an integer greater than or equal to 1 and less than or equal to m). Note that FIG. 9 illustrates only circuits MPC[1, 1], MPC[1, m], MPC[n, 1], and MPC[n, m] and does not show the other circuits MPC.

The circuit AFP includes n circuits ACTF arranged in one column. In FIG. 9, a circuit ACTF[J] represents the circuit ACTF in the j-th row. Note that FIG. 9 illustrates only the circuits ACTF[1] and ACTF[n] and does not shown the other circuits ACTF.

When the j-th row in the array portion ALP and the circuit AFP is focused, in the circuits MPC[j, 1] to MPC[j, m], the terminal outp and the terminal outn are electrically connected to the terminal inp and the terminal inn, respectively, of the adjacent circuits MPC. The terminal outp and the terminal outn of the circuit MPC[j, m] are electrically connected to the terminal inpa and the terminal inna, respectively, of the circuit ACTF[j]. The terminals xt of the circuits MPC[j, 1] to MPC[j, m] are electrically connected to the converter circuit TRF.

In other words, with a focus on the circuit MPC and the circuit ACTF in one row of the array portion ALP of the arithmetic circuit 120, the circuit MPC and the circuit ACTF in the row can be regarded as the arithmetic circuit 110 in FIG. 1A.

The circuit MPC in the array portion ALP includes a terminal st in addition to the terminal wt, the terminal wtm, the terminal xt, the terminal inp, the terminal inn, the terminal outp, and the terminal outn described in Embodiment 1. The terminal st is electrically connected to the wiring SL01 described in Embodiment 1.

The terminals st of the circuits MPC[j, 1] to MPC[j, m] are electrically connected to the wiring SWL[j]. The wiring SWL[j] corresponds to the wiring SWL in Embodiment 1, and FIG. 9 illustrates the wiring SWL[1] and the wiring SWL[n]. The terminals wt of the circuits MPC[1, i] to MPC[n, i] are electrically connected to the wiring DL[i]. The wiring DL[i] corresponds to the wiring DL in Embodiment 1, and FIG. 9 illustrates the wiring DL[1] and the wiring DL[m]. The terminals wtm of the circuits MPC[1, i] to MPC[n, i] are electrically connected to the wiring DLm[i]. The wiring DLm[i] corresponds to the wiring DLm in Embodiment 1, and FIG. 9 illustrates the wiring DLm[1] and the wiring DLm[m].

The circuit TSG generates signals input to the terminals inp and inn of the circuits MPC[1, 1] to MPC[n, 1].

The circuit WLD has a function of supplying potentials corresponding to weight coefficients to the wirings DL[1] to DL[m] and a function of supplying an intermediate potential to the wirings DLm[1] to DLm[m].

The circuit SWLD selects a holding unit for holding the potentials corresponding to the weight coefficients. Specifically, the circuit SWLD has a function of supplying potentials to the gates of the transistors Tr03 and the transistors Tr03m in the holding units HCA and the holding units HCAm, respectively, of the circuits MPC[j, 1] to MPC[j, m] through the wiring SWL[j].

To maintain potentials in the holding unit HCA and the holding unit HCAm of the circuit MPC[j, i], for example, the circuit WLD supplies the potentials to be held to the wiring DL[i] and the wiring DLm[i], and the circuit SWLD supplies a high-level potential to the wiring SWL[j] to turn on the transistor Tr03 and the transistor Tr03m in the holding unit HCA and the holding unit HCAm, respectively, of the circuit MPC[j, i], so that the potentials of the wiring DL[i] and the wiring DLm[i] can be supplied to the first terminals of the capacitor C01 and the capacitor C01m, respectively. After the potentials are written to the first terminals of the capacitor C01 and the capacitor C01m, the circuit SWLD supplies a low-level potential to the wiring SWL[j] to turn off the transistor Tr03 and the transistor Tr03m in the holding unit HCA and the holding unit HCAm, respectively, of the circuit MPC[j, i], so that the potentials supplied to the holding unit HCA and the holding unit HCAm can be held.

For the converter circuit TRF, refer to the description thereof in Embodiment 1. Note that in FIG. 9, the signal $z_1^{(k-1)}$ and the signal $z_m^{(k-1)}$ are input to the converter circuit TRF. The signals $z_1^{(k-1)}$ to $z_m^{(k-1)}$ input to the converter circuit TRF are converted into the signals $x_1^{(k-1)}$ to $x_m^{(k-1)}$ and transmitted to the circuits MPC included in the array portion ALP. In particular, the signal $x_i^{(k-1)}$ is transmitted to the terminals xt of the circuits MPC[1, i] to MPC[n, i].

With the arithmetic circuit 120 in FIG. 9, a plurality of arithmetic operations can be performed concurrently. Although Embodiment 1 describes the arithmetic circuit 110 in FIG. 1A as a circuit for obtaining the signal $z_j^{(k)}$ output from the neuron $N_j^{(k)}$ in FIG. 4B, the use of the arithmetic circuit 120 in FIG. 9 makes it possible to simultaneously obtain the signals $z_1^{(k)}$ to $z_n^{(k)}$ output from the neurons $N_1^{(k)}$ to $N_n^{(k)}$.

Specifically, all the signals $z_1^{(k-1)}$ to $z_m^{(k-1)}$ output from the neurons $N_1^{(k-1)}$ to $N_m^{(k-1)}$ in the (k−1)th layer are input to each of the neurons $N_1^{(k)}$ to $N_n^{(k)}$ in the k-th layer. This corresponds to the transmission of the signals $x_1^{(k-1)}$ to $x_m^{(k-1)}$ output from the converter circuit TRF, to the circuits MPC included in the array portion ALP. The potential corresponding to the weight coefficient between the neuron $N_i^{(k-1)}$ in the (k−1)th layer and the neuron $N_j^{(k)}$ in the k-th layer is held in the holding unit HCA of the circuit MPC[j, i], whereby the signal $z_j^{(k)}$ from the neuron $N_j^{(k)}$ in the k-th layer can be output from the circuit ACTF[j]. Note that in FIG. 9, the signal $z_1^{(k)}$ is output from the circuit ACTF[1], and the signal $z_n^{(k)}$ is output from the circuit ACTF[n].

Note that the semiconductor device of one embodiment of the present invention is not limited to the arithmetic circuit 120 illustrated in FIG. 9. The circuits MPC[i] in FIG. 6 are arranged in a matrix in the arithmetic circuit 120 in FIG. 9; alternatively, the circuits MPC[i] in FIG. 10 may be arranged in a matrix to configure an arithmetic circuit. The circuit MPC[i] in FIG. 10 differs from the circuit MPC[i] in FIG. 6 in that the terminal wt in the holding unit HCA of the circuit BF1 and the terminal wtm in the holding unit HCAm of the circuit BF2 are electrically connected to the wiring DL, the wiring SL01 in the circuit BF1 is electrically connected to the wiring SWL, and the wiring SL01m in the circuit BF2 is electrically connected to a wiring SWLm.

Figure 10:
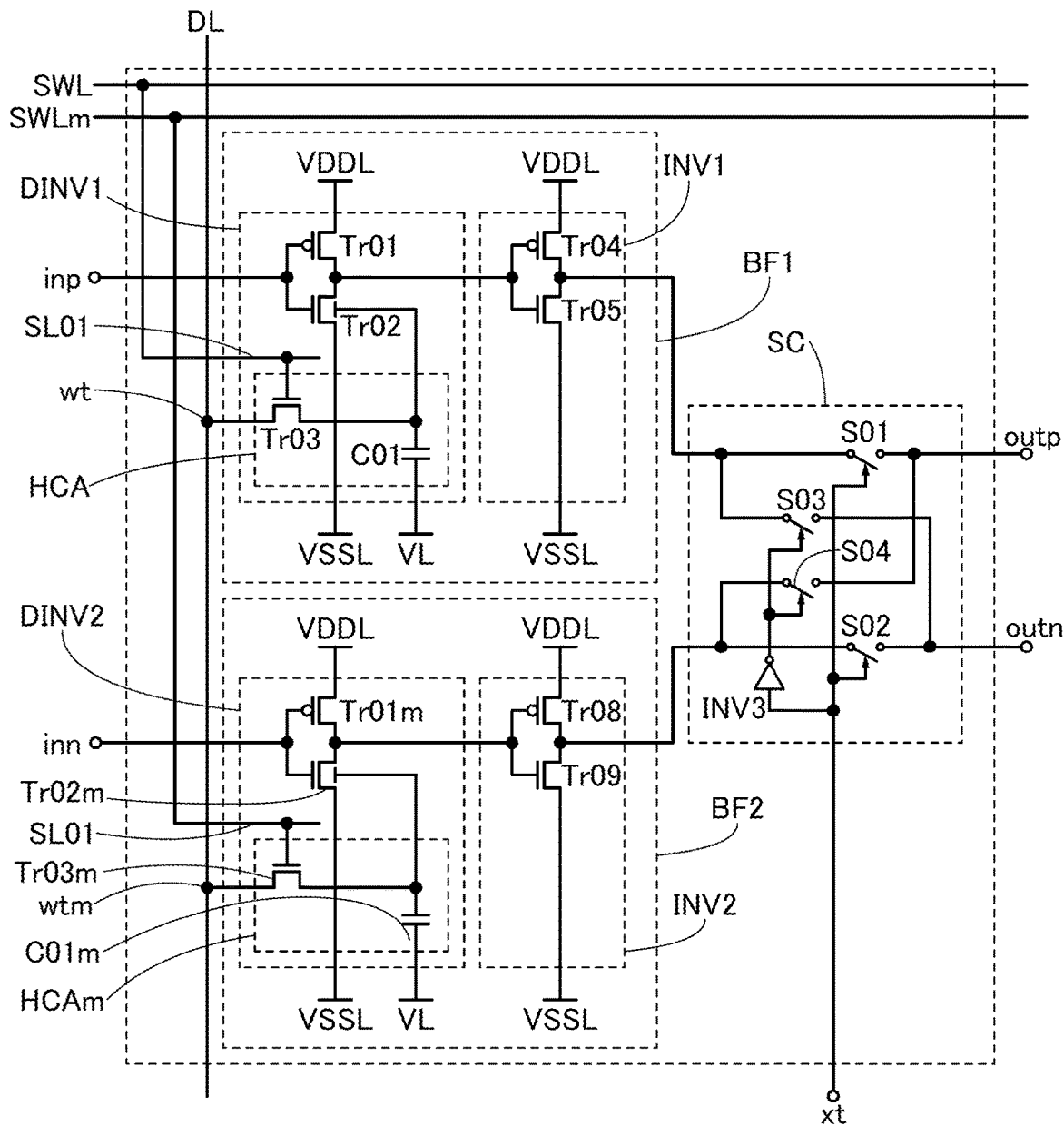
FIG. 10 is a circuit diagram illustrating a structure example of a circuit included in a semiconductor device.
Figure 11:
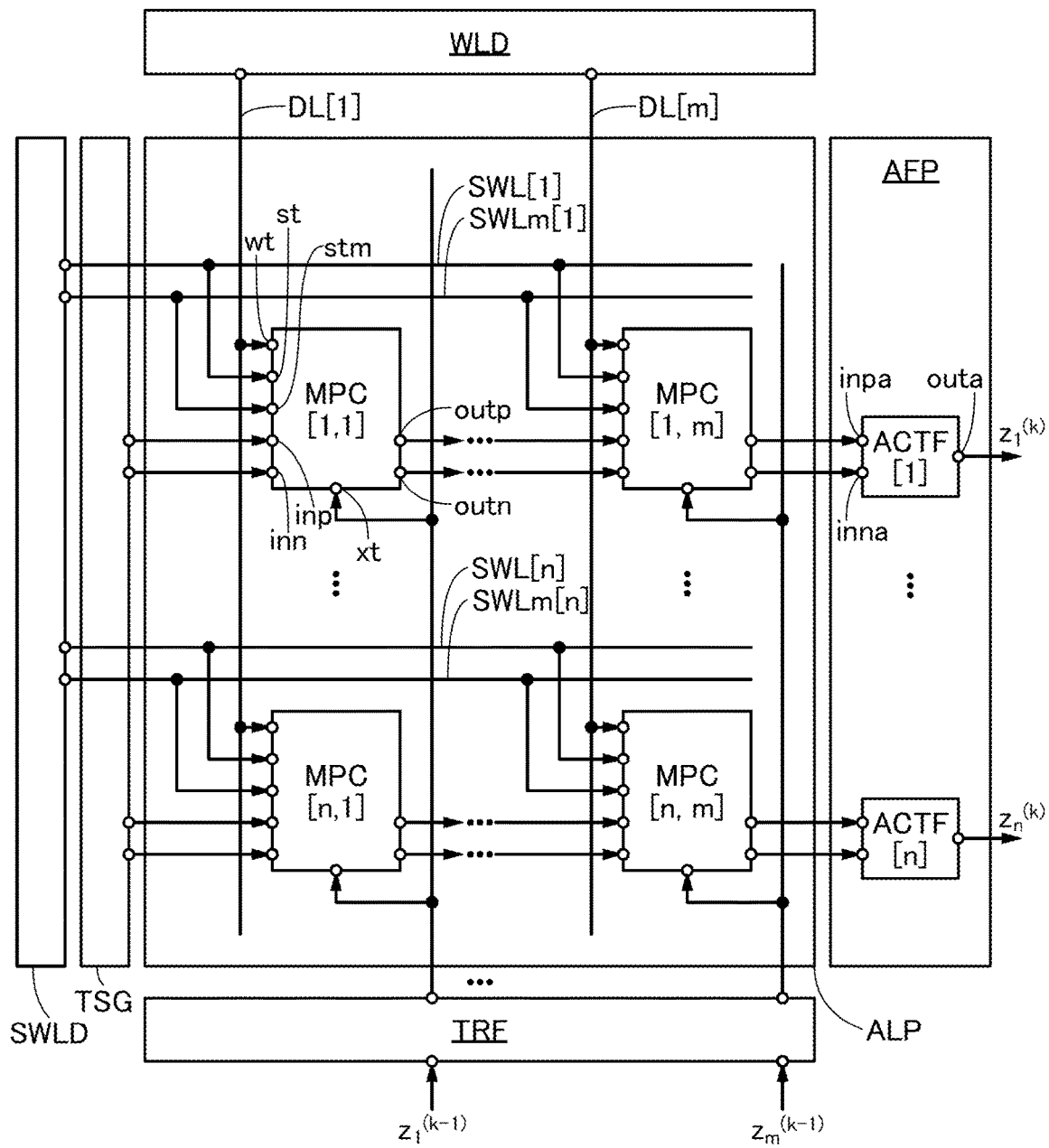
FIG. 11 is a block diagram illustrating a structure example of a semiconductor device.

FIG. 11 illustrates an example of an arithmetic circuit including the circuits MPC[i] in FIG. 10 arranged in a matrix of n rows and m columns as in the arithmetic circuit 120 in FIG. 9. An arithmetic circuit 130 in FIG. 11 is different from the arithmetic circuit 120 in FIG. 9 in some terminals of the circuit MPC and wirings connected to those terminals.

Each of the circuits MPC in the array portion ALP includes the terminal st and a terminal stm in addition to the terminal wt, the terminal wtm, the terminal xt, the terminal inp, the terminal inn, the terminal outp, and the terminal outn illustrated in FIG. 10. The terminal st is electrically connected to the wiring SL01 in the circuit BF1, and the terminal stm is electrically connected to the wiring SL01m in the circuit BF2. Since the terminal wt and the terminal wtm are electrically connected to each other in FIG. 10, the terminal wtm is not illustrated in FIG. 11 and the terminal wtm and the terminal wt are regarded as one terminal in the following description.

The terminals st of the circuits MPC[j, 1] to MPC[j, m] are electrically connected to the wiring SWL[j]. The wiring SWL[j] corresponds to the wiring SWL in FIG. 10, and FIG. 11 illustrates the wiring SWL[1] and the wiring SWL[n]. The terminals stm of the circuits MPC[j, 1] to MPC[j, m] are electrically connected to the wiring SWLm[j]. The wiring SWLm[j] corresponds to the wiring SWLm in FIG. 10, and FIG. 11 illustrates the wiring SWLm[1] and the wiring SWLm[n]. The terminals wt of the circuits MPC[1, i] to MPC[n, i] are electrically connected to the wiring DL[i]. The wiring DL[i] corresponds to the wiring DL in FIG. 10, and FIG. 11 illustrates the wiring DL[1] and the wiring DL[m].

In other words, in the arithmetic circuit 120, the potentials to be held in two holding units HCA in the circuit MPC are input from different wirings, and the on/off states of the transistor Tr03 and the transistor Tr03m are switched with one wiring. Meanwhile, in the arithmetic circuit 130, the potentials to be held in two holding units HCA in the circuit MPC are input from one wiring, and the on/off states of the transistor Tr03 and the transistor Tr03m are switched with different wirings.

Note that this embodiment can be combined with any of the other embodiments in this specification as appropriate.

Embodiment 3

In this embodiment, other configuration examples of the circuit MPC shown in Embodiment 1 will be described.

Figure 12A:
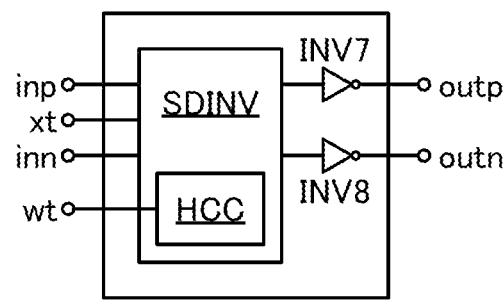
FIGS. 12A and 12B are block diagrams illustrating structure examples of a circuit included in a semiconductor device.

The circuit MPC illustrated in FIG. 12A includes a circuit SDINV, an inverter circuit INV7, and an inverter circuit INV8.

The circuit SDINV includes two input terminals and two output terminals. One of the two input terminals of the circuit SDINV is electrically connected to the terminal inp, and the other of the two input terminals of the circuit SDINV is electrically connected to the terminal inn. One of the two output terminals of the circuit SDINV is electrically connected to an input terminal of the inverter circuit INV7, and the other of the two output terminals of the circuit SDINV is electrically connected to an input terminal of the inverter circuit INV8. An output terminal of the inverter circuit INV7 is electrically connected to the terminal outp, and an output terminal of the inverter circuit INV8 is electrically connected to the terminal outn. The terminal wt and the terminal xt of the circuit MPC are electrically connected to the circuit SDINV.

The circuit SDINV has a function of selecting one of the input terminal of the inverter circuit INV7 and the output terminal of the inverter circuit INV8 as an output destination for a signal input to the terminal inp or the terminal inn of the circuit MPC. The circuit SDINV is electrically connected to the terminal xt and can determine the output destination in response to a signal input to the terminal xt (the signals $x_1^{(k-1)}$ to $x_m^{(k-1)}$ in FIG. 1A).

The circuit MPC in FIG. 12A has a function of changing the input/output time from the input of a signal to the terminal inp to the output of the signal from one of the terminal outp and the terminal outn, and a function of changing the input/output time from the input of a signal to the terminal inn to the output of the signal from the other of the terminal outp and the terminal outn. The input/output time can be determined by signals input to the terminal wt (the weight coefficients $w_1^{(k-1)(k)}_j$ to $w_m^{(k-1)(k)}_j$).

In the circuit MPC in FIG. 12A, the circuit SDINV includes a holding unit HCC. The holding unit HCC has a function of holding a potential corresponding to the signal input from the terminal wt, and the circuit MPC can vary the input/output time in accordance with the potential. When the holding unit HCC has a function of setting and holding a parameter such as a resistance in accordance with the signal input from the terminal wt instead of a function of holding a potential, the input/output time can vary depending on the parameter.

Like the inverter circuit INV1 and the inverter circuit INV2 described in Embodiment 1, the inverter circuit INV7 and the inverter circuit INV8 have a function of outputting an inverted signal of a signal input thereto. In the circuit MPC in FIG. 12A, the circuit SDINV may include one or more inverter circuits. When the circuit SDINV includes an inverter circuit, the circuit MPC in FIG. 12A also serves as a circuit that corrects a signal input to the terminal inp and outputs the corrected signal to one of the terminal outp and the terminal outn and corrects a signal input to the terminal inn and outputs the corrected signal to the other of the terminal outp and the terminal outn. Note that the number of inverter circuits included in the circuit MPC is not limited to two but is preferably an even number other than zero because a circuit that outputs a signal with the same logic value as an input signal is configured more easily.

Note that the configuration of the circuit MPC in FIG. 12A may be changed depending on circumstances. For example, instead of the inverter circuits included in the circuit MPC in FIG. 12A, an amplifier circuit may be configured with a logic circuit, a signal converter circuit (e.g., an analog-to-digital converter circuit or a digital-to-analog converter circuit), a potential level converter circuit, or the like.

Figure 12B:
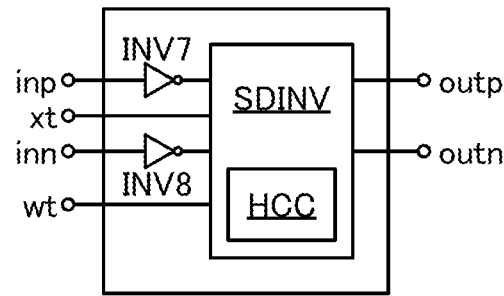

A another example, as illustrated in FIG. 12B, the inverter circuit INV7 and the inverter circuit INV8 may be provided at different positions from FIG. 12A. In the circuit MPC in FIG. 12B, the input terminal of the inverter circuit INV7 is electrically connected to the terminal inp, the output terminal of the inverter circuit INV7 is electrically connected to one of the two input terminals of the circuit SDINV, one of the two output terminals of the circuit SDINV is electrically connected to the terminal outp, the input terminal of the inverter circuit INV8 is electrically connected to the terminal inn, the output terminal of the inverter circuit INV8 is electrically connected to the other input terminal of the circuit SDINV, and the other output terminal of the circuit SDINV is electrically connected to the terminal outn.

Configuration Example 1

Figure 13:
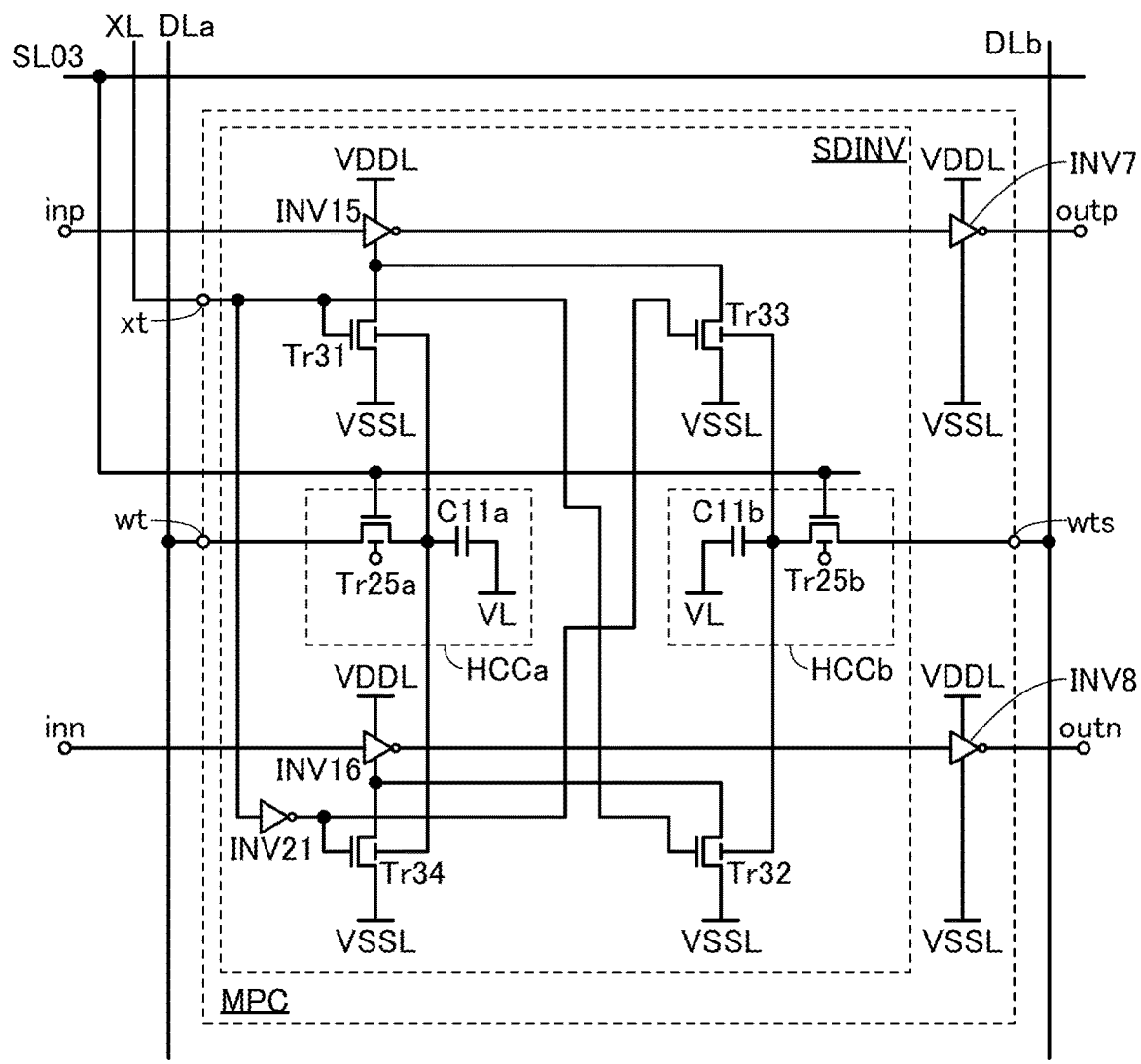
FIG. 13 is a circuit diagram illustrating a structure example of a circuit included in a semiconductor device.

FIG. 13 illustrates a specific configuration example of the circuit MPC in FIG. 12A. The circuit SDINV in the circuit MPC in FIG. 13 includes transistors Tr31 to Tr34, an inverter circuit INV15, an inverter circuit INV16, and an inverter circuit INV21. The holding unit HCC in the circuit SDINV in FIG. 12A is shown as a holding unit HCCa and a holding unit HCCb in FIG. 13. The holding unit HCCa includes a transistor Tr25a and a capacitor C11a. The holding unit HCCb includes a transistor Tr25b and a capacitor C11b.

Each of the transistors Tr31 to Tr34 has a back gate. The transistors Tr31 to Tr34 are preferably the OS transistors described in the foregoing embodiment. Alternatively, the transistors Tr31 to Tr34 may be Si transistors.

An input terminal of the inverter circuit INV15 is electrically connected to the terminal inp. An output terminal of the inverter circuit INV15 is electrically connected to the input terminal of the inverter circuit INV7. A high power supply potential input terminal of the inverter circuit INV15 is electrically connected to the wiring VDDL. A low power supply potential input terminal of the inverter circuit INV15 is electrically connected to a first terminal of the transistor Tr31 and a first terminal of the transistor Tr33. An input terminal of the inverter circuit INV16 is electrically connected to the terminal inn. An output terminal of the inverter circuit INV16 is electrically connected to the input terminal of the inverter circuit INV8. A high power supply potential input terminal of the inverter circuit INV16 is electrically connected to the wiring VDDL. A low power supply potential input terminal of the inverter circuit INV16 is electrically connected to a first terminal of the transistor Tr32 and a first terminal of the transistor Tr34.

A second terminal of the transistor Tr31 is electrically connected to the wiring VSSL, and a back gate of the transistor Tr31 is electrically connected to the holding unit HCCa. A second terminal of the transistor Tr32 is electrically connected to the wiring VSSL, and a back gate of the transistor Tr32 is electrically connected to the holding unit HCCb. A second terminal of the transistor Tr33 is electrically connected to the wiring VSSL, and a back gate of the transistor Tr33 is electrically connected to the holding unit HCCb. A second terminal of the transistor Tr34 is electrically connected to the wiring VSSL, and a back gate of the transistor Tr34 is electrically connected to the holding unit HCCa.

In the holding unit HCCa, a first terminal of the transistor Tr25a is electrically connected to a first terminal of the capacitor C11a, the back gate of the transistor Tr31, and the back gate of the transistor Tr34; a second terminal of the transistor Tr25a is electrically connected to a wiring DLa through the terminal wt; and a gate of the transistor Tr25a is electrically connected to a wiring SL03. A second terminal of the capacitor C11a is electrically connected to the wiring VL.

In the holding unit HCCb, a first terminal of the transistor Tr25b is electrically connected to a first terminal of the capacitor C11b, the back gate of the transistor Tr32, and the back gate of the transistor Tr33; a second terminal of the transistor Tr25b is electrically connected to a wiring DLb through a terminal wts; and a gate of the transistor Tr25b is electrically connected to the wiring SL03. A second terminal of the capacitor C11b is electrically connected to the wiring VL.

Note that in a transistor including a back gate in this specification and the like, where its gate is electrically connected and where the back gate is electrically connected may be replaced with each other. For example, in FIG. 13, a gate of the transistor Tr31 is electrically connected to the terminal xt and the back gate of the transistor Tr31 is electrically connected to the holding unit HCCa; alternatively, the holding unit HCCa may be electrically connected to the gate of the transistor Tr31 and the terminal xt may be electrically connected to the back gate of the transistor Tr31. The portions where the gate and the back gate are electrically connected may be interchanged in all or some of the transistors Tr31 to Tr34. In a possible example, the holding unit HCCa is electrically connected to the gates of the transistors Tr31 and Tr34, the holding unit HCCb is electrically connected to the gates of the transistors Tr32 and Tr33, the terminal xt is electrically connected to the back gates of the transistors Tr31 and Tr32, and an output terminal of the inverter circuit INV21 is electrically connected to the back gates of the transistors Tr33 and Tr34. As another possible example, the portions where the gate and the back gate are electrically connected are not changed in the transistors Tr31, Tr33, and Tr34, the holding unit HCCb is electrically connected to the gate of the transistor Tr32, and the terminal xt is electrically connected to the back gate of the transistor Tr32.

Also in a transistor including a back gate in configuration examples other than that in FIG. 13, portions where its gate and back gate are electrically connected may be interchanged.

Like the wiring VSSL described in Embodiment 1, the wiring VSSL functions as a voltage line that supplies the voltage VSS, which is a low level potential. The wiring VL functions as a voltage line that supplies a constant voltage like the wiring VL described in Embodiment 1. The constant voltage can be VDD, VSS, a ground potential, or the like.

The holding unit HCCa has a function of holding a potential corresponding to a signal input from the terminal wt, and the holding unit HCCb has a function of holding a potential corresponding to a signal input from the terminal wts. That is, the wiring DLa electrically connected to the terminal wt functions as a signal line that supplies a potential to be held in the holding unit HCCa, and the wiring DLb electrically connected to the terminal wts functions as a signal line that supplies a potential to be held in the holding unit HCCb. A potential held in the holding units HCCa and HCCb can be, for example, a high-level or low-level potential representing a digital value or a potential representing an analog value.

The transistor Tr25a included in the holding unit HCCa functions as a switching element, and the supply of a potential from the wiring SL03 to the gate of the transistor Tr25a can turn on or off the transistor Tr25a. Similarly, the transistor Tr25b included in the holding unit HCCb functions as a switching element, and the supply of a potential from the wiring SL03 to the gate of the transistor Tr25b can turn on or off the transistor Tr25b.

When the transistor Tr25a and the transistor Tr25b are turned on by the supply of a high-level potential to the wiring SL03, electrical continuity is established between the terminal wt and the first terminal of the capacitor C11a and between the terminal wts and the first terminal of the capacitor C11b. At that time, when receiving signals from the terminal wt and the terminal wts, the circuit MPC can supply the potentials corresponding to the signals to the first terminals of the capacitors C11a and C11b. After the potentials are written to the first terminals of the capacitors C11a and C11b, a low-level potential is supplied to the wiring SL03 to turn off the transistor Tr25a and the transistor Tr25b, whereby the potentials can be held in the holding unit HCCa and the holding unit HCCb.

To hold the potentials in the holding unit HCCa and the holding unit HCCb for a long time, the transistor Tr25a and the transistor Tr25b are preferably the OS transistors with an extremely low off-state current. The transistor Tr25a and the transistor Tr25b may each have a back gate as illustrated in FIG. 13. The detailed electrical connections of the back gates of the transistor Tr25a and the transistor Tr25b are not illustrated in FIG. 13; for example, when the gate and the back gate of the transistor Tr25a (the transistor Tr25b) are electrically connected to each other, the on-state current of the transistor Tr25a (the transistor Tr25b) can be increased. As another example, when the back gate of the transistor Tr25a (the transistor Tr25b) is electrically connected to a wiring that supplies a voltage increasing the threshold voltage, the off-state current of the transistor Tr25a (the transistor Tr25b) can be reduced. Note that each of the transistors Tr25a and Tr25b does not necessarily have the back gate.

As described in Embodiment 1, the potential corresponding to the weight coefficient $w_i^{(k-1)(k)}_j$ is input as a signal to the terminal wt. The potential can be a binary potential, such as a low-level potential or a high-level potential, or an analog potential, for example. An intermediate potential is input as a signal to the terminal wts. The intermediate potential can be a potential that is higher than a low-level potential and is lower than a high-level potential. That is, the intermediate potential input to the terminal wts can be regarded as a reference potential for the potentials input to the terminal wt. Accordingly, the wiring DLa supplies the potential corresponding to the weight coefficient $w_i^{(k-1)(k)}_j$, and the wiring DLb supplies the intermediate potential.

As described in Embodiment 1, the potential corresponding to the signal $x_i^{(k-1)}$ is input as a signal to the terminal xt. The signal $x_i^{(k-1)}$ can be a signal with a low-level potential or a high-level potential.

Figure 14:
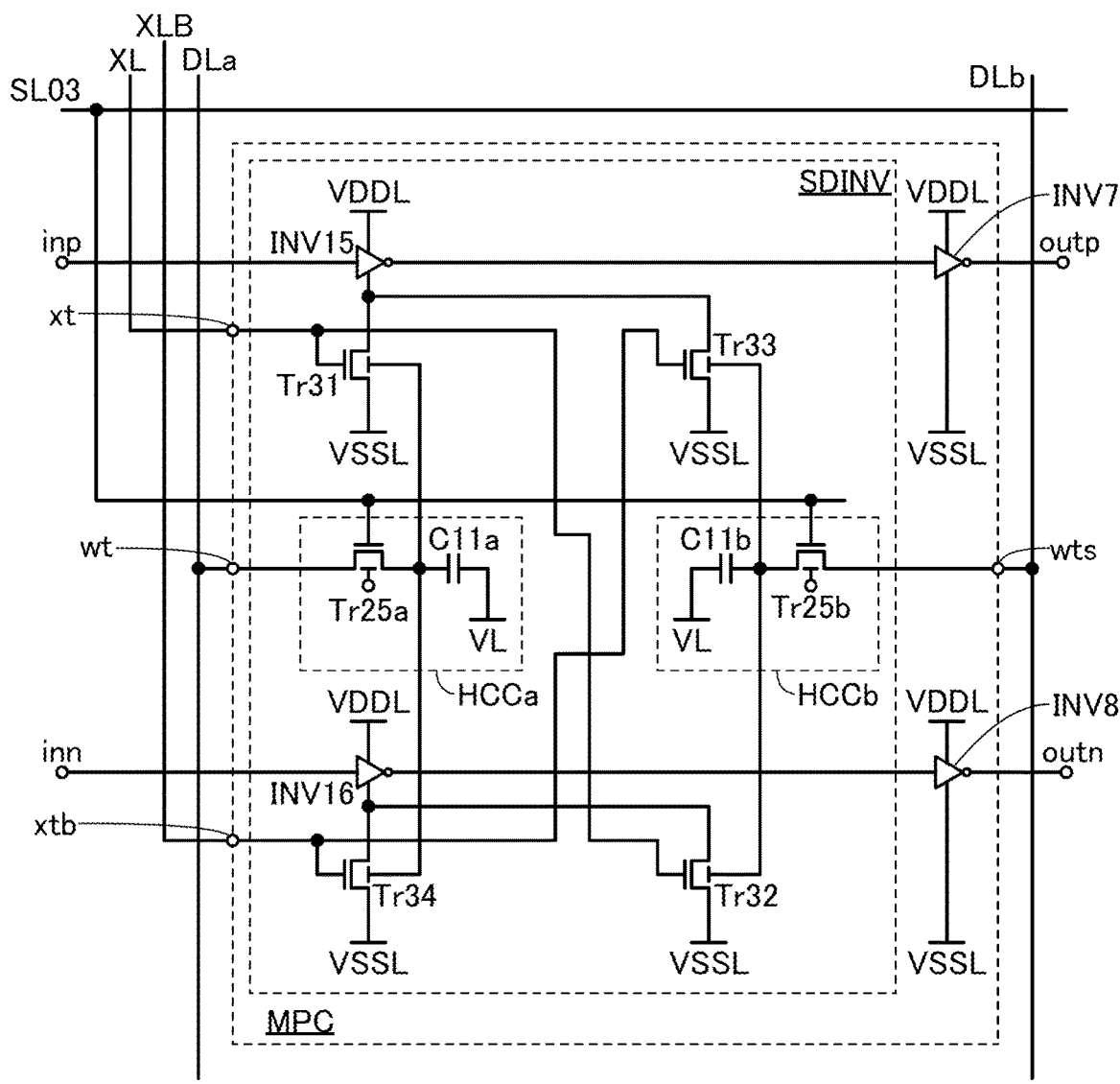
FIG. 14 is a circuit diagram illustrating a structure example of a circuit included in a semiconductor device.

Note that the configuration of the circuit MPC in FIG. 12A is not limited to that of the circuit MPC in FIG. 13 and may be changed from the circuit configuration in FIG. 13 depending on the situation. For example, a configuration in which the inverter circuit INV21 in the circuit SDINV of the circuit MPC in FIG. 13 is not provided as illustrated in FIG. 14 may be employed. In this case, the circuit MPC in FIG. 14 is provided with a terminal xtb, and a wiring XLB is electrically connected to the terminal xtb. An inverted signal of a signal supplied to a wiring XL is input to the wiring XLB, whereby the circuit MPC in FIG. 14 can operate in the same manner as the circuit MPC in FIG. 13.

Figure 15:
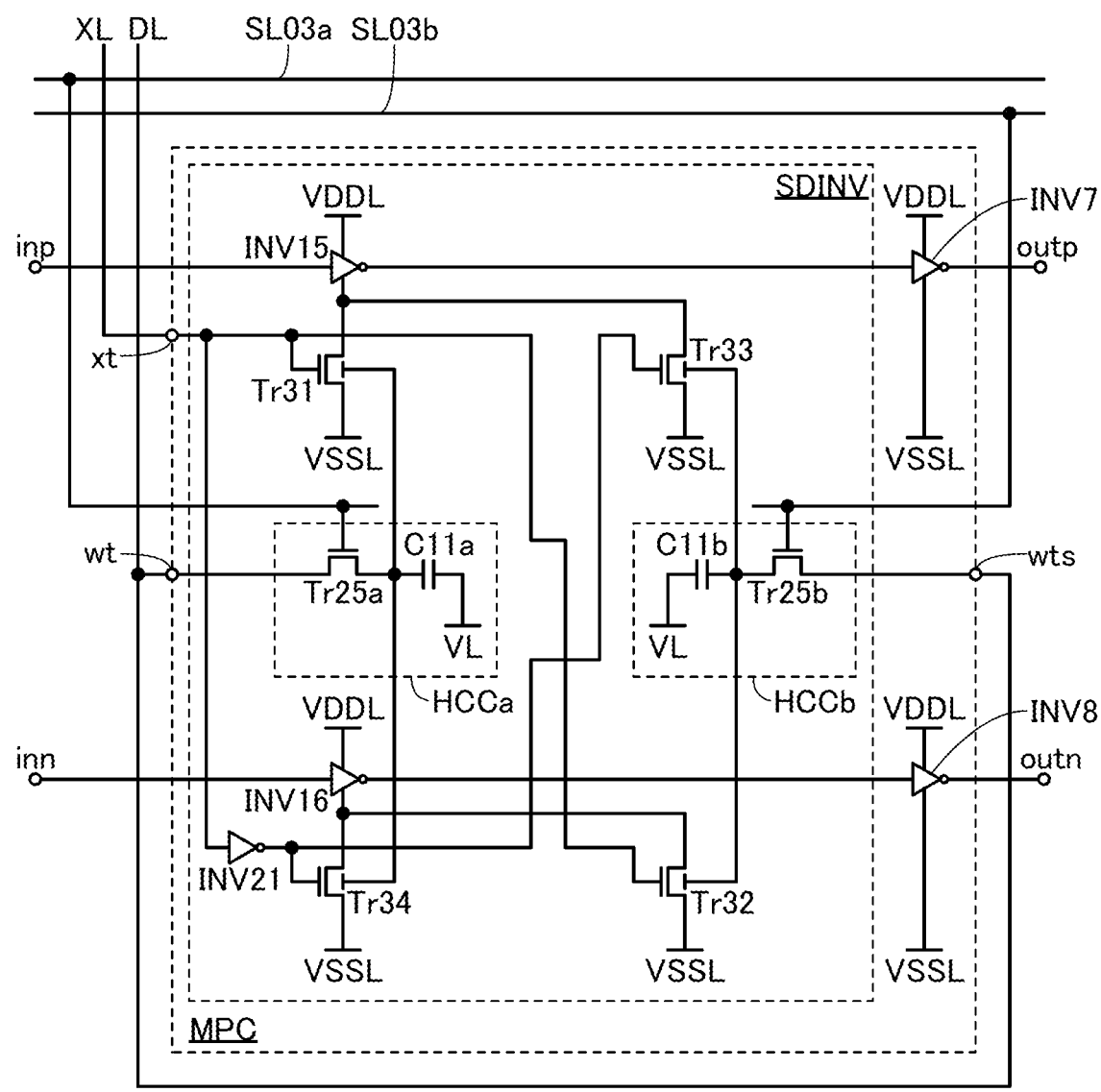
FIG. 15 is a circuit diagram illustrating a structure example of a circuit included in a semiconductor device.

As another example, the circuit MPC illustrated in FIG. 15 can be used as the circuit MPC in FIG. 12A. Electrical connections between wirings in the circuit MPC in FIG. 15 are different from those in FIG. 13; a wiring SL03a is electrically connected to the gate of the transistor Tr25a in the holding unit HCCa, a wiring SL03b is electrically connected to the gate of the transistor Tr25b in the holding unit HCCb, and the wiring DL is electrically connected to the terminal wt and the terminal wts. That is, the circuit MPC in FIG. 15 differs from that in FIG. 13 in that the wiring DLa and the wiring DLb are combined into one wiring DL and the wiring SL03 is divided into the wiring SL03a and the wiring SL03b. To write different potentials to the holding unit HCCa and the holding unit HCCb in the circuit MPC in FIG. 15, the potentials cannot be supplied at the same time because the wiring DL is electrically connected to the terminal wt and the terminal wts. For that reason, in the circuit MPC in FIG. 15, one of the transistor Tr25a and the transistor Tr25b is turned on and the other is turned off with the wiring SL03a and the wiring SL03b to supply the potential of the wiring DL to one of the holding unit HCCa and the holding unit HCCb.

Although the back gates of the transistor Tr25a and the transistor Tr25b are not illustrated in FIG. 15, the transistor Tr25a and the transistor Tr25b may each have the back gate as in FIG. 13. Unless otherwise specified, the presence or absence of a back gate of a transistor described in this specification and the like is not limited. For example, even when a back gate of a transistor is not illustrated in the drawings, the transistor can have a back gate.

Figure 16:
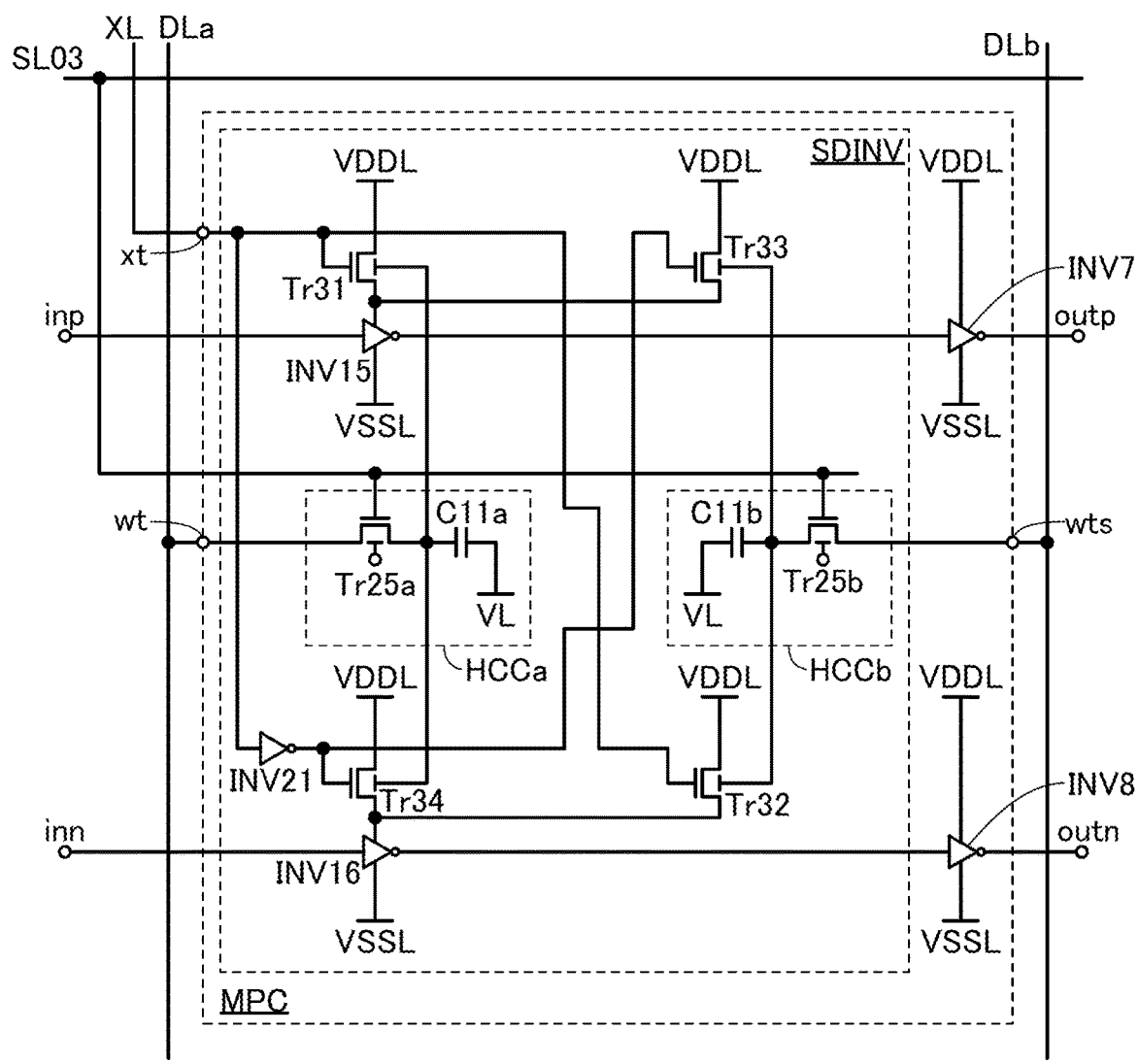
FIG. 16 is a circuit diagram illustrating a structure example of a circuit included in a semiconductor device.

As another example, the circuit MPC illustrated in FIG. 16 can be used as the circuit MPC in FIG. 12A. In the circuit MPC in FIG. 16, the first terminal of the transistor Tr31 and the first terminal of the transistor Tr33 are electrically connected to the high power supply potential input terminal of the inverter circuit INV15, and the first terminal of the transistor Tr32 and the first terminal of the transistor Tr34 are electrically connected to the high power supply potential input terminal of the inverter circuit INV16. In FIG. 13, the transistors are electrically connected to the low power supply potential input terminals of the inverter circuits INV15 and INV16; alternatively, the transistors can be electrically connected to the high power supply potential input terminals of the inverter circuits INV15 and INV16 as in the circuit MPC in FIG. 16. Therefore, in this specification and the like, the term "low power supply potential input terminal" can be replaced with the term "high power supply potential input terminal" when the wiring VSSL and the wiring VDDL are appropriately interchanged with each other. Moreover, one or both of the low power supply potential input terminal and the high power supply potential input terminal may be referred to as a power supply potential input terminal.

In FIG. 16, the transistors Tr31 to Tr34 can be, for example, OS transistors as in the description of FIG. 12A. As another example, the transistors Tr31 to Tr34 can be p-channel transistors with a silicon-on-insulator (SOI) structure (not illustrated). In particular, the transistors connected to the high power supply potential input terminals of the inverter circuits INV15 and INV16 are preferably p-channel transistors. This is because if an n-channel transistor is electrically connected to the high power supply potential input terminals of the inverter circuits INV15 and INV16, a voltage lower than the high-level potential VDD (to be precise, a voltage obtained by subtracting the threshold voltage of the n-channel transistor from the high-level potential VDD) is sometimes input to the high power supply potential input terminals of the inverter circuits INV15 and INV16.

Figure 17:
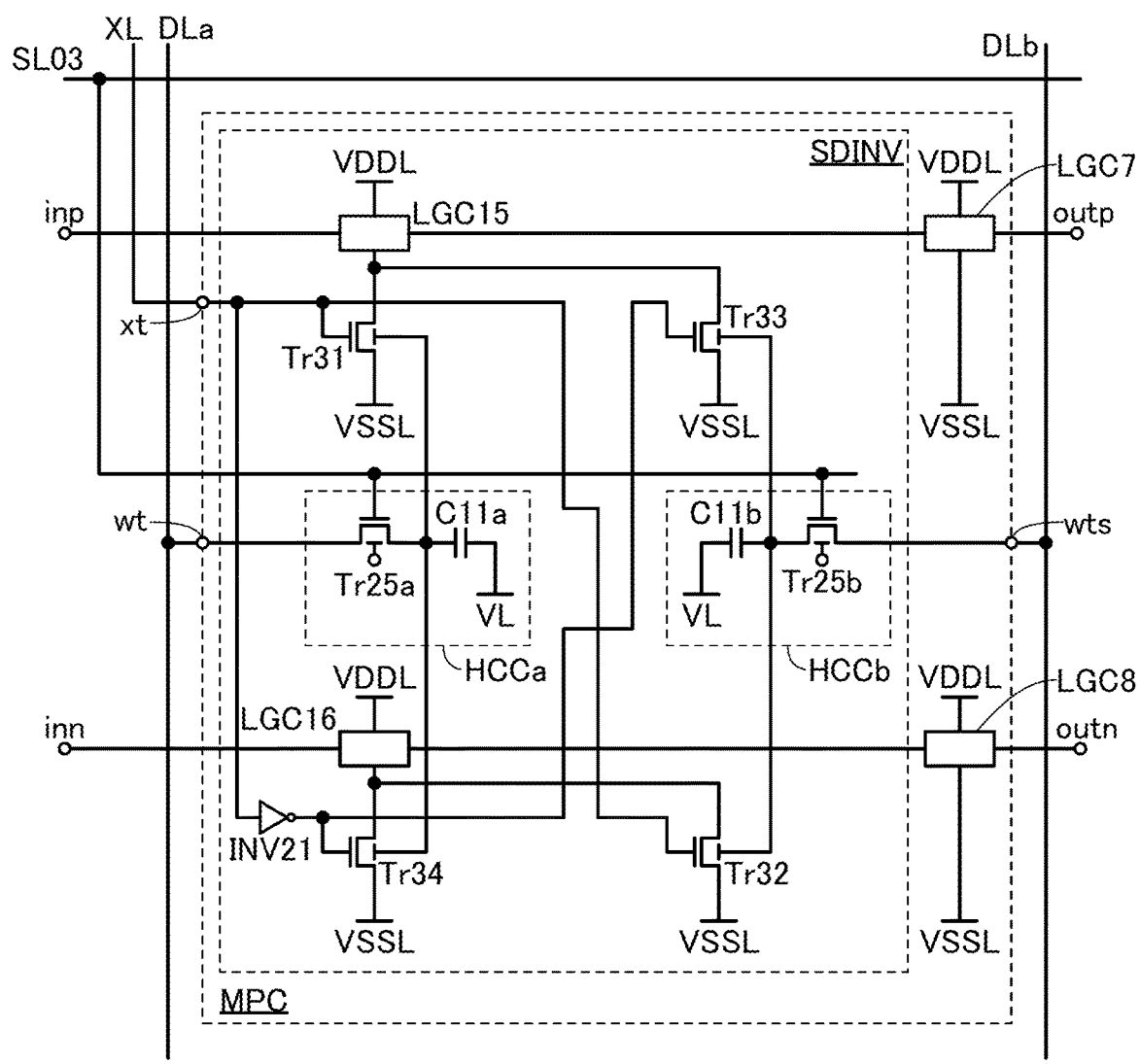
FIG. 17 is a block diagram illustrating a structure example of a circuit included in a semiconductor device.

As another example, the circuit MPC illustrated in FIG. 17 can be used as the circuit MPC in FIG. 12A. In circuit MPC in FIG. 17, the inverter circuit INV7, the inverter circuit INV8, the inverter circuit INV15, and the inverter circuit INV16 included in the circuit MPC in FIG. 13 are replaced with a logic circuit LGC7, a logic circuit LGC8, a logic circuit LGC15, and a logic circuit LGC16, respectively. The logic circuits LGC7, LGC8, LGC15, and LGC16 have a function of generating and outputting an inverted signal of a signal input thereto, and their examples are the inverter circuits INV7, INV8, INV15, and INV16 described above. Examples of circuits that can be used for the logic circuits LGC7, LGC8, LGC15, and LGC16 other than an inverter circuit include a NAND circuit, a NOR circuit, an XOR circuit, and a circuit configured with a combination of these circuits. When aNAND circuit is used as the logic circuits LGC7, LGC8, LGC15, and LGC16, the NAND circuit can function as an inverter circuit by input of a high-level potential to one of two input terminals of the NAND circuit as a fixed potential. When a NOR circuit is used as the logic circuits LGC7, LGC8, LGC15, and LGC16, the NOR circuit can function as an inverter circuit by input of a low-level potential to one of two input terminals of the NOR circuit as a fixed potential. When an XOR circuit is used as the logic circuits LGC7, LGC8, LGC15, and LGC16, the XOR circuit can function as an inverter circuit by input of a high-level potential to one of two input terminals of the XOR circuit as a fixed potential.

As described above, the inverter circuits INV7, INV8, INV15, and INV16 can be replaced with a logic circuit such as a NAND circuit, a NOR circuit, an XOR circuit, or a circuit configured with a combination of these circuits. Therefore, in this specification and the like, the term "inverter circuit" can be referred to as a logic circuit in a broad sense.

<<Arithmetic Operation>>

Next, an operation example in which the circuit MPC in FIG. 13 is used as the arithmetic circuit 110 in FIG. 1A is described. In this operation example, the description is made with a focus on the circuit MPC[i] of the arithmetic circuit 110 in FIG. 1A. Note that the description of the contents already described in Embodiment 1 is omitted.

In the initial operation, a potential corresponding to the signal $x_i^{(k-1)}$ is input to the terminal xt. Thus, the transistors Tr31 to Tr34 are turned on or off in response to the potential corresponding to the signal $x_i^{(k-1)}$.

A potential corresponding to the weight coefficient $w_i^{(k-1)}{}_j^{(k)}$ is input to the wiring DLa, and an intermediate potential is input to the wiring DLb. After that, a high-level potential is supplied to the wiring SL03 to turn on the transistor Tr25a and the transistor Tr25b. With this operation, the potential corresponding to the weight coefficient $w_i^{(k-1)}{}_j^{(k)}$ is supplied to the first terminal of the capacitor C11a from the wiring DLa through the terminal wt, and the intermediate potential is supplied to the first terminal of the capacitor C11b from the wiring DLb through the terminal wts. Thus, the threshold voltages of the transistor Tr31 and the transistor Tr34 change in accordance with the weight coefficient $w_i^{(k-1)}{}_j^{(k)}$, and the threshold voltages of the transistor Tr32 and the transistor Tr33 change in accordance with the intermediate potential. Lastly, a low-level potential is supplied to the wiring SL03 to turn off the transistor Tr25a and the transistor Tr25b, whereby the potentials of the first terminals of the capacitor C11a and the capacitor C11b can be held.

After the initial operation, a signal Sp[i−1] and a signal Sn[i−1] are input to the terminal inp and the terminal inn, respectively, of the circuit MPC[i] (here, i is an integer greater than or equal to 1 and less than or equal to m), whereby arithmetic operation starts in the circuit MPC[i]. In particular, when i is 1, the signal Sp[0] and the signal Sn[0] are input to the terminal inp and the terminal inn, respectively, of the circuit MPC[1] with little time lag (substantially at the same time). When i is greater than or equal to 2, the signal Sp[i−1] and the signal Sn[i−1] are output from the circuit MPC[i−1]; thus, a time lag therebetween occurs sometimes. In the description of the arithmetic operation, for convenience, the signal Sp[i−1] and the signal Sn[i−1] are input to the terminal inp and the terminal inn, respectively, of the circuit MPC[i] with little time lag (substantially at the same time).

[Condition 1]

The case where the potential corresponding to the weight coefficient $w_i^{(k-1)}{}_j^{(k)}$ is a high-level potential and the potential corresponding to the signal $x_i^{(k-1)}$ is a high-level potential is considered.

In this case, the transistors Tr31 and Tr32 are turned on and the transistors Tr33 and Tr34 are turned off; thus, a low power supply potential is supplied to the inverter circuit INV15 from the wiring VSSL through the transistor Tr31 and supplied to the inverter circuit INV16 from the wiring VSSL through the transistor Tr32.

The high-level potential is supplied to the back gate of the transistor Tr31, and the intermediate potential is supplied to the back gate of the transistor Tr32; hence, the amount of current flowing between the source and the drain of the transistor Tr31 is larger than that of current flowing between the source and the drain of the transistor Tr32. Thus, the speed of signal transmission from the input terminal to the output terminal of the inverter circuit INV15 is higher than that from the input terminal to the output terminal of the inverter circuit INV16. Consequently, when signals are input to the terminal inp and the terminal inn at the same time, the signal input to the terminal inp is output to the terminal outp first, and then, the signal input to the terminal inn is output to the terminal outn.

Since the signal is output from the terminal outp before the signal is output from the terminal outn, the timing chart for the circuit MPC[i] in this condition can be the same as the timing chart in FIG. 7A. At Time T2, the potential of the terminal outp becomes high, and then, the potential of the terminal outn becomes high at Time T3. That is, the signal Sp[i] is output as an output signal from the terminal outp at Time T2, and the signal Sn[i] is output as an output signal from the terminal outn at Time T3.

Unlike the circuit MPC in FIG. 2A described in Embodiment 1, the circuit MPC in FIG. 13 does not include the switching circuit SC; therefore, the curved arrows that indicate switching of signal output destinations in FIG. 7A are negligible when driving of the circuit MPC in FIG. 13 is considered. Similarly, the curved arrows in FIGS. 7B to 7D are negligible under conditions 2 to 4 described later.

[Condition 2]

The case where the potential corresponding to the weight coefficient $w_i^{(k-1)}{}_j^{(k)}$ is a low-level potential and the potential corresponding to the signal $x_i^{(k-1)}$ is a high-level potential is considered.

In this case, the transistors Tr31 and Tr32 are turned on and the transistors Tr33 and Tr34 are turned off; thus, a low power supply potential is supplied to the inverter circuit INV15 from the wiring VSSL through the transistor Tr31 and supplied to the inverter circuit INV16 from the wiring VSSL through the transistor Tr32.

The low-level potential is supplied to the back gate of the transistor Tr31, and the intermediate potential is supplied to the back gate of the transistor Tr32; hence, the amount of current flowing between the source and the drain of the transistor Tr31 is smaller than that of current flowing between the source and the drain of the transistor Tr32. Thus, the speed of signal transmission from the input terminal to the output terminal of the inverter circuit INV15 is lower than that from the input terminal to the output terminal of the inverter circuit INV16. Consequently, when signals are input to the terminal inp and the terminal inn at the same time, the signal input to the terminal inn is output to the terminal outn first, and then, the signal input to the terminal inp is output to the terminal outp.

Since the signal is output from the terminal outp after the signal is output from the terminal outn, the timing chart for the circuit MPC[i] in this condition can be the same as the timing chart in FIG. 7B. At Time T3, the potential of the terminal outn becomes high, and then, the potential of the terminal outp becomes high at Time T4. That is, the signal Sn[i] is output as the output signal from the terminal outn at Time T3, and the signal Sp[i] is output as the output signal from the terminal outp at Time T4.

[Condition 3]

The case where the potential corresponding to the weight coefficient $w_i^{(k-1)}{}_j^{(k)}$ is a high-level potential and the potential corresponding to the signal $x_i^{(k-1)}$ is a low-level potential is considered.

In this case, the transistors Tr31 and Tr32 are turned off and the transistors Tr33 and Tr34 are turned on; thus, a low power supply potential is supplied to the inverter circuit INV15 from the wiring VSSL through the transistor Tr33 and supplied to the inverter circuit INV16 from the wiring VSSL through the transistor Tr34.

The high-level potential is supplied to the back gate of the transistor Tr34, and the intermediate potential is supplied to the back gate of the transistor Tr33; hence, the amount of current flowing between the source and the drain of the transistor Tr34 is larger than that of current flowing between the source and the drain of the transistor Tr33. Thus, the speed of signal transmission from the input terminal to the output terminal of the inverter circuit INV16 is higher than that from the input terminal to the output terminal of the inverter circuit INV15. Consequently, when signals are input to the terminal inp and the terminal inn at the same time, the signal input to the terminal inn is output to the terminal outn first, and then, the signal input to the terminal inp is output to the terminal outp.

Since the signal is output from the terminal outp after the signal is output from the terminal outn, the timing chart for the circuit MPC[i] in this condition can be the same as the timing chart in FIG. 7C. At Time T2, the potential of the terminal outn becomes high, and then, the potential of the terminal outp becomes high at Time T3. That is, the signal Sn[i] is output as the output signal from the terminal outn at Time T2, and the signal Sp[i] is output as the output signal from the terminal outp at Time T3.

[Condition 4]

The case where the potential corresponding to the weight coefficient $w_i^{(k-1)}{}_j^{(k)}$ is a low-level potential and the potential corresponding to the signal $x_i^{(k-1)}$ is a low-level potential is considered.

In this case, the transistors Tr31 and Tr32 are turned off and the transistors Tr33 and Tr34 are turned on; thus, a low power supply potential is supplied to the inverter circuit INV15 from the wiring VSSL through the transistor Tr33 and supplied to the inverter circuit INV16 from the wiring VSSL through the transistor Tr34.

The low-level potential is supplied to the back gate of the transistor Tr34, and the intermediate potential is supplied to the back gate of the transistor Tr33; hence, the amount of current flowing between the source and the drain of the transistor Tr34 is smaller than that of current flowing between the source and the drain of the transistor Tr33. Thus, the speed of signal transmission from the input terminal to the output terminal of the inverter circuit INV16 is lower than that from the input terminal to the output terminal of the inverter circuit INV15. Consequently, when signals are input to the terminal inp and the terminal inn at the same time, the signal input to the terminal inp is output to the terminal outp first, and then, the signal input to the terminal inn is output to the terminal outn.

Since the signal is output from the terminal outp before the signal is output from the terminal outn, the timing chart for the circuit MPC[i] in this condition can be the same as the timing chart in FIG. 7D. At Time T3, the potential of the terminal outp becomes high, and then, the potential of the terminal outn becomes high at Time T4. That is, the signal Sp[i] is output as the output signal from the terminal outp at Time T3, and the signal Sn[i] is output as the output signal from the terminal outn at Time T4.

In the conditions 1 to 4, the time lag T[i] between the output of the signal Sn[i] from the terminal outn and the output of the signal Sp[i] from the terminal outp is determined by the potential corresponding to the weight coefficient $w_i^{(k-1)}{}_j^{(k)}$ and the potential corresponding to the signal $x_i^{(k-1)}$, as in the description of the arithmetic operation example in Embodiment 1. Specifically, when the transistor Tr31 and the transistor Tr34 operate with a potential supplied to the gates of the transistor Tr31 and the transistor Tr34 (the potential corresponding to the signal $x_i^{(k-1)}$) in the range of −0.8 V to 2.5 V, a high-level potential of 1.5 V or higher and a low-level potential of lower than 1.5 V are supplied as the potential corresponding to the weight coefficient $w_i^{(k)}{}_j^{(k)}$ to the back gates of the transistor Tr31 and the transistor Tr34. When the transistor Tr32 and the transistor Tr33 operate with a potential supplied to the gates of the transistor Tr32 and the transistor Tr33 (the potential corresponding to the signal $x_i^{(k-1)}$) in the range of −0.8 V to 2.5 V, a potential between the high-level potential and the low-level potential, which are supplied to the back gates of the transistor Tr31 and the transistor Tr34, is supplied as the intermediate potential to the back gates of the transistor Tr32 and the transistor Tr33. For the relation between the time lag T[i], the weight coefficient $w_i^{(k-1)}{}_j^{(k)}$, and the signal $x_i^{(k-1)}$, refer to the description of the arithmetic operation example in Embodiment 1.

Although a potential corresponding to the weight coefficient $w_i^{(k-1)}{}_j^{(k)}$ is described as a high-level potential or a low-level potential in the above conditions 1 to 4, a potential corresponding to the weight coefficient $w_i^{(k-1)}{}_j^{(k)}$ may be an analog potential other than a high-level potential and a low-level potential.

As described above, when the signal Sp[i−1] and the signal Sn[i−1] are input to the circuit MPC[i], the circuit MPC[i] outputs the two signals Sp[i] and Sn[i] to which the time lag T[i], which depends on the potential corresponding to the weight coefficient $w_i^{(k-1)}{}_j^{(k)}$ and the potential corresponding to the signal $x_i^{(k-1)}$, is added.

Then, as in FIG. 1A, the arithmetic circuit 110 is configured using the m connected circuits MPC, whereby the signal $z_j^{(k)}$ can be output from the terminal outa of the circuit ACTF. For the arithmetic operation in this case, refer to the description in Embodiment 1 about the arithmetic operation in the case where a plurality of circuits MPC are connected.

Configuration Example 2

Next, a configuration example of a circuit that can be used as the circuit MPC in FIG. 12A and is different from Configuration example 1 is described.

Figure 18:
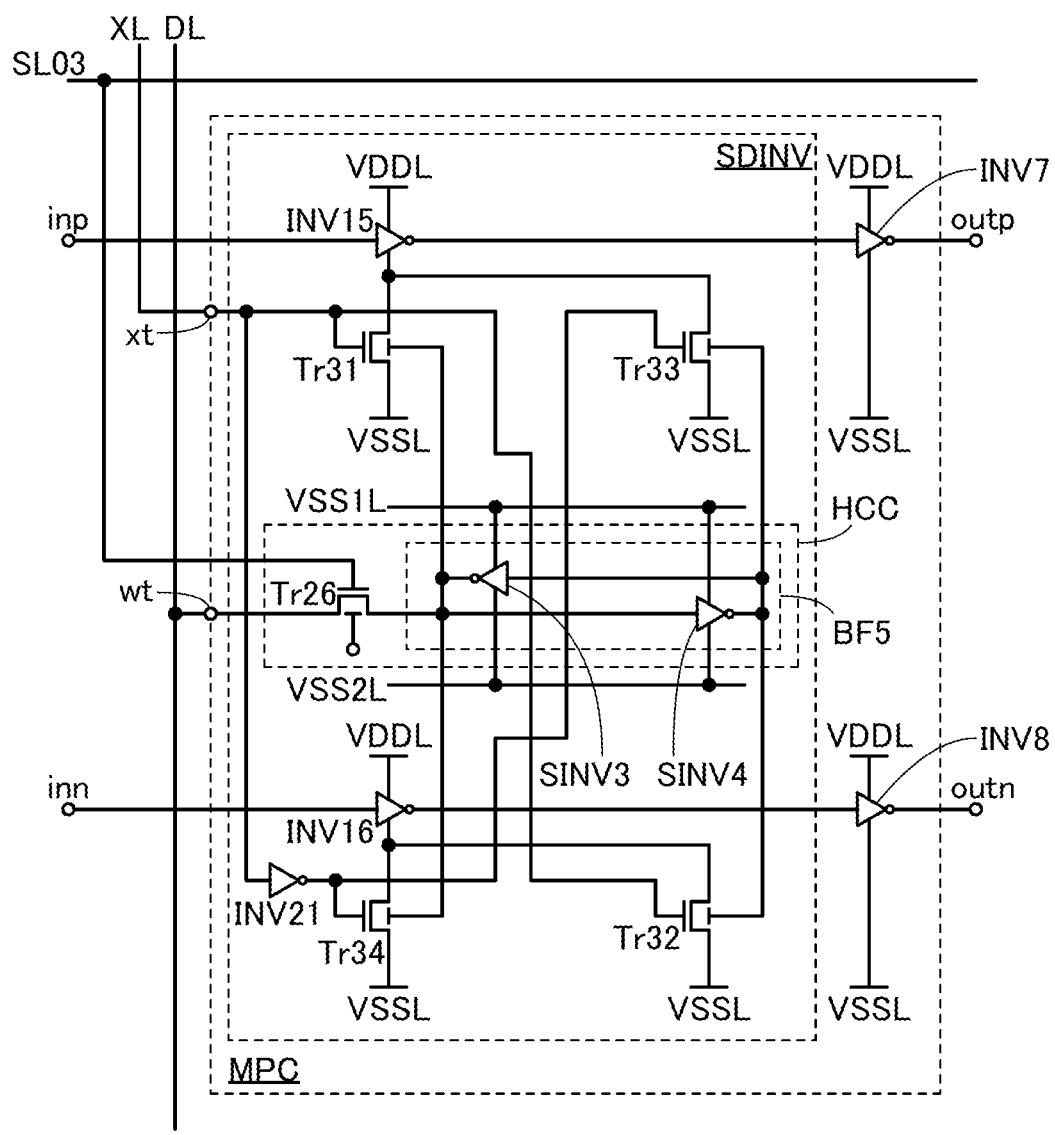
FIG. 18 is a circuit diagram illustrating a structure example of a circuit included in a semiconductor device.

In the circuit MPC illustrated in FIG. 18, the configuration of a holding unit is different from those of the holding unit HCCa and the holding unit HCCb of the circuits MPC in FIG. 13 and FIG. 15. The holding unit HCC of the circuit MPC in FIG. 18 includes an inverter circuit SINV3, an inverter circuit SINV4, and a transistor Tr26. An output terminal of the inverter circuit SINV3 is electrically connected to a first terminal of the transistor Tr26, an input terminal of the inverter circuit SINV4, the back gate of the transistor Tr31, and the back gate of the transistor Tr34. An output terminal of the inverter circuit SINV4 is electrically connected to an input terminal of the inverter circuit SINV3, the back gate of the transistor Tr32, and the back gate of the transistor Tr33. A second terminal of the transistor Tr26 is electrically connected to the wiring DL through the terminal wt. A gate of the transistor Tr26 is electrically connected to the wiring SL03.

The holding unit HCC in the circuit MPC in FIG. 18 includes an inverter loop composed of the inverter circuit SINV3 and the inverter circuit SINV4. Note that FIG. 18 also illustrates a circuit BF5 including the inverter circuit SINV3 and the inverter circuit SINV4. The number of inverter circuits is not limited to two but is preferably an even number other than zero because the circuit can be configured more easily when the input and the output have the same logic value.

High power supply potential input terminals of the inverter circuit SINV3 and the inverter circuit SINV4 are electrically connected to a wiring VSS1L. Low power supply potential input terminals of the inverter circuit SINV3 and the inverter circuit SINV4 are electrically connected to a wiring VSS2L.

The wiring VSS1L functions as a voltage line for supplying a voltage VSS1. The wiring VSS2L functions as a voltage line for supplying a voltage VSS2 that is lower than the voltage VSS1. The voltage VSS1 can be lower than or equal to the voltage VSS, for example.

The wiring SL03 in FIG. 18 corresponds to the wiring SL03 in FIG. 13. Hence, the potential is supplied to the holding unit HCC by turning on the transistor Tr26 by supply of a high-level potential to the wiring SL03. After that, the potential is held in the holding unit HCC by turning off the transistor Tr26 by supply of a low-level potential to the wiring SL03.

As illustrated in FIG. 18, the holding unit HCC includes the inverter loop configured using the inverter circuit SINV3 and the inverter circuit SINV4, and thus can hold one of VSS1 and VSS2 as the potentials of the back gates of the transistors Tr31 and Tr34 and hold the other of VSS1 and VSS2 as the potentials of the back gates of the transistors Tr32 and Tr33 in response to the potential input to the input terminal of the inverter circuit SINV3.

That is, the holding unit HCC in FIG. 18 can hold binary data as a weight coefficient. For that reason, when the circuit MPC in FIG. 18 is used as the circuit MPC included in the arithmetic circuit 110 in FIG. 1A, the weight coefficient input to the terminal wt is preferably binary data.

Since the potentials supplied to the back gates of the transistors Tr31 to Tr34 are VSS1 or VSS2, there are two patterns of time lag between the signal output from the terminal outp and the signal output from the terminal outn.

In order that hold the potential input from the wiring DL to the circuit BF5 in the holding unit HCC, the transistor Tr26 preferably has a low off-state current. For that reason, the transistor Tr26 is preferably the OS transistor described above. The transistor Tr26 in FIG. 18 has the back gate, and its on-state current can be increased by electrically connecting the back gate and the gate of the transistor Tr26 to each other, for example. The off-state current of the transistor Tr26 can be further reduced by electrically connecting the back gate to a wiring that supplies a low potential. Note that the transistor Tr26 does not necessarily have a back gate.

In the circuit MPC in FIG. 18, the first terminal of the transistor Tr31 and the first terminal of the transistor Tr33 are electrically connected to the low power supply potential input terminal of the inverter circuit INV15, and the first terminal of the transistor Tr32 and the first terminal of the transistor Tr34 are electrically connected to the low power supply potential input terminal of the inverter circuit INV16. Alternatively, as in the circuit MPC in FIG. 16, the first terminal of the transistor Tr31 and the first terminal of the transistor Tr33 may be electrically connected to the high power supply potential input terminal of the inverter circuit INV15, and the first terminal of the transistor Tr32 and the first terminal of the transistor Tr34 may be electrically connected to the high power supply potential input terminal of the inverter circuit INV16. Furthermore, the inverter circuit INV7, the inverter circuit INV8, the inverter circuit INV15, and the inverter circuit INV16 included in the circuit MPC in FIG. 18 may be replaced with the logic circuit LGC7, the logic circuit LGC8, the logic circuit LGC15, and the logic circuit LGC16, respectively, as in the circuit MPC in FIG. 17.

Configuration Example 3

Next, a configuration example of a circuit that can be used as the circuit MPC in FIG. 12A and is different from Configuration examples 1 and 2 is described.

Figure 19:
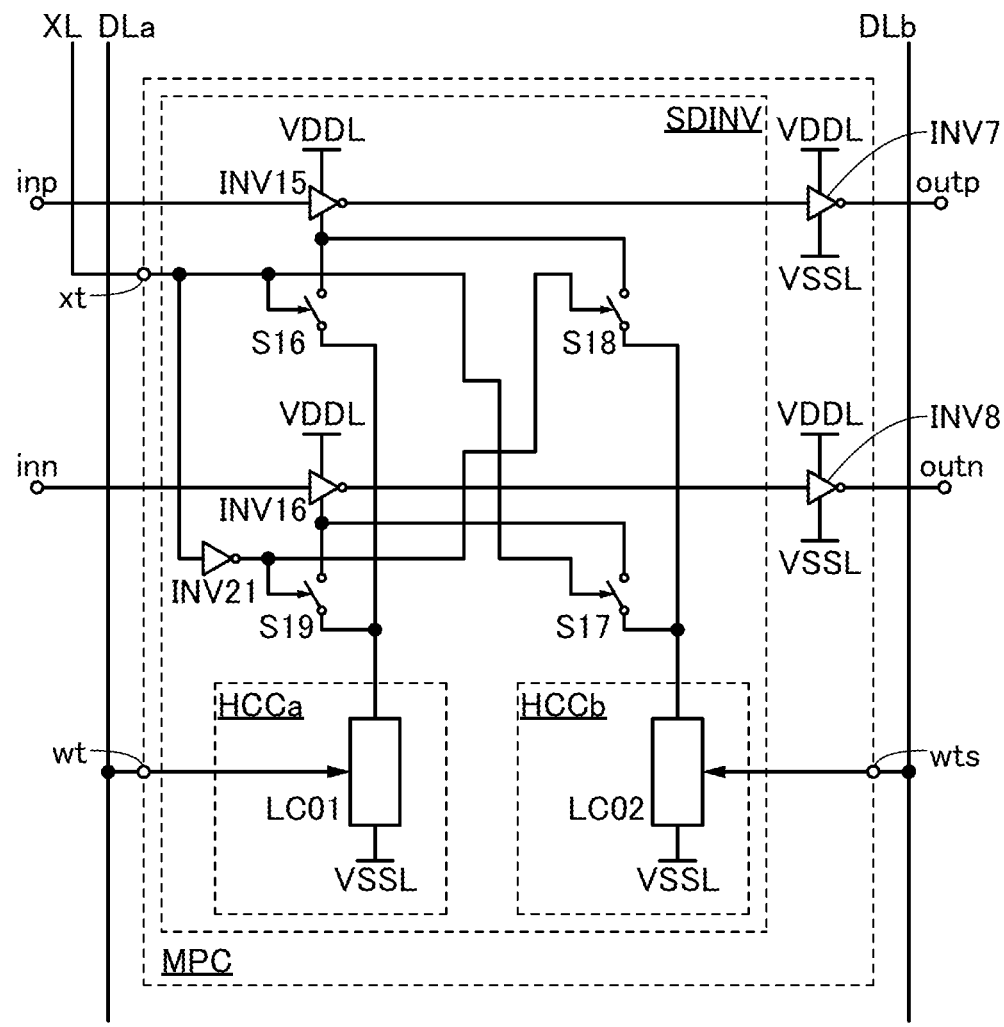
FIG. 19 is a block diagram illustrating a structure example of a circuit included in a semiconductor device.

The circuit MPC illustrated in FIG. 19 has a configuration different from those of the circuits MPC in FIGS. 13 to 15. Specifically, the circuit MPC in FIG. 19 includes switches S16 to S19 instead of the transistors Tr31 to Tr34 included in the circuits MPC in FIGS. 13 to 15. Moreover, the holding unit HCCa and the holding unit HCCb included in the circuit SDINV in FIG. 19 include a load circuit LC01 and a load circuit LC02, respectively, instead of a transistor and a capacitor.

The holding unit HCCa and the holding unit HCCb of the circuit SDINV in FIG. 19 have a function of setting and holding a parameter such as a resistance in accordance with a signal input from the terminal wt, instead of holding the back gate potential of the transistor with the transistor and the capacitor like the holding unit HCCa and the holding unit HCCb in FIGS. 13 to 15.

The low power supply potential input terminal of the inverter circuit INV15 is electrically connected to a first terminal of the switch S16 and a first terminal of the switch S18. The low power supply potential input terminal of the inverter circuit INV16 is electrically connected to a first terminal of the switch S17 and a first terminal of the switch S19. A first terminal of the load circuit LC01 is electrically connected to a second terminal of the switch S16 and a second terminal of the switch S19. A first terminal of the load circuit LC02 is electrically connected to a second terminal of the switch S17 and a second terminal of the switch S18. The terminal xt is electrically connected to a control terminal of the switch S16, a control terminal of the switch S17, and an input terminal of the inverter circuit INV21. An output terminal of the inverter circuit INV21 is electrically connected to a control terminal of the switch S18 and a control terminal of the switch S19. A second terminal of the load circuit LC01 is electrically connected to the wiring VSSL. A second terminal of the load circuit LC02 is electrically connected to the wiring VSSL.

Like the wiring VSSL described in Embodiment 1, the wiring VSSL functions as a voltage line that supplies the voltage VSS, which is a low level potential.

The load circuit LC01 is electrically connected to the terminal wt, and the load circuit LC02 is electrically connected to the terminal wts. In the load circuit LC01 and the load circuit LC02, the resistance between the first terminal and the second terminal is determined in accordance with a signal input to the terminal wt and a signal input to the terminal wts, respectively.

Figure 20:
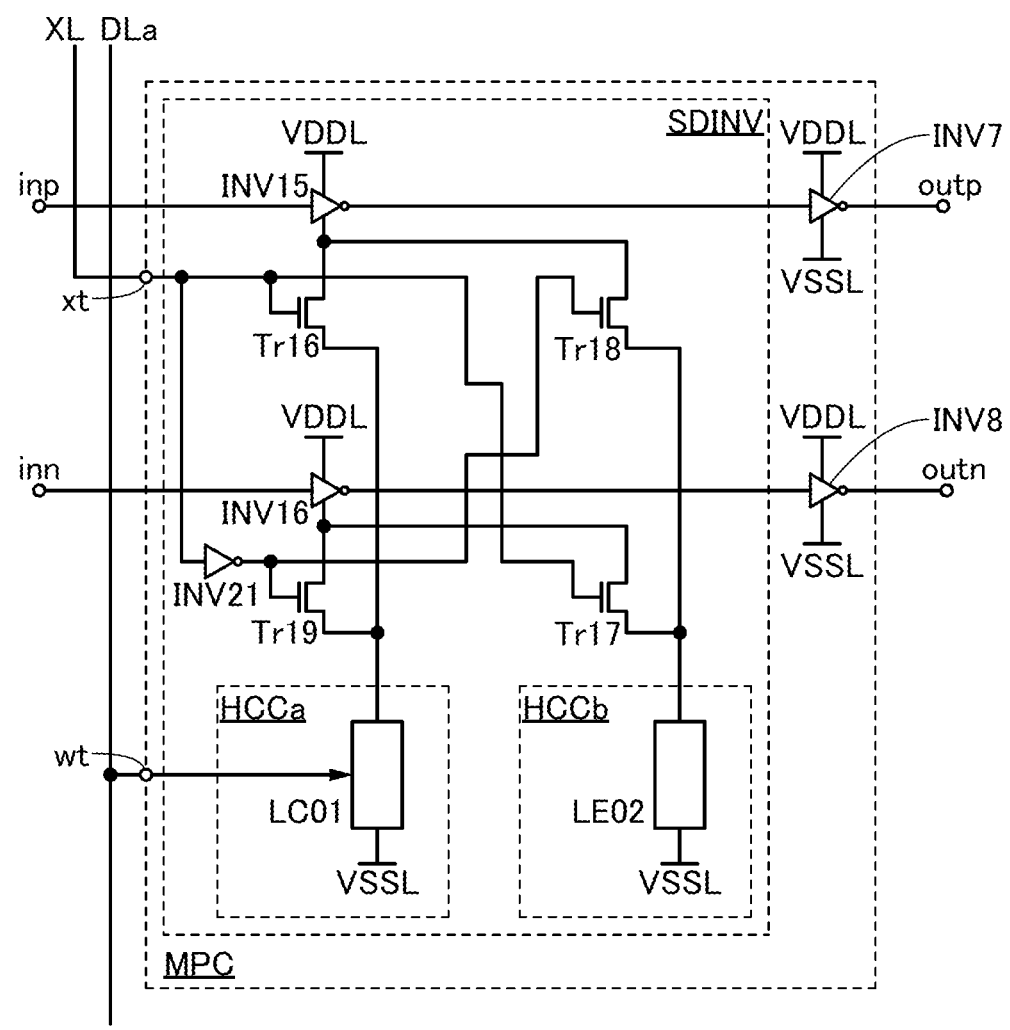
FIG. 20 is a block diagram illustrating a structure example of a circuit included in a semiconductor device.

Note that in this specification and the like, each of the switches S16 to S19 is turned on when a high-level potential is applied to the control terminal, and is turned off when a low-level potential is applied to the control terminal. As the switches S16 to S19, an element having a switching function, such as an analog switch or a transistor, is preferably used, for example. For instance, as in the circuit MPC illustrated in FIG. 20, transistors Tr16 to Tr19 may be used as the switches S16 to S19. Although not shown in FIG. 20, the transistors Tr16 to Tr19 may include a back gate.

Figure 21:
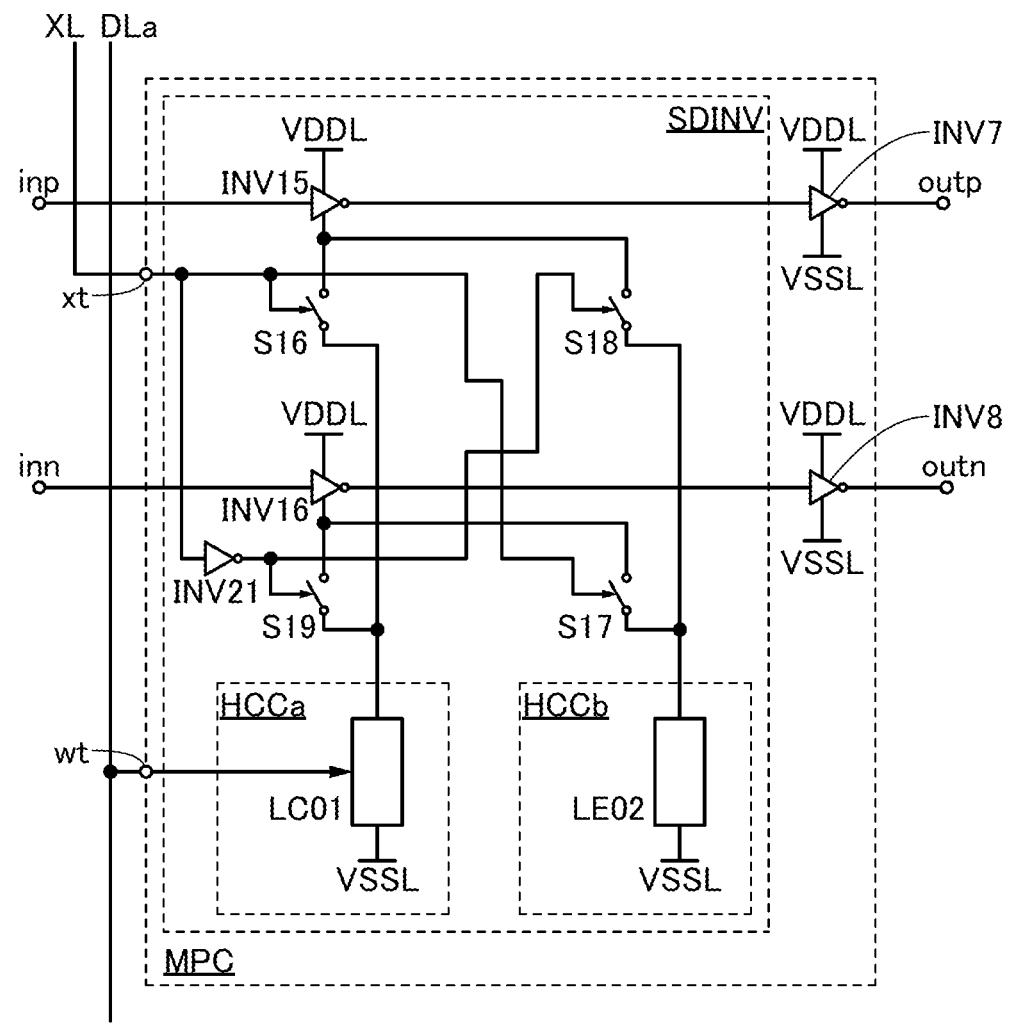
FIG. 21 is a block diagram illustrating a structure example of a circuit included in a semiconductor device.

Note that in the circuit MPC in FIG. 19, the resistance of the load circuit LC02 is not necessarily changed. Specifically, as in the circuit MPC illustrated in FIG. 21, a load element LE02 whose resistance does not change may be used instead of the load circuit LC02. The load circuit LC02 has a function of supplying a reference load of the load circuit LC01. Thus, in the case where the reference load does not need to be changed, the load element LE02 is used instead. Note that a resistor, a coil, a transistor, or the like can be used as the load element LE02. The load element LE02 does not necessarily include a circuit component; i.e., the load element LE02 may be a wiring that directly and electrically connects the wiring VSSL to the second terminals of the switches S17 and S18.

Figure 22:
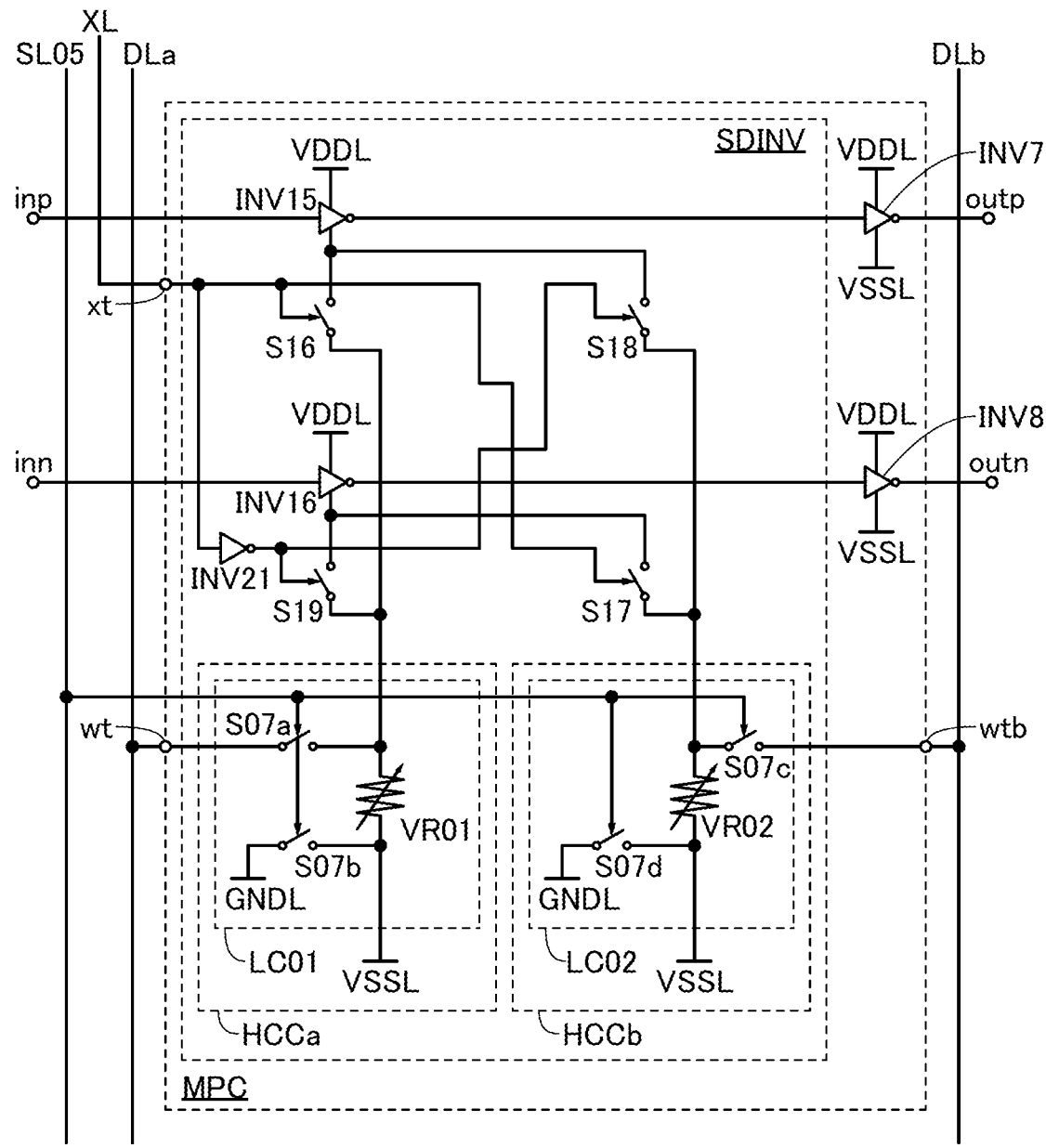
FIG. 22 is a circuit diagram illustrating a structure example of a circuit included in a semiconductor device.

FIG. 22 illustrates an example of a circuit including variable resistors as the load circuit LC01 and the load circuit LC02 of the circuit MPC in FIG. 19. The load circuit LC01 in the holding unit HCCa in FIG. 22 includes a variable resistor VR01, a switch S07a, and a switch S07b. Similarly, the load circuit LC02 in the holding unit HCCb includes a variable resistor VR02, a switch S07c, and a switch S07d. Note that each of the switches S07a to S07d is turned on when a high-level potential is supplied to its control terminal, and turned off when a low-level potential is supplied to its control terminal.

The variable resistor VR01 (the variable resistor VR02) can be formed using, for example, a conductor (e.g., silver, platinum, titanium nitride, or titanium dioxide) serving as a pair of electrodes and a metal oxide (e.g., a metal oxide having a perovskite structure) positioned between the pair of electrodes.

In the load circuit LC01, a first terminal of the switch S07a is electrically connected to the first terminal of the load circuit LC01 and a first terminal of the variable resistor VR01, a second terminal of the switch S07a is electrically connected to the terminal wt, and a control terminal of the switch S07a is electrically connected to a wiring SL05. A first terminal of the switch S07b is electrically connected to the second terminal of the load circuit LC01 and a second terminal of the variable resistor VR01, a second terminal of the switch S07b is electrically connected to a wiring GNDL, and a control terminal of the switch S07b is electrically connected to the wiring SL05.

In the load circuit LC02, a first terminal of the switch S07c is electrically connected to the first terminal of the load circuit LC02 and a first terminal of the variable resistor VR02, a second terminal of the switch S07c is electrically connected to a terminal wtb, and a control terminal of the switch S07c is electrically connected to the wiring SL05. A first terminal of the switch S07d is electrically connected to the second terminal of the load circuit LC02 and a second terminal of the variable resistor VR02, a second terminal of the switch S07d is electrically connected to the wiring GNDL, and a control terminal of the switch S07d is electrically connected to the wiring SL05.

The signal corresponding to the weight coefficient is input to the terminal wt. The terminal wtb corresponds to the terminal wts in the circuit MPC in FIG. 19 and is supplied with an inverted signal of the signal input to the terminal wt.

The wiring GNDL can supply a voltage GND. The voltage GND can be a ground potential, for example. Alternatively, the wiring GNDL may have a function of supplying another reference potential instead of the ground potential.

The wiring SL05 has a function of turning on or off the switches S07a to S07d. In this specification and the like, the switches S07a to S07d are turned on by supply of a high-level potential to the wiring SL05, and are turned off by supply of a low-level potential to the wiring SL05. Accordingly, a voltage between the first terminal and the second terminal of the variable resistor VR01 becomes a voltage corresponding to the signal input from the terminal wt, and a voltage between the first terminal and the second terminal of the variable resistor VR02 becomes a voltage corresponding to the signal input from the terminal wtb. That is, the resistances of the variable resistor VR01 and the variable resistor VR02 are determined by the signals input to the terminal wt and the terminal wts, respectively.

For example, by supplying a high-level potential to the terminal wt (the terminal wtb), the resistance of the variable resistor VR01 (the variable resistor VR02) can be reduced. In addition, for example, by supplying a low-level potential to the terminal wt (the terminal wtb), the resistance of the variable resistor VR01 (the variable resistor VR02) can be increased. Thus, in the circuit MPC, the speed of signal transmission between the terminals inp and inn and the terminals outp and outn can be changed.

In the circuit MPC in FIG. 22, the load circuit LC01 and/or the load circuit LC02 is not necessarily connected to the wiring GNDL through the corresponding switch S07b and/or switch S07d depending on the circumstances. In such cases, the circuit MPC has a configuration shown in FIG. 23, resulting in a smaller circuit area than that of the circuit MPC in FIG. 22.

In the holding unit HCCa and the holding unit HCCb of the circuit MPC in FIG. 22, electrical connections between the variable resistor VR01 (the variable resistor VR02) and the switches S07a to S07d may be changed depending on the circumstances. For example, the circuit MPC in FIG. 22 may have a configuration shown in FIG. 24 in which the first terminal of the switch S07b (the switch S07d) is electrically connected to the first terminal of the variable resistor VR01 (the variable resistor VR02) and the first terminal of the switch S07a (the switch S07c) is electrically connected to the second terminal of the variable resistor VR01 (the variable resistor VR02) in the load circuit LC01 (the load circuit LC02).

Figure 23:
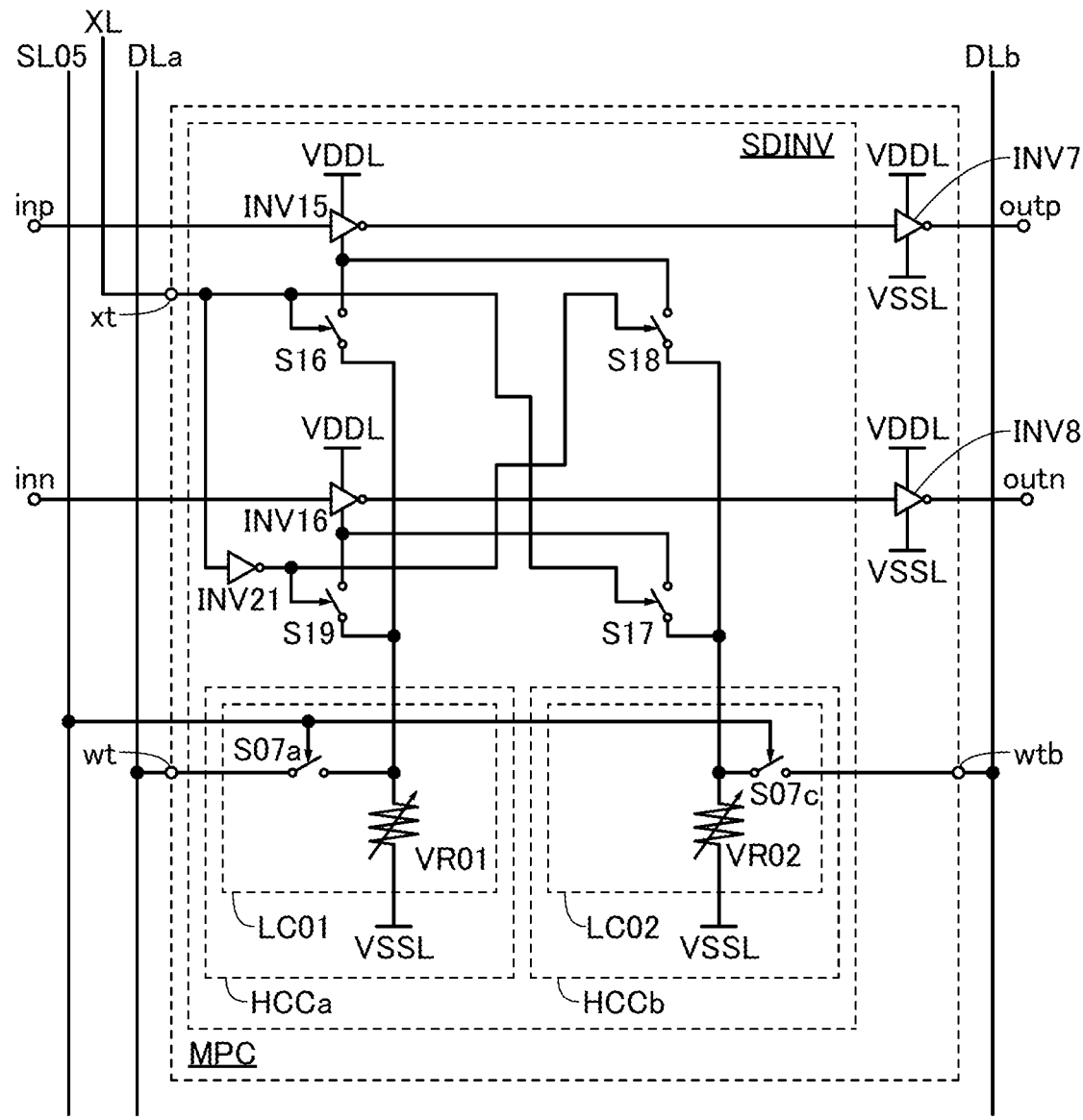
FIG. 23 is a circuit diagram illustrating a structure example of a circuit included in a semiconductor device.
Figure 24:
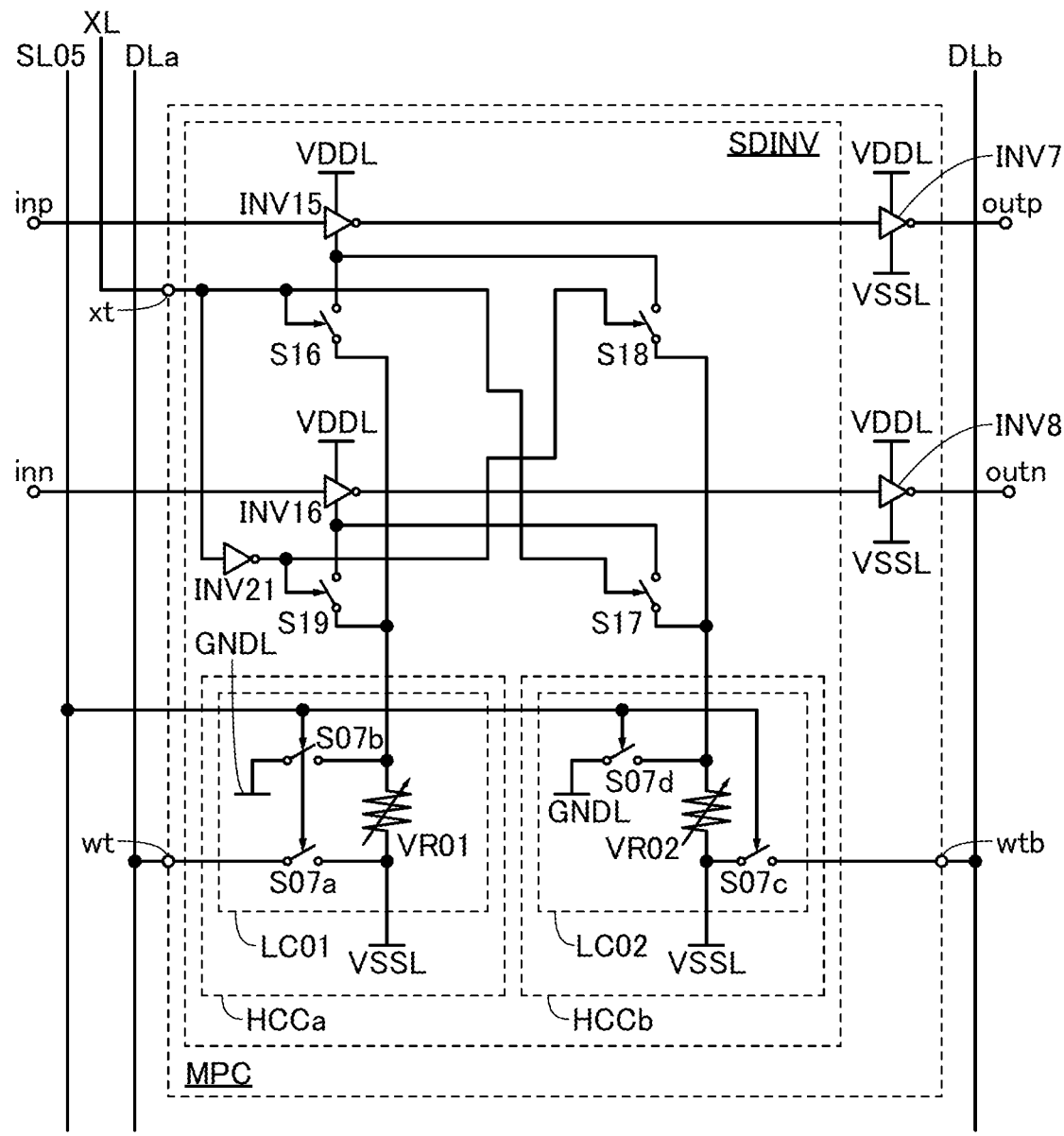
FIG. 24 is a circuit diagram illustrating a structure example of a circuit included in a semiconductor device.
Figure 25A:
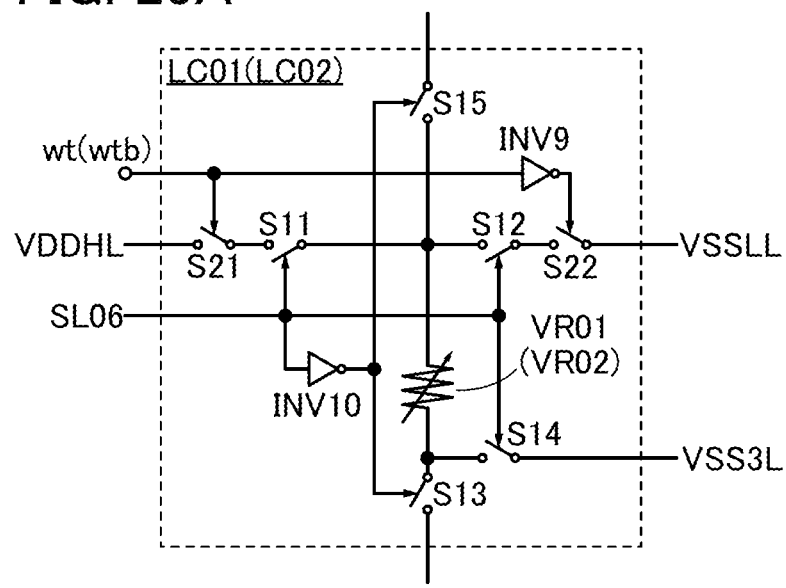
FIGS. 25A and 25B are circuit diagrams illustrating structure examples of a circuit included in a semiconductor device.

The load circuit LC01 (the load circuit LC02) including the variable resistor can be the load circuit LC01 shown in FIG. 25A, which has a configuration different from those of the load circuit LC01 (the load circuit LC02) in FIGS. 22 to 24. The load circuit LC01 (the load circuit LC02) in FIG. 25A includes switches S11 to S15, a switch S21, a switch S22, an inverter circuit INV9, an inverter circuit INV10, and the variable resistor VR01 (the variable resistor VR02). Note that the switches S11 to S15, the switch S21, and the switch S22 are turned on by supplying a high-level potential to their control terminals, and are turned off by supplying a low-level potential to their control terminals.

The first terminal of the variable resistor VR01 (the variable resistor VR02) is electrically connected to a first terminal of the switch S11, a first terminal of the switch S12, and a first terminal of the switch S15. A second terminal of the switch S15 is electrically connected to the first terminal of the load circuit LC01 (the load circuit LC02). The second terminal of the variable resistor VR01 (the variable resistor VR02) is electrically connected to a first terminal of the switch S13 and a first terminal of the switch S14. A second terminal of the switch S13 is electrically connected to the second terminal of the load circuit LC01 (the load circuit LC02). A second terminal of the switch S11 is electrically connected to a first terminal of the switch S21. A second terminal of the switch S21 is electrically connected to a wiring VDDHL. A second terminal of the switch S12 is electrically connected to a first terminal of the switch S22. A second terminal of the switch S22 is electrically connected to a wiring VSSLL. A second terminal of the switch S14 is electrically connected to a wiring VSS3L.

The terminal wt (the terminal wtb) is electrically connected to the control terminal of the switch S21 and an input terminal of the inverter circuit INV9. An output terminal of the inverter circuit INV9 is electrically connected to the control terminal of the switch S22. An input terminal of the inverter circuit INV10 is electrically connected to the control terminal of the switch S11, the control terminal of the switch S12, the control terminal of the switch S14, and a wiring SL06. An output terminal of the inverter circuit INV10 is electrically connected to the control terminal of the switch S13 and the control terminal of the switch S15.

The wiring SL06 has a function of turning on or off the switches S11 to S15. The wiring VDDHL functions as a voltage line that supplies a voltage VDDH, the wiring VSSLL functions as a voltage line that supplies a voltage VSSS, and the wiring VSS3L functions as a voltage line that supplies a voltage VSS3. The voltage VDDH, the voltage VSSS, and the voltage VSS3 are input voltages for changing the resistance of the variable resistor VR01 (the variable resistor VR02), and the voltage VDDH is higher than the voltage VSSS and the voltage VSS3. The voltage VSS3 can be higher than or equal to the voltage VSSS.

Here, the case where the resistance of the variable resistor VR01 is changed is considered. First, a high-level potential is input to the wiring SL06, so that the switch S11, the switch S12, and the switch S14 are turned on and the switch S13 and the switch S15 are turned off. Then, when a high-level potential is input as the potential corresponding to the weight coefficient to the terminal wt, for example, the switch S21 is turned on and the switch S22 is turned off. At this time, VDDH is input to the first terminal of the variable resistor VR01, and VSS3 is input to the second terminal of the variable resistor VR01. Thus, the resistance of the variable resistor VR01 can be reduced. After that, a low-level potential is input to the wiring SL06 to turn off the switch S11, the switch S12, and the switch S14 and turn on the switch S13 and the switch S15; hence, the resistance of the load circuit LC01 can be set low.

On the other hand, when a low-level potential is input as the potential corresponding to the weight coefficient to the terminal wt in the above case, the switch S21 is turned off and the switch S22 is turned on. At this time, VSSS is input to the first terminal of the variable resistor VR01, and VSS3 is input to the second terminal of the variable resistor VR01. Thus, the resistance of the variable resistor VR01 can be increased. After that, a low-level potential is input to the wiring SL06 to turn off the switch S11, the switch S12, and the switch S14 and turn on the switch S13 and the switch S15; hence, the resistance of the load circuit LC01 can be set high.

The variable resistor VR02 can have a circuit configuration similar to that of the variable resistor VR01 in FIG. 25A. In that case, the terminal wtb corresponds to that in FIG. 22. In addition, the signal input to the terminal wtb is preferably an inverted signal of the signal input to the terminal wt.

In the case where a high-level potential is applied to the terminal xt, when the resistance of the variable resistor VR01 is set low and the resistance of the variable resistor VR02 is set high, the speed of signal transmission between the terminal inp and the terminal outp of the circuit MPC can be higher than that between the terminal inn and the terminal outn of the circuit MPC. In contrast, when the resistance of the variable resistor VR01 is set high and the resistance of the variable resistor VR02 is set low, the speed of signal transmission between the terminal inp and the terminal outp of the circuit MPC can be lower than that between the terminal inn and the terminal outn of the circuit MPC. In the case where a low-level potential is applied to the terminal xt, when the resistance of the variable resistor VR01 is set low and the resistance of the variable resistor VR02 is set high, the speed of signal transmission between the terminal inp and the terminal outp of the circuit MPC can be lower than that between the terminal inn and the terminal outn of the circuit MPC. In contrast, when the resistance of the variable resistor VR01 is set high and the resistance of the variable resistor VR02 is set low, the speed of signal transmission between the terminal inp and the terminal outp of the circuit MPC can be higher than that between the terminal inn and the terminal outn of the circuit MPC.

Consequently, when signals are input to the terminal inp and the terminal inn of the circuit MPC, the signals output from the terminal outp and the terminal outn can have a time lag based on the potential of the terminal xt and the resistances of the variable resistor VR01 and the variable resistor VR02.

Figure 25B:
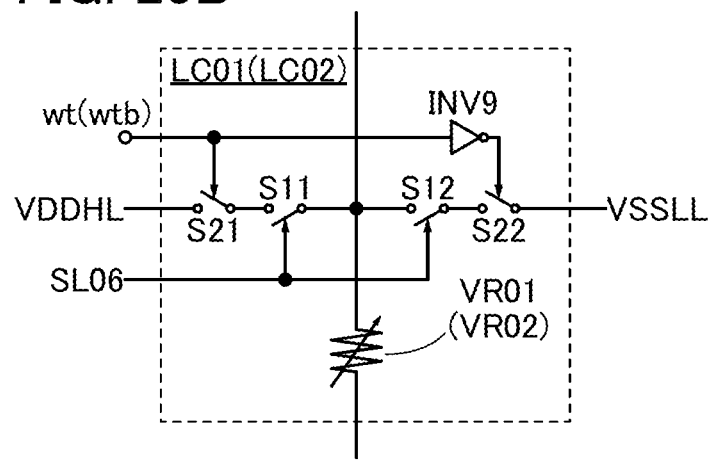

In the load circuit LC01 (the load circuit LC02) illustrated in FIG. 25A, the switches S13 to S15 and the inverter circuit INV10 can be omitted according to circumstances. In that case, the load circuit LC01 (the load circuit LC02) has a configuration illustrated in FIG. 25B. In other words, in FIG. 25B, the voltage VSS3 supplied to the load circuit LC01 (the load circuit LC02) is a voltage supplied from the wiring VSSL (not shown) that is electrically connected to the second terminal of the load circuit LC01 (the load circuit LC02). The circuit area of the load circuit LC01 (the load circuit LC02) with this configuration can be smaller than that of the load circuit LC01 in FIG. 25A.

Note that the configuration of the circuit MPC in FIG. 19 is not limited to the configuration of the circuit MPC shown in any of FIGS. 21 to 24 and may be changed from the configurations in FIGS. 21 to 24 depending on the circumstances. The load circuit LC01 and the load circuit LC02 can be, for example, a circuit including a magnetic tunnel junction (MTJ) element, instead of the circuit including the variable resistor in FIG. 22. For example, as in the circuit MPC illustrated in FIG. 26, the variable resistor VR01 of the load circuit LC01 and the variable resistor VR02 of the load circuit LC02 in FIG. 22 may be replaced with a variable resistor circuit VR03 including an MTJ element MR01 and a variable resistor circuit VR04 including an MTJ element MR02, respectively. Instead of a variable resistor and an MTJ element, a resistor containing a phase-change material that is used for phase-change memory (PCM) or the like may be used; in this specification and the like, such a resistor is sometimes referred to as a phase-change memory for convenience. For example, as in the circuit MPC illustrated in FIG. 27, the variable resistor VR01 of the load circuit LC01 and the variable resistor VR02 of the load circuit LC02 in FIG. 22 can be replaced with a phase-change memory PCM1 and a phase-change memory PCM2, respectively.

In the circuits MPC in FIGS. 19 to 24, FIG. 26, and FIG. 27, the first terminal of the switch S16 and the first terminal of the switch S18 are electrically connected to the low power supply potential input terminal of the inverter circuit INV15, and the first terminal of the switch S17 and the first terminal of the switch S19 are electrically connected to the low power supply potential input terminal of the inverter circuit INV16. Alternatively, referring to the circuit MPC in FIG. 16, the first terminal of the switch S16 and the first terminal of the switch S18 may be electrically connected to the high power supply potential input terminal of the inverter circuit INV15, and the first terminal of the switch S17 and the first terminal of the switch S19 may be electrically connected to the high power supply potential input terminal of the inverter circuit INV16. Furthermore, the inverter circuit INV7, the inverter circuit INV8, the inverter circuit INV15, and the inverter circuit INV16 included in the circuits MPC in FIGS. 19 to 24, FIG. 26, and FIG. 27 may be replaced with the logic circuit LGC7, the logic circuit LGC8, the logic circuit LGC15, and the logic circuit LGC16, respectively, as in the circuit MPC in FIG. 17.

Configuration Example 4

Next, a configuration example of a circuit that can be used as the circuit MPC in FIG. 12A and is different from Configuration examples 1 to 3 is described.

Figure 28:
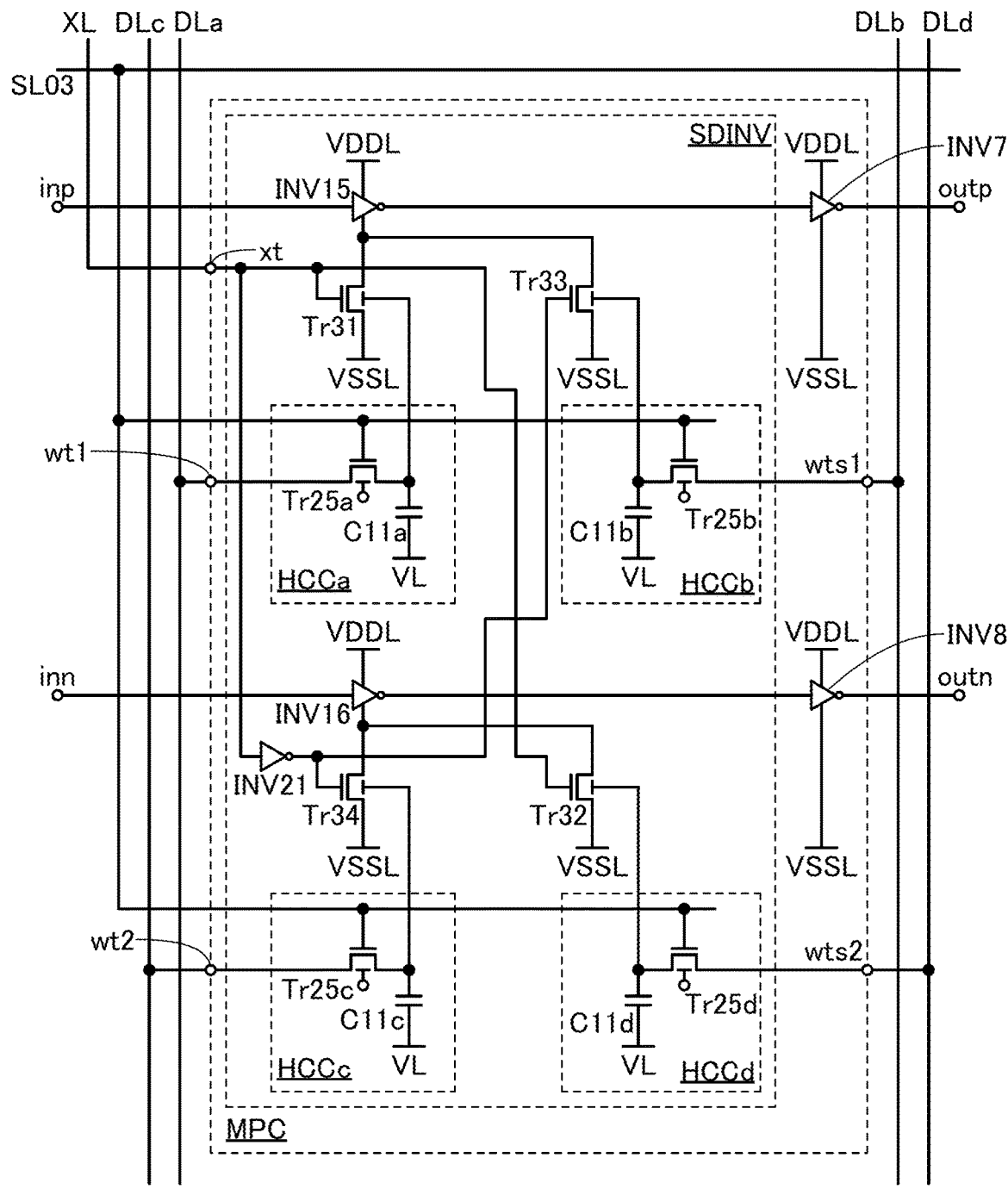
FIG. 28 is a circuit diagram illustrating a structure example of a circuit included in a semiconductor device.

The circuit MPC in FIG. 28 is different from that in FIG. 13 and FIG. 15 in that the back gate of each of the transistors Tr31 to Tr34 is provided with a holding unit. The circuit SDINV of the circuit MPC in FIG. 28 includes, as the holding unit HCC in FIG. 12A, the holding unit HCCa, the holding unit HCCb, a holding unit HCCc, and a holding unit HCCd.

The holding unit HCCa includes the transistor Tr25a and the capacitor C11a. The first terminal of the transistor Tr25a is electrically connected to the back gate of the transistor Tr31 and the first terminal of the capacitor C11a. The second terminal of the transistor Tr25a is electrically connected to the wiring DLa through a terminal wt1. The gate of the transistor Tr25a is electrically connected to the wiring SL03. The second terminal of the capacitor C11a is electrically connected to the wiring VL.

The holding unit HCCb includes the transistor Tr25b and the capacitor C11b. The holding unit HCCc includes a transistor Tr25c and a capacitor C11c. The holding unit HCCd includes a transistor Tr25d and a capacitor C11d. The holding unit HCCb, the holding unit HCCc, and the holding unit HCCd can have a circuit configuration similar to that of the holding unit HCCa, for example. In the circuit MPC in FIG. 28, each of the holding units HCCb, HCCc, and HCCd has the configuration similar to that of the holding unit HCCa.

Specifically, the first terminal of the transistor Tr25*b* is electrically connected to the back gate of the transistor Tr33, and the second terminal of the transistor Tr25*b* is electrically connected to the wiring DLb through a terminal wts1. A first terminal of the transistor Tr25*c* is electrically connected to the back gate of the transistor Tr34, and a second terminal of the transistor Tr25*c* is electrically connected to a wiring DLc through a terminal wt2. A first terminal of the transistor Tr25*d* is electrically connected to the back gate of the transistor Tr32, and a second terminal of the transistor Tr25*d* is electrically connected to a wiring DLd through a terminal wts2.

As described above, the holding unit HCCa has the configuration similar to that of the holding unit HCCa of the circuit MPC in FIGS. 13 to 15 and thus can hold the potential of the back gate of the transistor Tr31. Similarly, the holding unit HCCb can hold the potential of the back gate of the transistor Tr33, the holding unit HCCc can hold the potential of the back gate of the transistor Tr34, and the holding unit HCCd can hold the potential of the back gate of the transistor Tr32.

The wiring SL03 illustrated in FIG. 28 corresponds to the wiring SL03 in FIG. 13. Hence, the potentials are supplied to the holding unit HCCa, the holding unit HCCb, the holding unit HCCc, and the holding unit HCCd by turning on the transistor Tr25*a*, the transistor Tr25*b*, the transistor Tr25*c*, and the transistor Tr25*d* by supply of a high-level potential to the wiring SL03. After that, the potentials are held in the holding unit HCCa, the holding unit HCCb, the holding unit HCCc, and the holding unit HCCd by turning off the transistor Tr25*a*, the transistor Tr25*b*, the transistor Tr25*c*, and the transistor Tr25*d* by supply of a low-level potential to the wiring SL03.

The terminal wt1 and the terminal wt2 in FIG. 28 correspond to the terminal wt in FIG. 13, and the terminal wts1 and the terminal wts2 in FIG. 28 correspond to the terminal wts in FIG. 13. Accordingly, in FIG. 28, the wiring DLa and the wiring DLc supply the potential corresponding to the weight coefficient $w_i^{(k-1)(k)}_j$, and the wiring DLb and the wiring DLd supply the intermediate potential.

The potential held at the first terminal of the capacitor C11*a* in the holding unit HCCa is preferably equal to the potential held at the first terminal of the capacitor C11*c* in the holding unit HCCc. For that reason, the terminal wt1 and the terminal wt2 may be a single terminal. Alternatively, the wiring DLa and the wiring DLc may be combined into one wiring. The potential held at the first terminal of the capacitor C11*b* in the holding unit HCCb is preferably equal to the potential held at the first terminal of the capacitor C11*d* in the holding unit HCCd. For that reason, the terminal wts1 and the terminal wts2 may be a single terminal. Alternatively, the wiring DLb and the wiring DLd may be combined into one wiring.

The characteristics of the transistors Tr31 to Tr34 might differ from each other in the manufacturing process of the arithmetic circuit 110, for example. At this time, the potentials to be supplied to the back gates of the transistors Tr31 to Tr34 are corrected in accordance with the characteristics of the transistors Tr31 to Tr34, and the corrected potentials are supplied to the back gates of the transistors Tr31 to Tr34. In such a case, it is preferred that the terminal wt1 and the terminal wt2 be different terminals and electrically connected to different wirings, and that the terminal wts1 and the terminal wts2 be different terminals and electrically connected to different wirings, as in the circuit MPC in FIG. 28.

Note that the configuration of the circuit MPC in FIG. 12A is not limited to that in FIG. 28 and may be obtained by changing the configuration in FIG. 28 according to circumstances. For example, in the circuit MPC in FIG. 28, the first terminal of the transistor Tr31 and the first terminal of the transistor Tr33 are electrically connected to the low power supply potential input terminal of the inverter circuit INV15, and the first terminal of the transistor Tr32 and the first terminal of the transistor Tr34 are electrically connected to the low power supply potential input terminal of the inverter circuit INV16. Alternatively, as in the circuit MPC in FIG. 16, the first terminal of the transistor Tr31 and the first terminal of the transistor Tr33 may be electrically connected to the high power supply potential input terminal of the inverter circuit INV15, and the first terminal of the transistor Tr32 and the first terminal of the transistor Tr34 may be electrically connected to the high power supply potential input terminal of the inverter circuit INV16. Furthermore, the inverter circuit INV7, the inverter circuit INV8, the inverter circuit INV15, and the inverter circuit INV16 included in the circuit MPC in FIG. 28 may be replaced with the logic circuit LGC7, the logic circuit LGC8, the logic circuit LGC15, and the logic circuit LGC16, respectively, as in the circuit MPC in FIG. 17.

Figure 29:
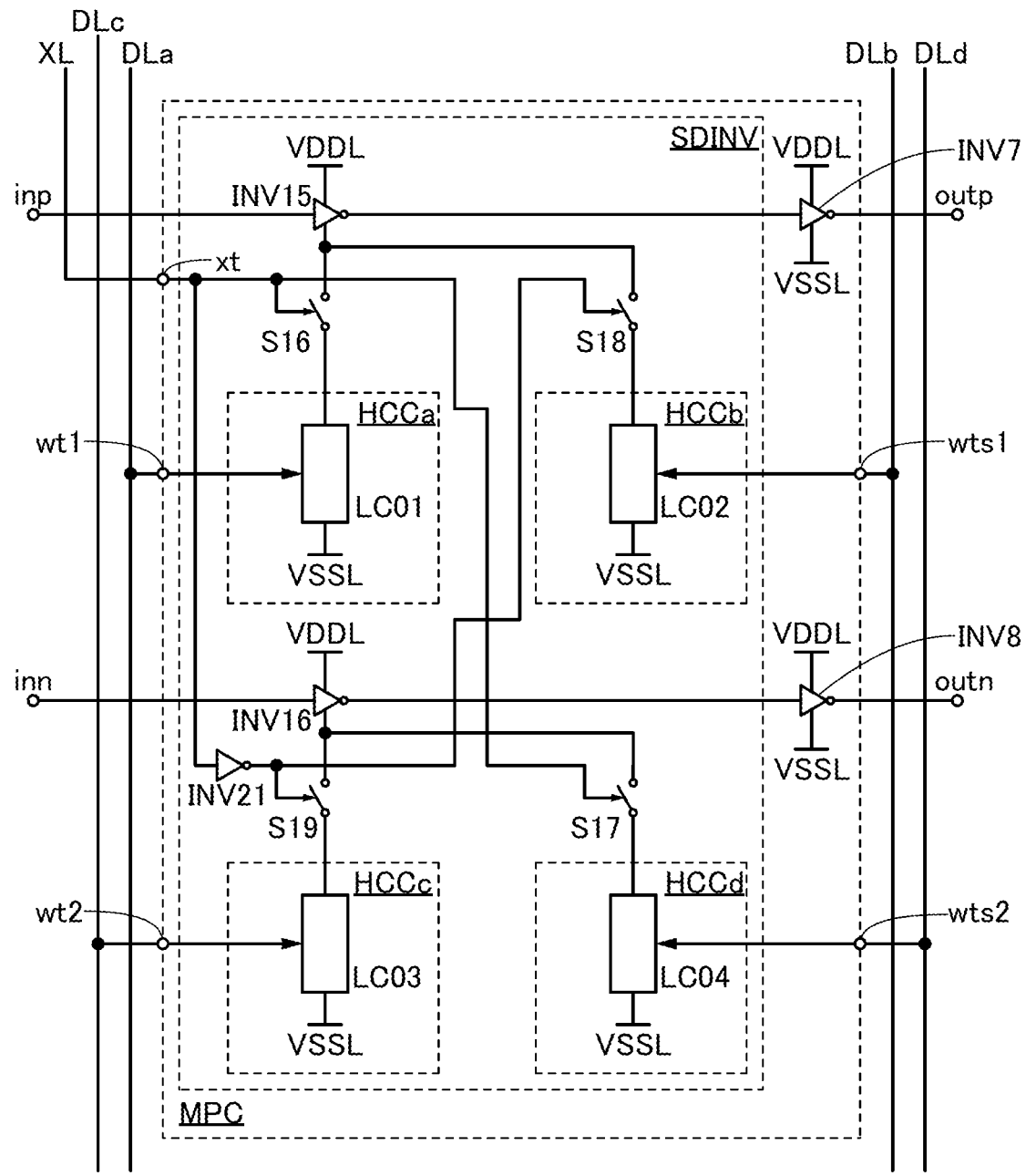
FIG. 29 is a block diagram illustrating a structure example of a circuit included in a semiconductor device.

As another example, each of the holding units HCCa to HCCd included in the circuit SDINV of the circuit MPC in FIG. 28 may include a load circuit like the holding units HCCa and HCCb of the circuit MPC in FIG. 19, and the circuit MPC in FIG. 28 may include the switches S16 to S19 instead of the transistors Tr31 to Tr34. FIG. 29 illustrates a circuit configuration in which the holding units HCCa to HCCd included in the circuit SDINV of the circuit MPC in FIG. 28 include respective load circuits LC01 to LC04 and the load circuit to be electrically connected to the low power supply potential input terminal of the inverter circuit is selected by switching of the on/off state of each of the switches S16 to S19.

The low power supply potential input terminal of the inverter circuit INV15 is electrically connected to the first terminal of the switch S16 and the first terminal of the switch S18. The low power supply potential input terminal of the inverter circuit INV16 is electrically connected to the first terminal of the switch S17 and the first terminal of the switch S19.

The holding unit HCCa includes the load circuit LC01. The first terminal of the load circuit LC01 is electrically connected to the second terminal of the switch S16, and the second terminal of the load circuit LC01 is electrically connected to the wiring VSSL. The resistance between the first terminal and the second terminal of the load circuit LC01 is determined in accordance with a potential supplied from the wiring DLa through the terminal wt1. The potential can be, for example, a high-level or low-level potential representing a digital value or a potential representing an analog value.

The holding unit HCCb includes the load circuit LC02, the holding unit HCCc includes the load circuit LC03, and the holding unit HCCd includes the load circuit LC04. The electrical connection structure of each of the load circuits LC02 to LC04 can be substantially the same as that of the load circuit LC01. In FIG. 29, the first terminal of the load circuit LC02 is electrically connected to the second terminal of the switch S18, a first terminal of the load circuit LC03 is electrically connected to the second terminal of the switch S19, and a first terminal of the load circuit LC04 is electrically connected to the second terminal of the switch S17. The resistance between the first terminal and the second terminal of the load circuit LC02 is determined in accordance with a voltage applied from the wiring DLb through the terminal wts1. The resistance between the first terminal and a second terminal of the load circuit LC03 is determined in accordance with a voltage applied from the wiring DLc through the terminal wt2. The resistance between the first terminal and a second terminal of the load circuit LC04 is determined in accordance with a voltage applied from the wiring DLd through the terminal wts2.

Figure 26:
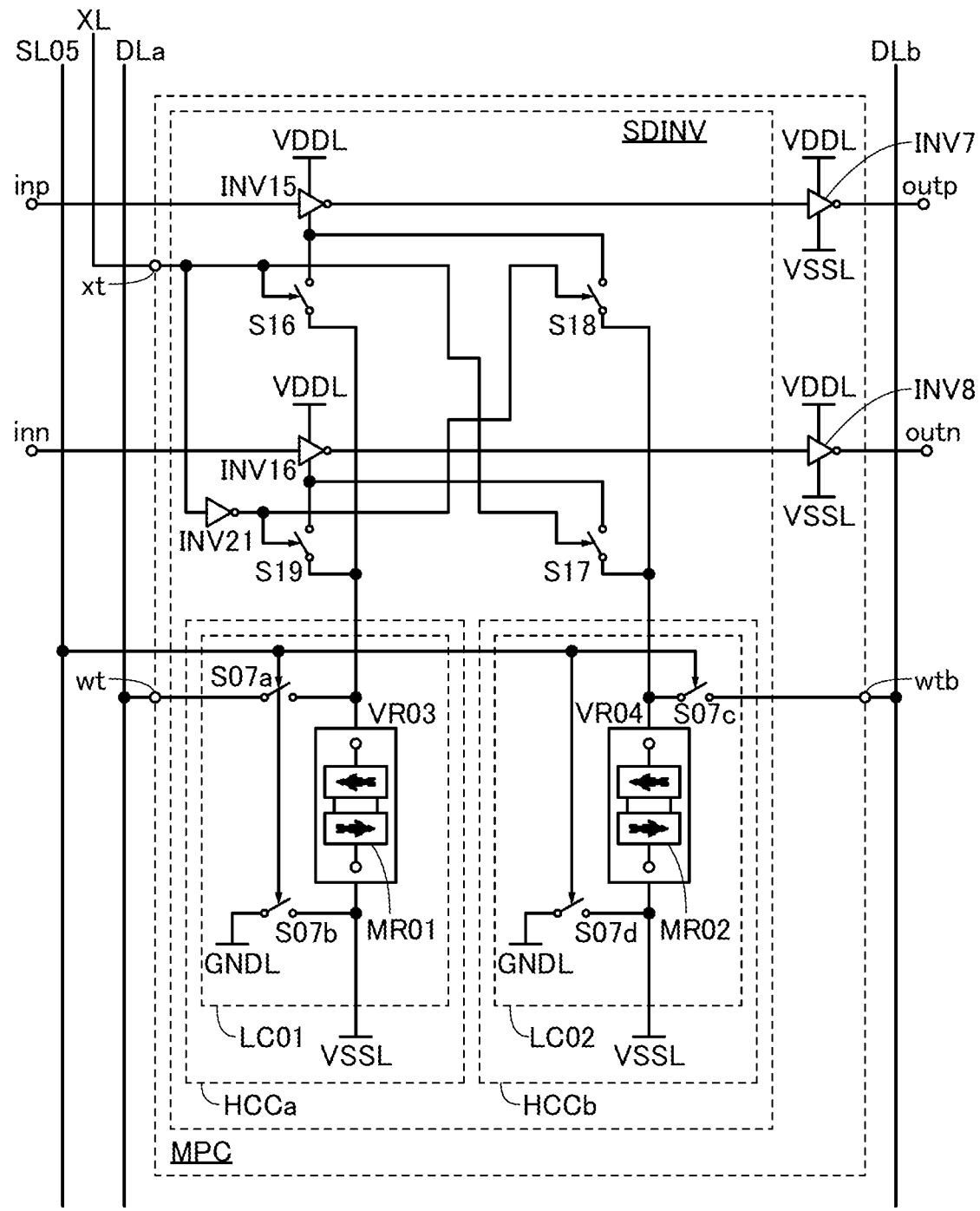
FIG. 26 is a block diagram illustrating a structure example of a circuit included in a semiconductor device.
Figure 27:
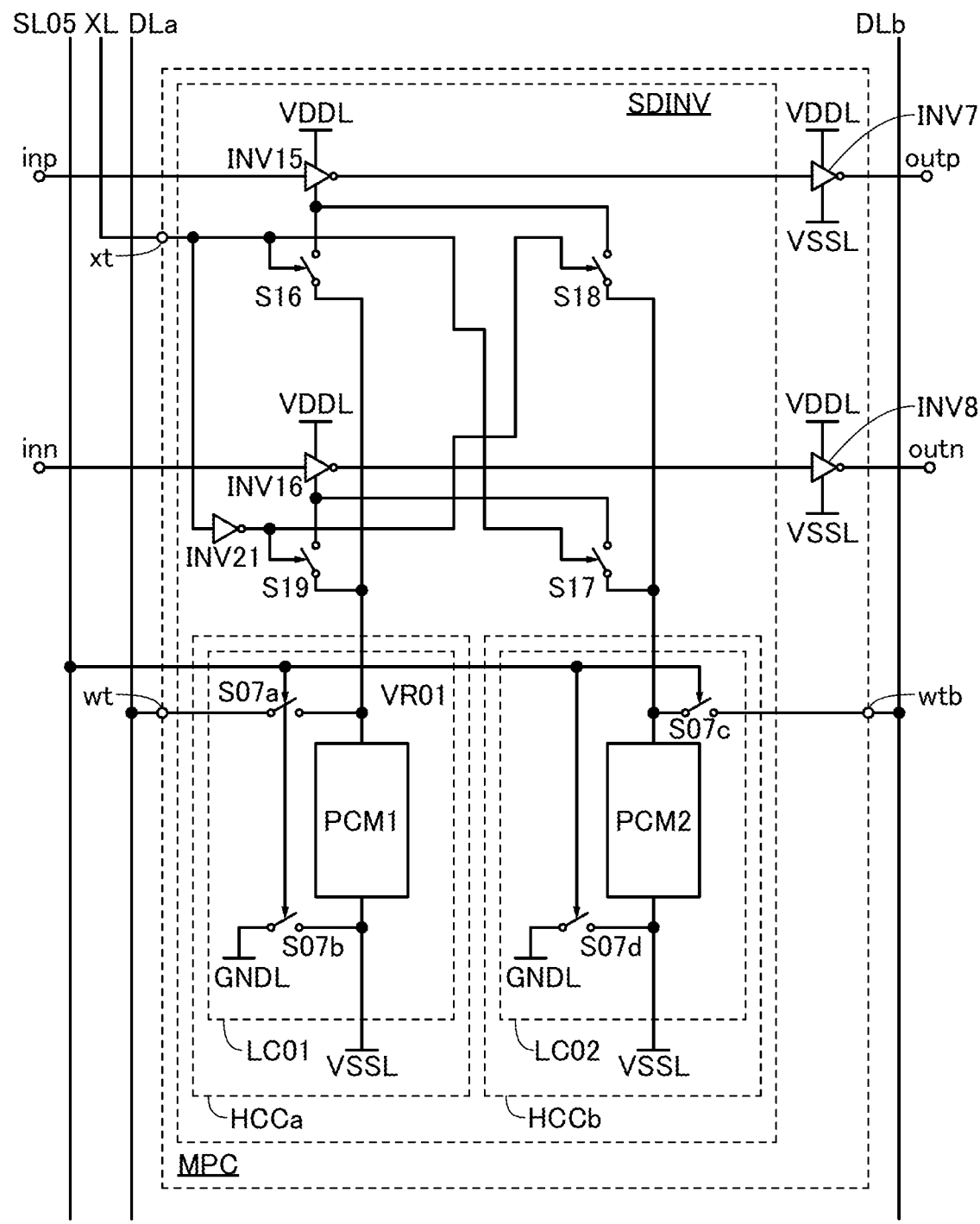
FIG. 27 is a block diagram illustrating a structure example of a circuit included in a semiconductor device.

The load circuits LC01 to LC04 illustrated in FIG. 29 can be, for example, the load circuit LC01 including the variable resistor VR01 (the load circuit LC02 including the variable resistor VR02) in FIGS. 22 to 25, the load circuit LC01 including the MTJ element MR01 (the load circuit LC02 including the MTJ element MR02) in FIG. 26, or the load circuit LC01 including the phase-change memory PCM1 (the load circuit LC02 including the phase-change memory PCM2) in FIG. 27.

Figure 30:
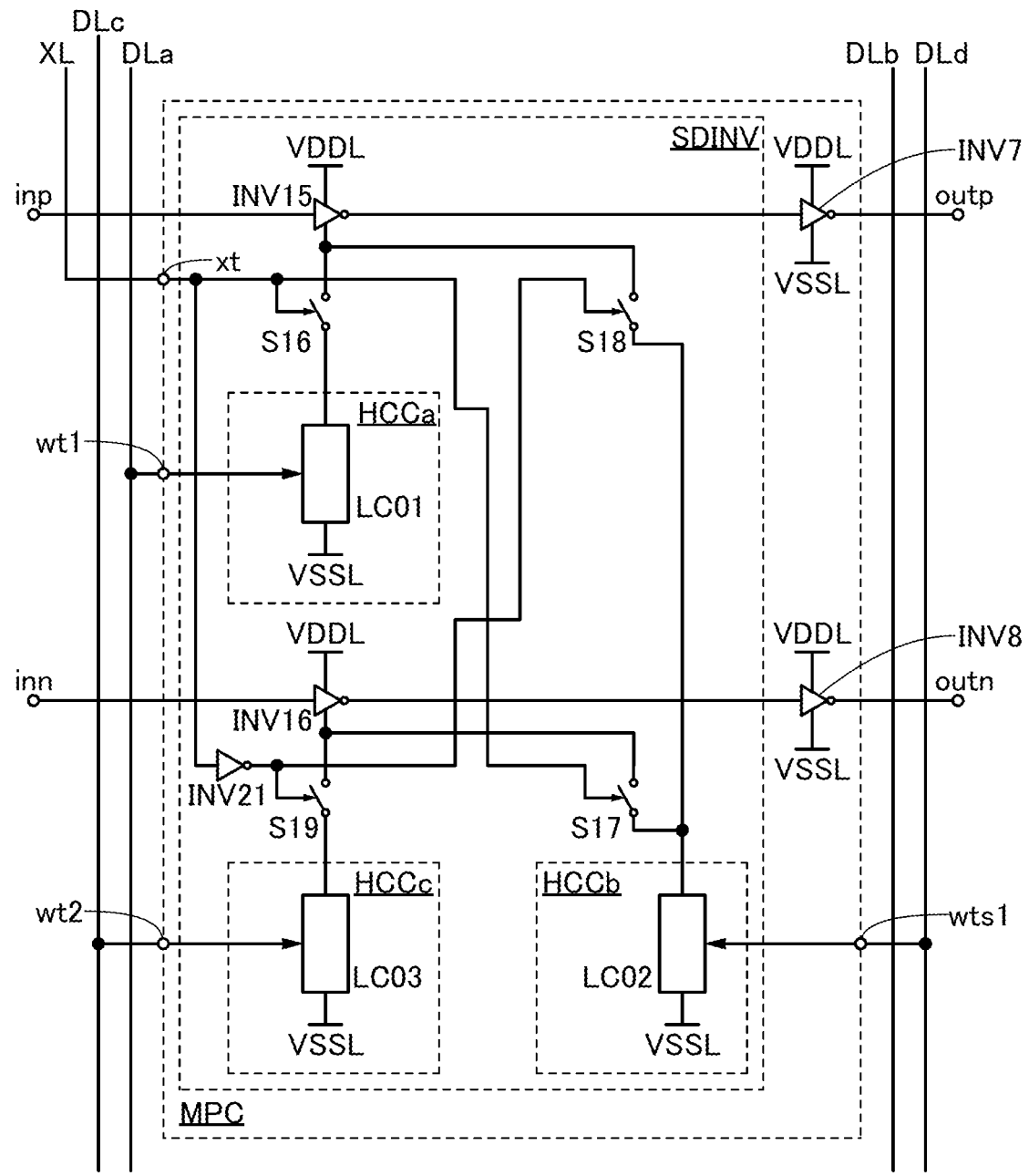
FIG. 30 is a block diagram illustrating a structure example of a circuit included in a semiconductor device.

The circuit MPC in FIG. 12A may have a configuration obtained by changing the configuration of the circuit MPC in FIG. 29. For example, in the circuit MPC in FIG. 29, the second terminals of the switches S17 and S18 may be electrically connected to the first terminal of the load circuit LC02 in the holding unit HCCb as illustrated in FIG. 30. The circuit MPC in FIG. 30 includes the holding unit HCCb serving as both the holding unit HCCb and the holding unit HCCd in FIG. 29. Although the holding unit HCCb of the circuit MPC in FIG. 30 serves as the holding unit HCCb and the holding unit HCCd in FIG. 29, one holding unit may serve as the holding unit HCCa and the holding unit HCCc while the holding unit HCCb and the holding unit HCCd in FIG. 29 are provided without change (not illustrated).

Figure 31:
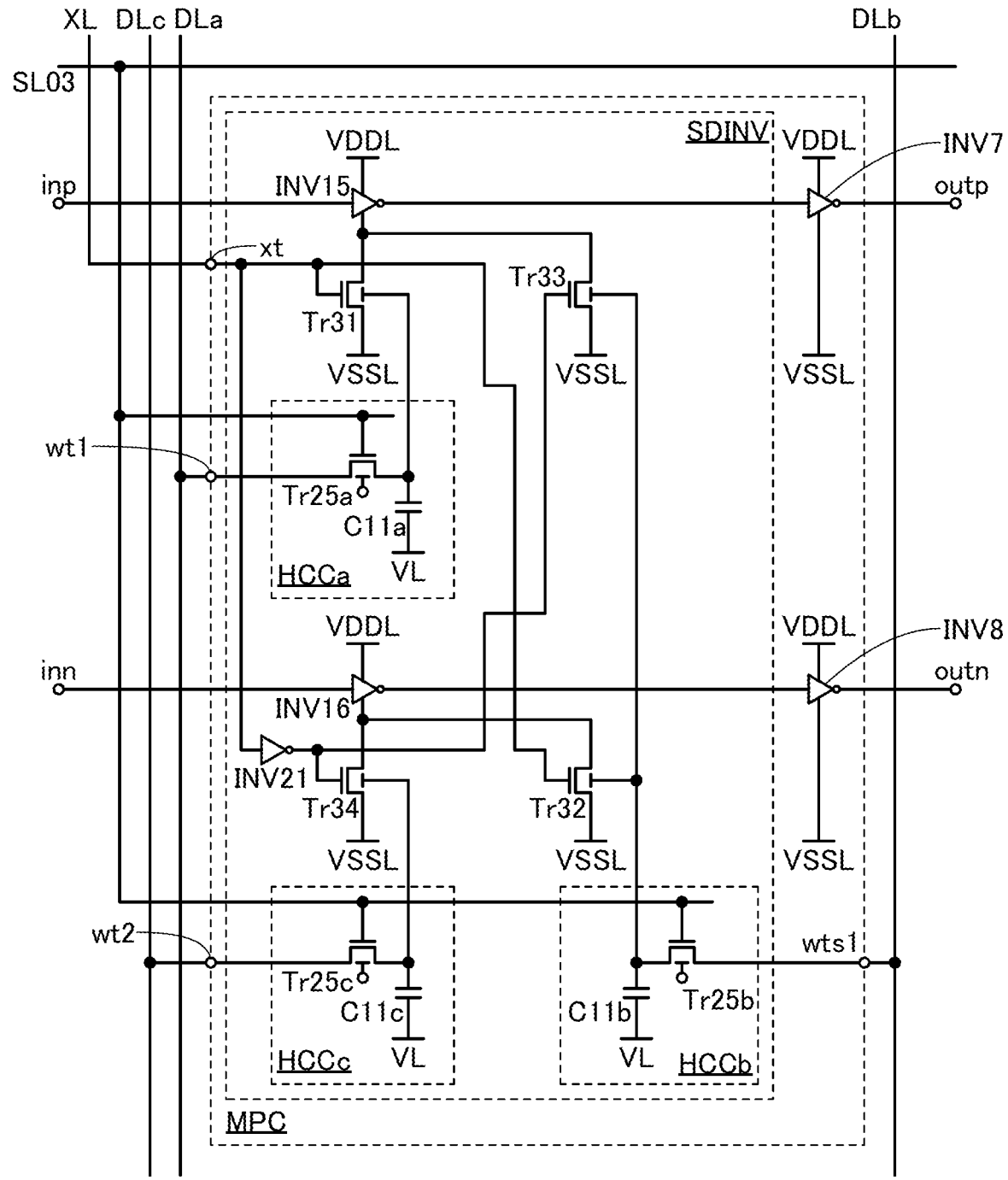
FIG. 31 is a circuit diagram illustrating a structure example of a circuit included in a semiconductor device.

In the circuit MPC in FIG. 30, the holding unit HCCb is formed as the holding unit HCCb and the holding unit HCCd in FIG. 29; similarly, as illustrated in FIG. 31, the circuit MPC in FIG. 28 may include the holding unit HCCb serving as both the holding unit HCCb and the holding unit HCCd in FIG. 29. Alternatively, one holding unit may serve as the holding unit HCCa and the holding unit HCCc while the holding unit HCCb and the holding unit HCCd in FIG. 28 are provided without change (not illustrated).

As the circuit MPC in FIG. 12A, the circuit MPC in which one holding unit functions as some of the holding units as illustrated in FIG. 30 and FIG. 31 can be used.

Structure Example 5

Figure 32:
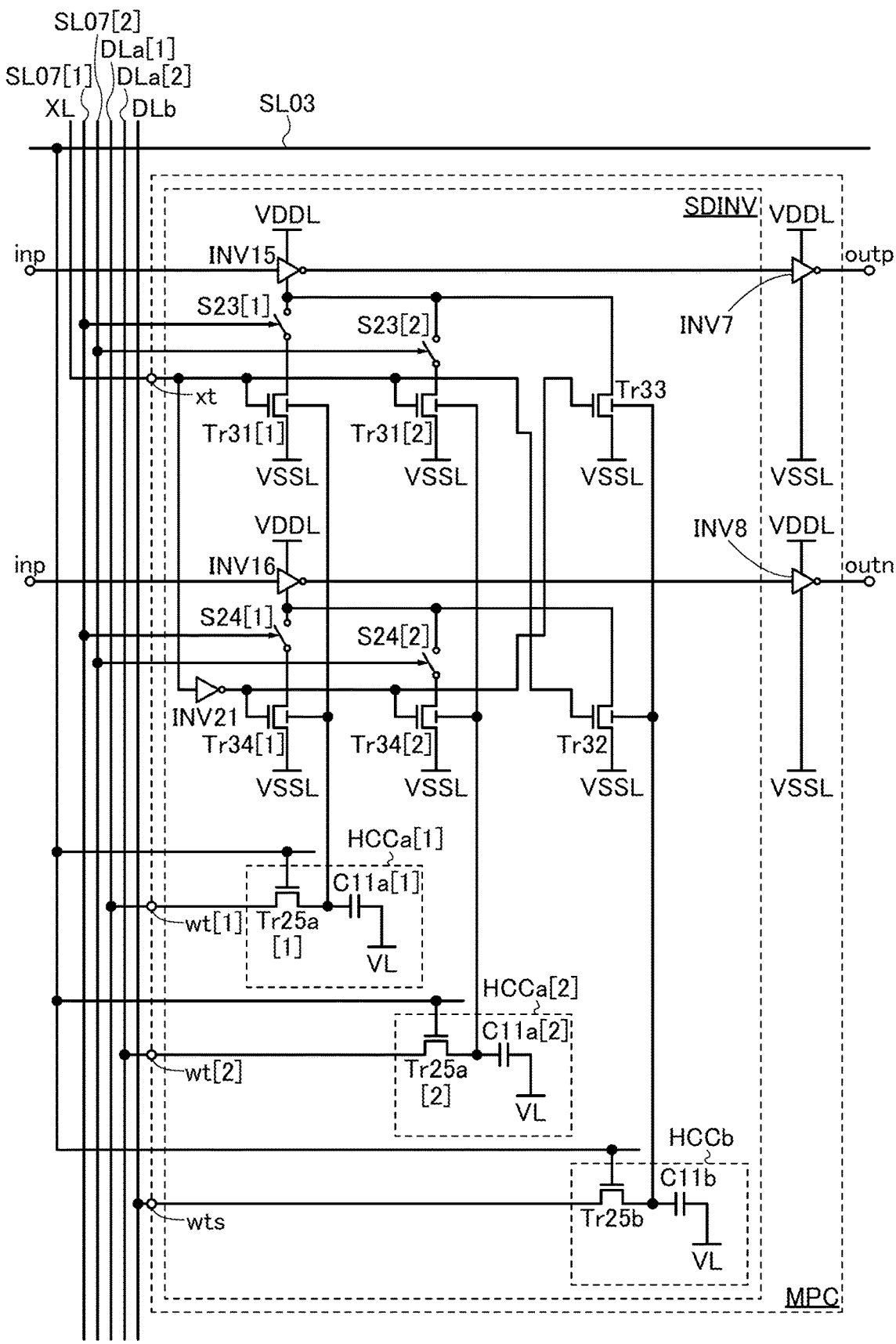
FIG. 32 is a circuit diagram illustrating a structure example of a circuit included in a semiconductor device.

In the circuit MPC illustrated in FIG. 32, the number of transistors Tr31 electrically connected to the low power supply potential input terminal of the inverter circuit INV15 and the number of transistors Tr34 electrically connected to the low power supply potential input terminal of the inverter circuit INV16 are different from those in the circuit MPC in FIG. 13. Specifically, the circuit SDINV in FIG. 32 includes a transistor Tr31[1] and a transistor Tr31[2] as the transistor Tr31 in FIG. 13, and includes a transistor Tr34[1] and a transistor Tr34[2] as the transistor Tr34 in FIG. 13.

Moreover, the circuit SDINV in FIG. 32 includes holding units for holding the potentials of back gates of the transistors Tr31[1], Tr31[2], Tr34[1], and Tr34[2]. Specifically, the circuit SDINV in FIG. 32 includes a holding unit HCCa[1] and a holding unit HCCa[2] as the holding unit HCCa of the circuit SDINV in FIG. 13.

The holding unit HCCa[1] and the holding unit HCCa[2] each have a circuit configuration similar to that of the holding unit HCCa of the circuit SDINV in FIG. 13. In the holding unit HCCa[1] in FIG. 32, a transistor Tr25a[1] corresponds to the transistor Tr25a in FIG. 13 and a capacitor C11a[1] corresponds to the capacitor C11a in FIG. 13. Moreover, in the holding unit HCCa[2] in FIG. 32, a transistor Tr25a[2] corresponds to the transistor Tr25a in FIG. 13 and a capacitor C11a[2] corresponds to the capacitor C11a in FIG. 13.

The circuit SDINV in FIG. 32 also includes a switch S23[1], a switch S23[2], a switch S24[1], and a switch S24[2] in addition to the circuit components included in the circuit SDINV in FIG. 13.

A first terminal of the switch S23[1] is electrically connected to the low power supply potential input terminal of the inverter circuit INV15, and a second terminal of the switch S23[1] is electrically connected to a first terminal of the transistor Tr31[1]. A first terminal of the switch S23[2] is electrically connected to the low power supply potential input terminal of the inverter circuit INV15, and a second terminal of the switch S23[2] is electrically connected to a first terminal of the transistor Tr31[2]. A first terminal of the switch S24[1] is electrically connected to the low power supply potential input terminal of the inverter circuit INV16, and a second terminal of the switch S24[1] is electrically connected to a first terminal of the transistor Tr34[1]. A first terminal of the switch S24[2] is electrically connected to the low power supply potential input terminal of the inverter circuit INV16, and a second terminal of the switch S24[2] is electrically connected to a first terminal of the transistor Tr34[2]. A control terminal of the switch S23[1] and a control terminal of the switch S24[1] are electrically connected to a wiring SL07[1], and a control terminal of the switch S23[2] and a control terminal of the switch S24[2] are electrically connected to a wiring SL07[2].

The switch S23[1] (the switch S24[1]) is turned on or off by supplying a potential from the wiring SL07[1] to the control terminal of the switch S23[1] (the switch S24[1]). Similarly, the switch S23[2] (the switch S24[2]) is turned on or off by supplying a potential from the wiring SL07[2] to the control terminal of the switch S23[2] (the switch S24[2]). Note that in this specification and the like, the switches S23[1], S23[2], S24[1], and S24[2] are turned on by supplying a high-level potential to their control terminals, and are turned off by supplying a low-level potential to their control terminals.

Gates of the transistors Tr31[1] and Tr31[2] are electrically connected to the wiring XL through the terminal xt. Gates of the transistors Tr34[1] and Tr34[2] are electrically connected to the output terminal of the inverter circuit INV21. The input terminal of the inverter circuit INV21 is electrically connected to the wiring XL through the terminal xt.

The back gate potentials of the transistors Tr31[1] and Tr34[1] are held in the holding unit HCCa[1]. The potential held in the holding unit HCCa[1] is input from the wiring DLa[1] through a terminal wt[1]. Similarly, the back gate potentials of the transistors Tr31 [2] and Tr34[2] are held in the holding unit HCCa[2]. The potential held in the holding unit HCCa[2] is input from a wiring DLa[2] through a terminal wt[2].

Like the terminal wt in FIG. 13, the terminal wt[1] and the terminal wt[2] are supplied with a potential corresponding to the weight coefficient. That is, like the holding unit HCC in FIG. 13, the holding unit HCCa[1] and the holding unit HCCa[2] can hold the potentials corresponding to the weight coefficients. In other words, the circuit SDINV in the circuit MPC in FIG. 32 can hold the potentials corresponding to two weight coefficients.

When the circuit MPC in FIG. 32 is used as all the circuits MPC in the arithmetic circuit 110, arithmetic operations can be performed with switching between the weight coefficients. For example, in the circuit SDINV in the circuits MPC[1] to MPC[m] of the arithmetic circuit 110, the potentials corresponding to the weight coefficients $w_1^{(k-1)(k)}{}_j$ to $w_m^{(k-1)(k)}{}_j$ are held in the holding units HCCa[1], the potentials corresponding to the weight coefficients $w_1^{(k-1)(k)}{}_h$ to $w_m^{(k-1)(k)}{}_h$ (here, h is an integer greater than or equal to 1 and less than or equal to n, and not j) are held in the holding units HCCa[2], and the signals $x_1^{(k-1)}$ to $x_m^{(k-1)}$ corresponding to the signals $z_1^{(k-1)}$ to $z_m^{(k-1)}$ are input to the terminals xt. Intermediate potentials are held in the holding units HCCb. At this time, a high-level potential is supplied to the wiring SL07[1] to turn on the switches S23[1] and S24[1] and a low-level potential is supplied to the wiring SL07[2] to turn off the switches S23[2] and S24[2], so that the arithmetic circuit 110 can perform the product-sum operation of the weight coefficients $w_1^{(k-1)(k)}{}_j$ to $w_m^{(k-1)(k)}{}_j$ and the signals $z_1^{(k-1)}$ to $z_m^{(k-1)}$ and the arithmetic operation of the activation function. In addition, a low-level potential is supplied to the wiring SL07[1] to turn off the switches S23[1] and S24[1] and a high-level potential is supplied to the wiring SL07[2] to turn on the switches S23[2] and S24[2], so that the arithmetic circuit 110 can perform the product-sum operation of the weight coefficients $w_1^{(k-1)(k)}{}_h$ to $w_m^{(k-1)(k)}{}_h$ and the signals $z_1^{(k-1)}$ to $z_m^{(k-1)}$ and the arithmetic operation of the activation function.

When the circuit MPC in FIG. 32 is used as all the circuits MPC in the arithmetic circuit 110, the weight coefficients can be switched and thus arithmetic operation for each weight coefficient can be performed. FIG. 32 shows that the circuit MPC includes two holding units HCCa[1] and HCCa[2] as the holding unit HCCa in FIG. 13; alternatively, the circuit MPC can include three or more holding units. In such cases, the holding units can hold different potentials (e.g., potentials representing analog values). In the case where the weight coefficient used in the neural network is 1-bit (binary) data, for example, a high-level potential is held in the holding unit HCCa[1] and a low-level potential is held in the holding unit HCCa[2] so that the arithmetic operation can be performed while the weight coefficients are switched depending on the conditions.

Note that the configuration of the circuit MPC in FIG. 12A is not limited to that in FIG. 32 and may be obtained by changing the configuration in FIG. 32 according to circumstances. For example, in the circuit MPC in FIG. 32, the first terminals of the transistors Tr31[1], Tr31[2], and Tr33 are electrically connected to the low power supply potential input terminal of the inverter circuit INV15, and the first terminals of the transistors Tr32, Tr34[1], and Tr34[2] are electrically connected to the low power supply potential input terminal of the inverter circuit INV16. Alternatively, as in the circuit MPC in FIG. 16, the first terminals of the transistors Tr31[1], Tr31[2], and Tr33 may be electrically connected to the high power supply potential input terminal of the inverter circuit INV15, and the first terminals of the transistors Tr32, Tr34[1], and Tr34[2] may be electrically connected to the high power supply potential input terminal of the inverter circuit INV16. Furthermore, the inverter circuit INV7, the inverter circuit INV8, the inverter circuit INV15, and the inverter circuit INV16 included in the circuit MPC in FIG. 32 may be replaced with the logic circuit LGC7, the logic circuit LGC8, the logic circuit LGC15, and the logic circuit LGC16, respectively, as in the circuit MPC in FIG. 17.

Figure 33:
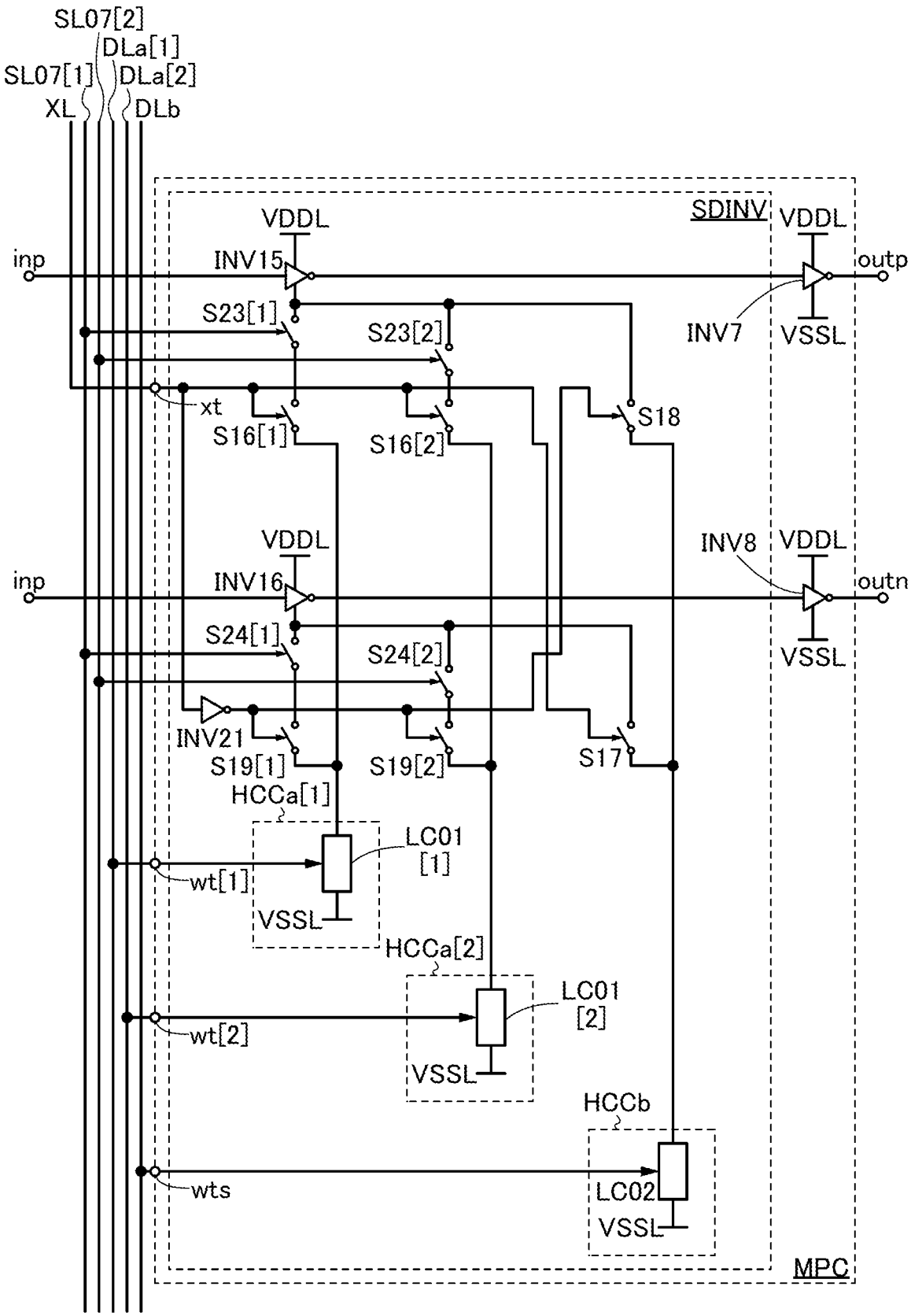
FIG. 33 is a block diagram illustrating a structure example of a circuit included in a semiconductor device.

As another example, like the holding units HCCa and HCCb of the circuit MPC in FIG. 19, each of the holding units HCCa[1], HCCa[2], and HCCb included in the circuit SDINV of the circuit MPC in FIG. 32 may include a load circuit. FIG. 33 illustrates a configuration in which the holding unit HCCa[1], the holding unit HCCa[2], and the holding unit HCCb included in the circuit SDINV of the circuit MPC in FIG. 32 include a load circuit LC01[1], a load circuit LC01[2], and the load circuit LC02, respectively. Thus, the circuit MPC in FIG. 33 includes a switch S16[1], a switch S16[2], the switch S17, the switch S18, a switch S19[1], and a switch S19[2] without the transistor Tr31[1], the transistor Tr31[2], the transistor Tr32, the transistor Tr33, the transistor Tr34[1], and the transistor Tr34[2], which are included in the circuit MPC in FIG. 32. The circuit MPC in FIG. 33 has a configuration in which each of the holding units of the circuit MPC in FIG. 32 includes a load circuit; as a variation example of the circuit MPC in FIG. 32, only one or two of the holding unit HCCa[1], the holding unit HCCa[2], and the holding unit HCCb may include a load circuit (not illustrated). When the circuit MPC in FIG. 33 is used as all the circuits MPC of the arithmetic circuit 110, the arithmetic circuit 110 can switch between weight coefficients and performs arithmetic operation corresponding to the selected weight coefficient as in the case of using the circuit MPC in FIG. 32.

Note that a plurality of structure examples described in this embodiment can be combined as appropriate.

This embodiment can be combined with any of the other embodiments in this specification as appropriate.

Embodiment 4

In this embodiment, an example of a structure of an OS transistor that can be used in the semiconductor device described in the above embodiment will be described.

<Structure Example of Semiconductor Device>

Figure 34:
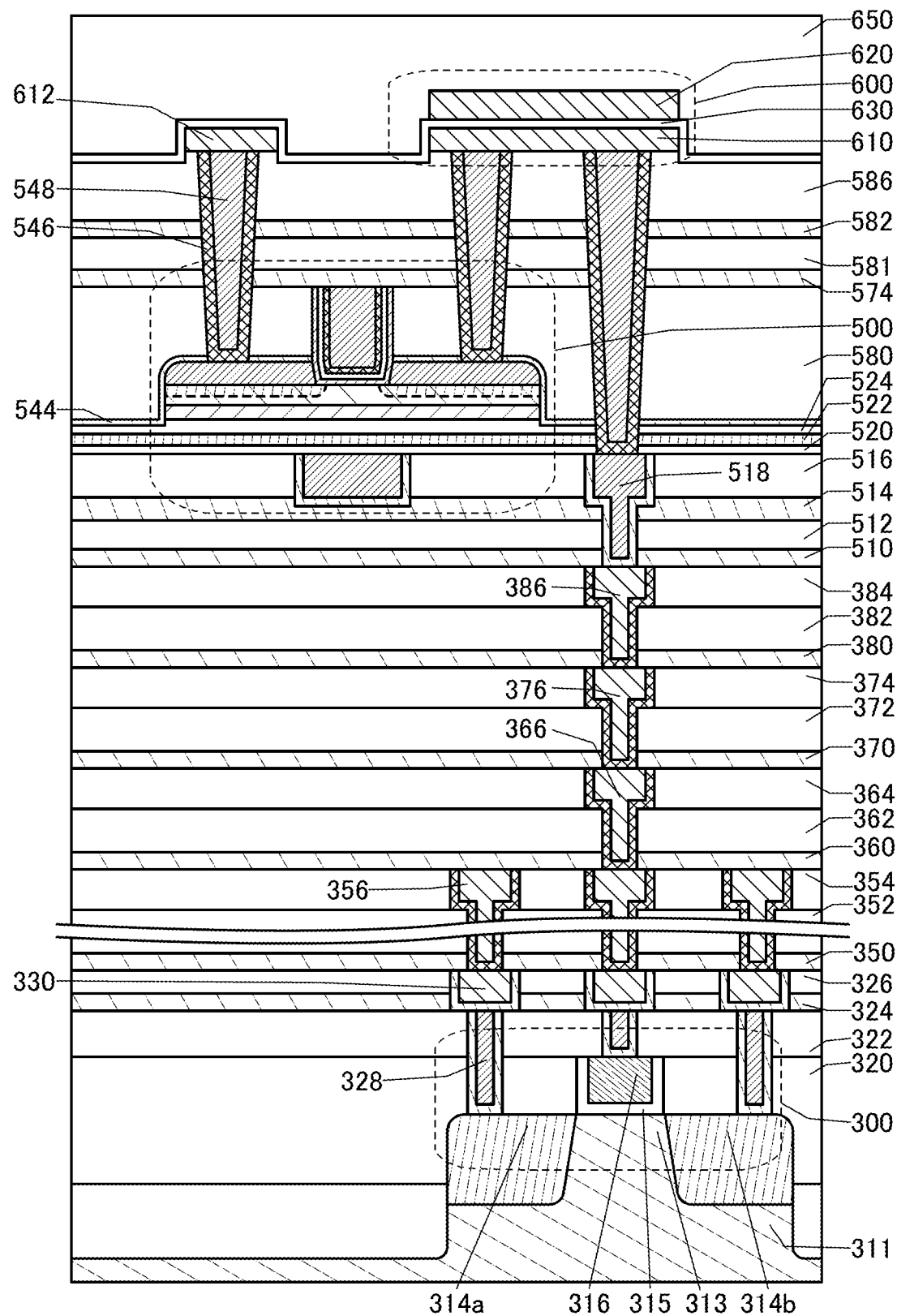
FIG. 34 is a cross-sectional view illustrating a structure example of a semiconductor device.
Figure 36A:
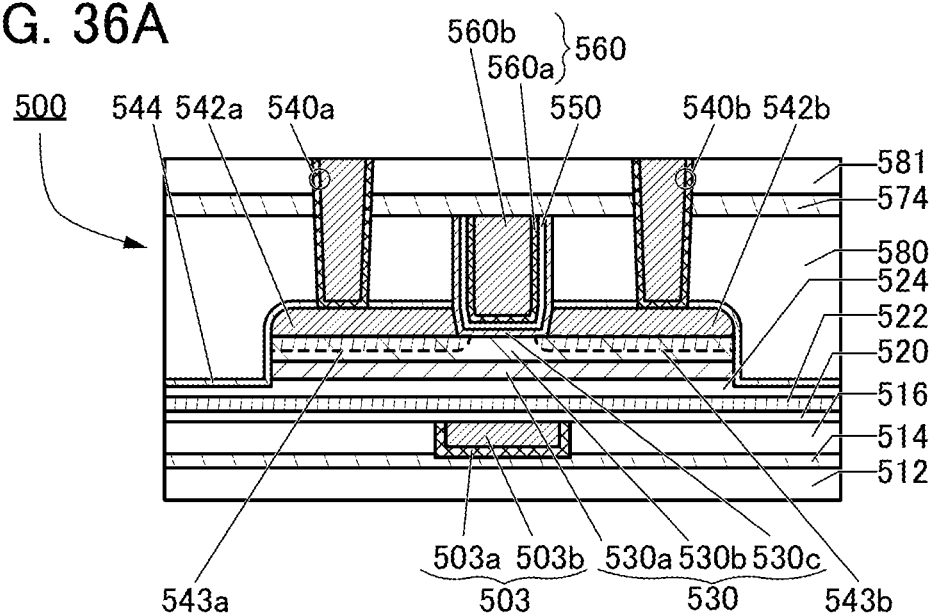
FIGS. 36A to 36C are cross-sectional views each illustrating a structure example of a transistor.
Figure 36B:
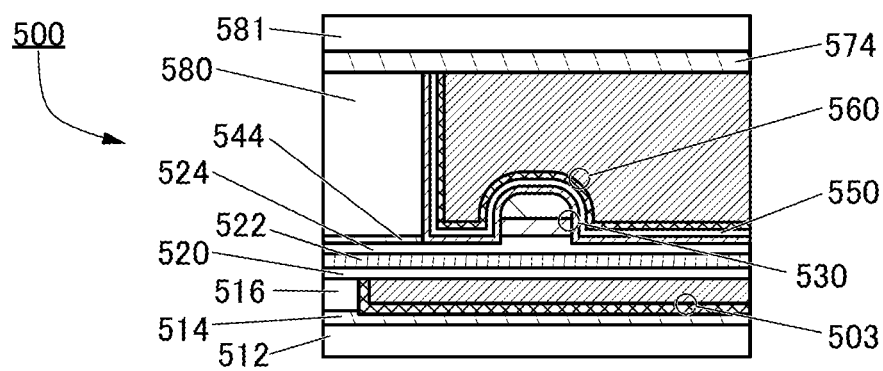
Figure 36C:
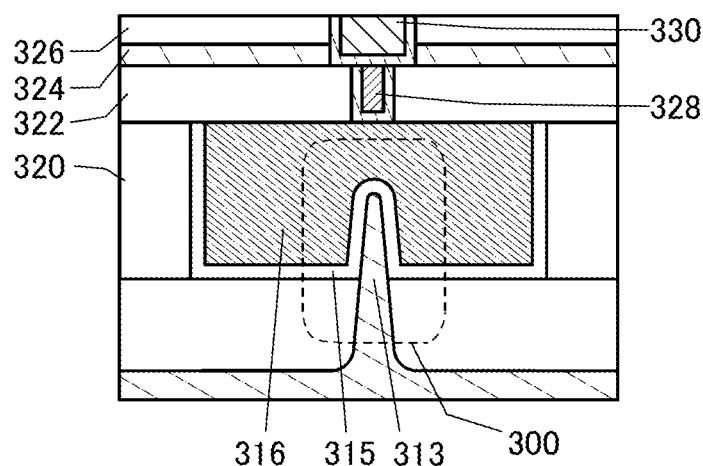

A semiconductor device illustrated in FIG. 34 includes a transistor 300, a transistor 500, and a capacitor 600. FIG. 36A is a cross-sectional view of the transistor 500 in the channel length direction. FIG. 36B is a cross-sectional view of the transistor 500 in the channel width direction. FIG. 36C is a cross-sectional view of the transistor 300 in the channel width direction.

The transistor 500 is a transistor including a metal oxide in its channel formation region (an OS transistor). Since the off-state current of the transistor 500 is low, the use of the transistor 500 in a semiconductor device, particularly as the transistor Tr03 in the arithmetic circuit 110, for example, enables long-term retention of written data. In other words, power consumption of the semiconductor device can be reduced because the semiconductor device has a low frequency of refresh operation or requires no refresh operation.

The semiconductor device described in this embodiment includes the transistor 300, the transistor 500, and the capacitor 600 as illustrated in FIG. 34. The transistor 500 is provided above the transistor 300, and the capacitor 600 is provided above the transistor 300 and the transistor 500. The capacitor 600 can be used as the capacitor C01 in the circuit BF1 shown in the foregoing embodiment, for example.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region. Note that the transistor 300 can be used as the transistors in the above embodiment, for example.

In the transistor 300, the top surface and the side surface in the channel width direction of the semiconductor region 313 are covered with the conductor 316 with the insulator 315 therebetween, as illustrated in FIG. 36C. Such a FIN-type transistor 300 can have an increased effective channel width, and thus have improved on-state characteristics. In addition, contribution of electric fields of the gate electrode can be increased, so that the off-state characteristics of the transistor 300 can be improved.

Note that the transistor 300 can be a p-channel transistor or an n-channel transistor.

A region of the semiconductor region 313 where a channel is formed, a region in the vicinity thereof, the low-resistance regions 314*a* and 314*b* functioning as the source and drain regions, and the like preferably contain a semiconductor such as a silicon-based semiconductor, further preferably contain single crystal silicon. Alternatively, a material including germanium (Ge), silicon germanium (SiGe), gallium arsenide (GaAs), gallium aluminum arsenide (GaAlAs), or the like may be contained. Silicon whose effective mass is adjusted by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 314*a* and 314*b* contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that the work function depends on a material used for a conductor; therefore, selecting the material for the conductor 316 can adjust the threshold voltage of the transistor. Specifically, titanium nitride, tantalum nitride, or the like is preferably used for the conductor. Furthermore, in order to ensure the conductivity and embeddability of the conductor, a stacked layer of metal materials such as tungsten and aluminum is preferably used for the conductor. In particular, tungsten is preferable in terms of heat resistance.

Figure 35:
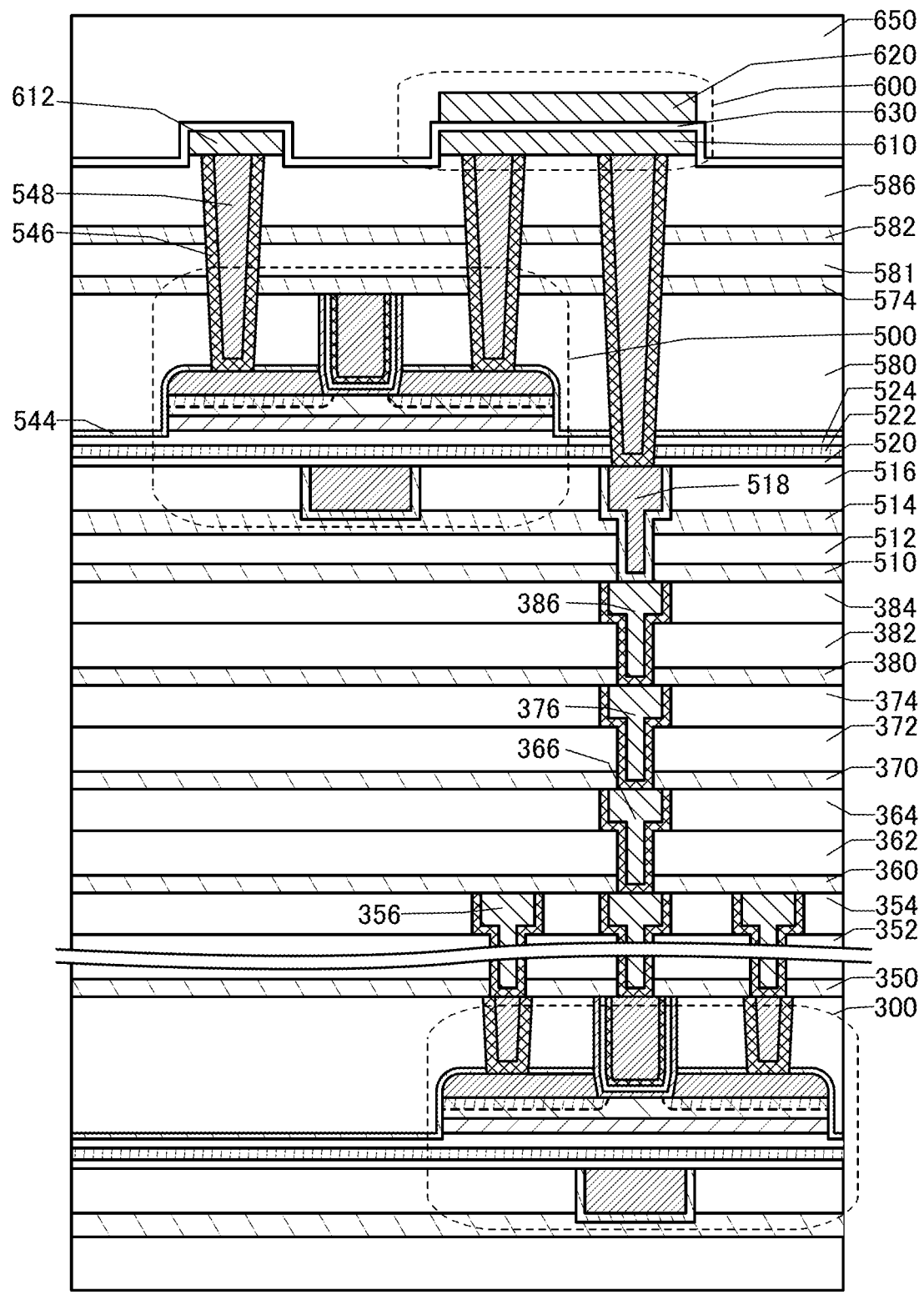
FIG. 35 is a cross-sectional view illustrating a structure example of a semiconductor device.

Note that the transistor 300 illustrated in FIG. 34 is just an example and is not limited to having the structure shown therein; an appropriate transistor can be used in accordance with a circuit configuration or a driving method. For example, when a semiconductor device is composed only of OS transistors, the transistor 300 has a structure similar to that of the transistor 500 containing an oxide semiconductor, as illustrated in FIG. 35. Note that the details of the transistor 500 will be described later.

An insulator 320, an insulator 322, an insulator 324, and an insulator 326 are stacked in this order to cover the transistor 300.

For the insulators 320, 322, 324, and 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to improve planarity.

The insulator 324 is preferably formed using a film having a barrier property that prevents hydrogen or impurities from the substrate 311, the transistor 300, or the like from diffusing to a region where the transistor 500 is provided.

For the film having a barrier property against hydrogen, silicon nitride formed by a CVD method can be used, for example. The diffusion of hydrogen to a semiconductor element including an oxide semiconductor, such as the transistor 500, degrades the characteristics of the semiconductor element in some cases. Therefore, a film that prevents hydrogen diffusion is preferably provided between the transistor 500 and the transistor 300. Specifically, the film that prevents hydrogen diffusion is a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less that of the insulator 324. The use of a material having a low dielectric constant for an interlayer film can reduce the parasitic capacitance between wirings.

A conductor 328, a conductor 330, and the like that are connected to the capacitor 600 or the transistor 500 are provided in the insulators 320, 322, 324, and 326. Note that each of the conductors 328 and 330 functions as a plug or a wiring. A plurality of conductors functioning as plugs or wirings are collectively denoted by the same reference numeral in some cases. Furthermore, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 34, an insulator 350, an insulator 352, and an insulator 354 are stacked in this order. Furthermore, a conductor 356 is formed in the insulator 350, the insulator 352, and the insulator 354. The conductor 356 functions as a plug or a wiring that is connected to the transistor 300. Note that the conductor 356 can be formed using a material similar to that for the conductor 328 and the conductor 330.

For example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. With this structure, the transistor 300 and the transistor 500 can be separated by a barrier layer, so that the diffusion of hydrogen from the transistor 300 to the transistor 500 can be prevented.

Note that as the conductor having a barrier property against hydrogen, tantalum nitride can be used, for example. The use of a stack including tantalum nitride and tungsten having high conductivity can inhibit the diffusion of hydrogen from the transistor 300 while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 34, an insulator 360, an insulator 362, and an insulator 364 are stacked in this order. Moreover, a conductor 366 is formed in the insulator 360, the insulator 362, and the insulator 364. The conductor 366 functions as a plug or a wiring. Note that the conductor 366 can be formed using a material similar to those used for forming the conductor 328 and the conductor 330.

For example, the insulator 360 is preferably formed using an insulator having a barrier property against hydrogen, like the insulator 324. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 and the transistor 500 can be separated by a barrier layer, so that the diffusion of hydrogen from the transistor 300 to the transistor 500 can be prevented.

A wiring layer may be provided over the insulator 364 and the conductor 366. For example, in FIG. 34, an insulator 370, an insulator 372, and an insulator 374 are stacked in this order. Furthermore, a conductor 376 is formed in the insulator 370, the insulator 372, and the insulator 374. The conductor 376 functions as a plug or a wiring. Note that the conductor 376 can be formed using a material similar to those for the conductor 328 and the conductor 330.

For example, the insulator 370 is preferably formed using an insulator having a barrier property against hydrogen, like the insulator 324. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 and the transistor 500 can be separated by a barrier layer, so that the diffusion of hydrogen from the transistor 300 to the transistor 500 can be prevented.

A wiring layer may be provided over the insulator 374 and the conductor 376. For example, in FIG. 34, an insulator 380, an insulator 382, and an insulator 384 are stacked in this order. Moreover, a conductor 386 is formed in the insulator 380, the insulator 382, and the insulator 384. The conductor 386 functions as a plug or a wiring. Note that the conductor 386 can be formed using a material similar to those used for forming the conductor 328 and the conductor 330.

For example, the insulator 380 is preferably formed using an insulator having a barrier property against hydrogen, like the insulator 324. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 and the transistor 500 can be separated by a barrier layer, so that the diffusion of hydrogen from the transistor 300 to the transistor 500 can be prevented.

Although the wiring layer including the conductor 356, the wiring layer including the conductor 366, the wiring layer including the conductor 376, and the wiring layer including the conductor 386 are described above, the semiconductor device of this embodiment is not limited to this structure. The number of wiring layers similar to the wiring layer including the conductor 356 may be three or less or five or more.

An insulator 510, an insulator 512, an insulator 514, and an insulator 516 are stacked in this order over the insulator 384. A material with a barrier property against oxygen or hydrogen is preferably used for any of the insulators 510, 512, 514, and 516.

For example, each of the insulator 510 and the insulator 514 is preferably formed using a film having a barrier property that prevents hydrogen or impurities from the substrate 311, a region where the transistor 300 is provided, or the like from diffusing to a region where the transistor 500 is provided. Therefore, each of the insulator 510 and the insulator 514 can be formed using a material similar to that for the insulator 324.

For the film having a barrier property against hydrogen, silicon nitride formed by a CVD method can be used, for example. The diffusion of hydrogen to a semiconductor element including an oxide semiconductor, such as the transistor 500, degrades the characteristics of the semiconductor element in some cases. Thus, a film that prevents hydrogen diffusion is preferably provided between the transistor 500 and the transistor 300. Specifically, the film that prevents hydrogen diffusion is a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide contained in the transistor 500 can be prevented. Therefore, aluminum oxide is suitably used for a protective film of the transistor 500.

The insulator 512 and the insulator 516 can be formed using a material similar to that for the insulator 320, for example. The use of a material with a relatively low dielectric constant for these insulators can reduce the parasitic capacitance between wirings. A silicon oxide film or a silicon oxynitride film can be used for the insulators 512 and 516, for example.

A conductor 518, a conductor included in the transistor 500 (e.g., a conductor 503), and the like are provided in the insulators 510, 512, 514, and 516. Note that the conductor 518 functions as a plug or a wiring that is connected to the capacitor 600 or the transistor 300. The conductor 518 can be formed using a material similar to that used for forming the conductor 328 and the conductor 330.

In particular, part of the conductor 518 that is in contact with the insulators 510 and 514 is preferably a conductor having a barrier property against oxygen, hydrogen, and water. With this structure, the transistor 300 and the transistor 500 can be separated by a layer having a barrier property against oxygen, hydrogen, and water. As a result, the diffusion of hydrogen from the transistor 300 to the transistor 500 can be prevented.

The transistor 500 is provided over the insulator 516.

As illustrated in FIGS. 36A and 36B, the transistor 500 includes the conductor 503 arranged to be embedded in the insulators 514 and 516, an insulator 520 over the insulator 516 and the conductor 503, an insulator 522 over the insulator 520, an insulator 524 over the insulator 522, an oxide 530a over the insulator 524, an oxide 530b over the oxide 530a, a conductor 542a and a conductor 542b arranged apart from each other over the oxide 530b, an insulator 580 that is placed over the conductors 542a and 542b and has an opening between the conductors 542a and 542b, an oxide 530c on a bottom surface and a side surface of the opening, an insulator 550 over and in contact with the oxide 530c, and a conductor 560 over and in contact with the insulator 550.

As illustrated in FIGS. 36A and 36B, an insulator 544 is preferably provided between the insulator 580 and any of the oxides 530a and 530b and the conductors 542a and 542b. As illustrated in FIGS. 36A and 36B, the conductor 560 preferably includes a conductor 560a over and in contact with the insulator 550 and a conductor 560b provided in contact with the conductor 560a to fill the opening. As illustrated in FIGS. 36A and 36B, an insulator 574 is preferably provided over the insulator 580, the conductor 560, and the insulator 550.

Hereinafter, the oxide 530a, the oxide 530b, and the oxide 530c may be collectively referred to as an oxide 530.

The transistor 500 has a structure where the three oxides 530a, 530b, and 530c are stacked in the region where the channel is formed and its vicinity; however, the present invention is not limited to this structure. For example, the transistor may have a single-layer structure of the oxide 530b, a two-layer structure of the oxide 530b and the oxide 530a or 530c, or a stacked-layer structure of four or more layers. Although the conductor 560 has a two-layer structure in the transistor 500, the present invention is not limited to this structure. For example, the conductor 560 may have a single-layer structure or a stacked-layer structure of three or more layers. The transistor 500 illustrated in FIG. 34 and FIG. 36A is just an example and is not limited to the structure shown therein; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is embedded in an opening of the insulator 580 and the region between the conductor 542a and the conductor 542b. The conductor 560, the conductor 542a, and the conductor 542b are formed in a self-aligned manner with respect to the position of the opening of the insulator 580. That is, in the transistor 500, the gate electrode can be positioned between the source electrode and the drain electrode in a self-aligned manner. Thus, the conductor 560 can be formed without an alignment margin, resulting in a reduction in the footprint of the transistor 500. Accordingly, miniaturization and high integration of the semiconductor device can be achieved.

Since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance formed between the conductor 560 and the conductors 542a and 542b can be reduced. As a result, the transistor 500 can have increased switching speed and excellent frequency characteristics.

The conductor 560 functions as a first gate (also referred to as top gate) electrode in some cases. The conductor 503 functions as a second gate (also referred to as bottom gate) electrode in some cases. In that case, the threshold voltage of the transistor 500 can be controlled by changing a potential applied to the conductor 503 independently of a potential applied to the conductor 560. In particular, when a negative potential is applied to the conductor 503, the threshold voltage of the transistor 500 can be higher than 0 V, and the off-state current can be reduced. Thus, a drain current at the time when a potential applied to the conductor 560 is 0 V can be smaller in the case where a negative potential is applied to the conductor 503 than in the case where a negative potential is not applied to the conductor 503.

The conductor 503 is positioned to be overlapped by the oxide 530 and the conductor 560. Thus, when potentials are applied to the conductor 560 and the conductor 503, an electric field generated from the conductor 560 and an electric field generated from the conductor 503 spread, thereby surrounding the channel formation region in the oxide 530. In this specification and the like, a transistor structure in which the channel formation region is electrically surrounded by electric fields of the first gate electrode and the second gate electrode is referred to as surrounded channel (s-channel) structure.

The conductor 503 has a structure similar to that of the conductor 518; the conductor 503a is formed in contact with an inner wall of the opening in the insulators 514 and 516, and the conductor 503b is formed over and in contact with the conductor 503a. Although the conductor 503a and the conductor 503b are stacked in the transistor 500, the present invention is not limited to this structure. For example, the conductor 503 may have a single-layer structure or a stacked-layer structure of three or more layers.

The conductor 503a is preferably formed using a conductive material having a function of inhibiting diffusion of impurities such as a hydrogen atom, a hydrogen molecule, a water molecule, and a copper atom, that is, a conductive material through which the above impurities are less likely to pass. Alternatively, the conductor 503a is preferably formed using a conductive material having a function of inhibiting diffusion of oxygen (e.g., at least one of oxygen atoms, oxygen molecules, and the like), that is, a conductive material through which the above oxygen is less likely to pass. Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, the conductivity of the conductor 503b can be prevented from being lowered because of oxidation.

When the conductor 503 also functions as a wiring, the conductor 503b is preferably formed using a conductive material that has high conductivity and contains tungsten, copper, or aluminum as its main component. In that case, a conductor 505 is not necessarily provided. Note that the conductor 503b is a single layer in the diagram but may have a stacked-layer structure, for example, a stacked-layer structure of titanium or titanium nitride and any of the above conductive materials.

The insulators 520, 522, and 524 function as a second gate insulating film.

Here, as the insulator 524 in contact with the oxide 530, an insulator containing more oxygen than that in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced, leading to an improvement in reliability of the transistor 500.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 400° C.

When the insulator 524 has an excess-oxygen region, the insulator 522 preferably has a function of inhibiting diffusion of oxygen (e.g., oxygen atoms and oxygen molecules). That is, it is preferred that oxygen be less likely to pass through the insulator 522.

The insulator 522 preferably has a function of inhibiting diffusion of oxygen or impurities, in which case diffusion of oxygen contained in the oxide 530 to the insulator 520 side is prevented. Furthermore, the conductor 503 can be prevented from reacting with oxygen in the insulator 524 or the oxide 530.

The insulator 522 preferably has a single-layer structure or a stacked-layer structure using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST). As miniaturization and high integration of transistors progress, a problem such as generation of leakage current may arise because of a thinner gate insulating film. When a high-k material is used for an insulator functioning as the gate insulating film, a gate potential at the time when the transistor operates can be reduced while the physical thickness of the gate insulating film is maintained.

It is particularly preferable to use an insulator containing an oxide of one or both of aluminum and hafnium, which are insulating materials having a function of inhibiting diffusion of impurities, oxygen, and the like (i.e., insulating materials through which the above oxygen, impurities, and the like are less likely to pass). As the insulator containing an oxide of one or both of aluminum and hafnium, aluminum oxide, hafnium oxide, an oxide containing aluminum and hafnium (hafnium aluminate), or the like is preferably used. The insulator 522 formed of such a material functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the above insulator.

It is preferable that the insulator 520 be thermally stable. For example, silicon oxide and silicon oxynitride are suitable because of their thermal stability. Furthermore, a combination of a high-k insulator and silicon oxide or silicon oxynitride enables the insulator 520 to have a stacked-layer structure that is thermally stable and has a high dielectric constant.

Note that FIGS. 36A and 36B show that the transistor 500 includes the insulators 520, 522, and 524 as the second gate insulating film having a three-layer structure; alternatively, the second gate insulating film may have a single-layer structure, a two-layer structure, or a stacked-layer structure of four or more layers. In such cases, the stacked layers are not necessarily formed of the same material and may be formed of different materials.

In the transistor 500, a metal oxide functioning as an oxide semiconductor is preferably used as the oxide 530 including a channel formation region. For example, as the oxide 530, a metal oxide such as an In-M-Zn oxide (the element M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. The In-M-Zn oxide that can be used as the oxide 530 is particularly preferably a CAAC-OS or a CAC-OS each of which will be described in Embodiment 5. Alternatively, an In—Ga oxide or an In—Zn oxide may be used as the oxide 530.

The metal oxide functioning as the channel formation region in the oxide 530 has a band gap of preferably 2 eV or higher, further preferably 2.5 eV or higher. The use of a metal oxide having a wide band gap can reduce the off-state current of the transistor.

By including the oxide 530a under the oxide 530b, the oxide 530 can prevent impurities from diffusing into the oxide 530b from the components formed below the oxide 530a. By including the oxide 530c over the oxide 530b, the oxide 530 can prevent impurities from diffusing into the oxide 530b from the components formed above the oxide 530c.

The oxide 530 preferably has a stacked-layer structure of oxides that differ in the atomic ratio of metal elements. Specifically, the atomic ratio of the element M to the constituent elements in the metal oxide used as the oxide 530a is preferably greater than that in the metal oxide used as the oxide 530b. Moreover, the atomic ratio of the element M to In in the metal oxide used as the oxide 530a is preferably greater than that in the metal oxide used as the oxide 530b. Furthermore, the atomic ratio of In to the element M in the metal oxide used as the oxide 530b is preferably greater than that in the metal oxide used as the oxide 530a. The oxide 530c can be formed using a metal oxide that can be used as the oxide 530a or the oxide 530b.

The energy of the conduction band minimum of each of the oxides 530a and 530c is preferably higher than that of the oxide 530b. In other words, the electron affinity of each of the oxides 530a and 530c is preferably smaller than that of the oxide 530b.

Here, the energy level of the conduction band minimum is gradually varied at junction portions of the oxides 530a, 530b, and 530c. In other words, the energy level of the conduction band minimum at the junction portions of the oxides 530a, 530b, and 530c is continuously varied or continuously connected. To vary the energy level gradually, the density of defect states in a mixed layer formed at the interface between the oxides 530a and 530b and the interface between the oxides 530b and 530c is decreased.

Specifically, when the oxides 530a and 530b or the oxides 530b and 530c contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxides 530a and 530c.

At this time, the oxide 530b serves as a main carrier path. When the oxides 530a and 530c have the above structure, the density of defect states at the interface between the oxides 530a and 530b and the interface between the oxides 530b and 530c can be made low. Thus, the influence of interface scattering on carrier conduction is small, and the transistor 500 can have a high on-state current.

The conductors 542a and 542b functioning as the source and drain electrodes are provided over the oxide 530b. For the conductors 542a and 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film such as a tantalum nitride film is preferable because it has a barrier property against hydrogen or oxygen.

Although FIG. 36A shows the conductors 542a and 542b have a single-layer structure, the conductors 542a and 542b may have a stacked-layer structure of two or more layers. For example, a tantalum nitride film and a tungsten film can be stacked. Alternatively, a titanium film and an aluminum film may be stacked. Other examples include a two-layer structure in which an aluminum film is stacked over a tungsten film, a two-layer structure in which a copper film is stacked over a copper-magnesium-aluminum alloy film, a two-layer structure in which a copper film is stacked over a titanium film, and a two-layer structure in which a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 36A, a region 543a and a region 543b are sometimes formed as low-resistance regions in the oxide 530 at and around the interface with the conductor 542a (the conductor 542b). In this case, the region 543a functions as one of a source region and a drain region, and the region 543b functions as the other of the source region and the drain region. The channel formation region is formed in a region between the region 543a and the region 543b.

When the conductor 542a (the conductor 542b) is provided in contact with the oxide 530, the oxygen concentration of the region 543a (the region 543b) sometimes decreases. In addition, a metal compound layer that contains the metal contained in the conductor 542a (the conductor 542b) and the component of the oxide 530 is sometimes formed in the region 543a (the region 543b). In such cases, the carrier density of the region 543a (the region 543b) increases, and the region 543a (the region 543b) becomes a low-resistance region.

The insulator 544 is provided to cover the conductors 542a and 542b and inhibits oxidation of the conductors 542a and 542b. Here, the insulator 544 may be provided to cover the side surface of the oxide 530 and to be in contact with the insulator 524.

A metal oxide containing one or more of hafnium, aluminum, gallium, yttrium, zirconium, tungsten, titanium, tantalum, nickel, germanium, neodymium, lanthanum, magnesium, and the like can be used as the insulator 544. Moreover, silicon nitride oxide or silicon nitride can be used as the insulator 544, for example.

It is particularly preferable to use an insulator containing an oxide of one or both of aluminum and hafnium, such as aluminum oxide, hafnium oxide, or an oxide containing aluminum and hafnium (hafnium aluminate) as the insulator 544. In particular, hafnium aluminate is preferable because it has higher heat resistance than hafnium oxide and thus is less likely to be crystallized by thermal budget in later steps. Note that the insulator 544 is not necessarily provided when the conductors 542a and 542b are oxidation-resistant or do not significantly lose the conductivity even after absorbing oxygen. Design is appropriately determined in consideration of required transistor characteristics.

The insulator 544 can prevent impurities such as water and hydrogen contained in the insulator 580 from diffusing into the oxide 530b through the oxide 530c and the insulator 550. The insulator 544 can also prevent oxidation of the conductor 560 due to excess oxygen contained in the insulator 580.

The insulator 550 functions as a first gate insulating film. The insulator 550 is preferably in contact with the inner side (the top surface and the side surface) of the oxide 530c. Like the insulator 524 described above, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride, which have thermal stability, are preferable.

When as the insulator 550, an insulator from which oxygen is released by heating is provided in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

In order to efficiently supply excess oxygen of the insulator 550 to the oxide 530, a metal oxide may be provided between the insulator 550 and the conductor 560. The metal oxide preferably prevents oxygen diffusion from the insulator 550 to the conductor 560. Providing the metal oxide that inhibits oxygen diffusion prevents diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be suppressed. For the metal oxide, a material that can be used for the insulator 544 is used.

Note that the insulator 550 may have a stacked-layer structure like the second gate insulating film. As miniaturization and high integration of transistors progress, a problem such as leakage current may arise because of a thinner gate insulating film. For that reason, when the insulator functioning as a gate insulating film has a stacked-layer structure of a high-k material and a thermally stable material, a gate potential at the time when the transistor operates can be reduced while the physical thickness of the gate insulating film is maintained. Moreover, the stacked-layer structure can be thermally stable and have a high dielectric constant.

Although the conductor 560 serving as the first gate electrode has a two-layer structure in FIGS. 36A and 36B, the conductor 560 may have a single-layer structure or a stacked-layer structure of three or more layers.

The conductor 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, and $NO_2$), and a copper atom. Alternatively, the conductor 560a is preferably formed using a conductive material having a function of inhibiting diffusion of oxygen (e.g., at least one of oxygen atoms, oxygen molecules, and the like). When the conductor 560a has a function of inhibiting diffusion of oxygen, it is possible to prevent a reduction in conductivity of the conductor 560b due to oxidation of the conductor 560b caused by oxygen in the insulator 550. As a conductive material having a function of inhibiting oxygen diffusion, tantalum, tantalum nitride, ruthenium, or ruthenium oxide is preferably used, for example. Alternatively, the conductor 560a can be formed using an oxide semiconductor that can be used for the oxide 530. In this case, when the conductor 560b is formed by a sputtering method, the electrical resistance of the oxide semiconductor used as the conductor 560a can be lowered. Thus, the oxide semiconductor as the conductor 560a can be made into a conductor. Note that an electrode using an oxide semiconductor as a conductor can be referred to as an oxide conductor (OC) electrode.

The conductor 560b is preferably formed using a conductive material containing tungsten, copper, or aluminum as its main component. The conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of titanium or titanium nitride and any of the above conductive materials.

The insulator 580 is provided over the conductors 542a and 542b with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride are particularly preferable in terms of high thermal stability. Silicon oxide and porous silicon oxide are particularly preferable because an excess-oxygen region can be formed easily in a later step.

When the insulator 580 from which oxygen is released by heating is provided in contact with the oxide 530c, oxygen in the insulator 580 can be efficiently supplied to the oxide 530 through the oxide 530c. The concentration of impurities such as water or hydrogen in the insulator 580 is preferably lowered.

The opening in the insulator 580 overlaps with the region between the conductor 542a and the conductor 542b. Accordingly, the conductor 560 is embedded in the opening of the insulator 580 and the region between the conductor 542a and the conductor 542b.

For miniaturization of the semiconductor device, the gate length needs to be short without reduction in conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is provided to be embedded in the opening of the insulator 580 in this embodiment.

The insulator 574 is preferably provided in contact with the top surface of the insulator 580, the top surface of the conductor 560, and the top surface of the insulator 550. When the insulator 574 is formed by a sputtering method, an excess-oxygen region can be provided in the insulators 550 and 580. Thus, oxygen can be supplied from the excess-oxygen regions to the oxide 530.

For example, a metal oxide containing one or more of hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, an aluminum oxide film formed by a sputtering method can serve both as an oxygen supply source and as a barrier film against impurities such as hydrogen.

An insulator 581 functioning as an interlayer film is preferably provided over the insulator 574. As in the insulator 524 or the like, the concentration of impurities such as water or hydrogen in the insulator 581 is preferably lowered.

A conductor 540a and a conductor 540b are provided in openings formed in the insulator 581, the insulator 574, the insulator 580, and the insulator 544. The conductor 540a and the conductor 540b are provided to face each other with the conductor 560 positioned therebetween. The conductors 540a and 540b have the same structure as that of a combination of a conductor 546 and a conductor 548 that will be described later.

An insulator 582 is provided over the insulator 581. A substance having a barrier property against oxygen and hydrogen is preferably used for the insulator 582. Thus, the insulator 582 can be formed using a material similar to that used for the insulator 514. For the insulator 582, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide contained in the transistor 500 can be prevented. Therefore, aluminum oxide is suitably used for a protective film of the transistor 500.

An insulator 586 is provided over the insulator 582. The insulator 586 can be formed using a material similar to that used for the insulator 320. The use of a material with a relatively low dielectric constant for the insulator 586 can reduce the parasitic capacitance between wirings. For example, a silicon oxide film or a silicon oxynitride film, can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductors 546 and 548 function as plugs or wirings that are connected to the capacitor 600, the transistor 500, or the transistor 300. The conductors 546 and 548 can be formed using a material similar to those used for forming the conductors 328 and 330.

The capacitor 600 is provided above the transistor 500. The capacitor 600 includes a conductor 610, a conductor 620, and an insulator 630.

A conductor 612 may be provided over the conductors 546 and 548. The conductor 612 functions as a plug or a wiring that is connected to the transistor 500. The conductor 610 functions as an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 34; however, one embodiment of the present invention is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided so as to overlap with the conductor 610 with the insulator 630 positioned therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, copper (Cu), aluminum (Al), or the like, which is a low-resistance metal material, can be used.

An insulator 650 is provided over the conductor 620 and the insulator 630. The insulator 650 can be formed using a material similar to that used for the insulator 320. The insulator 650 may function as a planarization film that covers roughness due to underlying layers.

With the use of this structure, a change in electrical characteristics can be prevented and reliability can be improved in a semiconductor device including a transistor including an oxide semiconductor. Alternatively, a semiconductor device using a transistor including an oxide semiconductor can be miniaturized or highly integrated.

<Structure Examples of Transistors>

The structure of the transistor 500 in the semiconductor device described in this embodiment is not limited to the above. Examples of structures that can be used for the transistor 500 will be described below. Note that transistors described below are variation examples of the above transistor; therefore, differences from the above transistor are mainly described below and the description of portions identical to the above is sometimes omitted.

Transistor Structure Example 1

Figure 37A:
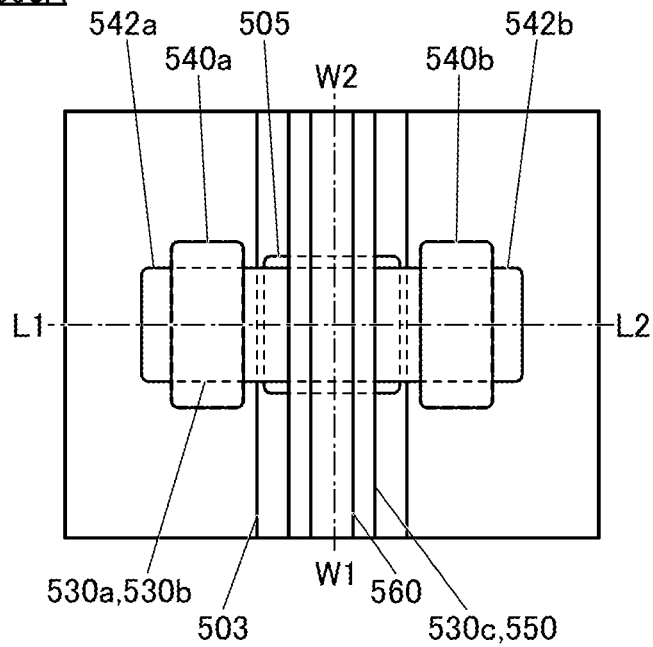
FIGS. 37A to 37C are a top view and cross-sectional views illustrating a structure example of a transistor.
Figure 37C:
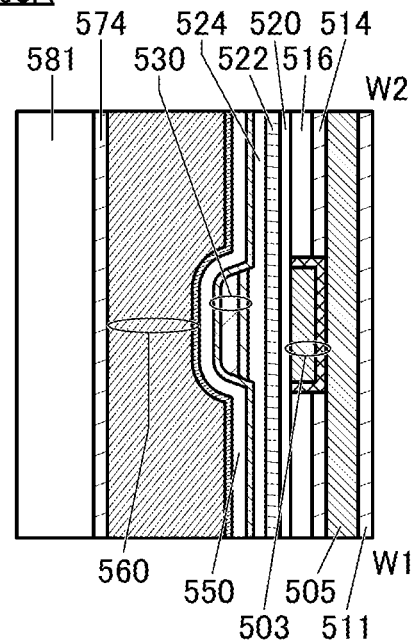
Figure 37B:
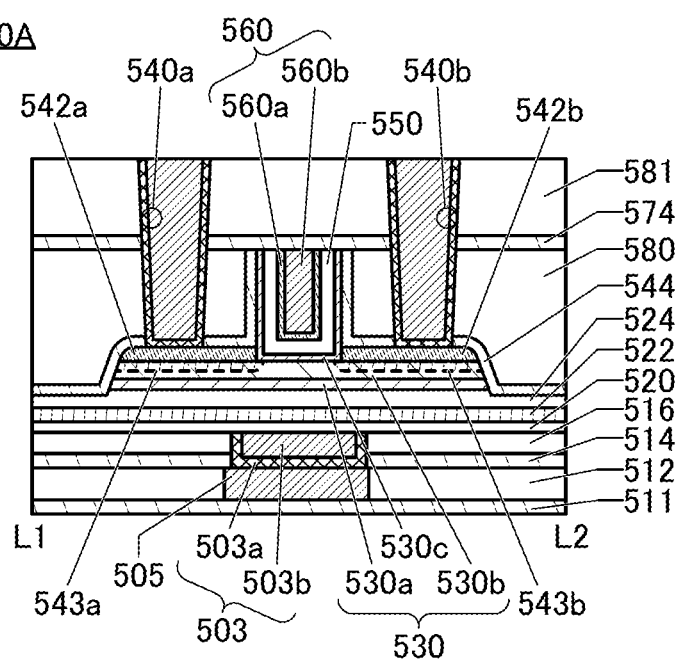

A structure example of a transistor 500A will be described with reference to FIGS. 37A to 37C. FIG. 37A is a top view of the transistor 500A. FIG. 37B is a cross-sectional view of a portion along the dashed-dotted line L1-L2 in FIG. 37A. FIG. 37C is a cross-sectional view of a portion along the dashed-dotted line W1-W2 in FIG. 37A. Note that for simplification of the drawing, some components are not illustrated in the top view in FIG. 37A.

The transistor 500A in FIGS. 37A to 37C includes an insulator 511 functioning as an interlayer film and the conductor 505 functioning as a wiring in addition to the components of the transistor 500 in FIG. 36A.

In the transistor 500A in FIGS. 37A to 37C, the oxide 530c, the insulator 550, and the conductor 560 are provided in an opening in the insulator 580 with the insulator 544 positioned between the insulator 580 and the oxide 530c, the insulator 550, and the conductor 560. Moreover, the oxide 530c, the insulator 550, and the conductor 560 are provided between the conductor 542a and the conductor 542b.

The insulator 511 can have a single-layer structure or a stacked-layer structure using an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or (Ba,Sr)$TiO_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

For example, the insulator 511 preferably functions as a barrier film for inhibiting impurities such as water or hydrogen from entering the transistor 500A from the substrate side. Accordingly, the insulator 511 is preferably formed using an insulating material having a function of inhibiting diffusion of impurities such as a hydrogen atom, a hydrogen molecule, a water molecule, and a copper atom, that is, an insulating material through which the above impurities are less likely to pass. Alternatively, the insulator 511 is preferably formed using an insulating material having a function of inhibiting diffusion of oxygen (e.g., at least one of oxygen atoms, oxygen molecules, and the like), that is, an insulating material through which the above oxygen is less likely to pass. Further alternatively, aluminum oxide or silicon nitride, for example, may be used for the insulator 511. With such a structure, impurities such as hydrogen or water can be prevented from diffusing into the transistor 500A from the substrate side through the insulator 511.

For example, the dielectric constant of the insulator 512 is preferably lower than that of the insulator 511. The use of a material having a low dielectric constant for the interlayer film can reduce the parasitic capacitance between wirings.

The conductor 505 is formed to be embedded in the insulator 512. Here, the top surface of the conductor 505 and the top surface of the insulator 512 can be at substantially the same level. Although the conductor 505 is a single layer in FIGS. 37B and 37C, the present invention is not limited to this. For example, the conductor 505 may have a multilayer structure of two or more layers. The conductor 505 is preferably formed using a conductive material that has high conductivity and contains tungsten, copper, or aluminum as its main component.

Like the insulators 511 and 512, the insulator 514 and the insulator 516 function as interlayer films. For example, the insulator 514 preferably functions as a barrier insulating film for inhibiting impurities such as water or hydrogen from entering the transistor 500A from the substrate side. With this structure, impurities such as hydrogen or water can be prevented from diffusing into the transistor 500A side from the substrate side through the insulator 514. Moreover, for example, the insulator 516 preferably has a lower dielectric constant than the insulator 514. The use of a material having a low dielectric constant for the interlayer film can reduce the parasitic capacitance between wirings.

The insulator 522 preferably has a barrier property. The insulator 522 having a barrier property prevents entry of impurities such as hydrogen to the transistor 500A from the peripheral portion of the transistor 500A.

The oxide 530c is preferably provided in the opening in the insulator 580 with the insulator 544 positioned between the insulator 580 and the oxide 530c. When the insulator 544 has a barrier property, diffusion of impurities from the insulator 580 into the oxide 530 can be prevented.

A barrier layer may be provided over the conductors 542a and 542b. The barrier layer is preferably formed using a material having a barrier property against oxygen or hydrogen. This structure can prevent oxidation of the conductors 542a and 542b at the time of forming the insulator 544.

For the barrier layer, for example, a metal oxide can be used. In particular, an insulating film having a barrier property against oxygen or hydrogen, such as an aluminum oxide film, a hafnium oxide film, or a gallium oxide film, is preferably used. Alternatively, silicon nitride deposited by a CVD method may be used.

With the use of the barrier layer, the range of choices for the materials of the conductors 542a and 542b can be expanded. For example, the conductors 542a and 542b can be formed using a material with a low oxidation resistance and high conductivity, such as tungsten or aluminum. Furthermore, a conductor that can be easily formed or processed can be used, for example.

The insulator 550 functions as a first gate insulating film. The insulator 550 is preferably provided in the opening in the insulator 580 with the oxide 530c and the insulator 544 positioned between the insulator 580 and the insulator 550.

Like the conductor 503, the conductors 540a and 540b can be formed to have a single-layer structure or a stacked-layer structure using a conductive material such as a metal material, an alloy material, a metal nitride material, or a metal oxide material. For example, a high-melting-point material having both heat resistance and conductivity, such as tungsten or molybdenum, is preferably used. Alternatively, a low-resistance conductive material such as aluminum or copper is preferably used. The use of a low-resistance conductive material can reduce wiring resistance.

With a stacked-layer structure of tantalum nitride or the like, which is a conductor having a barrier property against hydrogen and oxygen, and tungsten, which has high conductivity, for example, the conductors 540a and 540b can prevent diffusion of impurities from the outside while maintaining conductivity as wirings.

The above structure makes it possible to provide a semiconductor device including a transistor that contains an oxide semiconductor and has a high on-state current. Alternatively, a semiconductor device including a transistor that contains an oxide semiconductor and has a low off-state current can be provided. Alternatively, a semiconductor device that has small variation in electrical characteristics, i.e., stable electrical characteristics, and has high reliability can be provided.

Transistor Structure Example 2

Figure 38A:
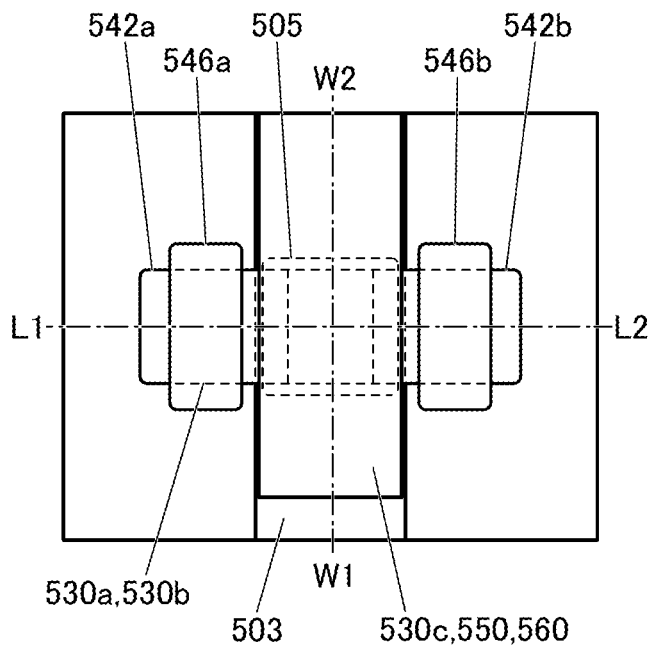
FIGS. 38A to 38C are a top view and cross-sectional views illustrating a structure example of a transistor.
Figure 38C:
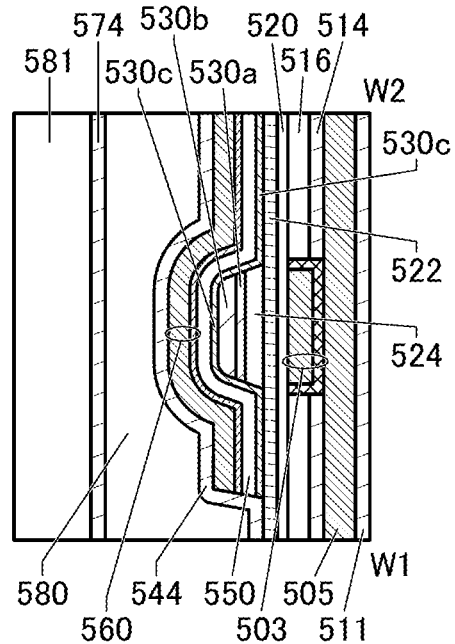
Figure 38B:
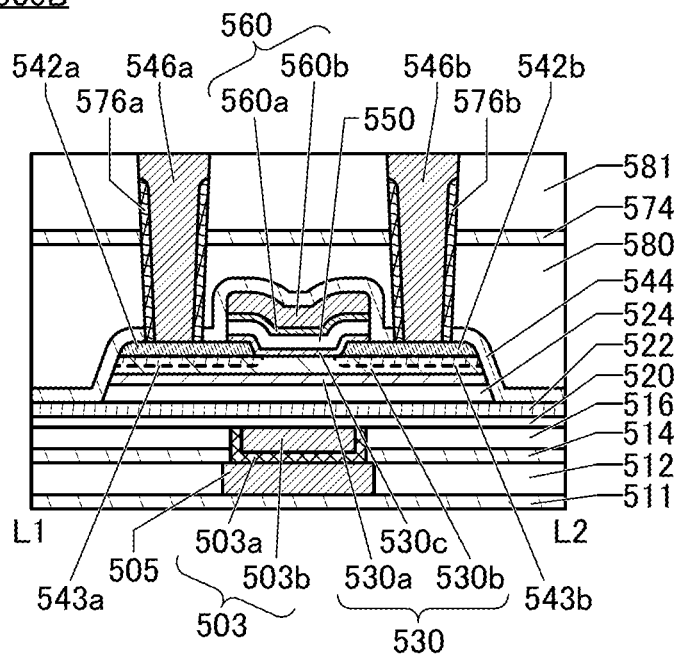

A structure example of a transistor 500B will be described with reference to FIGS. 38A to 38C. FIG. 38A is a top view of the transistor 500B. FIG. 38B is a cross-sectional view of a portion along the dashed-dotted line L1-L2 in FIG. 38A. FIG. 38C is a cross-sectional view of a portion along the dashed-dotted line W1-W2 in FIG. 38A. Note that for simplification of the drawing, some components are not illustrated in the top view in FIG. 38A.

The transistor 500B is a variation example of the transistor 500A. Therefore, differences from the transistor 500A are mainly described to avoid repeated description.

The transistor 500B includes a region where the conductor 542a (the conductor 542b), the oxide 530c, the insulator 550, and the conductor 560 overlap each other. This structure allows the transistor to have a high on-state current or high controllability.

The conductor 560 functioning as a first gate electrode includes the conductor 560a and the conductor 560b over the conductor 560a. Like the conductor 503a, the conductor 560a is preferably formed using a conductive material having a function of inhibiting diffusion of impurities such as a hydrogen atom, a hydrogen molecule, a water molecule, and a copper atom. Alternatively, the conductor 560a is preferably formed using a conductive material having a function of inhibiting diffusion of oxygen (e.g., at least one of oxygen atoms, oxygen molecules, and the like).

When the conductor 560a has a function of preventing oxygen diffusion, the range of choices for the material of the conductor 560b can be expanded. That is, the conductor 560a inhibits oxidation of the conductor 560b, thereby preventing the decrease in conductivity of the conductor 560b.

The insulator 544 is preferably provided to cover the top surface and the side surface of the conductor 560, the side surface of the insulator 550, and the side surface of the oxide 530c.

The insulator 544 can inhibit oxidation of the conductor 560. Moreover, the insulator 544 can inhibit diffusion of impurities such as water and hydrogen contained in the insulator 580 into the transistor 500B.

A contact plug of the transistor 500B has a structure different from that of the contact plug of the transistor 500A. In the transistor 500B, an insulator 576a (an insulator 576b) having a barrier property is provided between the insulator 580 and the conductor 546a (the conductor 546b) serving as a contact plug. Providing the insulator 576a (the insulator 576b) can prevent oxygen in the insulator 580 from reacting with the conductor 546 and oxidizing the conductor 546.

Furthermore, with the insulator 576a (the insulator 576b) having a barrier property, the range of choices for the materials for the conductors used as plugs and wirings can be expanded. The use of a metal material having an oxygen absorbing property and high conductivity for the conductor 546a (the insulator 546b), for example, can provide a semiconductor device with low power consumption. Specifically, it is possible to use a material with a low oxidation resistance and high conductivity, such as tungsten or aluminum. Furthermore, a conductor that can be easily formed or processed can be used, for example.

Transistor Structure Example 3

Figure 39A:
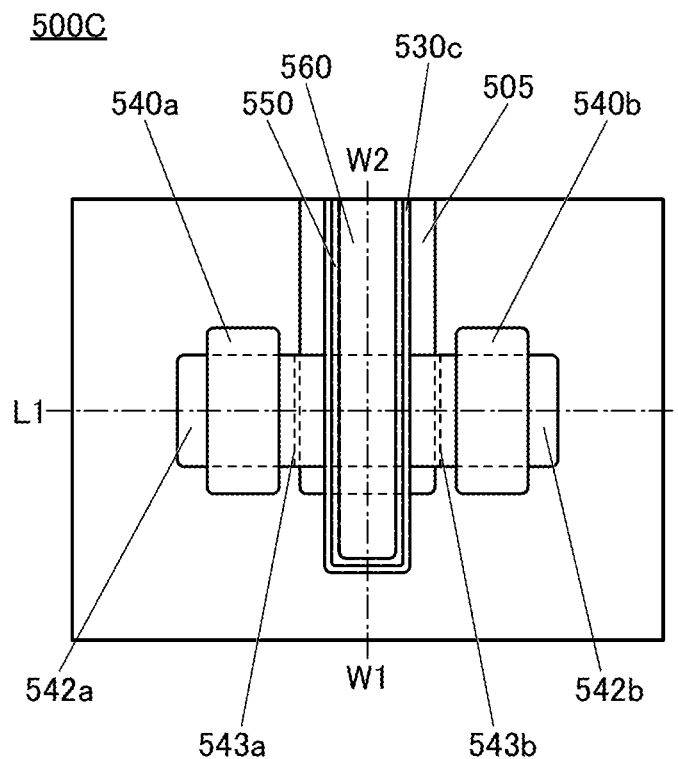
FIGS. 39A to 39C are a top view and cross-sectional views illustrating a structure example of a transistor.
Figure 39C:
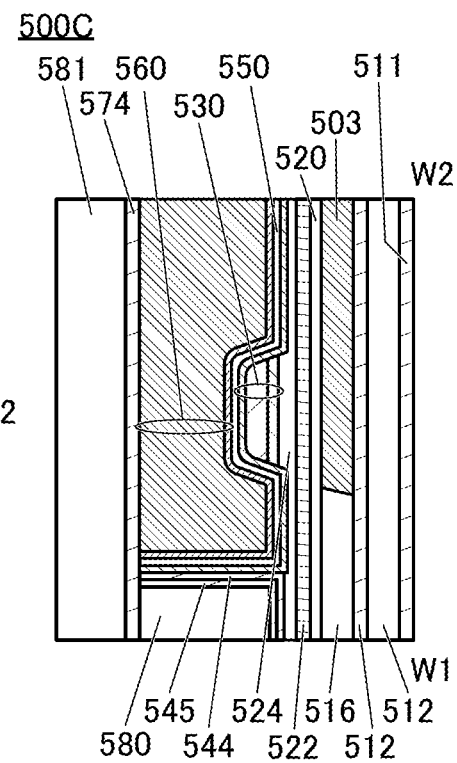
Figure 39B:
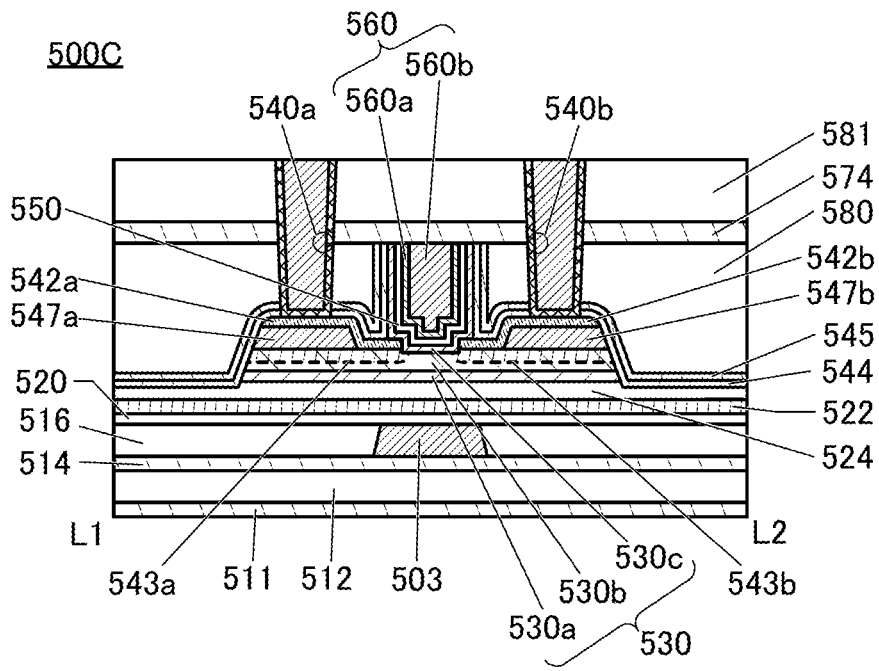

A structure example of a transistor 500C will be described with reference to FIGS. 39A to 39C. FIG. 39A is a top view of the transistor 500C. FIG. 39B is a cross-sectional view of a portion along the dashed-dotted line L1-L2 in FIG. 39A. FIG. 39C is a cross-sectional view of a portion along the dashed-dotted line W1-W2 in FIG. 39A. Note that for simplification of the drawing, some components are not illustrated in the top view in FIG. 39A.

The transistor 500C is a variation example of the transistor 500A. Therefore, differences from the transistor 500A are mainly described to avoid repeated description.

The transistor 500C in FIGS. 39A to 39C includes a conductor 547a between the conductor 542a and the oxide 530b, and a conductor 547b between the conductor 542b and the oxide 530b. The conductor 542a (the conductor 542b) has a region that extends beyond the top surface of the conductor 547a (the conductor 547b) and its side surface close to the conductor 560 and is in contact with the top surface of the oxide 530b. Here, the conductors 547a and 547b can be formed using a conductor that can be used as the conductors 542a and 542b. Furthermore, the conductors 547a and 547b are preferably thicker than at least the conductors 542a and 542b.

In the transistor 500C in FIGS. 39A to 39C, because of the above structure, the conductors 542a and the 542b can be closer to the conductor 560 than in the transistor 500A. Alternatively, the conductor 560 and the end portions of the conductors 542a and 542b can overlap each other. Accordingly, the effective channel length of the transistor 500C can be shortened, and the on-state current and the frequency characteristics can be improved.

The conductor 547a (the conductor 547b) is preferably overlapped by the conductor 542a (the conductor 542b). With this structure, the conductor 547a (the conductor 547b) can function as a stopper to prevent over-etching of the oxide 530b in etching for forming the opening in which the conductor 540a (the conductor 540b) is to be embedded.

In the transistor 500C in FIGS. 39A to 39C, an insulator 545 is provided on and in contact with the insulator 544. The insulator 544 preferably functions as a barrier insulating film for inhibiting impurities such as water or hydrogen and excess oxygen from entering the transistor 500C from the insulator 580 side. The insulator 545 can be formed using an insulator that can be used as the insulator 544. The insulator 544 may be formed using a nitride insulator such as aluminum nitride, aluminum titanium nitride, titanium nitride, silicon nitride, or silicon nitride oxide, for example.

Unlike in the transistor 500A in FIGS. 37A to 37C, the conductor 503 has a single-layer structure in the transistor 500C in FIGS. 39A to 39C. In this case, an insulating film to be the insulator 516 is formed over the patterned conductor 503, and an upper portion of the insulating film is removed by a CMP method or the like until the top surface of the conductor 503 is exposed. Preferably, the planarity of the top surface of the conductor 503 is made favorable. For example, the average surface roughness (Ra) of the top surface of the conductor 503 is less than or equal to 1 nm, preferably less than or equal to 0.5 nm, further preferably less than or equal to 0.3 nm. This allows the improvement in planarity of the insulating layer formed over the conductor 503 and the increase in crystallinity of the oxides 530b and 530c.

Transistor Structure Example 4

Figure 40A:
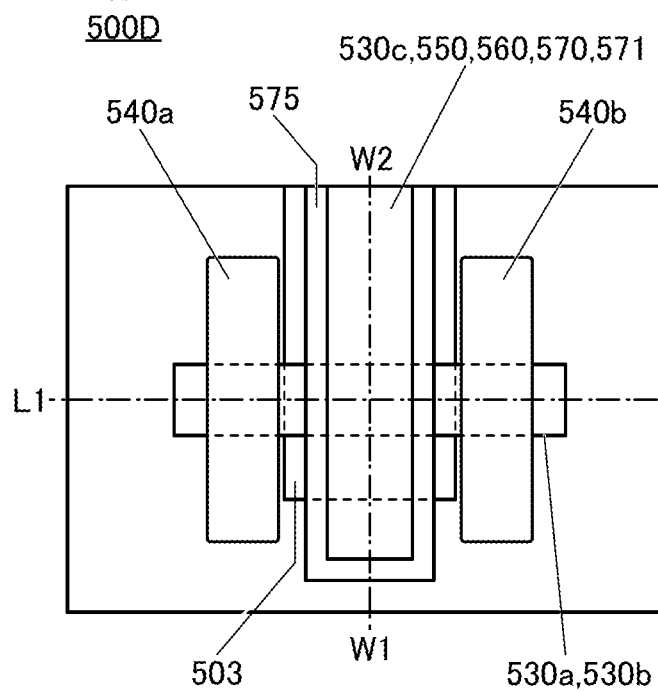
FIGS. 40A to 40C are a top view and cross-sectional views illustrating a structure example of a transistor.
Figure 40C:
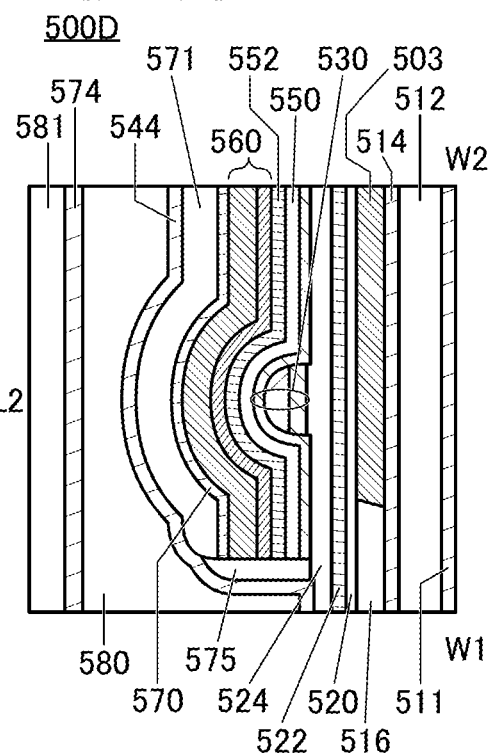
Figure 40B:
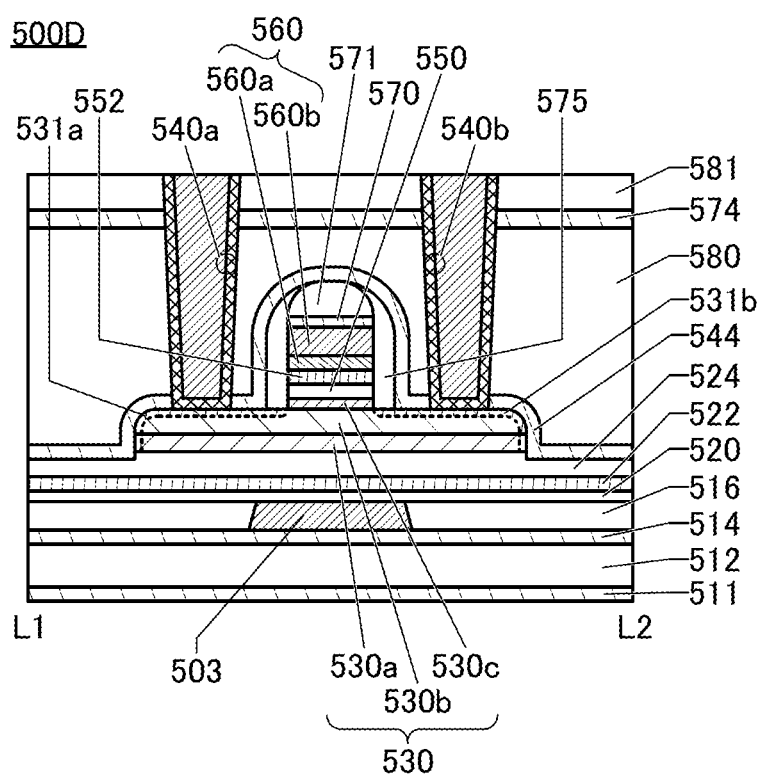

A structure example of a transistor 500D will be described with reference to FIGS. 40A to 40C. FIG. 40A is a top view of the transistor 500D. FIG. 40B is a cross-sectional view of a portion along the dashed-dotted line L1-L2 in FIG. 40A. FIG. 40C is a cross-sectional view of a portion along the dashed-dotted line W1-W2 in FIG. 40A. For simplification of the drawing, some components are not illustrated in the top view of FIG. 40A.

The transistor 500D is a variation example of the above transistors. Therefore, differences from the above transistors are mainly described to avoid repeated description.

The transistor 500D in FIGS. 40A to 40C differs from the transistors 500 and 500A to 500C in not including the conductors 542a and 542b and in including a region 531a and a region 531b on part of the exposed surface of the oxide 530b. One of the regions 531a and 531b functions as a source region, and the other functions as a drain region.

Like the transistor 500C in FIGS. 39A to 39C, the transistor 500D is not provided with the conductor 505 and makes the conductor 503 serve as both a second gate and a wiring. The transistor 500D includes the insulator 550 over the oxide 530c and a metal oxide 552 over the insulator 550. The conductor 560 is placed over the metal oxide 552, and an insulator 570 is placed over the conductor 560. An insulator 571 is placed over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidization of the conductor 560 due to oxygen can be suppressed.

Note that the metal oxide 552 may function as part of the first gate. For example, an oxide semiconductor that can be used as the oxide 530 can be used as the metal oxide 552.

In this case, when the conductor 560 is formed by a sputtering method, the electrical resistance of the metal oxide 552 is lowered so that the metal oxide 552 can be a conductive layer, that is, an OC electrode.

The metal oxide 552 functions as the part of a gate insulating film in some cases. For that reason, when silicon oxide, silicon oxynitride, or the like is used for the insulator 550, the metal oxide 552 is preferably a metal oxide that is a high-k material with a high dielectric constant. Such a stacked-layer structure can be thermally stable and can have a high dielectric constant. Accordingly, a gate potential that is applied during operation of the transistor can be reduced while the physical thickness of the gate insulating film is maintained. In addition, the equivalent oxide thickness (EOT) of an insulating layer functioning as the gate insulating film can be reduced.

Although the metal oxide 552 in the transistor 500D is shown as a single layer, the metal oxide 552 may have a stacked-layer structure of two or more layers. For example, a metal oxide functioning as part of a gate electrode and a metal oxide functioning as part of a gate insulating film may be stacked.

With the metal oxide 552 functioning as a gate electrode, the on-state current of the transistor 500D can be increased without a reduction in influence of electric fields from the conductor 560. Meanwhile, with the metal oxide 552 functioning as a gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric fields applied from the conductor 560 to the oxide 530 can be easily adjusted as appropriate.

Specifically, for the metal oxide 552, a material obtained by lowering the resistance of an oxide semiconductor that can be used for the oxide 530 can be used. Alternatively, a metal oxide containing one or more of hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, such as aluminum oxide, hafnium oxide, or an oxide containing aluminum and hafnium (hafnium aluminate). In particular, hafnium aluminate is preferable because it has higher heat resistance than hafnium oxide and thus is less likely to be crystallized by thermal budget in later steps. Note that the metal oxide 552 is not necessarily provided. Design is appropriately determined in consideration of required transistor characteristics.

The insulator 570 is preferably formed using an insulating material having a function of inhibiting the passage of oxygen and impurities such as water or hydrogen. For example, aluminum oxide or hafnium oxide is preferably used. Thus, oxidization of the conductor 560 due to oxygen from above the insulator 570 can be inhibited. Moreover, impurities such as water or hydrogen from above the insulator 570 can be prevented from entering the oxide 530 through the conductor 560 and the insulator 550.

The insulator 571 functions as a hard mask. By provision of the insulator 571, the conductor 560 can be processed to have a side surface that is substantially perpendicular. Specifically, the angle formed by the side surface of the conductor 560 and the substrate surface can be greater than or equal to 75° and less than or equal to 100°, preferably greater than or equal to 80° and less than or equal to 95°.

The insulator 571 may be formed using an insulating material having a function of inhibiting the passage of oxygen and impurities such as water or hydrogen so that the insulator 571 also functions as a barrier layer. In this case, the insulator 570 is not necessarily provided.

The insulator 570, the conductor 560, the metal oxide 552, the insulator 550, and the oxide 530c are selectively removed using the insulator 571 as a hard mask, whereby their side surfaces can be substantially aligned with each other and the surface of the oxide 530b can be partly exposed.

The transistor 500D includes the region 531a and the region 531b on part of the exposed surface of the oxide 530b. One of the regions 531a and 531b functions as the source region, and the other functions as the drain region.

The regions 531a and 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an impurity element refers to an element other than main constituent elements.

Alternatively, the regions 531a and 531b can be formed in such manner that, after part of the surface of the oxide 530b is exposed, a metal film is formed and then heat treatment is performed so that the element contained in the metal film is diffused into the oxide 530b.

The electrical resistivity of the regions of the oxide 530b to which the impurity element is added decreases. For that reason, the regions 531a and 531b are sometimes referred to impurity regions or low-resistance regions.

The regions 531a and 531b can be formed in a self-aligned manner by using the insulator 571 and/or the conductor 560 as a mask. Accordingly, the conductor 560 does not overlap the region 531a and/or the region 531b, so that the parasitic capacitance can be reduced. Moreover, an offset region is not formed between the channel formation region and the source/drain region (the region 531a or the region 531b). The formation of the regions 531a and 531b in a self-aligned manner achieves a higher on-state current, a lower threshold voltage, and a higher operating frequency, for example.

Note that an offset region may be provided between the channel formation region and the source/drain region in order to further reduce the off-state current. The offset region is a region where the electrical resistivity is high and the impurity element is not added. The offset region can be formed by addition of the impurity element after the formation of the insulator 575. In this case, the insulator 575 serves as a mask like the insulator 571 or the like. Thus, the impurity element is not added to the region of the oxide 530b overlapped by the insulator 575, so that the electrical resistivity of the region can be kept high.

The transistor 500D includes the insulator 575 on the side surfaces of the insulator 570, the conductor 560, the metal oxide 552, the insulator 550, and the oxide 530c. The insulator 575 is preferably an insulator having a low dielectric constant. The insulator 575 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin, for example. In particular, silicon oxide, silicon oxynitride, silicon nitride oxide, or porous silicon oxide is preferably used as the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 500D also includes the insulator 544 over the insulator 575 and the oxide 530. The insulator 544 is preferably formed by a sputtering method. The insulator formed by a sputtering method can be an insulator containing few impurities such as water or hydrogen. For example, aluminum oxide is preferably used for the insulator 544.

Note that an oxide film formed by a sputtering method may extract hydrogen from the component over which the oxide film is formed. For that reason, the hydrogen concentration in the oxide 530 and the insulator 575 can be reduced when the insulator 544 absorbs hydrogen and water from the oxide 530 and the insulator 575.

Transistor Structure Example 5

Figure 41A:
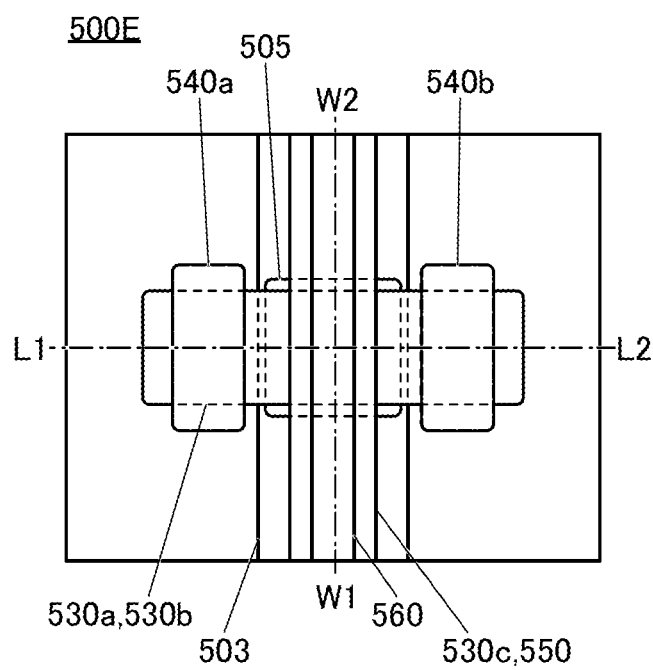
FIGS. 41A to 41C are a top view and cross-sectional views illustrating a structure example of a transistor.
Figure 41C:
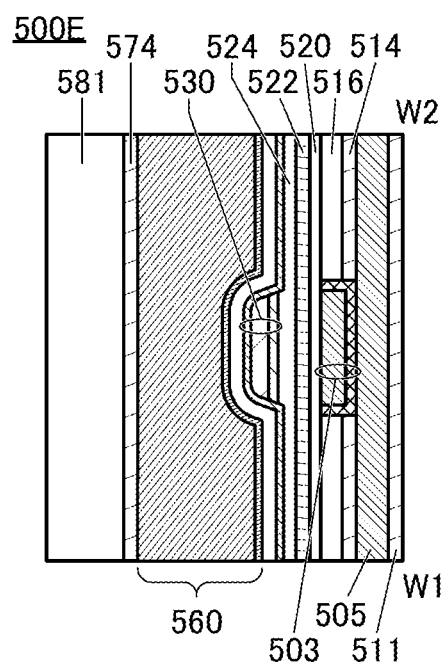
Figure 41B:
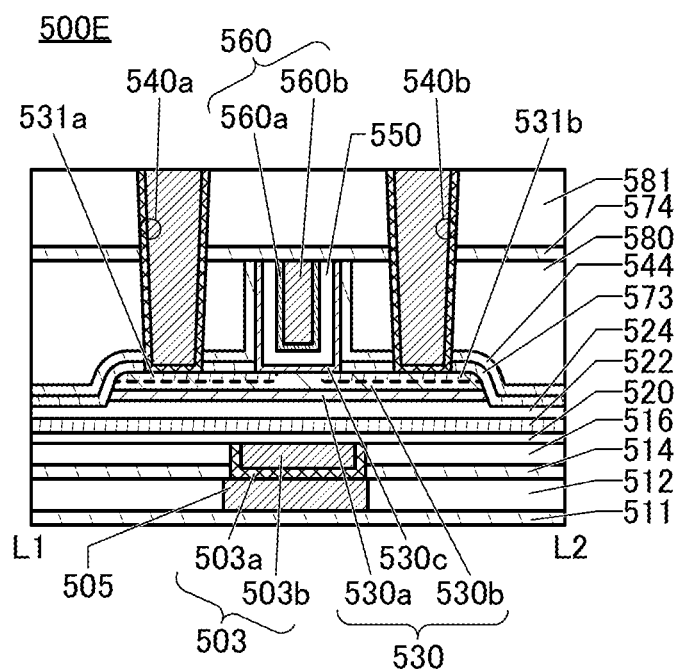

A structure example of a transistor 500E will be described with reference to FIGS. 41A to 41C. FIG. 41A is a top view of the transistor 500E. FIG. 41B is a cross-sectional view of a portion along the dashed-dotted line L1-L2 in FIG. 41A. FIG. 41C is a cross-sectional view of a portion along the dashed-dotted line W1-W2 in FIG. 41A. Note that for simplification of the drawing, some components are not illustrated in the top view in FIG. 41A.

The transistor 500E is a variation example of the above transistors. Therefore, differences from the above transistors are mainly described to avoid repeated description.

Like the transistor 500D, the transistor 500E in FIGS. 41A to 41C includes the region 531a and the region 531b on part of the exposed surface of the oxide 530b, without including the conductors 542a and 542b. One of the regions 531a and 531b functions as a source region, and the other functions as a drain region. Moreover, an insulator 573 is provided between the oxide 530b and the insulator 544.

The regions 531a and 531b illustrated in FIG. 41B are obtained by addition of any of the following elements to the oxide 530b. The regions 531a and 531b can be formed using a dummy gate, for example.

Specifically, a dummy gate is provided over the oxide 530b, and an element that reduces the resistance of some regions of the oxide 530b is added using the dummy gate as a mask. That is, the element is added to regions of the oxide 530 that are not overlapped by the dummy gate, whereby the regions 531a and 531b are formed. For the addition of the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of some regions of the oxide 530b are boron and phosphorus. Moreover, hydrogen, carbon, nitrogen, fluorine, sulfur, chlorine, titanium, a rare gas, or the like may be used. Typical examples of a rare gas element include helium, neon, argon, krypton, and xenon. The concentration of the element for reducing the resistance can be measured by secondary ion mass spectrometry (SIMS) or the like.

In particular, boron and phosphorus can be added by an apparatus in the manufacturing line for a Si transistor containing amorphous silicon, low-temperature polysilicon, or the like in its semiconductor layer; thus, the resistance of part of the oxide 530b can be reduced by using the apparatus in the manufacturing line. That is, part of the manufacturing line for a Si transistor can be used in the process of manufacturing the transistor 500E.

Next, an insulating film to be the insulator 573 and an insulating film to be the insulator 544 may be formed over the oxide 530b and the dummy gate. Stacking the insulating film to be the insulator 573 and the insulating film to be the insulator 544 can provide a region where the region 531a or the region 531b, the oxide 530c, and the insulator 550 overlap each other.

Specifically, after an insulating film to be the insulator 580 is provided over the insulating film to be the insulator 544, the insulating film to be the insulator 580 is subjected to chemical mechanical polishing (CMP) treatment, whereby part of the insulating film to be the insulator 580 is removed and the dummy gate is exposed. Then, when the dummy gate is removed, part of the insulator 573 in contact with the dummy gate is preferably also removed. Thus, the insulator 544 and the insulator 573 are exposed at the side surface of the opening provided in the insulator 580, and the regions 531a and 531b provided in the oxide 530b are partly exposed at the bottom surface of the opening. Next, an oxide film to be the oxide 530c, an insulating film to be the insulator 550, and a conductive film to be the conductor 560 are formed in this order in the opening, and then are partly removed by CMP treatment or the like until the insulator 580 is exposed. Consequently, the transistor illustrated in FIGS. 41A to 41C can be formed.

Note that the insulator 573 and the insulator 544 are not necessarily provided. Design is appropriately determined in consideration of required transistor characteristics.

Since the transistor in FIGS. 41A to 41C is not provided with the conductors 542a and 542b, the cost can be reduced.

Transistor Structure Example 6

Although FIGS. 36A and 36B show the structure example in which the conductor 560 functioning as the gate is formed inside the opening in the insulator 580, it is possible to provide the insulator 580 above the conductor 560, for example. FIGS. 42A and 42B and FIGS. 43A and 43B illustrate a structure example of such a transistor.

Figure 42A:
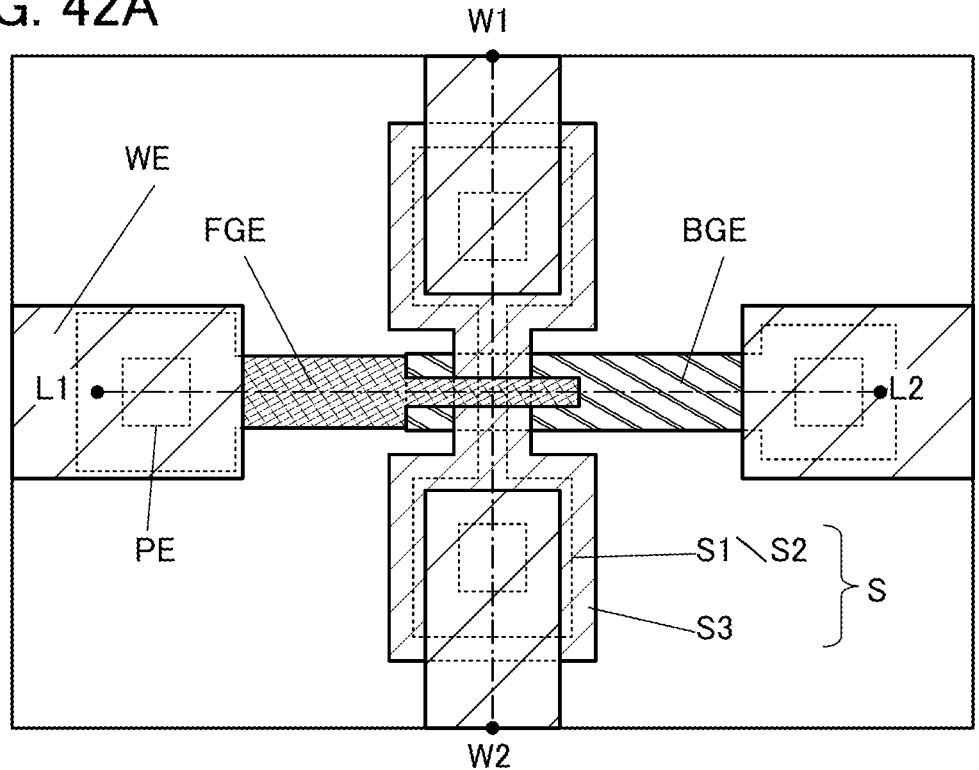
FIGS. 42A and 42B are a top view and a perspective view illustrating a structure example of a transistor.
Figure 42B:
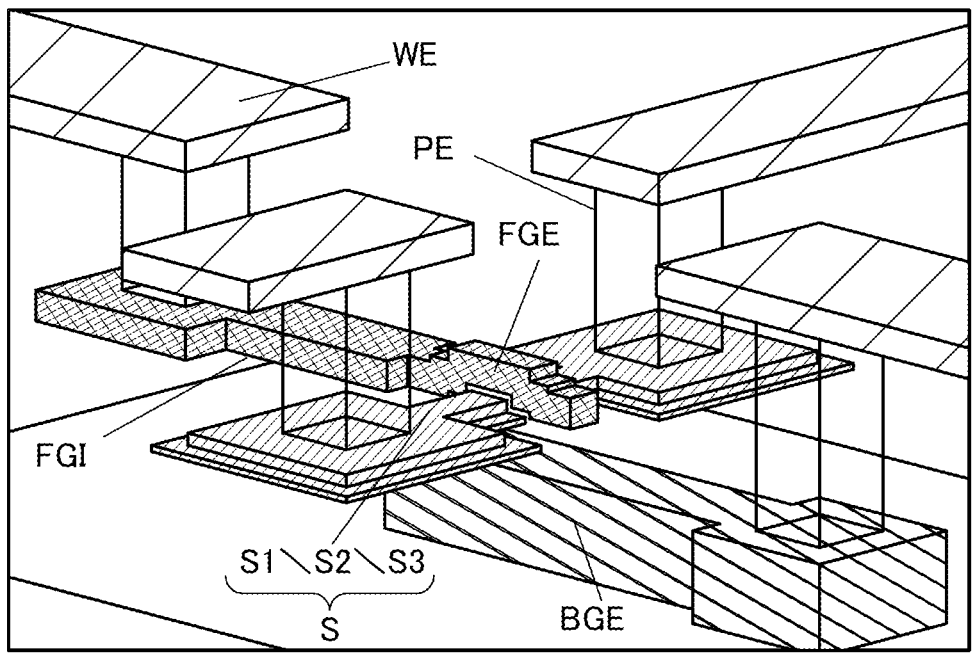
Figure 43A:
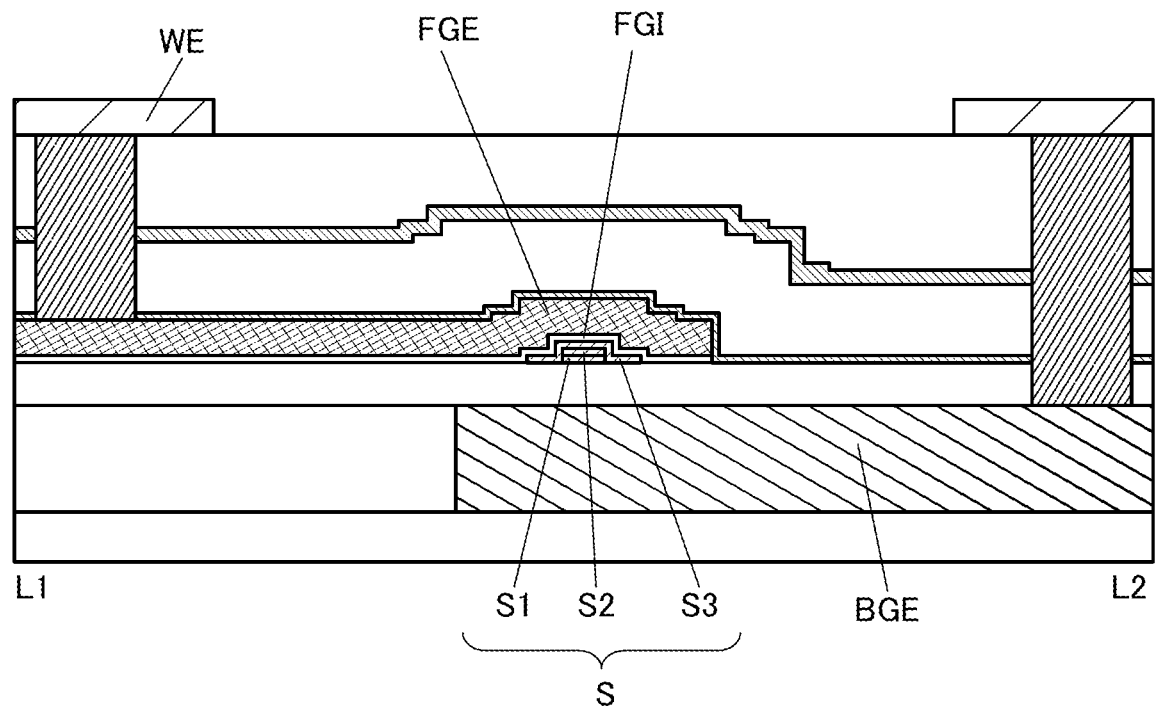
FIGS. 43A and 43B are cross-sectional views illustrating a structure example of a transistor.
Figure 43B:
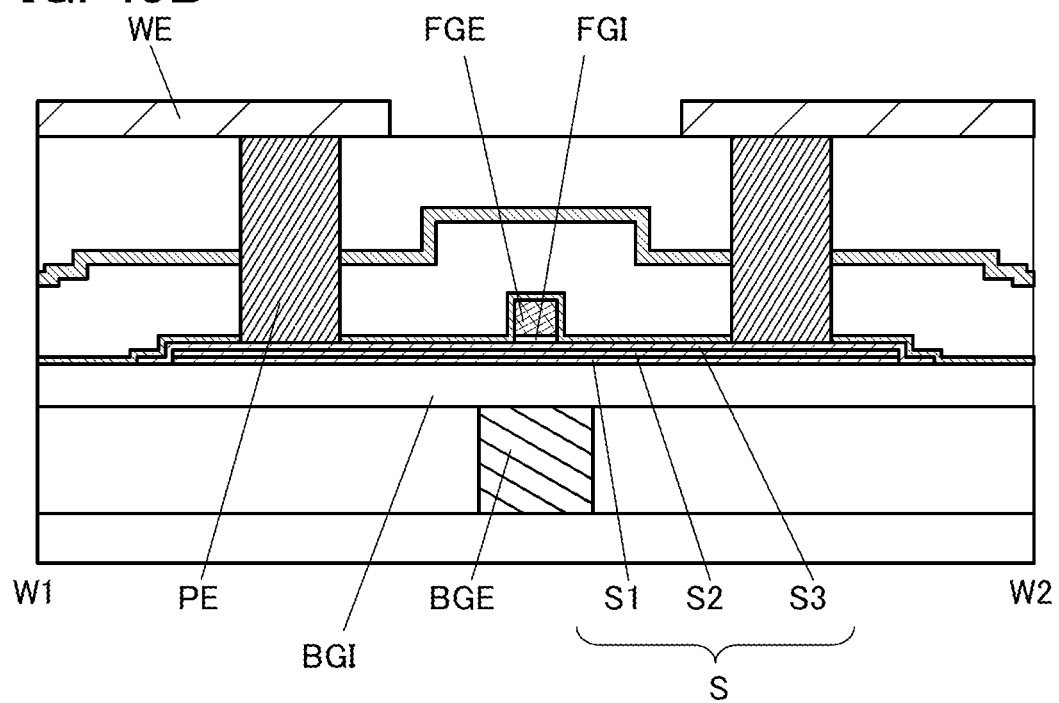

FIG. 42A is a top view of the transistor, and FIG. 42B is a perspective view of the transistor. FIG. 43A is a cross-sectional view along the line L1-L2 in FIG. 42A, and FIG. 43B is a cross-sectional view along the line W1-W2.

The transistor in FIGS. 42A and 42B and FIGS. 43A and 43B includes a conductor BGE functioning as a back gate, an insulator BGI functioning as a gate insulating film, an oxide semiconductor S, an insulator FGI functioning as a gate insulating film, a conductor FGE functioning as a front gate, and a conductor WE functioning as a wiring. A conductor PE functions as a plug for connecting the conductor WE to the oxide semiconductor S, the conductor BGE, or the conductor FGE. An example where the oxide semiconductor S includes three layers of oxides S1, S2, and S3 is shown here.

<Structure Example of Capacitor>

Figure 44A:
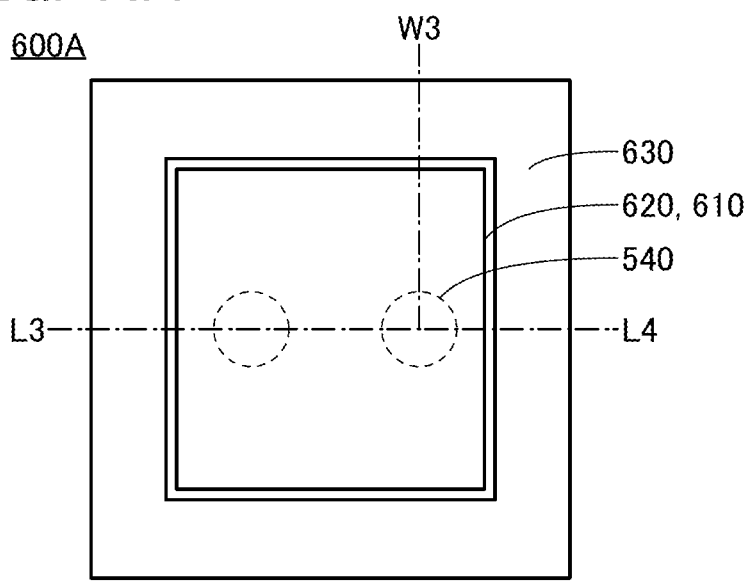
FIGS. 44A to 44C are a top view and perspective views illustrating a structure example of a capacitor.
Figure 44B:
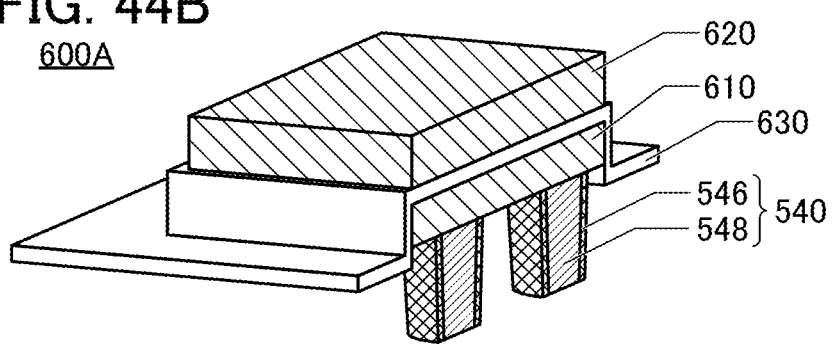
Figure 44C:
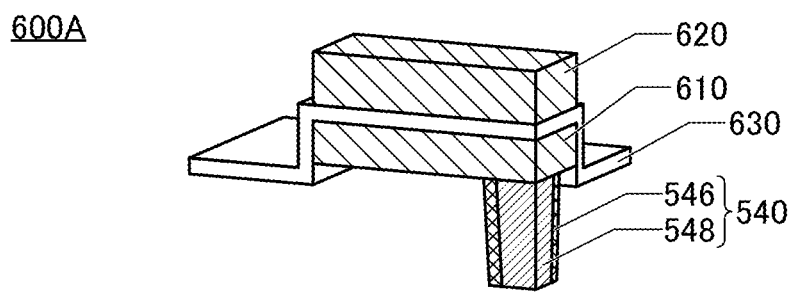

FIGS. 44A to 44C illustrate a capacitor 600A as an example of the capacitor 600 that can be used in the semiconductor device shown in FIG. 34. FIG. 44A is a top view of the capacitor 600A. FIG. 44B is a perspective view illustrating a cross section of the capacitor 600A along the dashed-dotted line L3-L4. FIG. 44C is a perspective view illustrating a cross section of the capacitor 600A along the dashed-dotted line W3-L4.

The conductor 610 functions as one of a pair of electrodes of the capacitor 600A, and the conductor 620 functions as the other of the pair of electrodes of the capacitor 600A. The insulator 630 functions as a dielectric that is sandwiched between the pair of electrodes.

The bottom portion of the conductor 610 in the capacitor 600A is electrically connected to the conductor 546 and the conductor 548. The conductors 546 and 548 function as plugs or wirings for connecting to another circuit component. In FIGS. 44B and 44C, the conductors 546 and 548 are collectively indicated by a conductor 540.

For simplification, FIGS. 44A to 44C do not show the insulator 586 in which the conductors 546 and 548 are embedded, and the insulator 650 that covers the conductor 620 and the insulator 630.

Although the capacitor 600 in FIG. 34, the capacitor 600 in FIG. 35, and the capacitor 600A in FIGS. 44A to 44C are planar capacitors, the shape of the capacitor is not limited thereto. For example, the capacitor 600 may be a cylindrical capacitor 600B illustrated in FIGS. 45A to 45C.

Figure 45A:
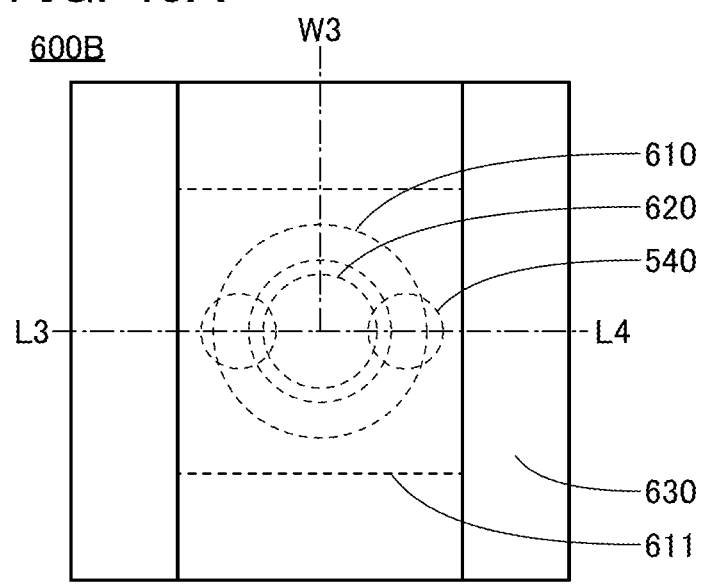
FIGS. 45A to 45C are a top view, a cross-sectional view, and a perspective view illustrating a structure example of a capacitor.
Figure 45B:
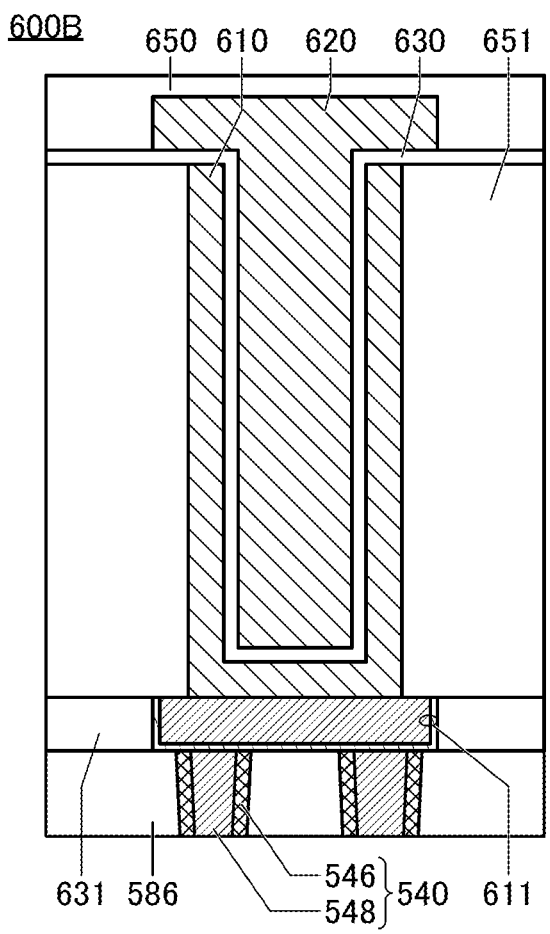
Figure 45C:
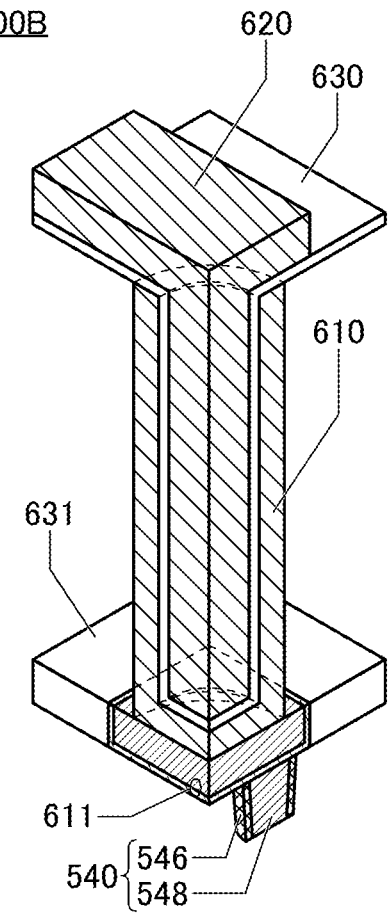

FIG. 45A is a top view of the capacitor 600B. FIG. 45B is a perspective view illustrating a cross section of the capacitor 600B along the dashed-dotted line L3-L4. FIG. 45C is a perspective view illustrating a cross section of the capacitor 600B along the dashed-dotted line W3-L4.

In FIG. 45B, the capacitor 600B includes an insulator 631 over the insulator 586 in which the conductor 540 is embedded, an insulator 651 having an opening, the conductor 610 functioning as one of a pair of electrodes, and the conductor 620 functioning as the other of the pair of electrodes.

For simplification, the insulator 586, the insulator 650, and the insulator 651 are omitted in FIG. 45C.

The insulator 631 can be formed using a material similar to that for the insulator 586, for example.

A conductor 611 is embedded in the insulator 631 to be electrically connected to the conductor 540. The conductor 611 can be formed using a material similar to that for the conductor 330 and the conductor 518, for example.

The insulator 651 can be formed using a material similar to that for the insulator 586, for example.

The insulator 651 has an opening as described above, and the opening overlaps the conductor 611.

The conductor 610 is formed on the bottom portion and the side surface of the opening. In other words, the conductor 610 overlaps the conductor 611 and is electrically connected to the conductor 611.

The conductor 610 is formed in such a manner that an opening is formed in the insulator 651 by an etching method or the like, the conductor 610 is then deposited by a sputtering method, an ALD method, or the like, and after that, the conductor 610 deposited over the insulator 651 is removed by a chemical mechanical polishing (CMP) method or the like while the conductor 610 deposited in the opening is left.

The insulator 630 is positioned over the insulator 651 and the conductor 610. In the capacitor, the insulator 630 functions as a dielectric between the pair of electrodes.

The conductor 620 is formed over the insulator 630 so as to fill the opening of the insulator 651.

The insulator 650 is formed to cover the insulator 630 and the conductor 620.

The capacitance of the cylindrical capacitor 600B in FIGS. 45A to 45C can be higher than that of the planar capacitor 600A. Thus, when the capacitor 600B is used as the capacitors C01 and C01m described in the above embodiment, for example, a voltage between the terminals of the capacitor can be maintained for long time.

Note that this embodiment can be combined with any of the other embodiments in this specification as appropriate.

Embodiment 5

In this embodiment, the compositions of a cloud-aligned composite oxide semiconductor (CAC-OS) and a c-axis-aligned crystalline oxide semiconductor (CAAC-OS) which are metal oxides that can be used in the OS transistor described in the above embodiment will be described. Note that in this specification and the like, CAAC refers to an example of a crystal structure, and CAC refers to an example of a function or a material composition.

<Composition Example of Metal Oxide>

A CAC-OS or a CAC metal oxide has a conducting function in a part of the material and has an insulating function in another part of the material, and has a semiconductor function as the whole material. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the aforementioned conducting function, and the insulating regions have the aforementioned insulating function. In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

Furthermore, in the CAC-OS or the CAC metal oxide, the conductive regions and the insulating regions each have a size of greater than or equal to 0.5 nm and less than or equal to 10 nm, preferably greater than or equal to 0.5 nm and less than or equal to 3 nm and are dispersed in the material in some cases.

The CAC-OS or the CAC metal oxide includes components having different band gaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used for a channel formation region of a transistor, the transistor in the on state can have high current drive capability, that is, a high on-state current and high field-effect mobility.

In other words, the CAC-OS or the CAC metal oxide can also be called a matrix composite or a metal matrix composite.

<Structure of Metal Oxide>

Oxide semiconductors are classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, or the like is included in the distortion in some cases. Note that a clear grain boundary cannot be observed even in the vicinity of distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal element, and the like.

The CAAC-OS tends to have a layered crystal structure (also referred to as a layered structure) in which a layer containing indium and oxygen (hereinafter, In layer) and a layer containing an element M, zinc, and oxygen (hereinafter, (M, Zn) layer) are stacked. Note that indium and the element M can be replaced with each other, and when the element M of the (M, Zn) layer is replaced with indium, the layer can be referred to as an (In, M, Zn) layer. When indium of the In layer is replaced with the element M, the layer can be referred to as an (In, M) layer.

The CAAC-OS is an oxide semiconductor with high crystallinity. On the other hand, in the CAAC-OS, a clear grain boundary cannot be observed; thus, a reduction in electron mobility due to the grain boundary is less likely to occur. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has lower crystallinity than the nc-OS and the CAAC-OS.

An oxide semiconductor can have any of various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the oxide semiconductor is used for a transistor is described.

When the oxide semiconductor is used for a transistor, the transistor can have high field-effect mobility. In addition, the transistor can have high reliability.

An oxide semiconductor with a low carrier density is preferably used for the transistor. In order to reduce the carrier density of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8\times10^{11}/cm^3$, preferably lower than $1\times10^{11}/cm^3$, further preferably lower than $1\times10^{10}/cm^3$ and greater than or equal to $1\times10^{9}/cm^3$ is used.

A highly purified intrinsic or substantially highly purified intrinsic oxide semiconductor film has a low density of defect states and accordingly has low density of trap states in some cases.

Charges trapped by the trap states in the oxide semiconductor take a long time to be released and may behave like fixed charges. Thus, a transistor whose channel formation region is formed in an oxide semiconductor having a high density of trap states has unstable electrical characteristics in some cases.

In order to obtain stable electrical characteristics of the transistor, it is effective to reduce the concentration of impurities in the oxide semiconductor. In order to reduce the concentration of impurities in the oxide semiconductor, the concentration of impurities in a film that is adjacent to the oxide semiconductor is preferably reduced. Examples of the impurities include hydrogen, nitrogen, alkali metal, alkaline earth metal, iron, nickel, and silicon.

<Impurities>

Here, the influence of impurities in the oxide semiconductor is described.

When silicon or carbon, which is a Group 14 element, is contained in the oxide semiconductor, defect states are formed. Thus, the concentration of silicon or carbon in the oxide semiconductor and in the vicinity of an interface with the oxide semiconductor (measured by secondary ion mass spectrometry (SIMS)) is lower than or equal to $2\times10^{18}$ atoms/$cm^3$, preferably lower than or equal to $2\times10^{17}$ atoms/$cm^3$.

When the oxide semiconductor contains alkali metal or alkaline earth metal, defect states are formed and carriers are generated in some cases. Thus, a transistor including an oxide semiconductor that contains alkali metal or alkaline earth metal tends to have normally-on characteristics. Therefore, it is preferable to reduce the concentration of alkali metal or alkaline earth metal in the oxide semiconductor. Specifically, the concentration of alkali metal or alkaline earth metal in the oxide semiconductor, which is measured by SIMS, is lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type by generation of electrons serving as carriers and an increase in carrier density. Thus, a transistor including an oxide semiconductor that contains nitrogen as the semiconductor tends to have normally-on characteristics. For this reason, the amount of nitrogen in the oxide semiconductor is preferably reduced as much as possible; the nitrogen concentration of the oxide semiconductor measured by SIMS is, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom generates an electron serving as a carrier. Thus, a transistor including an oxide semiconductor that contains hydrogen tends to have normally-on characteristics. Accordingly, hydrogen in the oxide semiconductor is preferably reduced as much as possible. Specifically, the hydrogen concentration in the oxide semiconductor measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurity concentration is used for a channel formation region of a transistor, the transistor can have stable electrical characteristics.

Note that this embodiment can be combined with any of the other embodiments in this specification as appropriate.

Embodiment 6

This embodiment will show a semiconductor wafer provided with the semiconductor device or the like described in the foregoing embodiment and examples of an electronic component including the semiconductor device.
<Semiconductor Wafer>

First, an example of a semiconductor wafer provided with a semiconductor device or the like is described with reference to FIG. 46A.

Figure 46A:
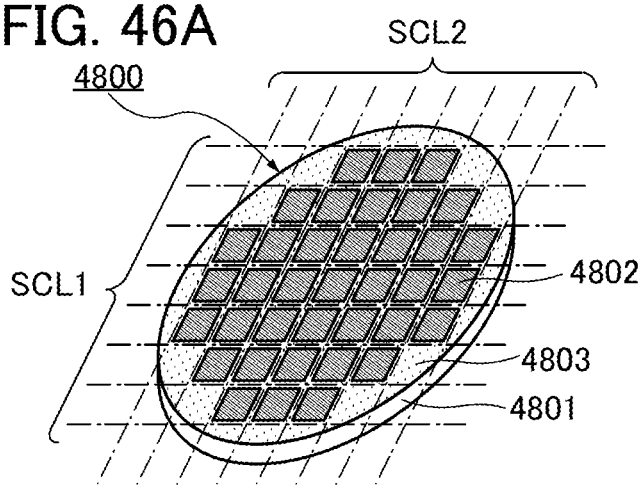
FIGS. 46A to 46D are perspective views illustrating examples of a semiconductor wafer and electronic components.

A semiconductor wafer 4800 illustrated in FIG. 46A includes a wafer 4801 and a plurality of circuit portions 4802 provided on the top surface of the wafer 4801. A portion without the circuit portions 4802 on the top surface of the wafer 4801 is a spacing 4803 that is a region for dicing.

The semiconductor wafer 4800 can be formed by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

Next, a dicing step is performed. The dicing is carried out along scribe lines SCL1 and scribe lines SCL2 (sometimes referred to as dicing lines or cutting lines) indicated by dashed-dotted lines. To perform the dicing step easily, the spacing 4803 is preferably arranged such that a plurality of scribe lines SCL1 are parallel to each other, a plurality of scribe lines SCL2 are parallel to each other, and the scribe lines SCL1 and the scribe lines SCL2 intersect each other perpendicularly.

Figure 46B:
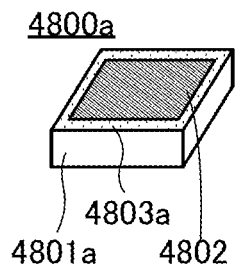

With the dicing step, a chip 4800a shown in FIG. 46B can be cut out from the semiconductor wafer 4800. The chip 4800a includes a wafer 4801a, the circuit portion 4802, and a spacing 4803a. Note that it is preferable to make the spacing 4803a as small as possible. Here, it is preferred that the width of the spacing 4803 between adjacent circuit portions 4802 be substantially the same as the width of the scribe line SCL1 or the scribe line SCL2.

The shape of the element substrate of one embodiment of the present invention is not limited to the shape of the semiconductor wafer 4800 illustrated in FIG. 46A. The element substrate may be a rectangular semiconductor wafer, for example. The shape of the element substrate can be changed as appropriate, depending on a process for fabricating an element and an apparatus for fabricating the element.
<Electronic Component>

Next, examples of an electronic component including the chip 4800a are described with reference to FIGS. 46C and 46D.

Figure 46C:
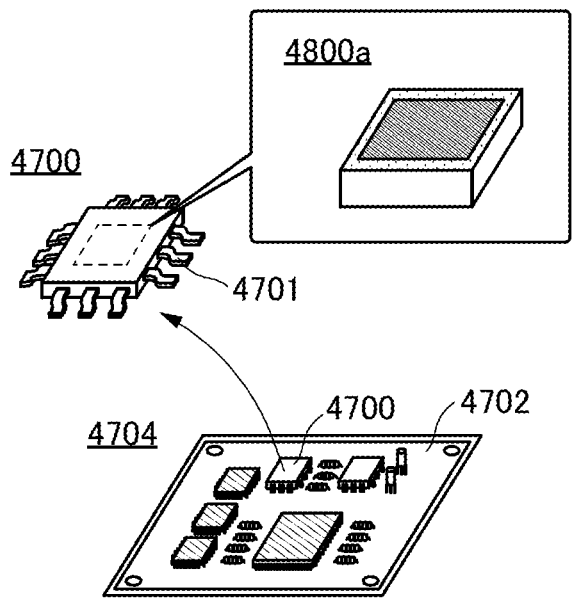

FIG. 46C is a perspective view of an electronic component 4700 and a substrate (a circuit board 4704) on which the electronic component 4700 is mounted. The electronic component 4700 in FIG. 46C includes a lead 4701 and the chip 4800a, and functions as an IC chip or the like. In particular, in this specification and the like, the electronic component 4700 including the semiconductor device such as the arithmetic circuit 110 described in the foregoing embodiment is referred to as a brain-morphic processor.

The electronic component 4700 can be formed by, for example, a wire bonding step of electrically connecting the lead 4701 of a lead frame to an electrode on the chip 4800a with a metal fine line (wire), a molding step of performing sealing with an epoxy resin or the like, a plating step on the lead 4701 of the lead frame, and a printing step on a surface of the package. Ball bonding or wedge bonding, for example, can be used in the wire bonding step. Although a quad flat package (QFP) is used as the package of the electronic component 4700 in FIG. 46C, the package is not limited thereto.

The electronic component 4700 is mounted on a printed circuit board 4702, for example. A plurality of such IC chips are combined and electrically connected to each other on the printed circuit board 4702; thus, the circuit board 4704 is completed.

Figure 46D:
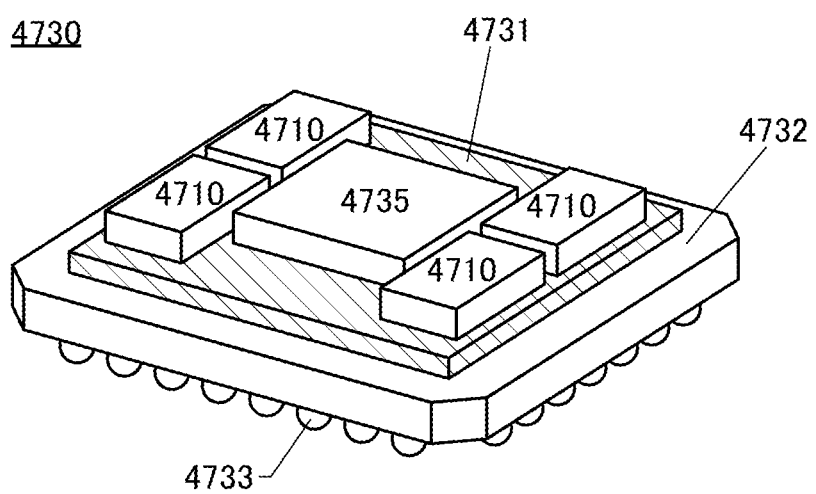

FIG. 46D is a perspective view of an electronic component 4730. The electronic component 4730 is an example of a system-in-package (SiP) or a multi-chip module (MCM). In the electronic component 4730, an interposer 4731 is provided over a package substrate 4732 (a printed circuit board), and a semiconductor device 4735 and a plurality of semiconductor devices 4710 are provided over the interposer 4731.

The electronic component 4730 includes the semiconductor devices 4710. Examples of the semiconductor devices 4710 include the semiconductor device described in the foregoing embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings have a single-layer structure or a layered structure. The interposer 4731 has a function of electrically connecting an integrated circuit provided on the interposer 4731 to an electrode provided on the package substrate 4732. Accordingly, the interposer is sometimes referred to as a redistribution substrate or an intermediate substrate. A through electrode may be provided in the interposer 4731 and used to electrically connect the integrated circuit and the package substrate 4732. In the case of using a silicon interposer, a through-silicon via (TSV) can also be used as the through electrode.

A silicon interposer is preferably used as the interposer 4731. The silicon interposer can be manufactured at lower cost than an integrated circuit because the silicon interposer is not necessarily provided with an active element. Moreover, since wirings of the silicon interposer can be formed through a semiconductor process, the formation of minute wirings, which is difficult for a resin interposer, is easily achieved.

In order to achieve a wide memory bandwidth, many wirings need to be connected to an HBM. Therefore, minute wirings are required to be formed densely on an interposer on which an HBM is mounted. For this reason, a silicon interposer is preferably used as the interposer on which an HBM is mounted.

In a SiP, an MCM, or the like using a silicon interposer, the decrease in reliability due to a difference in expansion coefficient between an integrated circuit and the interposer is less likely to occur. Furthermore, the surface of a silicon interposer has high planarity, so that a poor connection between the silicon interposer and an integrated circuit provided thereon is less likely to occur. It is particularly preferable to use a silicon interposer for a 2.5D package (2.5D mounting) in which a plurality of integrated circuits are arranged side by side on an interposer.

A heat sink (a radiator plate) may be provided to overlap with the electronic component 4730. When a heat sink is provided, the heights of integrated circuits provided on the interposer 4731 are preferably the same. For example, in the electronic component 4730 shown in this embodiment, the heights of the semiconductor devices 4710 and the semiconductor device 4735 are preferably the same.

An electrode 4733 may be provided on the bottom of the package substrate 4732 to mount the electronic component 4730 on another substrate. FIG. 46D illustrates an example in which the electrode 4733 is formed of a solder ball. Solder balls are provided in a matrix on the bottom of the package substrate 4732, whereby a ball grid array (BGA) can be achieved. Alternatively, the electrode 4733 may be formed of a conductive pin. When conductive pins are provided in a matrix on the bottom of the package substrate 4732, a pin grid array (PGA) can be achieved.

The electronic component 4730 can be mounted on another substrate in a variety of manners other than a BGA and a PGA. For example, a staggered pin grid array (SPGA), a land grid array (LGA), a quad flat package (QFP), a quad flat J-leaded package (QFJ), or a quad flat non-leaded package (QFN) can be employed.

Note that this embodiment can be combined with any of the other embodiments in this specification as appropriate.

Embodiment 7

Figure 47:
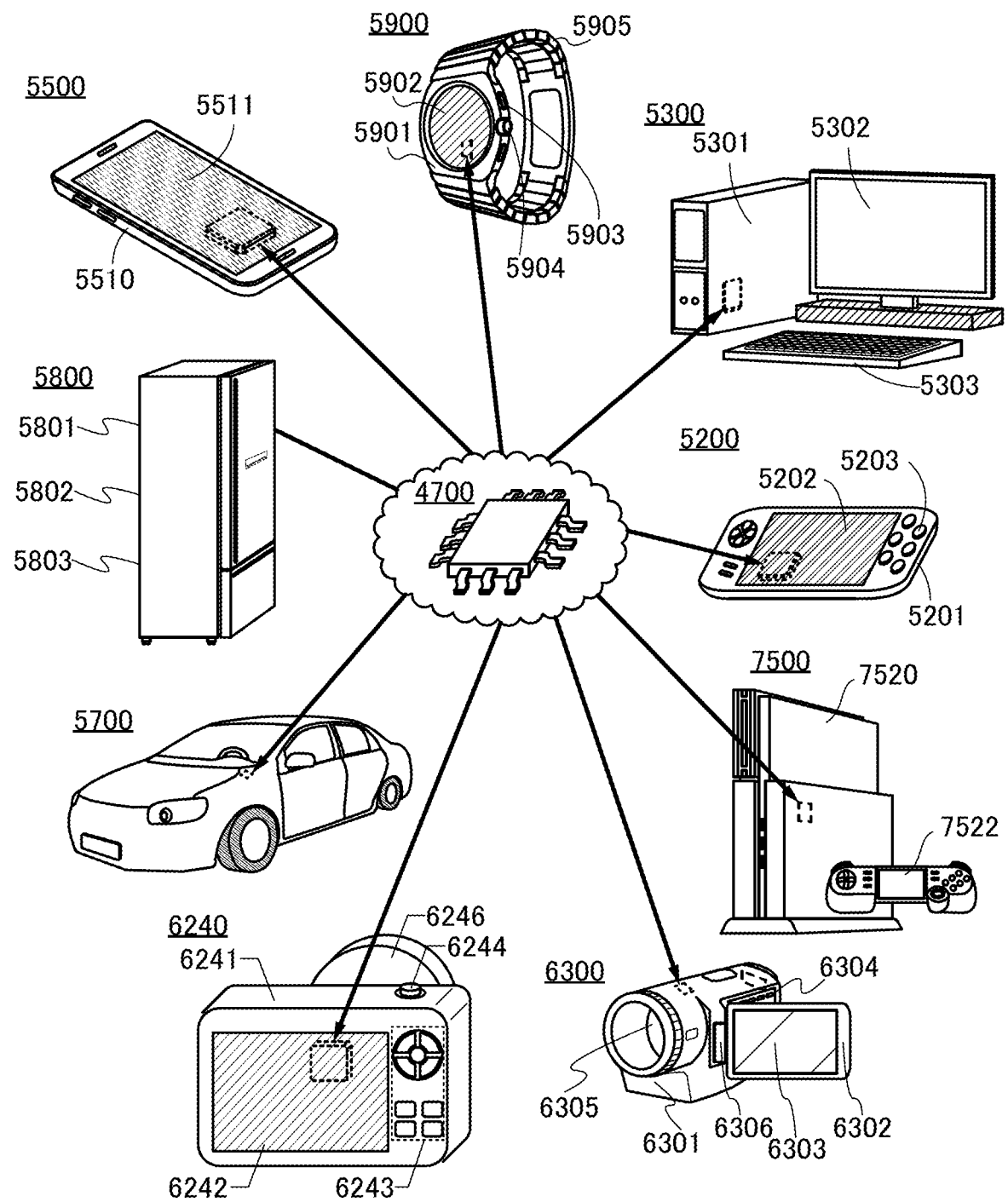
FIG. 47 is a perspective view illustrating examples of electronic devices.

This embodiment will show examples of electronic devices including the semiconductor device described in the foregoing embodiment. FIG. 47 illustrates electronic devices each including the electronic component 4700 that includes the semiconductor device.

[Mobile Phone]

An information terminal 5500 illustrated in FIG. 47 is a mobile phone (a smartphone), which is a type of information terminal. The information terminal 5500 includes a housing 5510 and a display portion 5511. As input interfaces, a touch panel and a button are provided in the display portion 5511 and the housing 5510, respectively.

With the use of the semiconductor device described in the foregoing embodiment, the information terminal 5500 can execute an application utilizing artificial intelligence. Examples of the application utilizing artificial intelligence include an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Wearable Terminal]

FIG. 47 illustrates a wearable terminal 5900, an example of which is a smartwatch (a registered trademark). The wearable terminal 5900 includes a housing 5901, a display portion 5902, an operation button 5903, an operator 5904, a band 5905, and the like.

Like the information terminal 5500, the wearable terminal 5900 can execute an application utilizing artificial intelligence with the use of the semiconductor device described in the foregoing embodiment. Examples of the application utilizing artificial intelligence include an application that manages the health condition of the user of the wearable terminal and a navigation system that selects the optimal route and navigates the user on the basis of the input of the destination.

[Information Terminal]

FIG. 47 also illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the semiconductor device described in the foregoing embodiment, like the information terminal 5500 described above. Examples of the application utilizing artificial intelligence include design-support software, text correction software, and software for automatic menu generation. Furthermore, with the use of the desktop information terminal 5300, novel artificial intelligence can be developed.

Although FIG. 47 illustrates a smartphone and a desktop information terminal as examples of the electronic device, one embodiment of the present invention can also be applied to information terminals other than a smartphone and a desktop information terminal. Examples of information terminals other than a smartphone and a desktop information terminal include a personal digital assistant (PDA), a laptop information terminal, and a workstation.

[Household Appliance]

FIG. 47 illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the foregoing embodiment is used in the electric refrigerator-freezer 5800, the electric refrigerator-freezer 5800 with artificial intelligence can be obtained. Utilizing the artificial intelligence enables the electric refrigerator-freezer 5800 to have a function of automatically making a menu on the basis of food stored in the electric refrigerator-freezer 5800 and food expiration dates, a function of controlling the temperature to be appropriate for the food stored in the electric refrigerator-freezer 5800, and the like.

Here, an electric refrigerator-freezer is described as an example of a household appliance; other examples of household appliances include a vacuum, a microwave oven, an electric oven, a rice cooker, a water heater, an IH cooker, a water server, a heating-cooling combination appliance such as an air conditioner, a washing machine, a drying machine, and an audio visual appliance.

[Game Machines]

FIG. 47 illustrates a portable game machine 5200 as an example of a game machine. The portable game machine 5200 includes a housing 5201, a display portion 5202, a button 5203, and the like.

FIG. 47 illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 47, the controller 7522 can include a display portion that displays a game image, a touch panel or a stick serving as an input interface besides the button, a rotating knob, a sliding knob, and the like. The shape of the controller 7522 is not limited to that in FIG. 47 and may be changed variously in accordance with the genres of games. For example, in a shooting game such as a first person shooter (FPS) game, a gun-shaped controller having a trigger button can be used. As another example, in a music game or the like, a controller having a shape of a music instrument, audio equipment, or the like can be used. Furthermore, the stationary game machine may include a camera, a depth sensor, a microphone, and the like so that the game player can play a game using a gesture and/or a voice instead of a controller.

An image displayed on the game machine can be output with a display device such as a television device, a personal computer display, a game display, or a head-mounted display.

The portable game machine 5200 including the semiconductor device described in the foregoing embodiment can have low power consumption. Furthermore, heat generation from a circuit can be reduced owing to low power consumption; thus, the influence of heat generation on the circuit, the peripheral circuit, and the module can be reduced.

When the semiconductor device described in the foregoing embodiment is used in the portable game machine 5200, the portable game machine 5200 with artificial intelligence can be obtained.

In general, progress of a game, the actions and words of game characters, and expressions of a phenomenon in the game are programmed in the game; however, the use of artificial intelligence in the portable game machine 5200 enables expressions not limited by the game program. For example, questions posed by the player, progress of the game, time, and actions and words of game characters can be changed for various expressions.

The artificial intelligence can construct a virtual game player; thus, a game that needs a plurality of players can be played by only one human game player with the portable game machine 5200, with the use of a virtual game player constructed by the artificial intelligence as an opponent.

Although FIG. 47 illustrates a portable game machine and a home stationary game machine as examples of game machines, the electronic device of one embodiment of the present invention is not limited thereto. Other examples of the electronic device of one embodiment of the present invention include an arcade game machine installed in an entertainment facility (e.g., a game center and an amusement park), and a throwing machine for batting practice installed in sports facilities.

[Moving Vehicle]

The semiconductor device described in the foregoing embodiment can be used for an automobile, which is a moving vehicle, and around the driver's seat in an automobile.

FIG. 47 illustrates an automobile 5700 as an example of a moving vehicle.

Various kinds of information can be provided around the driver's seat of the automobile 5700 by displaying a speedometer, a tachometer, a mileage, a fuel meter, a gearshift indicator, air-conditioning settings, and the like.

In particular, the display device can provide the view obstructed by the pillar or the like, the blind areas for the driver's seat, and the like to the driver by displaying an image taken by an imaging device (not illustrated) provided for the automobile 5700. That is, displaying an image taken by the imaging device provided on the exterior of the automobile 5700 eliminates blind areas and enhances safety.

Since the semiconductor device described in the foregoing embodiment can be used as the components of artificial intelligence, the semiconductor device can be used for the automatic driving system of the automobile 5700. The semiconductor device can also be used for a system for navigation, risk prediction, or the like. The display device may display navigation information, risk prediction information, and the like.

Although an automobile is described above as an example of a moving vehicle, moving vehicles are not limited to an automobile. Examples of moving vehicles include a train, a monorail train, a ship, and a flying object (a helicopter, an unmanned aircraft (a drone), an airplane, and a rocket), and these moving vehicles can include a system utilizing artificial intelligence when equipped with the semiconductor device of one embodiment of the present invention.

[Camera]

The semiconductor device described in the foregoing embodiment can be used for a camera.

FIG. 47 illustrates a digital camera 6240 as an example of an imaging device. The digital camera 6240 includes a housing 6241, a display portion 6242, operation buttons 6243, a shutter button 6244, and the like. An attachable lens 6246 is attached to the digital camera 6240. Here, the lens 6246 of the digital camera 6240 is detachable from the housing 6241 for replacement; alternatively, the lens 6246 may be incorporated into the housing 6241. Moreover, the digital camera 6240 may be configured to be equipped with a stroboscope, a viewfinder, or the like.

The digital camera 6240 including the semiconductor device described in the foregoing embodiment can have low power consumption. Furthermore, heat generation from a circuit can be reduced owing to low power consumption; thus, the influence of heat generation on the circuit, the peripheral circuit, and the module can be reduced.

Furthermore, when the semiconductor device described in the foregoing embodiment is used for the digital camera 6240, the digital camera 6240 including artificial intelligence can be obtained. Utilizing the artificial intelligence enables the digital camera 6240 to have a function of automatically recognizing a subject such as a face or an object, a function of adjusting a focus on the subject, a function of automatically using a flash in accordance with environments, and a function of toning a taken image, for example.

[Video Camera]

The semiconductor device described in the foregoing embodiment can be used for a video camera.

FIG. 47 illustrates a video camera 6300 that is an example of an imaging device. The video camera 6300 includes a first housing 6301, a second housing 6302, a display portion 6303, operation keys 6304, a lens 6305, a joint 6306, and the like. The operation keys 6304 and the lens 6305 are provided for the first housing 6301, and the display portion 6303 is provided for the second housing 6302. The first housing 6301 and the second housing 6302 are connected to each other with the joint 6306, and the angle between the first housing 6301 and the second housing 6302 can be changed with the joint 6306. Images displayed on the display portion 6303 may be switched in accordance with the angle at the joint 6306 between the first housing 6301 and the second housing 6302.

When images taken by the video camera 6300 are recorded, the images need to be encoded in accordance with a data recording format. With the use of artificial intelligence, the video camera 6300 can perform the pattern recognition by artificial intelligence in encoding of the images. The pattern recognition is used to calculate a difference in the human, the animal, the object, and the like between continuously taken image data, so that the data can be compressed.

[Expansion Device for Personal Computer]

The semiconductor device described in the foregoing embodiment can be used for a calculator such as a personal computer (PC) and an expansion device for an information terminal.

Figure 48A:
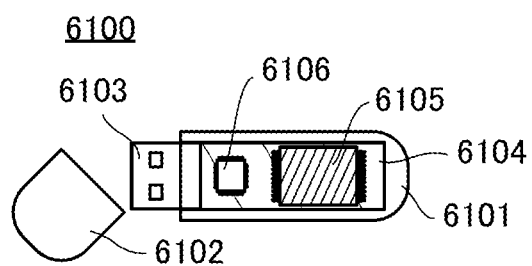
FIGS. 48A to 48C are perspective views illustrating examples of electronic devices.

FIG. 48A illustrates, as an example of the expansion device, a portable expansion device 6100 that is externally attached to a PC and includes a chip capable of arithmetic processing. The expansion device 6100 can perform arithmetic processing using the chip when connected to the PC with a universal serial bus (USB), for example. FIG. 48A illustrates the portable expansion device 6100; however, the expansion device of one embodiment of the present invention is not limited to this and may be a relatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the foregoing embodiment. For example, the substrate 6104 is provided with a chip 6105 (e.g., the semiconductor device described in the foregoing embodiment, the electronic component 4700, and a memory chip) and a controller chip 6106. The USB connector 6103 functions as an interface for connection to an external device.

The use of the expansion device 6100 for a PC and the like can increase the arithmetic processing properties of the PC. Thus, a PC with insufficient processing capability can perform arithmetic operation of artificial intelligence, moving image processing, and the like.

[Broadcasting System]

The semiconductor device described in the foregoing embodiment can be used for a broadcasting system.

Figure 48B:
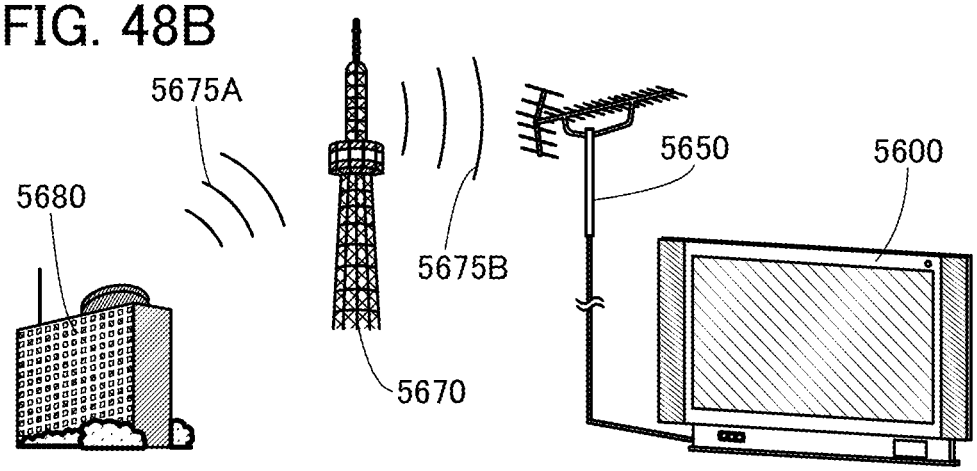

FIG. 48B schematically illustrates data transmission in a broadcasting system. Specifically, FIG. 48B illustrates a path in which a radio wave (a broadcast signal) transmitted from a broadcast station 5680 is delivered to a television receiver (TV) 5600 at home. The TV 5600 includes a receiving device (not illustrated), and the broadcast signal received by an antenna 5650 is transmitted to the TV 5600 through the receiving device.

Although an ultra-high frequency (UHF) antenna is shown as the antenna 5650 in FIG. 48B, a BS/110° CS antenna, a CS antenna, or the like can also be used.

A radio wave 5675A and a radio wave 5675B are broadcast signals for terrestrial broadcasting; a radio wave tower 5670 amplifies the received radio wave 5675A and transmits the radio wave 5675B. Each household can view terrestrial broadcasting on the TV 5600 by receiving the radio wave 5675B with the antenna 5650. Note that the broadcasting system is not limited to the terrestrial broadcasting illustrated in FIG. 48B and may be satellite broadcasting using an artificial satellite, data broadcasting using an optical line, or the like.

The above-described broadcasting system may utilize artificial intelligence by including the semiconductor device described in the foregoing embodiment. When the broadcast data is transmitted from the broadcast station 5680 to the TV 5600 at home, the broadcast data is compressed by an encoder. The antenna 5650 receives the compressed broadcast data, and then the compressed broadcast data is decompressed by a decoder of the receiving device in the TV 5600. With the use of the artificial intelligence, for example, a display pattern included in an image can be recognized in motion compensation prediction, which is one of the compressing methods for the encoder. In addition, in-frame prediction, for instance, can also be performed utilizing artificial intelligence. Furthermore, for example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As an application of artificial intelligence in the TV 5600, a recording device with artificial intelligence may be provided in the TV 5600, for example. With such a structure, the artificial intelligence in the recording device can learn the user's preference, so that TV programs that suit the user's preference can be recorded automatically.

[Authentication System]

The semiconductor device described in the foregoing embodiment can be used for an authentication system.

Figure 48C:
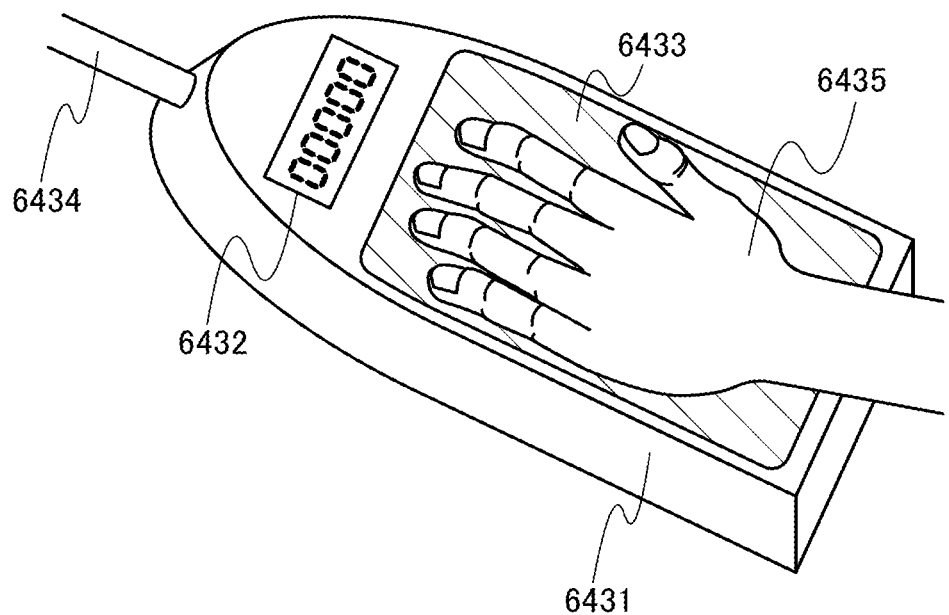

FIG. 48C illustrates a palm print authentication device that includes a housing 6431, a display portion 6432, a palm print reading portion 6433, and a wiring 6434.

In FIG. 48C, a palm print of a hand 6435 is obtained by a palm print authentication device. The obtained palm print is subjected to the pattern recognition utilizing artificial intelligence, so that personal authentication of the palm print can be performed. Accordingly, a system that performs highly secure authentication can be constructed. Without limitation to the palm print authentication device, the authentication system of one embodiment of the present invention may be a device that performs biological authentication by obtaining biological information of fingerprints, veins, faces, iris, voice prints, genes, physical constitutions, or the like.

Note that this embodiment can be combined with any of the other embodiments in this specification as appropriate.

This application is based on Japanese Patent Application Serial No. 2018-136839 filed with Japan Patent Office on Jul. 20, 2018, the entire contents of which are hereby incorporated by reference.

What is claimed is:

1. A semiconductor device comprising:
   a first transistor, a second transistor, a third transistor, a fourth transistor, a first logic circuit, a second logic circuit, a first holding unit, and a second holding unit, wherein:
each of the first logic circuit and the second logic circuit comprises an input terminal, an output terminal, and a power supply potential input terminal,
the first logic circuit is configured to output an inverted signal of a signal input to the input terminal of the first logic circuit, from the output terminal of the first logic circuit,
the second logic circuit is configured to output an inverted signal of a signal input to the input terminal of the second logic circuit, from the output terminal of the second logic circuit,
each of the first to fourth transistors comprises a first gate and a second gate,
the first holding unit comprises a fifth transistor and a first capacitor,
the second holding unit comprises a sixth transistor and a second capacitor,
the power supply potential input terminal of the first logic circuit is electrically connected to a first terminal of the first transistor and a first terminal of the third transistor,
the power supply potential input terminal of the second logic circuit is electrically connected to a first terminal of the second transistor and a first terminal of the fourth transistor,
the first gate of the first transistor is electrically connected to the first gate of the second transistor,
the first gate of the third transistor is electrically connected to the first gate of the fourth transistor,
a first terminal of the fifth transistor is electrically connected to a first terminal of the first capacitor, the second gate of the first transistor, and the second gate of the fourth transistor, and
a first terminal of the sixth transistor is electrically connected to a first terminal of the second capacitor, the second gate of the second transistor, and the second gate of the third transistor.

2. The semiconductor device according to claim 1, wherein at least one of the first to fourth transistors comprises a metal oxide in a channel formation region.

3. An electronic device comprising the semiconductor device according to claim 1,
wherein the semiconductor device performs neural network operation.

4. A semiconductor device comprising:
a first circuit comprising a first input terminal, a second input terminal, a third input terminal, a first output terminal, a second output terminal, a first transistor, a second transistor, a third transistor, a fourth transistor, a first logic circuit, a second logic circuit, a third logic circuit, and a fourth logic circuit,
wherein:
each of the first to fourth logic circuits comprises an input terminal, an output terminal, and a power supply potential input terminal,
the first logic circuit is configured to output an inverted signal of a signal input to the input terminal of the first logic circuit, from the output terminal of the first logic circuit,
the second logic circuit is configured to output an inverted signal of a signal input to the input terminal of the second logic circuit, from the output terminal of the second logic circuit,
the third logic circuit is configured to output an inverted signal of a signal input to the input terminal of the third logic circuit, from the output terminal of the third logic circuit,
the fourth logic circuit is configured to output an inverted signal of a signal input to the input terminal of the fourth logic circuit, from the output terminal of the fourth logic circuit,
each of the first to fourth transistors comprises a first gate and a second gate,
the first input terminal is electrically connected to the input terminal of one of the first logic circuit and the third logic circuit,
when the first input terminal is electrically connected to the input terminal of the first logic circuit, the output terminal of the first logic circuit is electrically connected to the input terminal of the third logic circuit, the output terminal of the third logic circuit is electrically connected to the first output terminal, the second input terminal is electrically connected to the input terminal of the second logic circuit, the output terminal of the second logic circuit is electrically connected to the input terminal of the fourth logic circuit, and the output terminal of the fourth logic circuit is electrically connected to the second output terminal,
when the first input terminal is electrically connected to the input terminal of the third logic circuit, the output terminal of the third logic circuit is electrically connected to the input terminal of the first logic circuit, the output terminal of the first logic circuit is electrically connected to the first output terminal, the second input terminal is electrically connected to the input terminal of the fourth logic circuit, the output terminal of the fourth logic circuit is electrically connected to the input terminal of the second logic circuit, and the output terminal of the second logic circuit is electrically connected to the second output terminal,
the power supply potential input terminal of the first logic circuit is electrically connected to a first terminal of the first transistor and a first terminal of the third transistor,
the power supply potential input terminal of the second logic circuit is electrically connected to a first terminal of the second transistor and a first terminal of the fourth transistor,
the first gate of the first transistor is electrically connected to the first gate of the second transistor,
the first gate of the third transistor is electrically connected to the first gate of the fourth transistor,
the first circuit is configured to turn on the first transistor and the second transistor and turn off the third transistor and the fourth transistor, or turn off the first transistor and the second transistor and turn on the third transistor and the fourth transistor, in response to a first signal input to the third input terminal, and
the first circuit is configured to change an input/output time from input of a signal to the first input terminal to output of the signal from the first output terminal and an input/output time from input of a signal to the second input terminal to output of the signal from the second output terminal, in response to a potential of the second gate of each of the first to fourth transistors.

5. The semiconductor device according to claim 4,
wherein:
the first circuit comprises a holding unit,
the holding unit comprises a fifth logic circuit and a sixth logic circuit,
an output terminal of the fifth logic circuit is electrically connected to an input terminal of the sixth logic circuit, the second gate of the first transistor, and the second gate of the fourth transistor, and an input terminal of the fifth logic circuit is electrically connected to an output terminal of the sixth logic circuit, the second gate of the second transistor, and the second gate of the third transistor.

6. The semiconductor device according to claim 4, wherein:
the first circuit comprises a first holding unit and a second holding unit,
the first holding unit comprises a fifth transistor and a first capacitor,
the second holding unit comprises a sixth transistor and a second capacitor,
a first terminal of the fifth transistor is electrically connected to the second gate of the first transistor, the second gate of the fourth transistor, and a first terminal of the first capacitor,
a first terminal of the sixth transistor is electrically connected to the second gate of the second transistor, the second gate of the third transistor, and a first terminal of the second capacitor, and
each of the fifth transistor and the sixth transistor comprises a metal oxide in a channel formation region.

7. The semiconductor device according to claim 4, wherein:
the first circuit comprises a first holding unit, a second holding unit, a third holding unit, and a fourth holding unit,
the first holding unit comprises a fifth transistor and a first capacitor,
the second holding unit comprises a sixth transistor and a second capacitor,
the third holding unit comprises a seventh transistor and a third capacitor,
the fourth holding unit comprises an eighth transistor and a fourth capacitor,
a first terminal of the fifth transistor is electrically connected to the second gate of the first transistor and a first terminal of the first capacitor,
a first terminal of the sixth transistor is electrically connected to the second gate of the second transistor and a first terminal of the second capacitor,
a first terminal of the seventh transistor is electrically connected to the second gate of the third transistor and a first terminal of the third capacitor,
a first terminal of the eighth transistor is electrically connected to the second gate of the fourth transistor and a first terminal of the fourth capacitor, and
each of the fifth to eighth transistors comprises a metal oxide in a channel formation region.

8. The semiconductor device according to claim 4, wherein at least one of the first to fourth transistors comprises a metal oxide in a channel formation region.

9. The semiconductor device according to claim 4, further comprising a plurality of the first circuits,
wherein:
the first output terminal of one first circuit is electrically connected to the first input terminal of the subsequent first circuit,
the second output terminal of the one first circuit is electrically connected to the second input terminal of the subsequent first circuit, and
when potentials corresponding to first data are supplied to the second gates of the first transistors and the fourth transistors in all the first circuits and the first signals corresponding to second data are input to the third input terminals of all the first circuits, a time lag between output signals output from the first output terminal and the second output terminal of the first circuit in a last stage by input of input signals to the first input terminal and the second input terminal of the first circuit in a first stage corresponds to a sum of products of the first data and the second data.

10. The semiconductor device according to claim 9, further comprising a second circuit,
wherein the second circuit is electrically connected to the first output terminal and the second output terminal of the first circuit in the last stage, and
wherein the second circuit is configured to generate a signal corresponding to the time lag between the output signals.

11. A semiconductor device comprising:
a first circuit comprising a first input terminal, a second input terminal, a third input terminal, a first output terminal, a second output terminal, a first switch, a second switch, a third switch, a fourth switch, a first logic circuit, a second logic circuit, a third logic circuit, a fourth logic circuit, a first load circuit, and a second load circuit,
wherein:
each of the first to fourth logic circuits comprises an input terminal, an output terminal, and a power supply potential input terminal,
the first logic circuit is configured to output an inverted signal of a signal input to the input terminal of the first logic circuit, from the output terminal of the first logic circuit,
the second logic circuit is configured to output an inverted signal of a signal input to the input terminal of the second logic circuit, from the output terminal of the second logic circuit,
the third logic circuit is configured to output an inverted signal of a signal input to the input terminal of the third logic circuit, from the output terminal of the third logic circuit,
the fourth logic circuit is configured to output an inverted signal of a signal input to the input terminal of the fourth logic circuit, from the output terminal of the fourth logic circuit,
the first input terminal is electrically connected to the input terminal of one of the first logic circuit and the third logic circuit,
when the first input terminal is electrically connected to the input terminal of the first logic circuit, the output terminal of the first logic circuit is electrically connected to the input terminal of the third logic circuit, the output terminal of the third logic circuit is electrically connected to the first output terminal, the second input terminal is electrically connected to the input terminal of the second logic circuit, the output terminal of the second logic circuit is electrically connected to the input terminal of the fourth logic circuit, and the output terminal of the fourth logic circuit is electrically connected to the second output terminal,
when the first input terminal is electrically connected to the input terminal of the third logic circuit, the output terminal of the third logic circuit is electrically connected to the input terminal of the first logic circuit, the output terminal of the first logic circuit is electrically connected to the first output terminal, the second input terminal is electrically connected to the input terminal of the fourth logic circuit, the output terminal of the fourth logic circuit is electrically connected to the input terminal of the second logic circuit, and the output terminal of the second logic circuit is electrically connected to the second output terminal, the power supply potential input terminal of the first logic circuit is electrically connected to a first terminal of the first switch and a first terminal of the third switch, the power supply potential input terminal of the second logic circuit is electrically connected to a first terminal of the second switch and a first terminal of the fourth switch, a control terminal of the first switch is electrically connected to a control terminal of the second switch, a control terminal of the third switch is electrically connected to a control terminal of the fourth switch, a first terminal of the first load circuit is electrically connected to a second terminal of the first switch and a second terminal of the fourth switch, a first terminal of the second load circuit is electrically connected to a second terminal of the second switch and a second terminal of the third switch, the first circuit is configured to turn on the first switch and the second switch and turn off the third switch and the fourth switch, or turn off the first switch and the second switch and turn on the third switch and the fourth switch, in response to a first signal input to the third input terminal, and the first circuit is configured to change an input/output time from input of a signal to the first input terminal to output of the signal from the first output terminal and an input/output time from input of a signal to the second input terminal to output of the signal from the second output terminal, in response to on/off states of the first to fourth switches, a first resistance between the first terminal and a second terminal of the first load circuit, and a second resistance between the first terminal and a second terminal of the second load circuit.

12. The semiconductor device according to claim 11, wherein the first load circuit comprises one of a variable resistor, a magnetic tunnel junction element, and a phase-change memory, and wherein the first load circuit is configured to change the first resistance in response to a signal input to the first load circuit.

13. The semiconductor device according to claim 12, wherein the second load circuit comprises one of a variable resistor, a magnetic tunnel junction element, and a phase-change memory, and wherein the second load circuit is configured to change the second resistance in response to a signal input to the second load circuit.

14. The semiconductor device according to claim 11, further comprising a plurality of the first circuits, wherein:
the first output terminal of one first circuit is electrically connected to the first input terminal of the subsequent first circuit, the second output terminal of the one first circuit is electrically connected to the second input terminal of the subsequent first circuit, and when the first resistances corresponding to first data are set in the first load circuits in all the first circuits and the first signals corresponding to second data are input to the third input terminals of all the first circuits, a time lag between output signals output from the first output terminal and the second output terminal of the first circuit in a last stage by input of input signals to the first input terminal and the second input terminal of the first circuit in a first stage corresponds to a sum of products of the first data and the second data.

15. The semiconductor device according to claim 14, further comprising a second circuit, wherein the second circuit is electrically connected to the first output terminal and the second output terminal of the first circuit in the last stage, and wherein the second circuit is configured to generate a signal corresponding to the time lag between the output signals.

16. A semiconductor device comprising:
a first circuit comprising a first input terminal, a second input terminal, a third input terminal, a first output terminal, a second output terminal, a first switch, a second switch, a third switch, a fourth switch, a first logic circuit, a second logic circuit, a third logic circuit, a fourth logic circuit, a first load circuit, a second load circuit, a third load circuit, and a fourth load circuit, wherein:
each of the first to fourth logic circuits comprises an input terminal, an output terminal, and a power supply potential input terminal, the first logic circuit is configured to output an inverted signal of a signal input to the input terminal of the first logic circuit, from the output terminal of the first logic circuit, the second logic circuit is configured to output an inverted signal of a signal input to the input terminal of the second logic circuit, from the output terminal of the second logic circuit, the third logic circuit is configured to output an inverted signal of a signal input to the input terminal of the third logic circuit, from the output terminal of the third logic circuit, the fourth logic circuit is configured to output an inverted signal of a signal input to the input terminal of the fourth logic circuit, from the output terminal of the fourth logic circuit, the first input terminal is electrically connected to the input terminal of one of the first logic circuit and the third logic circuit, when the first input terminal is electrically connected to the input terminal of the first logic circuit, the output terminal of the first logic circuit is electrically connected to the input terminal of the third logic circuit, the output terminal of the third logic circuit is electrically connected to the first output terminal, the second input terminal is electrically connected to the input terminal of the second logic circuit, the output terminal of the second logic circuit is electrically connected to the input terminal of the fourth logic circuit, and the output terminal of the fourth logic circuit is electrically connected to the second output terminal, when the first input terminal is electrically connected to the input terminal of the third logic circuit, the output terminal of the third logic circuit is electrically connected to the input terminal of the first logic circuit, the output terminal of the first logic circuit is electrically connected to the first output terminal, the second input terminal is electrically connected to the input terminal of the fourth logic circuit, the output terminal of the fourth logic circuit is electrically connected to the input terminal of the second logic circuit, and the output terminal of the second logic circuit is electrically connected to the second output terminal, the power supply potential input terminal of the first logic circuit is electrically connected to a first terminal of the first switch and a first terminal of the third switch, the power supply potential input terminal of the second logic circuit is electrically connected to a first terminal of the second switch and a first terminal of the fourth switch, a control terminal of the first switch is electrically connected to a control terminal of the second switch, a control terminal of the third switch is electrically connected to a control terminal of the fourth switch, a first terminal of the first load circuit is electrically connected to a second terminal of the first switch, a first terminal of the second load circuit is electrically connected to a second terminal of the third switch, a first terminal of the third load circuit is electrically connected to a second terminal of the fourth switch, a first terminal of the fourth load circuit is electrically connected to a second terminal of the second switch, the first circuit is configured to turn on the first switch and the second switch and turn off the third switch and the fourth switch, or turn off the first switch and the second switch and turn on the third switch and the fourth switch, in response to a first signal input to the third input terminal, and the first circuit is configured to change an input/output time from input of a signal to the first input terminal to output of the signal from the first output terminal and an input/output time from input of a signal to the second input terminal to output of the signal from the second output terminal, in response to on/off states of the first to fourth switches, a first resistance between the first terminal and a second terminal of the first load circuit, a second resistance between the first terminal and a second terminal of the second load circuit, a third resistance between the first terminal and a second terminal of the third load circuit, and a fourth resistance between the first terminal and a second terminal of the fourth load circuit.

17. The semiconductor device according to claim 16, wherein:

each of the first to fourth load circuits comprises one of a variable resistor, a magnetic tunnel junction element, and a phase-change memory, the first load circuit is configured to change the first resistance in response to a signal input to the first load circuit, the second load circuit is configured to change the second resistance in response to a signal input to the second load circuit, the third load circuit is configured to change the third resistance in response to a signal input to the third load circuit, and the fourth load circuit is configured to change the fourth resistance in response to a signal input to the fourth load circuit.

18. The semiconductor device according to claim 16, further comprising a plurality of the first circuits, wherein:

the first output terminal of one first circuit is electrically connected to the first input terminal of the subsequent first circuit, the second output terminal of the one first circuit is electrically connected to the second input terminal of the subsequent first circuit, and when the first resistances corresponding to first data are set in the first load circuits in all the first circuits and the first signals corresponding to second data are input to the third input terminals of all the first circuits, a time lag between output signals output from the first output terminal and the second output terminal of the first circuit in a last stage by input of input signals to the first input terminal and the second input terminal of the first circuit in a first stage corresponds to a sum of products of the first data and the second data.

19. The semiconductor device according to claim 18, further comprising a second circuit, wherein the second circuit is electrically connected to the first output terminal and the second output terminal of the first circuit in the last stage, and wherein the second circuit is configured to generate a signal corresponding to the time lag between the output signals.

* * * * *